US012737318B2

(12) United States Patent
Koker et al.

(10) Patent No.: US 12,737,318 B2
(45) Date of Patent: Sep. 15, 2026

(54) CACHE STRUCTURE AND UTILIZATION

(71) Applicant: Intel Corporation, Santa Clara, CA (US)

(72) Inventors: Altug Koker, El Dorado Hills, CA (US); Lakshminarayanan Striramassarma, Folsom, CA (US); Aravindh Anantaraman, Folsom, CA (US); Valentin Andrei, San Jose, CA (US); Abhishek R. Appu, El Dorado Hills, CA (US); Sean Coleman, Folsom, CA (US); Varghese George, Folsom, CA (US); Pattabhiraman K, Bangalore KA (IN); Mike MacPherson, Portland, OR (US); Subramaniam Maiyuran, Gold River, CA (US); ElMoustapha Ould-Ahmed-Vall, Chandler, AZ (US); Vasanth Ranganathan, El Dorado Hills, CA (US); Joydeep Ray, Folsom, CA (US); Jayakrishna P S, Bangalore KA (IN); Prasoonkumar Surti, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 18/738,785

(22) Filed: Jun. 10, 2024

(65) Prior Publication Data

US 2024/0411717 A1 Dec. 12, 2024

Related U.S. Application Data

(63) Continuation of application No. 17/674,703, filed on Feb. 17, 2022, now Pat. No. 12,153,541, which is a (Continued)

(51) Int. Cl.
*G06F 12/00* (2006.01)
*G06F 7/544* (2006.01)
(Continued)

(52) U.S. Cl.
CPC ........ *G06F 15/7839* (2013.01); *G06F 7/5443* (2013.01); *G06F 7/575* (2013.01);
(Continued)

(58) Field of Classification Search
CPC .... G06F 15/7839; G06F 7/5443; G06F 7/575; G06F 7/588; G06F 9/3001;
(Continued)

(56) References Cited

U.S. PATENT DOCUMENTS 3,872,442 A 3/1975 Boles et al.
4,476,523 A 10/1984 Beauchamp
(Continued)

FOREIGN PATENT DOCUMENTS

CN 101131674 A * 2/2008 ......... G06F 12/0891
CN 101133393 A 2/2008
(Continued)

OTHER PUBLICATIONS

U.S. Appl. No. 17/429,873 "Non-Final Office Action" mailed Jan. 9, 2023, 13 pages.
(Continued)

*Primary Examiner* — Shawn X Gu
*Assistant Examiner* — Mohammad S Hasan
(74) *Attorney, Agent, or Firm* — JAFFERY WATSON HAMILTON & DESANCTIS LLP

(57) ABSTRACT

Embodiments are generally directed to cache structure and utilization. An embodiment of an apparatus includes one or more processors including a graphics processor; a memory for storage of data for processing by the one or more processors; and a cache to cache data from the memory;
(Continued)

wherein the apparatus is to provide for dynamic overfetching of cache lines for the cache, including receiving a read request and accessing the cache for the requested data, and upon a miss in the cache, overfetching data from memory or a higher level cache in addition to fetching the requested data, wherein the overfetching of data is based at least in part on a current overfetch boundary, and provides for data is to be prefetched extending to the current overfetch boundary.

11 Claims, 51 Drawing Sheets

Related U.S. Application Data continuation of application No. 17/429,291, filed as application No. PCT/US2020/022849 on Mar. 14, 2020, now Pat. No. 12,066,975.

(60) Provisional application No. 62/819,361, filed on Mar. 15, 2019, provisional application No. 62/819,337, filed on Mar. 15, 2019, provisional application No. 62/819,435, filed on Mar. 15, 2019.

(51) Int. Cl.

| | |
|---|---|
| ***G06F 7/575*** | (2006.01) |
| ***G06F 7/58*** | (2006.01) |
| ***G06F 9/30*** | (2018.01) |
| ***G06F 9/38*** | (2018.01) |
| ***G06F 9/50*** | (2006.01) |
| ***G06F 12/02*** | (2006.01) |
| ***G06F 12/06*** | (2006.01) |
| ***G06F 12/0802*** | (2016.01) |
| ***G06F 12/0804*** | (2016.01) |
| ***G06F 12/0811*** | (2016.01) |
| ***G06F 12/0862*** | (2016.01) |
| ***G06F 12/0866*** | (2016.01) |
| ***G06F 12/0871*** | (2016.01) |
| ***G06F 12/0875*** | (2016.01) |
| ***G06F 12/0882*** | (2016.01) |
| ***G06F 12/0888*** | (2016.01) |
| ***G06F 12/0891*** | (2016.01) |
| ***G06F 12/0893*** | (2016.01) |
| ***G06F 12/0895*** | (2016.01) |
| ***G06F 12/0897*** | (2016.01) |
| ***G06F 12/1009*** | (2016.01) |
| ***G06F 12/128*** | (2016.01) |
| ***G06F 13/16*** | (2006.01) |
| ***G06F 15/78*** | (2006.01) |
| ***G06F 15/80*** | (2006.01) |
| ***G06F 17/16*** | (2006.01) |
| ***G06F 17/18*** | (2006.01) |
| ***G06T 1/20*** | (2006.01) |
| ***G06T 1/60*** | (2006.01) |
| ***H03M 7/46*** | (2006.01) |
| *G06N 3/08* | (2023.01) |
| *G06T 15/06* | (2011.01) |

(52) U.S. Cl.

CPC ........... *G06F 7/588* (2013.01); *G06F 9/3001* (2013.01); *G06F 9/30014* (2013.01); *G06F 9/30036* (2013.01); *G06F 9/3004* (2013.01); *G06F 9/30043* (2013.01); *G06F 9/30047* (2013.01); *G06F 9/30065* (2013.01); *G06F 9/30079* (2013.01); *G06F 9/3887* (2013.01); *G06F 9/3888* (2023.08); *G06F 9/5011* (2013.01); *G06F 9/5077* (2013.01); *G06F 12/0215* (2013.01); *G06F 12/0238* (2013.01); *G06F 12/0246* (2013.01); *G06F 12/0607* (2013.01); *G06F 12/0802* (2013.01); *G06F 12/0804* (2013.01); *G06F 12/0811* (2013.01); *G06F 12/0862* (2013.01); *G06F 12/0866* (2013.01); *G06F 12/0871* (2013.01); *G06F 12/0875* (2013.01); *G06F 12/0882* (2013.01); *G06F 12/0888* (2013.01); *G06F 12/0891* (2013.01); *G06F 12/0893* (2013.01); *G06F 12/0895* (2013.01); *G06F 12/0897* (2013.01); *G06F 12/1009* (2013.01); *G06F 12/128* (2013.01); *G06F 13/1626* (2013.01); *G06F 15/8046* (2013.01); *G06F 17/16* (2013.01); *G06F 17/18* (2013.01); *G06T 1/20* (2013.01); *G06T 1/60* (2013.01); *H03M 7/46* (2013.01); *G06F 9/3802* (2013.01); *G06F 9/3818* (2013.01); *G06F 9/3867* (2013.01); *G06F 2212/1008* (2013.01); *G06F 2212/1021* (2013.01); *G06F 2212/1044* (2013.01); *G06F 2212/302* (2013.01); *G06F 2212/401* (2013.01); *G06F 2212/455* (2013.01); *G06F 2212/60* (2013.01); *G06N 3/08* (2013.01); *G06T 15/06* (2013.01)

(58) Field of Classification Search

CPC ............ G06F 9/30014; G06F 9/30036; G06F 9/3004; G06F 9/30043; G06F 9/30047; G06F 9/30065; G06F 9/30079; G06F 9/3887; G06F 9/3888; G06F 9/5011; G06F 9/5077; G06F 12/0215; G06F 12/0238; G06F 12/0246; G06F 12/0607; G06F 12/0802; G06F 12/0804; G06F 12/0811; G06F 12/0862; G06F 12/0866; G06F 12/0871; G06F 12/0875; G06F 12/0882; G06F 12/0888; G06F 12/0891; G06F 12/0893; G06F 12/0895; G06F 12/0897; G06F 12/1009; G06F 12/128; G06F 15/8046; G06F 17/16; G06F 17/18; G06F 9/3802; G06F 9/3818; G06F 9/3867; G06F 2212/1008; G06F 2212/1021; G06F 2212/1044; G06F 2212/302; G06F 2212/401; G06F 2212/455; G06F 2212/60; G06F 2212/1016; G06F 7/58; G06F 9/5066; G06F 2212/1024; G06F 15/173; G06F 16/24569; G06F 12/12; G06F 2212/2542; G06F 2212/601; G06F 2212/608; G06F 2212/652; G06F 9/383; G06F 2212/6026; G06F 2212/6028; G06F 12/0877; G06T 1/20; G06T 1/60; G06T 15/06; H03M 7/46; G06N 3/08

See application file for complete search history.

(56) References Cited

U.S. PATENT DOCUMENTS

| | | | |
|---|---|---|---|
| 4,823,252 | A | 4/1989 | Horst et al. |
| 5,182,801 | A | 1/1993 | Asfour |
| 5,282,274 | A | 1/1994 | Liu |
| 5,381,539 | A | 1/1995 | Yanai et al. |
| 5,450,607 | A | 9/1995 | Kowalczyk et al. |
| 5,469,552 | A | 11/1995 | Suzuki et al. |
| 5,471,593 | A | 11/1995 | Branigin |
| 5,491,650 | A | 2/1996 | Barhen et al. |
| 5,502,827 | A | 3/1996 | Yoshida |
| 5,574,928 | A | 11/1996 | White et al. |
| 5,627,985 | A | 5/1997 | Fetterman et al. |
| 5,673,407 | A | 9/1997 | Poland et al. |

(56) References Cited

U.S. PATENT DOCUMENTS 5,737,752 A 4/1998 Hilditch
5,777,629 A 7/1998 Baldwin
5,805,475 A 9/1998 Putrino et al.
5,822,767 A 10/1998 MacWilliams et al.
5,890,211 A 3/1999 Sokolov et al.
5,917,741 A 6/1999 Ng
5,926,406 A 7/1999 Tucker et al.
5,940,311 A 8/1999 Dao et al.
5,943,687 A 8/1999 Liedberg
6,038,582 A 3/2000 Arakawa et al.
6,049,865 A 4/2000 Smith
6,078,940 A 6/2000 Scales
6,119,205 A * 9/2000 Wicki ................ G06F 12/0804 711/134
6,260,008 B1 7/2001 Sanfilippo
6,330,654 B1 12/2001 LaBerge et al.
6,412,046 B1 6/2002 Sharma et al.
6,480,872 B1 11/2002 Choquette
6,513,099 B1 1/2003 Smith et al.
6,529,928 B1 3/2003 Resnick et al.
6,578,102 B1 6/2003 Batchelor et al.
6,578,111 B1 6/2003 Damron et al.
6,598,120 B1 7/2003 Berg et al.
6,678,806 B1 1/2004 Redford
6,788,738 B1 9/2004 New
6,856,320 B1 2/2005 Rubinstein et al.
6,947,049 B2 9/2005 Spitzer et al.
6,963,954 B1 11/2005 Trehus et al.
7,102,646 B1 9/2006 Rubinstein et al.
7,127,482 B2 10/2006 Hou et al.
7,197,605 B2 3/2007 Schmisseur et al.
7,327,289 B1 2/2008 Lippincott
7,346,741 B1 3/2008 Keish et al.
7,373,369 B2 5/2008 Gerwig et al.
7,437,510 B2 10/2008 Rosenbluth et al.
7,483,031 B2 1/2009 Williams et al.
7,483,935 B2 1/2009 Hansen et al.
7,565,513 B2 7/2009 Ahmed et al.
7,567,252 B2 7/2009 Buck et al.
7,571,286 B2 8/2009 Fontenot et al.
7,616,206 B1 11/2009 Danilak
7,620,793 B1 11/2009 Edmondson et al.
7,640,399 B1 12/2009 Lepak et al.
7,873,812 B1 1/2011 Mimar
7,898,442 B1 3/2011 Sovik
7,913,041 B2 3/2011 Shen et al.
7,958,558 B1 6/2011 Leake et al.
8,253,750 B1 8/2012 Huang et al.
8,326,904 B2 12/2012 Muff et al.
8,340,280 B2 12/2012 Gueron et al.
8,429,351 B1 4/2013 Yu et al.
8,458,354 B2 6/2013 Bremler-Barr et al.
8,488,055 B2 7/2013 Côté et al.
8,577,950 B2 11/2013 Eichenberger et al.
8,645,634 B1 2/2014 Cox et al.
8,669,990 B2 3/2014 Sprangle et al.
8,683,243 B2 3/2014 Wu et al.
8,847,965 B2 9/2014 Chandak et al.
8,990,505 B1 3/2015 Jamil et al.
9,104,633 B2 8/2015 Moloney
9,142,004 B2 9/2015 Abiezzi et al.
9,170,955 B2 10/2015 Forsyth et al.
9,189,046 B2 11/2015 Man et al.
9,304,835 B1 4/2016 Ekanadham et al.
9,311,157 B2 4/2016 Kim et al.
9,317,251 B2 4/2016 Tsen et al.
9,384,168 B2 7/2016 Mortensen
9,461,667 B2 10/2016 Quinnell
9,491,112 B1 11/2016 Patel et al.
9,501,392 B1 11/2016 Weingarten
9,558,156 B1 1/2017 Bekas et al.
9,588,577 B2 3/2017 Ahn et al.
9,690,696 B1 6/2017 Hefner et al.
9,703,708 B2 7/2017 Alameldeen et al.
9,727,337 B2 8/2017 Gschwind et al.
9,747,659 B2 8/2017 Banerjee et al.
9,804,666 B2 10/2017 Jiao
9,811,468 B2 11/2017 Hooker et al.
9,928,034 B2 3/2018 Merrill, III
9,959,936 B1 5/2018 Song
9,960,917 B2 5/2018 Gopal et al.
10,002,045 B2 6/2018 Chung et al.
10,049,322 B2 8/2018 Ross
10,102,015 B1 10/2018 Gordon et al.
10,146,738 B2 12/2018 Nurvitadhi et al.
10,169,297 B2 1/2019 Buchanan
10,192,162 B2 1/2019 Thorson et al.
10,229,470 B2 3/2019 Benthin et al.
10,296,411 B1 * 5/2019 Diggins ................ G06F 11/079
10,324,689 B2 6/2019 Kalsi et al.
10,338,919 B2 7/2019 Boswell et al.
10,353,706 B2 7/2019 Kaul et al.
10,360,063 B2 7/2019 Zhao et al.
10,372,416 B2 8/2019 Fais et al.
10,379,865 B1 8/2019 Menezes et al.
10,409,614 B2 9/2019 Ould-Ahmed-Vall et al.
10,409,887 B1 9/2019 Gauria et al.
10,474,458 B2 11/2019 Kaul et al.
10,528,864 B2 1/2020 Dally et al.
10,572,409 B1 2/2020 Zejda et al.
10,678,508 B2 6/2020 Vantrease et al.
10,755,201 B2 8/2020 Sika
10,762,137 B1 9/2020 Volpe et al.
10,762,164 B2 9/2020 Chen et al.
10,769,750 B1 9/2020 Yoon
10,860,316 B2 12/2020 Zhi et al.
10,860,922 B2 12/2020 Dally et al.
10,891,538 B2 1/2021 Dally et al.
10,896,045 B2 1/2021 Sodani et al.
11,080,046 B2 8/2021 Kaul et al.
11,113,784 B2 9/2021 Ray et al.
11,169,799 B2 11/2021 Kaul et al.
11,250,108 B2 2/2022 Dong et al.
11,360,767 B2 6/2022 Kaul et al.
11,361,496 B2 6/2022 Maiyuran et al.
11,367,160 B2 6/2022 Dash et al.
11,409,537 B2 8/2022 Ould-Ahmed-Vall et al.
11,461,107 B2 10/2022 Ould-Ahmed-Vall et al.
11,550,971 B1 1/2023 Lu et al.
11,620,256 B2 4/2023 Koker et al.
11,663,746 B2 5/2023 Appu et al.
11,676,239 B2 6/2023 Ray et al.
11,709,793 B2 7/2023 Maiyuran et al.
11,805,109 B1 10/2023 Khare et al.
11,836,497 B2 12/2023 Wang et al.
11,842,423 B2 12/2023 Appu et al.
11,861,761 B2 1/2024 Maiyuran
11,934,342 B2 3/2024 Koker et al.
12,007,935 B2 6/2024 Maiyuran et al.
12,079,155 B2 9/2024 Ray et al.
2001/0042194 A1 11/2001 Elliott et al.
2002/0152361 A1 10/2002 Dean et al.
2002/0156979 A1 10/2002 Rodriguez
2002/0188808 A1 12/2002 Rowlands et al.
2003/0061459 A1 3/2003 Aboulenein et al.
2003/0204840 A1 10/2003 Wu
2004/0054841 A1 3/2004 Callison et al.
2005/0080834 A1 4/2005 Belluomini et al.
2005/0125631 A1 6/2005 Symes et al.
2005/0169463 A1 8/2005 Ahn et al.
2005/0219253 A1 10/2005 Piazza et al.
2006/0037003 A1 2/2006 Long et al.
2006/0083489 A1 4/2006 Aridome et al.
2006/0101244 A1 5/2006 Siu et al.
2006/0143396 A1 6/2006 Cabot
2006/0149803 A1 7/2006 Siu et al.
2006/0179092 A1 8/2006 Schmookler
2006/0248279 A1 11/2006 Al-Sukhni et al.
2006/0265576 A1 11/2006 Davis et al.
2006/0277365 A1 12/2006 Pong
2006/0282620 A1 12/2006 Kashyap et al.
2007/0030277 A1 2/2007 Prokopenko et al.
2007/0030279 A1 2/2007 Paltashev et al.
2007/0033289 A1 2/2007 Nuyttens et al.

(56) References Cited

U.S. PATENT DOCUMENTS

2007/0055824 A1 3/2007 Diefendorff et al.
2007/0074008 A1 3/2007 Donofrio
2007/0083742 A1 4/2007 Abernathy et al.
2007/0115291 A1 5/2007 Chen et al.
2007/0130432 A1* 6/2007 Aigo .................. G06F 11/2074 711/162
2007/0211064 A1 9/2007 Buck et al.
2007/0273698 A1 11/2007 Du et al.
2007/0294682 A1 12/2007 Demetriou et al.
2008/0028152 A1 1/2008 Du et al.
2008/0030510 A1 2/2008 Wan et al.
2008/0052466 A1 2/2008 Zulauf
2008/0071851 A1 3/2008 Zohar et al.
2008/0086598 A1 4/2008 Maron et al.
2008/0147992 A1* 6/2008 Raikin ................ G06F 12/0833 711/146
2008/0189487 A1 8/2008 Craske
2008/0263324 A1 10/2008 Sutardja et al.
2008/0276066 A1 11/2008 Lee et al.
2008/0288746 A1 11/2008 Inglett et al.
2008/0307207 A1 12/2008 Khailany et al.
2009/0003593 A1 1/2009 Gopal et al.
2009/0019253 A1 1/2009 Stecher et al.
2009/0030960 A1 1/2009 Geraghty et al.
2009/0113170 A1 4/2009 Abdallah
2009/0135180 A1 5/2009 Li
2009/0150654 A1 6/2009 Oberman et al.
2009/0157972 A1 6/2009 Byers et al.
2009/0182942 A1 7/2009 Greiner et al.
2009/0189898 A1 7/2009 Dammertz et al.
2009/0190432 A1 7/2009 Bilger et al.
2009/0248976 A1 10/2009 Rotithor
2009/0254733 A1 10/2009 Chen et al.
2009/0307472 A1 12/2009 Essick, IV et al.
2009/0309896 A1 12/2009 DeLaurier et al.
2010/0053162 A1 3/2010 Dammertz et al.
2010/0082906 A1 4/2010 Hinton et al.
2010/0082910 A1 4/2010 Raikar et al.
2010/0162247 A1 6/2010 Welc et al.
2010/0185816 A1 7/2010 Sauber et al.
2010/0228941 A1 9/2010 Koob et al.
2010/0262722 A1 10/2010 Vauthier et al.
2010/0281235 A1 11/2010 Vorbach et al.
2010/0293334 A1 11/2010 Xun et al.
2010/0299656 A1 11/2010 Shah et al.
2010/0312944 A1 12/2010 Walker
2010/0332775 A1 12/2010 Kapil et al.
2011/0010521 A1 1/2011 Wang et al.
2011/0040744 A1 2/2011 Haas et al.
2011/0040822 A1 2/2011 Eichenberger et al.
2011/0060879 A1 3/2011 Rogers et al.
2011/0072213 A1 3/2011 Nickolls et al.
2011/0078226 A1 3/2011 Baskaran et al.
2011/0119446 A1 5/2011 Blumrich et al.
2011/0153707 A1 6/2011 Ginzburg et al.
2011/0157195 A1 6/2011 Sprangle et al.
2011/0238934 A1 9/2011 Xu et al.
2012/0011182 A1 1/2012 Raafat et al.
2012/0042130 A1* 2/2012 Peapell ............... G06F 12/0866 711/E12.019
2012/0059983 A1 3/2012 Nellans et al.
2012/0072631 A1 3/2012 Chirca et al.
2012/0075319 A1 3/2012 Dally
2012/0124115 A1 5/2012 Ollmann
2012/0154411 A1 6/2012 Cheng
2012/0233444 A1 9/2012 Stephens et al.
2012/0268909 A1 10/2012 Emma et al.
2012/0278376 A1 11/2012 Bakos
2013/0013864 A1 1/2013 Chung et al.
2013/0031328 A1 1/2013 Kelleher et al.
2013/0063463 A1 3/2013 Clark et al.
2013/0073599 A1 3/2013 Maloney
2013/0099946 A1 4/2013 Dickie et al.
2013/0111136 A1 5/2013 Bell, Jr. et al.
2013/0138795 A1* 5/2013 Field .................. H04L 67/5682 709/224
2013/0141442 A1 6/2013 Brothers et al.
2013/0148947 A1 6/2013 Glen et al.
2013/0185515 A1 7/2013 Sassone et al.
2013/0218938 A1 8/2013 Dockser et al.
2013/0219088 A1 8/2013 Rawe et al.
2013/0235925 A1 9/2013 Nguyen et al.
2013/0254491 A1 9/2013 Coleman et al.
2013/0283135 A1 10/2013 Kiyoshi et al.
2013/0293544 A1 11/2013 Schreyer et al.
2013/0297906 A1 11/2013 Loh et al.
2014/0006753 A1 1/2014 Gopal et al.
2014/0032818 A1 1/2014 Chang et al.
2014/0040552 A1 2/2014 Rychlik
2014/0052928 A1 2/2014 Shimoi
2014/0059328 A1 2/2014 Gonion
2014/0068197 A1 3/2014 Joshi et al.
2014/0075060 A1 3/2014 Sharp et al.
2014/0075163 A1 3/2014 Loewenstein et al.
2014/0082322 A1 3/2014 Loh et al.
2014/0089371 A1 3/2014 Dinechin et al.
2014/0089602 A1 3/2014 Biswas et al.
2014/0089697 A1 3/2014 Kim et al.
2014/0095796 A1 4/2014 Bell, Jr. et al.
2014/0108481 A1 4/2014 Davis et al.
2014/0108766 A1 4/2014 Desai
2014/0122555 A1 5/2014 Hickmann et al.
2014/0129807 A1 5/2014 Tannenbaum et al.
2014/0146607 A1 5/2014 Nagai et al.
2014/0156930 A1 6/2014 Isloorkar
2014/0173203 A1 6/2014 Forsyth
2014/0173207 A1 6/2014 Wang et al.
2014/0181460 A1 6/2014 Hsu et al.
2014/0181487 A1 6/2014 Sasanka
2014/0181806 A1 6/2014 Abiezzi et al.
2014/0188963 A1 7/2014 Tsen et al.
2014/0188966 A1 7/2014 Galal et al.
2014/0208069 A1 7/2014 Wegener
2014/0223096 A1 8/2014 Zhe Yang et al.
2014/0223131 A1 8/2014 Agarwal et al.
2014/0229713 A1 8/2014 Muff et al.
2014/0258622 A1 9/2014 Lacourba et al.
2014/0266417 A1 9/2014 Dally et al.
2014/0267232 A1 9/2014 Lum et al.
2014/0267334 A1 9/2014 Duluk, Jr. et al.
2014/0281008 A1 9/2014 Muthiah et al.
2014/0281110 A1 9/2014 Duluk, Jr. et al.
2014/0281261 A1 9/2014 Vera et al.
2014/0281299 A1 9/2014 Duluk, Jr. et al.
2014/0317388 A1 10/2014 Chung et al.
2014/0348431 A1 11/2014 Brick et al.
2014/0365715 A1 12/2014 Lee
2014/0379987 A1 12/2014 Aggarwal et al.
2015/0039661 A1 2/2015 Blomgren et al.
2015/0046655 A1 2/2015 Nystad et al.
2015/0046662 A1 2/2015 Heinrich et al.
2015/0067259 A1 3/2015 Wang et al.
2015/0095588 A1 4/2015 Abdallah
2015/0106613 A1 4/2015 Amann et al.
2015/0160872 A1 6/2015 Chen
2015/0193358 A1 7/2015 Dyke et al.
2015/0205615 A1 7/2015 Cunningham et al.
2015/0205724 A1 7/2015 Hancock et al.
2015/0221063 A1 8/2015 Kim et al.
2015/0227540 A1 8/2015 Lin et al.
2015/0235338 A1 8/2015 Alla et al.
2015/0254104 A1 9/2015 Kessler et al.
2015/0261683 A1 9/2015 Hong et al.
2015/0268940 A1 9/2015 Baghsorkhi et al.
2015/0268963 A1 9/2015 Etsion et al.
2015/0278984 A1 10/2015 Koker et al.
2015/0334043 A1 11/2015 Li et al.
2015/0339229 A1 11/2015 Zhang et al.
2015/0349953 A1 12/2015 Kruglick
2015/0371407 A1 12/2015 Kim et al.
2015/0378741 A1 12/2015 Lukyanov et al.
2015/0378920 A1 12/2015 Gierach et al.
2015/0380088 A1 12/2015 Naeimi et al.

(56) References Cited

U.S. PATENT DOCUMENTS

2016/0062947 A1 3/2016 Chetlur et al.
2016/0070536 A1 3/2016 Maeda
2016/0071242 A1 3/2016 Uralsky et al.
2016/0079997 A1 3/2016 Raichelgauz et al.
2016/0086303 A1 3/2016 Bae et al.
2016/0086654 A1 3/2016 Arora et al.
2016/0092118 A1 3/2016 Kumar et al.
2016/0092239 A1 3/2016 Maiyuran et al.
2016/0092240 A1 3/2016 Maiyuran et al.
2016/0124713 A1 5/2016 Bekas et al.
2016/0124861 A1 5/2016 Fujii et al.
2016/0140686 A1 5/2016 Lueh et al.
2016/0170889 A1 6/2016 Lee et al.
2016/0179535 A1 6/2016 Chen et al.
2016/0179574 A1 6/2016 Merrill, III
2016/0180001 A1 6/2016 Adler
2016/0188295 A1 6/2016 Rarick et al.
2016/0239065 A1 8/2016 Lee et al.
2016/0246723 A1 8/2016 Doshi et al.
2016/0255169 A1 9/2016 Kovvuri et al.
2016/0283249 A1 9/2016 Forsell
2016/0307362 A1 10/2016 Farrell et al.
2016/0321187 A1 11/2016 Bernat et al.
2016/0342889 A1 11/2016 Thorson et al.
2016/0342892 A1 11/2016 Ross
2016/0350225 A1 12/2016 Podaima et al.
2016/0350227 A1 12/2016 Hooker et al.
2016/0357680 A1 12/2016 Hooker et al.
2016/0378366 A1 12/2016 Tomishima et al.
2016/0378465 A1 12/2016 Venkatesh et al.
2016/0378674 A1 12/2016 Cheng et al.
2017/0024327 A1 1/2017 Saidi et al.
2017/0039144 A1 2/2017 Wang et al.
2017/0039674 A1 2/2017 Klosowski et al.
2017/0060202 A1 3/2017 Sundaram et al.
2017/0061279 A1 3/2017 Yang et al.
2017/0083240 A1 3/2017 Rogers et al.
2017/0090924 A1 3/2017 Mishra et al.
2017/0109282 A1 4/2017 Frank et al.
2017/0132134 A1 5/2017 Gschwind et al.
2017/0139748 A1 5/2017 Tipparaju et al.
2017/0168954 A1 6/2017 Meyer et al.
2017/0177336 A1 6/2017 Astafev et al.
2017/0185379 A1 6/2017 Anderson et al.
2017/0200303 A1 7/2017 Havran et al.
2017/0214930 A1 7/2017 Loughry
2017/0220592 A1 8/2017 Foltz
2017/0228252 A1 8/2017 Gadelrab et al.
2017/0228342 A1 8/2017 Narayanaswami et al.
2017/0277460 A1 9/2017 Li et al.
2017/0308800 A1 10/2017 Cichon et al.
2017/0315921 A1 11/2017 Hooker et al.
2017/0315932 A1 11/2017 Moyer et al.
2017/0323042 A1 11/2017 Zhang
2017/0344822 A1 11/2017 Popescu et al.
2017/0357506 A1 12/2017 Wang et al.
2017/0357600 A1 12/2017 Moon
2017/0371790 A1 12/2017 Dwiel et al.
2018/0011790 A1 1/2018 Gaur et al.
2018/0018153 A1 1/2018 Mukai
2018/0018266 A1 1/2018 Jones, III
2018/0026651 A1 1/2018 Gopal et al.
2018/0040096 A1 2/2018 Benthin et al.
2018/0046898 A1 2/2018 Lo
2018/0046900 A1 2/2018 Dally et al.
2018/0046906 A1 2/2018 Dally et al.
2018/0052920 A1 2/2018 Klein et al.
2018/0067869 A1 3/2018 Yang et al.
2018/0107602 A1 4/2018 Dasgupta et al.
2018/0114114 A1 4/2018 Molchanov et al.
2018/0129608 A9 5/2018 Damodaran et al.
2018/0157464 A1 6/2018 Lutz et al.
2018/0165204 A1 6/2018 Venkatesh et al.
2018/0173623 A1 6/2018 Koob et al.
2018/0174353 A1 6/2018 Shin et al.
2018/0181519 A1 6/2018 Cheng
2018/0183577 A1 6/2018 Suresh et al.
2018/0189231 A1 7/2018 Fleming, Jr. et al.
2018/0189925 A1 7/2018 Lee et al.
2018/0210830 A1 7/2018 Malladi et al.
2018/0210836 A1 7/2018 Lai et al.
2018/0232846 A1 8/2018 Gruber et al.
2018/0253635 A1 9/2018 Park
2018/0276044 A1 9/2018 Fong et al.
2018/0276150 A1 9/2018 Eckert et al.
2018/0284994 A1 10/2018 Haller et al.
2018/0285261 A1 10/2018 Mandal et al.
2018/0285264 A1 10/2018 Kayiran et al.
2018/0285278 A1 10/2018 Appu et al.
2018/0286053 A1 10/2018 Labbe et al.
2018/0293173 A1 10/2018 Zhu et al.
2018/0293690 A1 10/2018 Ray et al.
2018/0293776 A1 10/2018 Ray et al.
2018/0293784 A1 10/2018 Benthin et al.
2018/0293965 A1 10/2018 Vembu et al.
2018/0295039 A1 10/2018 Yasman et al.
2018/0300105 A1 10/2018 Langhammer
2018/0300258 A1 10/2018 Wokhlu et al.
2018/0307494 A1 10/2018 Ould-Ahmed-Vall et al.
2018/0307498 A1 10/2018 Yang et al.
2018/0308201 A1 10/2018 Appu et al.
2018/0314644 A1 11/2018 Hwang et al.
2018/0315159 A1 11/2018 Ould-Ahmed-Vall et al.
2018/0315398 A1 11/2018 Kaul et al.
2018/0315399 A1 11/2018 Kaul et al.
2018/0321938 A1 11/2018 Boswell et al.
2018/0322387 A1 11/2018 Sridharan et al.
2018/0336136 A1 11/2018 Hijaz et al.
2018/0373200 A1 12/2018 Shi et al.
2018/0373635 A1 12/2018 Mukherjee et al.
2018/0373809 A1 12/2018 Ylitie et al.
2019/0035140 A1 1/2019 Fricke et al.
2019/0042193 A1 2/2019 Pasca et al.
2019/0042195 A1 2/2019 Kalsi et al.
2019/0042237 A1 2/2019 Azizi et al.
2019/0042244 A1 2/2019 Henry et al.
2019/0042457 A1 2/2019 Doshi et al.
2019/0042534 A1 2/2019 Butera et al.
2019/0042542 A1 2/2019 Narayanamoorthy et al.
2019/0042923 A1 2/2019 Janedula et al.
2019/0065051 A1 2/2019 Mills et al.
2019/0065150 A1 2/2019 Heddes et al.
2019/0065195 A1 2/2019 Pool et al.
2019/0065338 A1 2/2019 Bramley et al.
2019/0066255 A1 2/2019 Nalluri et al.
2019/0073590 A1 3/2019 Wu et al.
2019/0079767 A1 3/2019 Heinecke et al.
2019/0079768 A1 3/2019 Heinecke et al.
2019/0095223 A1 3/2019 Dubel et al.
2019/0095336 A1 3/2019 Barczak
2019/0108651 A1 4/2019 Gu et al.
2019/0114534 A1 4/2019 Teng et al.
2019/0114535 A1 4/2019 Ng et al.
2019/0121638 A1 4/2019 Knowles
2019/0121679 A1 4/2019 Wilkinson et al.
2019/0121680 A1 4/2019 Wilkinson et al.
2019/0129847 A1 5/2019 Roh
2019/0130271 A1 5/2019 Narang et al.
2019/0146800 A1 5/2019 Ould-Ahmed-Vall et al.
2019/0155768 A1 5/2019 Wilkinson et al.
2019/0163641 A1 5/2019 Cooray et al.
2019/0164050 A1 5/2019 Chen et al.
2019/0164268 A1 5/2019 Gallo et al.
2019/0179757 A1 6/2019 Walker et al.
2019/0188142 A1 6/2019 Rappoport et al.
2019/0205146 A1 7/2019 Patel et al.
2019/0205358 A1 7/2019 Diril et al.
2019/0221556 A1 7/2019 Gomes et al.
2019/0227936 A1 7/2019 Jang
2019/0251034 A1 8/2019 Bernat et al.
2019/0266217 A1 8/2019 Arakawa et al.
2019/0278593 A1 9/2019 Elango et al.
2019/0278600 A1 9/2019 Frumkin et al.
2019/0294413 A1 9/2019 Vantrease et al.

(56) References Cited

U.S. PATENT DOCUMENTS

2019/0327124 A1 10/2019 Lai et al.
2019/0347043 A1 11/2019 Hasbun et al.
2019/0361954 A1 11/2019 Page et al.
2019/0369988 A1 12/2019 Kaul et al.
2019/0370173 A1 12/2019 Boyer et al.
2019/0392287 A1 12/2019 Ovsiannikov et al.
2020/0021540 A1 1/2020 Marolia et al.
2020/0042362 A1 2/2020 Cui et al.
2020/0050830 A1 2/2020 Krueger et al.
2020/0058155 A1 2/2020 Bakalash et al.
2020/0061811 A1 2/2020 Iqbal et al.
2020/0065241 A1 2/2020 Cho et al.
2020/0073825 A1 3/2020 Zaydman
2020/0081714 A1 3/2020 Britto et al.
2020/0097409 A1 3/2020 Nathella et al.
2020/0097411 A1 3/2020 Pusdesris et al.
2020/0098725 A1 3/2020 Liff et al.
2020/0104692 A1 4/2020 Hill et al.
2020/0117463 A1 4/2020 Nassi et al.
2020/0117999 A1 4/2020 Yoon et al.
2020/0133898 A1 4/2020 Therene et al.
2020/0150926 A1 5/2020 Connor et al.
2020/0159810 A1 5/2020 Ghosh et al.
2020/0174897 A1 6/2020 McNamara et al.
2020/0175074 A1 6/2020 Li et al.
2020/0184309 A1 6/2020 Patel
2020/0201810 A1 6/2020 Felix et al.
2020/0202195 A1 6/2020 Patel
2020/0203332 A1 6/2020 Schreiber et al.
2020/0210192 A1 7/2020 Alexander et al.
2020/0211147 A1 7/2020 Doyle et al.
2020/0211253 A1 7/2020 Liktor et al.
2020/0211267 A1 7/2020 Rowley et al.
2020/0218538 A1 7/2020 Mansell
2020/0218540 A1 7/2020 Kesiraju et al.
2020/0226920 A1 7/2020 Takenaka et al.
2020/0234124 A1 7/2020 Park
2020/0242049 A1 7/2020 Loh et al.
2020/0250098 A1 8/2020 Ma et al.
2020/0272425 A1 8/2020 Latorre et al.
2020/0285592 A1 9/2020 Ambroladze et al.
2020/0311531 A1 10/2020 Liu et al.
2020/0371752 A1 11/2020 Murray et al.
2020/0380369 A1 12/2020 Case et al.
2021/0012197 A1 1/2021 Simonyan et al.
2021/0019591 A1 1/2021 Venkatesh et al.
2021/0034979 A1 2/2021 Robinson et al.
2021/0035258 A1 2/2021 Ray et al.
2021/0103550 A1 4/2021 Appu et al.
2021/0117084 A1 4/2021 Shabi et al.
2021/0117201 A1 4/2021 Gray
2021/0124579 A1 4/2021 Kaul et al.
2021/0150663 A1 5/2021 Maiyuran et al.
2021/0150770 A1 5/2021 Appu et al.
2021/0182024 A1 6/2021 Mueller et al.
2021/0182058 A1 6/2021 Kaul et al.
2021/0182140 A1 6/2021 Gruber
2021/0200680 A1 7/2021 Vogelsang et al.
2021/0211643 A1 7/2021 Gabriel et al.
2021/0216316 A1 7/2021 Bhoria et al.
2021/0224125 A1 7/2021 Liu et al.
2021/0248085 A1 8/2021 Bian et al.
2021/0312697 A1 10/2021 Maiyuran et al.
2021/0374897 A1 12/2021 Ray et al.
2022/0019431 A1 1/2022 Kaul et al.
2022/0066931 A1 3/2022 Ray et al.
2022/0066971 A1 3/2022 Brewer et al.
2022/0070115 A1 3/2022 Brewer et al.
2022/0100518 A1 3/2022 Tomei et al.
2022/0107914 A1 4/2022 Koker et al.
2022/0114096 A1 4/2022 Striramassarma
2022/0114108 A1 4/2022 Koker
2022/0121421 A1 4/2022 Appu et al.
2022/0121499 A1 4/2022 Butcher et al.
2022/0122215 A1 4/2022 Ray
2022/0129265 A1 4/2022 Appu et al.
2022/0129266 A1 4/2022 Maiyuran
2022/0129271 A1 4/2022 Appu et al.
2022/0129521 A1 4/2022 Surti
2022/0137967 A1 5/2022 Koker
2022/0138101 A1 5/2022 Appu et al.
2022/0138104 A1 5/2022 Koker
2022/0138895 A1 5/2022 Raganathan et al.
2022/0156202 A1 5/2022 Koker et al.
2022/0171710 A1 6/2022 Koker et al.
2022/0179787 A1 6/2022 Koker
2022/0180467 A1 6/2022 Koker
2022/0197664 A1 6/2022 Patterson et al.
2022/0197800 A1 6/2022 Appu
2022/0197975 A1 6/2022 Adelman et al.
2022/0237478 A1* 7/2022 Lafford .................. G06N 20/00
2022/0335563 A1 10/2022 Elzur
2022/0350751 A1 11/2022 Koker et al.
2022/0350768 A1 11/2022 Brewer et al.
2022/0357945 A1 11/2022 Kaul et al.
2022/0365901 A1 11/2022 Maiyuran et al.
2022/0382555 A1 12/2022 Ould-Ahmed-Vall et al.
2023/0014565 A1 1/2023 Ray et al.
2023/0046506 A1 2/2023 Kaul et al.
2023/0095363 A1 3/2023 Hsu et al.
2023/0185607 A1 6/2023 Gutierrez et al.
2023/0195685 A1 6/2023 Maiyuran et al.
2023/0260075 A1 8/2023 Maiyuran et al.
2023/0333981 A1 10/2023 Lee et al.
2023/0377209 A1 11/2023 Appu et al.
2023/0419585 A1 12/2023 Smith et al.
2024/0078630 A1 3/2024 Maiyuran et al.
2024/0086356 A1 3/2024 Ray et al.
2024/0111609 A1 4/2024 George et al.
2024/0243829 A1 7/2024 Wei et al.

FOREIGN PATENT DOCUMENTS

CN 101238454 8/2008
CN 100458738 C 2/2009
CN 102214160 10/2011
CN 102750127 A 10/2012
CN 104011676 8/2014
CN 104321741 A 1/2015
CN 104603748 5/2015
CN 105468542 A 4/2016
CN 105487838 A 4/2016
CN 105760135 B 7/2016
CN 106683036 A 5/2017
CN 107688745 A 2/2018
CN 108268422 A 7/2018
CN 112506567 A 3/2021
CN 111666066 B 11/2021
CN 115756384 A 3/2023
CN 119404182 A 2/2025
EP 0656592 A1 6/1995
EP 2937794 A1 10/2015
EP 2849410 B1 2/2018
EP 3382533 A1 10/2018
EP 3396533 A2 10/2018
EP 3407183 A2 11/2018
EP 3407183 A3 2/2019
EP 3958116 A1 2/2022
EP 4270201 A2 11/2023
GB 2286909 A 8/1995
GB 2296155 A 6/1996
GB 2447428 A 9/2008
GB 2455401 A 6/2009
GB 2612167 A 4/2023
JP H1185969 A 3/1999
JP 2010521729 A 6/2010
JP 2011530234 12/2011
JP 2012528377 A 11/2012
JP 2013506917 2/2013
JP 2013246598 12/2013
JP 2017506010 A 2/2017
JP 2017184250 A 10/2017
JP 2018120589 A 8/2018
JP WO2017073000 A1 11/2018

(56) References Cited

FOREIGN PATENT DOCUMENTS

| | | | |
|---|---|---|---|
| JP | 2019008444 | A | 1/2019 |
| JP | 2019036298 | A | 3/2019 |
| JP | 2019029023 | B | 3/2020 |
| JP | 2024138299 | A | 10/2024 |
| KR | 100920227 | B1 | 10/2009 |
| KR | 20120113777 | A1 | 10/2012 |
| KR | 1020120113777 | A | 10/2012 |
| KR | 1020150067316 | | 6/2015 |
| KR | 20170052432 | A | 5/2017 |
| KR | 1020170093697 | A | 8/2017 |
| KR | 20170126999 | A | 11/2017 |
| KR | 1020170126999 | A | 11/2017 |
| KR | 1020180019755 | A | 2/2018 |
| KR | 101843243 | B1 | 3/2018 |
| KR | 1020190003849 | A | 1/2019 |
| KR | 20190027367 | A | 3/2019 |
| KR | 1020170126999 | B1 | 4/2020 |
| KR | 1020190027367 | B1 | 8/2023 |
| TW | 200949691 | A | 12/2009 |
| TW | 201344564 | A | 11/2013 |
| TW | 201614997 | A | 4/2016 |
| WO | 2013095619 | A1 | 6/2013 |
| WO | 2013101018 | A1 | 7/2013 |
| WO | 2013119226 | A1 | 8/2013 |
| WO | 2016097813 | A1 | 6/2016 |
| WO | 2018125250 | A1 | 7/2018 |
| WO | 2018213636 | A1 | 11/2018 |
| WO | 2019057281 | A1 | 3/2019 |
| WO | 2020190796 | A1 | 9/2020 |
| WO | 2020190797 | A1 | 9/2020 |
| WO | 2020190798 | A1 | 9/2020 |
| WO | 2020190799 | A2 | 9/2020 |
| WO | 2020190800 | A1 | 9/2020 |
| WO | 2020190801 | A1 | 9/2020 |
| WO | 2020190802 | A1 | 9/2020 |
| WO | 2020190803 | A1 | 9/2020 |
| WO | 2020190805 | A1 | 9/2020 |
| WO | 2020190806 | A1 | 9/2020 |
| WO | 2020190807 | A1 | 9/2020 |
| WO | 2020190808 | A1 | 9/2020 |
| WO | 2020190809 | A1 | 9/2020 |
| WO | 2020190810 | A1 | 9/2020 |
| WO | 2020190811 | A1 | 9/2020 |
| WO | 2020190812 | A1 | 9/2020 |
| WO | 2020190813 | A1 | 9/2020 |
| WO | 2020190814 | A1 | 9/2020 |
| WO | 2023069384 | A1 | 4/2023 |
| WO | 2023249742 | | 12/2023 |

OTHER PUBLICATIONS

U.S. Appl. No. 17/429,873 “Notice of Allowance” mailed Sep. 7, 2023, 8 pages.
U.S. Appl. No. 17/429,873 “Final Office Action” mailed Apr. 26, 2023, 14 pages.
U.S. Appl. No. 17/430,574 “Final Office Action” mailed May 24, 2023, 9 pages.
U.S. Appl. No. 17/430,574 “Non-Final Office Action” mailed Jan. 23, 2023, 8 pages.
U.S. Appl. No. 17/430,611 “Non-Final Office Action” mailed Jun. 2, 2023, 11 pages.
U.S. Appl. No. 17/590,362 “Non-Final Office Action” mailed Jul. 10, 2023, 29 pages.
U.S. Appl. No. 17/732,308 “Non-Final Office Action” mailed Jul. 27, 2022, 10 pages.
U.S. Appl. No. 17/732,308 “Notice of Allowability” mailed Mar. 3, 2023, 2 pages.
U.S. Appl. No. 17/732,308 “Notice of Allowance” mailed Dec. 6, 2022, 5 pages.
U.S. Appl. No. 17/827,067 “Non-Final Office Action” mailed Nov. 25, 2022, 25 pages.
U.S. Appl. No. 17/827,067 “Notice of Allowance” mailed Mar. 2, 2023, 8 pages.
U.S. Appl. No. 17/834,482 “Notice of Allowance” mailed Mar. 8, 2023, 7 pages.
U.S. Appl. No. 17/839,856 “Non-Final Office Action” mailed Feb. 10, 2023, 15 pages.
U.S. Appl. No. 17/967,283 “Non-Final Office Action” mailed Aug. 18, 2023, 23 pages.
U.S. Appl. No. 17/429,291, Final Office Action, mailed Sep. 28, 2023.
U.S. Appl. No. 17/430,963 Non-Final OA mailed Sep. 28, 2023, 18 pages.
Yin Jieming, et al., “Modular Routing Design for Chiplet-Based Systems”, 2018 ACM/IEEE 45th Annual International Symposium on Computer Architecture (ISCA), IEEE, Jun. 1, 2018, pp. 726-738, XP033375532.
Young Vinson et al: “Combining HW/SW Mechanisms to Improve NUMA Performance of Multi-GPU Systems”, 2018 51st Annual IEEE/ACM International Symposium on Microarchitecture (Micro), IEEE, Oct. 20, 2018 (Oct. 20, 2018), pp. 339-351, XP033473308.
Yuan, et al., “Complexity Effective Memory Access Scheduling for Many-Core Accelerator Architectures”, 11 pages, Dec. 2009.
Zhang et al., “Fabrication cost analysis for 2D, 2.5D, and 3D IC designs,” 2011 IEEE International 3D Systems Integration Conference (3DIC), 2011 IEEE International, Osaka, Japan, 2012, pp. 1-4, doi: 10.1109/3DIC.2012.6263032.
U.S. Appl. No. 15/819,152 “Notice of Allowance” mailed Mar. 19, 2019, 5 pages.
U.S. Appl. No. 15/819,167 “Final Office Action” mailed Aug. 19, 2020, 22 pages.
U.S. Appl. No. 15/819,167 “Final Office Action” mailed Jun. 2, 2021, 20 pages.
U.S. Appl. No. 15/819,167 “Final Office Action” mailed Oct. 1, 2018, 17 pages.
U.S. Appl. No. 15/819,167 “Final Office Action” mailed Oct. 18, 2019, 17 pages.
U.S. Appl. No. 15/819,167 “Non-Final Office Action” mailed Dec. 14, 2021, 20 pages.
U.S. Appl. No. 15/819,167 “Non-Final Office Action” mailed Jan. 26, 2021, 19 pages.
U.S. Appl. No. 15/819,167 “Non-Final Office Action” mailed Mar. 1, 2018, 12 pages.
U.S. Appl. No. 15/819,167 “Non-Final Office Action” mailed Mar. 31, 2020, 19 pages.
U.S. Appl. No. 15/819,167 “Non-Final Office Action” mailed May 2, 2019, 15 pages.
U.S. Appl. No. 15/819,167 “Notice of Allowability” mailed Jul. 7, 2022, 4 pages.
U.S. Appl. No. 15/819,167 “Notice of Allowance” mailed Apr. 12, 2022, 7 pages.
U.S. Appl. No. 16/227,645 “Final Office Action” mailed Jul. 9, 2021, 23 pages.
U.S. Appl. No. 16/227,645 “Final Office Action” mailed Sep. 8, 2020, 20 pages.
U.S. Appl. No. 16/227,645 “Non-Final Office Action” mailed Apr. 8, 2020, 19 pages.
U.S. Appl. No. 16/227,645 “Non-Final Office Action” mailed Dec. 17, 2021, 23 pages.
U.S. Appl. No. 16/227,645 “Non-Final Office Action” mailed Feb. 22, 2021, 23 pages.
U.S. Appl. No. 16/227,645 “Notice of Allowability” mailed Aug. 4, 2022, 2 pages.
U.S. Appl. No. 16/227,645 “Notice of Allowance” mailed May 25, 2022, 7 pages.
U.S. Appl. No. 16/432,402 “Final Office Action” mailed Feb. 19, 2021, 9 pages.
U.S. Appl. No. 16/432,402 “Non-Final Office Action” mailed Jul. 10, 2020, 17 pages.
U.S. Appl. No. 16/432,402 “Notice of Allowance” mailed Jun. 23, 2021, 5 pages.
U.S. Appl. No. 17/064,427 “Final Office Action” mailed Jan. 21, 2021, 13 pages.
U.S. Appl. No. 17/064,427 “Non-Final Office Action” mailed Dec. 7, 2020, 11 pages.

(56) References Cited

OTHER PUBLICATIONS

U.S. Appl. No. 17/064,427 "Notice of Allowability" mailed Jun. 10, 2021, 2 pages.
U.S. Appl. No. 17/064,427 "Notice of Allowance" mailed May 12, 2021, 7 pages.
U.S. Appl. No. 17/095,544 "Notice of Allowability" mailed Feb. 10, 2023, 2 pages.
U.S. Appl. No. 17/095,544 "Notice of Allowance" mailed Jan. 31, 2023, 10 pages.
U.S. Appl. No. 17/095,590 "Restriction Requirement" mailed Feb. 9, 2023, 5 pages.
U.S. Appl. No. 17/122,905 "Final Office Action" mailed Apr. 1, 2022, 29 pages.
U.S. Appl. No. 17/122,905 "Final Office Action" mailed Dec. 27, 2022, 23 pages.
U.S. Appl. No. 17/122,905 "Final Office Action" mailed May 11, 2021, 23 pages.
U.S. Appl. No. 17/122,905 "Non-Final Office Action" mailed Aug. 30, 2022, 26 pages.
U.S. Appl. No. 17/122,905 "Non-Final Office Action" mailed Feb. 17, 2021, 20 pages.
U.S. Appl. No. 17/122,905 "Non-Final Office Action" mailed Nov. 16, 2021, 23 pages.
U.S. Appl. No. 17/169,232 "Notice of Allowability" mailed Jun. 14, 2021, 3 pages.
U.S. Appl. No. 17/169,232 "Notice of Allowance" mailed Apr. 7, 2021, 8 pages.
U.S. Appl. No. 17/303,654 "Non-Final Office Action" mailed Oct. 31, 2022, 15 pages.
U.S. Appl. No. 17/303,654 "Notice of Allowability" mailed Feb. 27, 2023, 2 pages.
U.S. Appl. No. 17/303,654 "Notice of Allowance" mailed Feb. 14, 2023, 8 pages.
U.S. Appl. No. 17/304,092 "Non-Final Office Action" mailed Oct. 28, 2021, 17 pages.
U.S. Appl. No. 17/304,092 "Notice of Allowability" mailed Apr. 20, 2022, 3 pages.
U.S. Appl. No. 17/304,092 "Notice of Allowability" mailed Feb. 28, 2022, 2 pages.
U.S. Appl. No. 17/304,092 "Notice of Allowance" mailed Feb. 11, 2022, 9 pages.
U.S. Appl. No. 17/305,355 "Non-Final Office Action" mailed Nov. 5, 2021, 28 pages.
U.S. Appl. No. 17/305,355 "Notice of Allowability" mailed May 4, 2022, 2 pages.
U.S. Appl. No. 17/305,355 "Notice of Allowance" mailed Feb. 23, 2022, 7 pages.
U.S. Appl. No. 17/428,527 "Non-Final Office Action" mailed Mar. 30, 2023, 20 pages.
U.S. Appl. No. 17/428,539 "Non-Final Office Action" mailed Jan. 5, 2023, 14 pages.
U.S. Appl. No. 17/429,277 "Notice of Allowance" mailed Oct. 31, 2023, 11 pages.
Nvidia: "Nvidia Tesla P100 Nvidia Tesla P100 Whitepaper", Jun. 21, 2016, pp. 1-45, downloaded frorn https://images.nvidia.corn/content/pdf/tesla/whitepaper/pascal-architecture-white paper.pdf.
Office Action and Search Report for Taiwan Patent Application No. 108141986 mailed Mar. 4, 2022, 24 pages (including translation).
Office Action for U.S. Appl. No. 17/430,611 mailed Jun. 2, 2023, 10 pages.
Office Action for CN 202110214543.3, 12 pages, no translation available.
Office Action for CN202110250102.9, mailed Apr. 16, 2024, 13 pages.
Office Action for CN202110906984, 6 pages, Nov. 21, 2023.
Office Action for JP 2021-547450, mailed Jun. 6, 2023, 15 pages.
Office Action for TW Application No. 112124508, mailed Aug. 22, 2023, 4 pages.
Office Action for U.S. Appl. No. 18/312,079, mailed Jun. 3, 2024, 9 pages.
Office Action for U.S. Appl. No. 17/428,216, mailed Jan. 1, 2024, 29 pages.
Office Action for U.S. Appl. No. 17/095,590, mailed Jul. 28, 2023, 23 pages.
Office Action for U.S. Appl. No. 17/122,905, mailed Apr. 25, 2023, 24 pages.
Office Action for U.S. Appl. No. 17/428,216, mailed Jul. 7, 2023, 21 pages.
Office Action for U.S. Appl. No. 17/428,233 mailed Apr. 11, 2024, 16 pages.
Office Action for U.S. Appl. No. 17/428,523, mailed Aug. 3, 2023, 12 pages.
Office Action for U.S. Appl. No. 17/428,530, mailed Nov. 14, 2023, 7 pages.
Office Action for U.S. Appl. No. 17/428,530, mailed Mar. 19, 2024, 8 pages.
Office Action for U.S. Appl. No. 17/428,534, mailed Jul. 17, 2023, 20 pages.
Office Action for U.S. Appl. No. 17/849,201, mailed Jun. 1, 2023, 6 pages.
Office Action for U.S. Appl. No. 17/862,739 mailed Sep. 21, 2023, 19 pages.
Office Action for U.S. Appl. No. 17/862,739, mailed Feb. 28, 2024, 21 pages.
Office Action for U.S. Appl. No. 17/961,833, mailed Apr. 18, 2024, 10 pages.
Office Action for U.S. Appl. No. 18/491,474, mailed Aug. 21, 2024, 7 pages.
Office Action for U.S. Appl. No. 17/428,529, mailed Jun. 7, 2023, 18 pages.
Office Action from DE Application No. 112020003700.2, mailed Mar. 16, 2023, 18 pages (no translation included).
Office Action, "Translation of Notice" for TW Application No. 111130374, mailed Mar. 9, 2023, 5 pages.
Ogg, et al., "Improved Data Compression for Serial Interconnected Network on Chip through Unused Significant Bit Removal", VLSO Design, 2006. Held jointly with 5th International Conference on Embedded Systems and Design. 19th International Conference on, Piscataway, NJ, USA, IEEE Jan. 3, 2006, pp. 525-529, XP010883136. ISBN: 978-0-7695-2502-0.
Olivares-Amaya et al. "Accelerating Correlated Quantum Chemistry Calculations Using Graphical Processing Units and a Mixed Precision Matrix Multipication Library" Journal of Chemical Theory and Computation, vol. 6, No. 1, Oct. 13, 2009, pp. 135-144, American Chemical Society.
Pearson Carl et al: "NUMA-Aware Data-Transfer Measurements for Power/NVLink Multi-GPU Systems", Jan. 25, 2019 (Jan. 25, 2019), Robocup 2008: Robot Soccer World Cup XII; pp. 448-454, XP047501461, ISBN: 978-3-319-10403-4 [retrieved on Jan. 25, 2019] p. 452, line 14—p. 453, line 6.
Publication Notification for CN202311810112.9, Mar. 26, 2024, 3 pages.
Publication of TW Application No. 113103959 (Pub No. 202420066), May 16, 2024, 3 pages.
Ross et al., "Intel Processor Graphics: Architecture & Programming," Power Point Presentation, Aug. 2015, 78 pages, Intel Corporation, Santa Clara, CA, USA.
Shane Cook, "Cuda Programming", Book, 2013, pp. 37-52, Chapter 3, Elsevier Inc., Amsterdam Netherlands.
Stephen Junkins, "The Compute Architecture of Intel Processor Graphics Gen9", paper, Aug. 14, 2015, 22 pages, Version 1.0, Intel Corporation, Santa Clara, CA.
Sze, V. et al., "Efficient Processing of Deep Neural Networks: A Tutorial and Survey", 31 pages, Mar. 27, 2017.
Tawain IPO Search Report for TW Application No. 111130374 mailed Mar. 9, 2023 1 page.
Temam O et al: "Software assistance for data caches", High-Performance Computer Architecture, 1995. Proceedings., First IEEE Symposium on Raleigh, NC, USA Jan. 22-25, 1995, Los Alamitos, CA, USA.IEEE Comput. Soc, Jan. 22, 1995 (Jan. 22, 1995), pp. 154-163, XP010130123.
Tong Chen et al: "Prefetching irregular references for software cache on cell", Sixth Annual IEEE/ACM International Symposium

(56) References Cited

OTHER PUBLICATIONS on Code Generation and 1Optimization (CGO 08). Boston, MA, USA, Apr. 5-9, 2008, New York, NY: ACM, 2 Penn Plaza, Suite 701 New York NY 10121-0701 USA, Apr. 6, 2008 (Apr. 6, 2008), pp. 155-164, XP058192632.
U.S. Appl. No. 17/674,703 Non-Final Office Action mailed Jul. 14, 2023, 23 pages.
U.S. Appl. No. 15/494,773 "Final Office Action" mailed Oct. 12, 2018, 18 pages.
U.S. Appl. No. 15/494,773 "Non-Final Office Action" mailed Apr. 18, 2018, 14 pages.
U.S. Appl. No. 15/494,773 "Notice of Allowability" mailed Jul. 31, 2019, 2 pages.
U.S. Appl. No. 15/494,773 "Notice of Allowance" mailed Jun. 19, 2019, 8 pages.
U.S. Appl. No. 15/787,129 "Non-Final Office Action" mailed Aug. 27, 2018, 9 pages.
U.S. Appl. No. 15/787,129 "Non-Final Office Action" mailed Mar. 7, 2019, 10 pages.
U.S. Appl. No. 15/787,129 "Notice of Allowance" mailed Jul. 10, 2019, 8 pages.
U.S. Appl. No. 15/819,152 "Final Office Action" mailed Nov. 19, 2018, 9 pages.
U.S. Appl. No. 15/819,152 "Non-Final Office Action" mailed Feb. 28, 2018, 7 pages.
U.S. Appl. No. 15/819,152 "Notice of Allowability" mailed Apr. 11, 2019, 2 pages.
International Patent Application No. PCT/US20/22843 "International Preliminary Report on Patentability" issued Sep. 16, 2021, 7 pages.
International Patent Application No. PCT/US20/22843 "International Search Report and Written Opinion" mailed Jul. 28, 2020, 13 pages.
International Patent Application No. PCT/US20/22844 "International Preliminary Report on Patentability" issued Sep. 16, 2021, 10 pages.
International Patent Application No. PCT/US20/22844 "International Search Report and Written Opinion" mailed Jul. 2, 2020, 13 pages.
International Patent Application No. PCT/US20/22845 "International Preliminary Report on Patentability" issued Sep. 16, 2021, 10 pages.
International Patent Application No. PCT/US20/22845 "International Search Report and Written Opinion" mailed Jun. 30, 2020, 13 pages.
International Patent Application No. PCT/US20/22846 "International Preliminary Report on Patentability" issued Sep. 16, 2021, 12 pages.
International Patent Application No. PCT/US20/22846 "International Search Report and Written Opinion" mailed Aug. 31, 2020, 16 pages.
International Patent Application No. PCT/US20/22847 "International Preliminary Report on Patentability" issued Sep. 16, 2021, 6 pages.
International Patent Application No. PCT/US20/22847 "International Search Report and Written Opinion" mailed Jul. 6, 2020, 8 pages.
International Patent Application No. PCT/US20/22848 "International Preliminary Report on Patentability" issued Sep. 16, 2021, 9 pages.
International Patent Application No. PCT/US20/22848 "International Search Report and Written Opinion" mailed Jul. 3, 2020, 12 pages.
International Patent Application No. PCT/US20/22849 "International Preliminary Report on Patentability" issued Sep. 16, 2021, 6 pages.
International Patent Application No. PCT/US20/22849 "International Search Report and Written Opinion" mailed Jul. 8, 2020, 9 pages.
International Patent Application No. PCT/US20/22850 "International Preliminary Report on Patentability" issued Sep. 16, 2021, 7 pages.
International Patent Application No. PCT/US20/22850 "International Search Report and Written Opinion" mailed Jul. 21, 2020, 9 pages.
International Patent Application No. PCT/US20/22851 "International Preliminary Report on Patentability" issued Sep. 16, 2021, 7 pages.
International Patent Application No. PCT/US20/22851 "International Search Report and Written Opinion" mailed Jun. 29, 2020, 10 pages.
International Patent Application No. PCT/US20/22852 "International Preliminary Report on Patentability" issued Sep. 16, 2021, 6 pages.
International Patent Application No. PCT/US20/22852 "International Search Report and Written Opinion" mailed Jul. 21, 2020, 9 pages.
Janzen Johan et al: "Partitioning GPUs for Improved Scalability", 2016 28th International Symposium on Computer Architecture and High Performance Computing (SBAC-PAD), IEEE, Oct. 26, 2016 (Oct. 26, 2016), pp. 42-49, XP033028008.
JP Application No. 2021-544279 Decision to Grant and Documents Citing Families of 2021-544279 mailed May 29, 2024.
Kaseridis Dimitris, et al., "Minimalist open-page: A DRAM page-mode scheduling polidy for the many-core era", 2011 44th Annual IEEE/ACM International Symposium on Michoarechtecture ACM, Dec. 3, 2011, p. 24-35, XP033064864.
Korean Office Action for KR2021-7025888, mailed Jul. 29, 2024, 7 pages, No translation available at this time.
Li Bingchao et al: "Elastic-Cache: GPU Cache Architecture for Efficient Fine- and Coarse-Grained Cache-Line Management", 2017 IEEE International Parallel and Distributed Processing Symposium (IPDPS), IEEE, May 29, 2017 (May 29, 2017), pp. 82-91, XP033113921.
Luo Cheng et al, "An Efficient Task Partitioning and Scheduling Method for Symmetric Multiple GPU Architecture", 2013 12th IEEE International Conference on Trust, Security and Privacy in Computing and Communications, IEEE, Jul. 16, 2013 (Jul. 16, 2013), p. 1133-1142, XP032529503.
Macri, J., "AMD's Next Generation GPU and High Bandwidth Memory Architecture: FURY", 26 pages, Aug. 2015.
Mark Harris: "Mixed-Precision Programming 1-5 with CUDA 8", Oct. 19, 2016, XP055509917, 11 pages.
Meng, J. et al. Dynamic wrap subdivision for integrated branch and memory divergence tolerance. ACM SIGARCH Computer Architecture News, Jun. 2010 [online], [retrieved on Feb. 16, 2021]. Retrieved from the internet.
Nicholas Wilt, "The CUDA Handbook: A Comprehensive Guide to GPU Programming," Book, Jun. 22, 2013, pp. 41-57, Addison-Wesley Professional, Boston, MA, USA.
Non-Final OA Issued in U.S. Appl. No. 17/429,277 mailed Jul. 7, 2023, 9 pages.
Non-Final Office Action in U.S. Appl. No. 17/429,291, mailed May 22, 2023, 20 pages.
Notice for Eligibility of Grant for SG Application No. 11202107290Q, 4 pages, Mar. 5, 2024.
Notice of Allowance for CN202011533036.8, 8 pages, Jun. 24, 2024.
Notice of Allowance for CN202110250102.9, Jun. 20, 2024, 7 pages.
Notice of Allowance for JP Application No. 2021-547288, 4 pages, Apr. 25, 2024.
Notice of Allowance for TW 109139554, Mar. 11, 2024, 3 pages.
Notice of Allowance for U.S. Appl. No. 17/310,540, mailed Nov. 21, 2023, 8 pages.
Notice of Allowance for U.S. Appl. No. 17/428,527, mailed Jan. 26, 2024, 10 pages.
Notice of Allowance for U.S. Appl. No. 17/590,362 mailed Apr. 3, 2024, 12 pages.
Notice of Allowance for U.S. Appl. No. 17/849,201), mailed Oct. 2, 2023, 9 pages.

(56) References Cited

OTHER PUBLICATIONS

Notice of Allowance in U.S. Appl. No. 17/431,034 mailed May 16, 2024, 10 pages.
Notice of Allowance issued in U.S. Appl. No. 17/429,873, mailed Jan. 11, 2024, 16 pages.
Notice of Publication for CN202410567634.9, mailed Aug. 1, 2024, 3 pages.
Notice of Reasons for Refusal in JP Application No. 2021-544544, Mailed Oct. 31, 2023, 4 pages.
Notice of Reasons for Refusal issued in JP Application No. 2021-544279, mailed Feb. 27, 2024, 7 pages including translation.
Notification of Grant of Taiwan Patent Application No. 107105949 mailed Apr. 14, 2022, 43 pages.
Notification of Issued Patent for TW Application No. 112124508 mailed Mar. 5, 2024, 54 pages.
Notification of Publication for TW113103959, mailed May 20, 2024, 3 pages.
Notification of Publication of CN202311777921.4, 3 pages, Mar. 12, 2024.
Notice of Allowance for U.S. Appl. No. 17/430,963, mailed Oct. 23, 2024, 10 pages.
Final Office Action in U.S. Appl. No. 17/430,041 mailed Jan. 6, 2025, 21 pages.
Japanese Application No. 2023-0223711 Decision to Grant mailed Jan. 7, 2025.
Decision to Grant EP Application No. 20718903.6, mailed Sep. 12, 2024, 3 pages.
Non-Final Office Action issued in U.S. Appl. No. 17/430,611, mailed Sep. 11, 2024, 11 pages.
Notice of Allowance and Notice of References Cited issued in U.S. Appl. No. 18/415,052, mailed Sep. 6, 2024, 9 pages.
Notice of Allowance for JP Application No. 2020-189645, dispatched Sep. 3, 2024, 4 pages.
Notice of Allowance for U.S. Appl. No. 17/428,529, mailed Aug. 28, 2024, 9 pages.
Notice of Allowance for U.S. Appl. No. 18/532,245, mailed Sep. 17, 2024, 8 pages.
Office Action from KR Application No. 2021-07025864, mailed Jul. 29, 2024, 20 pages.
Certificate of Grant for AU Application No. 2020241262, 2 pages, granted on Apr. 24, 2025.
EP Intention to Grant for EP 20718909.3, Feb. 18, 2025, 5 pages.
Final Office Action in U.S. Appl. No. 18/647,549 mailed Apr. 30, 2025, 7 pages.
Non-Final Office Action issued in U.S. Appl. No. 17/430,611, mailed May 2, 2025, 17 pages.
Notice of Allowance for U.S. Appl. No. 18/432,859, mailed Mar. 5, 2025, 11 pages.
Notice of Allowance for CN Application No. 202110214543.3, mailed Feb. 21, 2025, 5 pages.
Notice of Allowance for Korean Application No. 9-5-2025-038947914 mailed Apr. 22, 2025, 4 pages.
Office Action for KR Application No. 10-2021-7025888, Apr. 22, 2025, 8 pages.
Office Action for U.S. Appl. No. 18/305,904 Mar. 28, 2025, 25 pages.
Office Action for U.S. Appl. No. 18/312,079 mailed Mar. 17, 2025, 15 pages.
Office Action for U.S. Appl. No. 18/490,593, Mar. 24, 2025, 25 pages.
Park, et al., "CNN Deep Learning Acceleration Algorithm for Mobile," Journal of KIIT. vol. 16, No. 10, pp. 1-9, pISSN 1598-8619 (released on Oct. 31, 2019).
Decision to Grant Application No. JP-2024-006026, Jun. 26, 2025, 4 pages.
Gabriel Mounce et al., "Chiplet Based Approach for Heterogeneous Processing and Packaging Architectures," 2019, IEEE, pp. 1-12. (Year: 2019).
Non-Final Office Action in U.S. Appl. No. 18/779,461, mailed Jun. 12, 2025, 9 pages.
Non-Final Office Action in U.S. Appl. No. 18/626,775, mailed May 20, 2025, 26 pages.
Notice of Allowance for Application No. 113103959 Jun. 23, 2025, 3 pages.
Notice of Allowance for CN Application No. 201810394160.7, mailed Jun. 18, 2025, 6 pages.
Notice of Allowance for Indonesian Patent Application No. P-00202105790, mailed Jun. 12, 2025, 5 pages.
Notice of Publication for EP Application No. 25174786.1 mailed May 21, 2025, Publication No. 4571498 (Jun. 18, 2025), 2 pages.
Notification of Publication for CN Application No. 202510085541.7 mailed May 21, 2025, 3 pages.
Office Action for U.S. Appl. No. 18/915,492 mailed Jun. 4, 2025, 14 pages.
Search Report for Malaysian Patent No. PI 2021003764, 6 pages, May 28, 2025.
TW Search Report for Application No. 113103959 Jun. 23, 2025, 2 pages.
U.S. Appl. No. 17/430,041 Non-Final Office Action mailed Jun. 13, 2025, 27 pages.
U.S. Appl. No. 18/305,904, filed Apr. 24, 2023, Subramaniam M. Maiyuran.
U.S. Appl. No. 18/310,688, filed May 2, 2023, Joydeep Ray.
U.S. Appl. No. 18/322,194, filed May 23, 2023, Abhishek R. Appu.
U.S. Appl. No. 18/415,052, filed Jan. 17, 2024, Altug Koker.
U.S. Appl. No. 18/491,474, filed Oct. 20, 2023, Joydeep Ray.
U.S. Appl. No. 62/819,337, filed Mar. 15, 2019, Abhishek R. Appu.
U.S. Appl. No. 62/819,361, filed Mar. 15, 2019, Subramaniam M. Maiyuran.
U.S. Appl. No. 62/819,435, filed Mar. 15, 2019, Lakshminarayanan Striramassarma.
U.S. Appl. No. 62/935,670, filed Nov. 15, 2019, Abhishek R. Appu.
Non-Final Office Action for U.S. Appl. No. 17/430,041 mailed Jun. 7, 2024, 14 pages.
Amd, "Graphics Core Next Architecture, Generation 3", Aug. 2016. (Year: 2016).
Anonymous: "bfloat16 floating-point format", retrieved from wikipedia on May 26, 2020, Aug. 24, 2018, 5 pages.
Article 94(3) Communication for EP 23181292.6 mailed Jun. 25, 2024, 5 pages.
Balkesen et al., "Rapid: In-Memory Analytical Query Processing Engine with Extreme Performance per Watt," SIGMOD'18, Jun. 10-15, 2018, Industry 4: Graph databases & Query Processing on Modern Hardware, pp. 1407-1419. (Year: 2018).
Brunie, "Mixed-precision Fused Multiply and Add", https://ens-lyon.hal.science/ensl-00642157, Nov. 17, 2011, 7 pages.
Communication pursuant to Article 94(3) EPC for EP Application 20718900.2, mailed Apr. 10, 2024, 6 pages.
Communication pursuant to Article 94(3) for EP 22 198 615.1, 5 pages.
Communication pursuant to Article 94(3) for EP20718907.7, mailed Feb. 5, 2024, 6 pages.
Communication pursuant to Article 94(3) for EP22210195, mailed Oct. 4, 2023, 7 pages.
Cui Xuewen et al: Directive-Based Partitioning and Pipelining for Graphics Processing Units11 , 2017 IEEE International Parallel and Distributed Processing Symposium (IPDPS), IEEE, May 29, 2017 (May 29, 2017), pp. 575-584, XP033113969.
Decision on Allowance for Taiwan Application No. 110127153, 1 page, mailed Oct. 27, 2022.
Decision to Grant for CN Application No. 202110224132.2, mailed Jan. 5, 2024, 7 pages.
Decision to Grant for JP Application No. 2022-104265, Dec. 5, 2023, 2 pages.
Eriko Nurvitadhi et al: "Can FPGAs Beat GPUs in Accelerating Next-Generation Deep Neural Networks?" Proceedings of the 2017 ACM/SIGDA International Symposium on 1Field-Programmable Gate Arrays, FPGA 17, Feb. 22, 2017, pp. 5-14, XP055542383.
Extended European Search Report for EP Application No. 23197619.2, Jan. 5, 2024, 12 pages.
Final OA for U.S. Appl. No. 17/115,989, mailed Mar. 25, 2024, 20 pages.
Final OA for U.S. Appl. No. 17/590,362, Dec. 4, 2023, 30 pages.

(56) References Cited

OTHER PUBLICATIONS

Final Office Action for U.S. Appl. No. 17/428,529, mailed Oct. 20, 2023, 20 pages.
Final Office Action for U.S. Appl. No. 17/430,611 mailed Oct. 26, 2023, 11 pages.
Final Office Action for U.S. Appl. No. 17/674,703, mailed Dec. 13, 2023, 26 pages.
Final Office Action U.S. Appl. No. 17/430,963 mailed Apr. 19, 2024, 12 pages.
Goodfellow et al., "Adaptive Computation and Machine Learning Series," Book, Nov. 18, 2016, pp. 98-165, Chapter 5, The MIT Press, Cambridge, MA, USA.
Grant Notification for CN Application No. 202110256528.5, May 6, 2024, 9 pages.
Grant Notification for CN Application No. 2021109069843X, mailed Apr. 10, 2024, 9 pages.
Heo et al., "BOSS: Bandwidth-Optimized Search Accelerator for Storage-Class Memory," 2021 ACM/IEEE 48th Annual International Symposium on Computer Architecture (ISCA), pp. 279-291, (Year: 2021).
Herrera, A., "Nvidia Grid: Graphics Accelerated VDI with the Visual Performance of a Workstation", 18 pages, May 2014.
Intent to Grant for EP Application No. 22210195.8, mailed Mar. 28, 2024, 5 pages.
Intention to Grant EP 21192702.5, mailed Apr. 2, 2024, 5 pages.
Intention to Grant EP Application No. 20718903.6, May 7, 2024, 5 pages.
International Patent Application No. PCT/US20/022840 "International Preliminary Report on Patentability" issued Sep. 16, 2021, 9 pages.
International Patent Application No. PCT/US20/22833 "International Preliminary Report on Patentability" issued Sep. 16, 2021, 6 pages.
International Patent Application No. PCT/US20/22833 "International Search Report and Written Opinion" mailed Jul. 8, 2020, 8 pages.
International Patent Application No. PCT/US20/22835 "International Preliminary Report on Patentability" issued Sep. 16, 2021, 7 pages.
International Patent Application No. PCT/US20/22835 "International Search Report and Written Opinion" mailed Jun. 10, 2020, 10 pages.
International Patent Application No. PCT/US20/22836 "International Preliminary Report on Patentability" issued Sep. 16, 2021, 8 pages.
International Patent Application No. PCT/US20/22836 "International Search Report and Written Opinion" mailed Jun. 26, 2020, 11 pages.
International Patent Application No. PCT/US20/22837 "International Preliminary Report on Patentability" issued Sep. 16, 2021, 9 pages.
International Patent Application No. PCT/US20/22837 "International Search Report and Written Opinion" mailed Sep. 15, 2020, 14 pages.
International Patent Application No. PCT/US20/22838 "International Preliminary Report on Patentability" issued Sep. 16, 2021, 8 pages.
International Patent Application No. PCT/US20/22838 "International Search Report and Written Opinion" mailed Jul. 6, 2020, 11 pages.
International Patent Application No. PCT/US20/22839 "International Preliminary Report on Patentability" issued Sep. 16, 2021, 6 pages.
International Patent Application No. PCT/US20/22839 "International Search Report and Written Opinion" mailed Jul. 8, 2020, 8 pages.
International Patent Application No. PCT/US20/22840 "International Search Report and Written Opinion" mailed Jul. 3, 2020, 11 pages.
International Patent Application No. PCT/US20/22841 "International Preliminary Report on Patentability" issued Sep. 16, 2021, 7 pages.
International Patent Application No. PCT/US20/22841 "International Search Report and Written Opinion" mailed Jun. 7, 2020, 10 pages.
Intention to Grant Vietnam Application No. 1-2021-04685, Nov. 7, 2025, 4 pages.
Notice of Allowance for Malaysian Application No. PI 2021003764, Nov. 21, 2025, 2 pages.
Office Action for U.S. Appl. No. 18/516,716 Sep. 17, 2025, 24 pages.
U.S. Appl. No. 17/430,611 Notice of Allowance, mailed Oct. 20, 205, 9 pages.
U.S. Appl. No. 18/779,461 Final Office Action mailed Oct. 1, 2025, 13 pages.
U.S. Appl. No. 17/430,041, Final Office Action mailed Nov. 21, 2025, 20 pages.
U.S. Appl. No. 18/906,428 Non-Final Office Action mailed Nov. 18, 2025, 22 pages.
U.S. Appl. No. 18/620,284 Non-Final Office Action mailed Feb. 18, 2026, 8 pages.
U.S. Appl. No. 18/967,172 Non-Final Office Action mailed Feb. 5, 2026, 14 pages.
Decision on Rejection in CN Application 202210586709.9, mailed Jan. 20, 2026, 14 pages.
U.S. Appl. No. 18/779,461 Non-Final Office Action mailed Jan. 15, 2026, 14 pages.
U.S. Appl. No. 18/948,174 Non-Final Office Action mailed Dec. 29, 2025, 13 pages.
U.S. Appl. No. 18/958,930 Non-Final Office Action mailed Jan. 5, 2026, 16 pages.
Anonymous: "Condition number—Wikipedia", , Mar. 5, 2017 (Mar. 5, 2017), pp. 1-6, XP093007673, Retrieved from the Internet: URL:https://en.wikipedia.org/w/index.php? title=Condition_number &oldid=768724690 [retrieved on Dec. 13, 2022].
Communication pursuant to Article 94(3) for EP Application No. 22 198 967.6, Nov. 19, 2025, 7 pages.
Decision to Grant in JP Application No. 2024-102405 mailed Jan. 6, 2026 (translation included).
EP Application No. 22 157 673.9 Intention to Grant, mailed Jan. 7, 2026, 8 pages.
Hearing Notice in Reference of Indian Application No. 202147030668, mailed Dec. 3, 2025, 3 pages.
Ichitaro Yamazaki et al: "Stability and Performance of Various Singular Value QR Implementations on Multicore CPU with a GPU", vol. 43, No. 2, Sep. 2, 2016 (Sep. 2, 2016), pp. 1-18, XP058275284, ISSN: 0098-3500, DOI: 10.1145/2898347.
Notice of Allowance for KR Application No. 2021-7025888 mailed Dec. 19, 2025, 9 pages.
Notice of Preliminary Rejection for Korean Application No. 10-2020-0151787 mailed Nov. 26, 2025, 7 pages.
Notice of Preliminary Rejection for Korean Application No. 10-2020-0151794 mailed Nov. 26, 2025, 6 pages.
Office Action for U.S. Appl. No. 18/901,027, mailed Mar. 27, 2026, 32 pages.
Office Action for U.S. Appl. No. 18/906,859, mailed Mar. 26, 2026, 31 pages.
Notice of Allowance for U.S. Appl. No. 18/626,775, mailed Mar. 19, 2026.
Communication pursuant to Article 94(3) for EP Application No. 25174786.1, Aug. 22, 2025, 5 pages.
European Search Report for EP25174786 mailed Aug. 8, 2025, 5 pages.
Interational Application No. CN202210586709.9, First Examination Opinion Notice, mailed Jul. 10, 2025, 13 pgs.
IPSJ SIG Technical Report, High-Performance Computing (HPC), 2018-HPC-164, 4, p. 1-6, Apr. 30, 2018, ISSN,2188-8841.
Korean Office Action for Application No. KR 10-2021-7025943 mailed Aug. 7, 2025, 6 pages.
Notice of Reasons of Refusal issued in JP Application No. 2024-102405, mailed Jun. 13, 2025, 5 pages.

(56) References Cited

OTHER PUBLICATIONS

EP Communication pursuant to Article 94(3) EPC in EP Application No. 22 198 615.1 mailed Jul. 25, 2025, 9 pages.
Korean Intellectual Property Office Notice of Allowance in KR Application No. 10-2023-7036986, mailed Aug. 28, 2025.
U.S. Appl. No. 18/948,174, Non-Final Office Action mailed Jun. 17, 2026, 17 pages.
Application No. BR112021016111-2, Search Report, Technical Examination Report and Notice of Allowance mailed Apr. 20, 2026, 5 pages.
Decision to Grant EP Application No. 22157673.9, Patent No. EP 4024223, published date Jun. 3, 2026, mailed May 8, 2026, 4 pages.
EP 22198615.1 Intention to Grant, mailed Jun. 1, 2026, 8 pages.
Ichitaro Yamazaki, "Stability and Performance of Various Singular Value QR Implementations on Multicore CPU with a GPU", ACM Transactions on Mathematical Software, vol. 43, No. 2, Article 10, Publication date: Sep. 2016, 18 pages.
Office Action for CN Application No. 202210949334.8 mailed May 14, 2026, 7 pages.
Final Office Action issued in U.S. Appl. No. 18/620,284 mailed Jun. 5, 2026, 9 pages.
Office action for U.S. Appl. No. 18/791,963 mailed Apr. 15, 2026, 30 pages.
U.S. Appl. No. 18/958,930 Final Office Action mailed May 8, 2026, 10 pages.
Notice of Allowance for KR Application No. 2021-7025943 mailed Jun. 19, 2026, 7 pages.

* cited by examiner

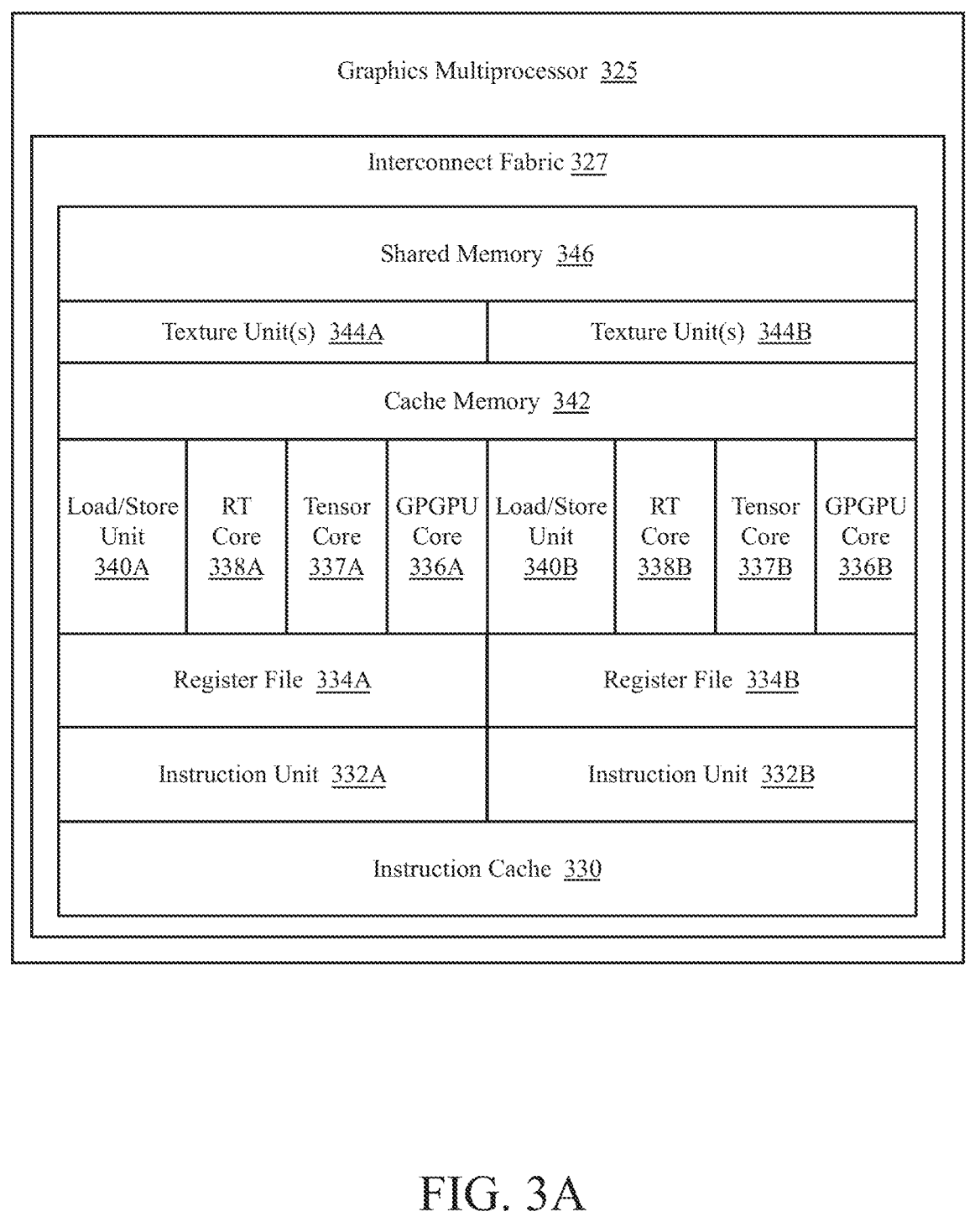

Graphics Multiprocessor 325
Interconnect Fabric 327
Shared Memory 346
Texture Unit(s) 344A
Texture Unit(s) 344B
Cache Memory 342
Load/Store Unit 340A
RT Core 338A
Tensor Core 337A
GPGPU Core 336A
Load/Store Unit 340B
RT Core 338B
Tensor Core 337B
GPGPU Core 336B
Register File 334A
Register File 334B
Instruction Unit 332A
Instruction Unit 332B
Instruction Cache 330

FIG. 3A

Figure 3B:
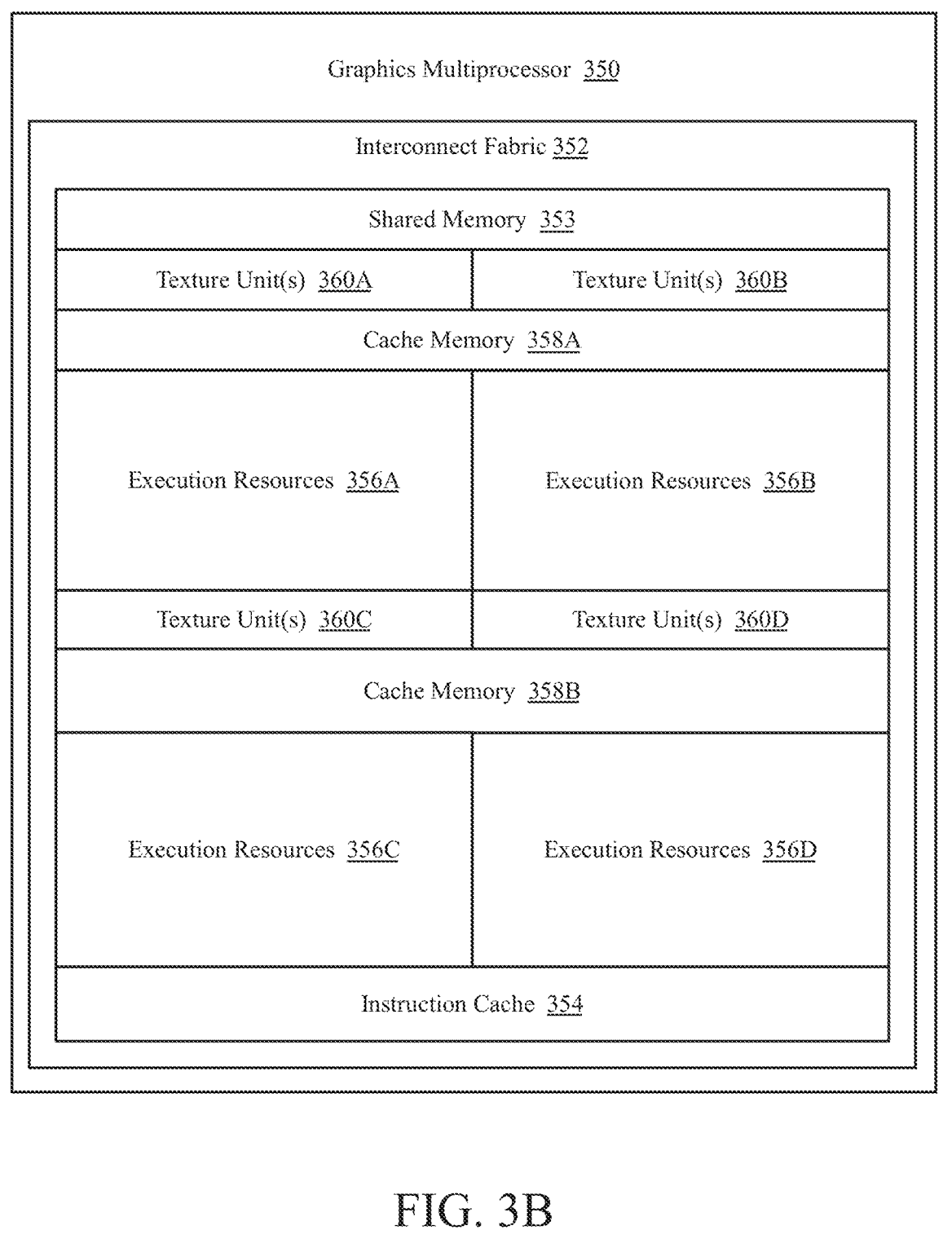

Graphics Multiprocessor 350

Interconnect Fabric 352

Shared Memory 353

Texture Unit(s) 360A

Texture Unit(s) 360B

Cache Memory 358A

Execution Resources 356A

Execution Resources 356B

Texture Unit(s) 360C

Texture Unit(s) 360D

Cache Memory 358B

Execution Resources 356C

Execution Resources 356D

Instruction Cache 354

MEDIA PROCESSOR 1302

VISION PROCESSOR 1304

ON-CHIP MEMORY 1305

GPGPU 1306

MULTI-CORE PROCESSOR 1308

FIG. 13

GRAPHICS PROCESSOR COMMAND FORMAT
2200

| CLIENT 2202 | OPCODE 2204 | SUB-OPCODE 2205 | DATA 2206 | COMMAND SIZE 2208 |
|---|---|---|---|---|

GRAPHICS PROCESSOR COMMAND SEQUENCE
2210

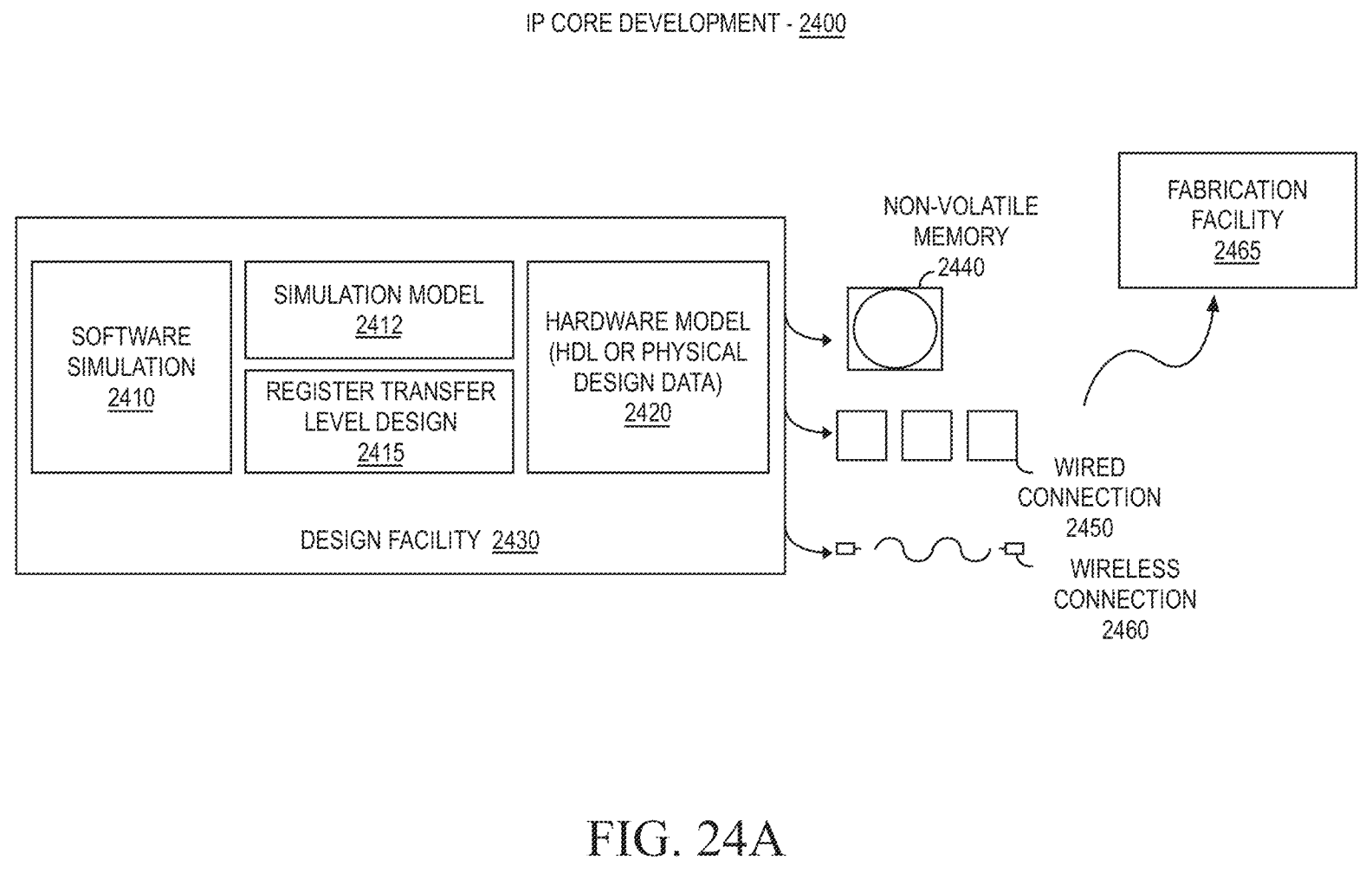

IP CORE DEVELOPMENT - 2400

SOFTWARE SIMULATION 2410

SIMULATION MODEL 2412

REGISTER TRANSFER LEVEL DESIGN 2415

HARDWARE MODEL (HDL OR PHYSICAL DESIGN DATA) 2420

DESIGN FACILITY 2430

NON-VOLATILE MEMORY 2440

WIRED CONNECTION 2450

WIRELESS CONNECTION 2460

FABRICATION FACILITY 2465

FIG. 24A

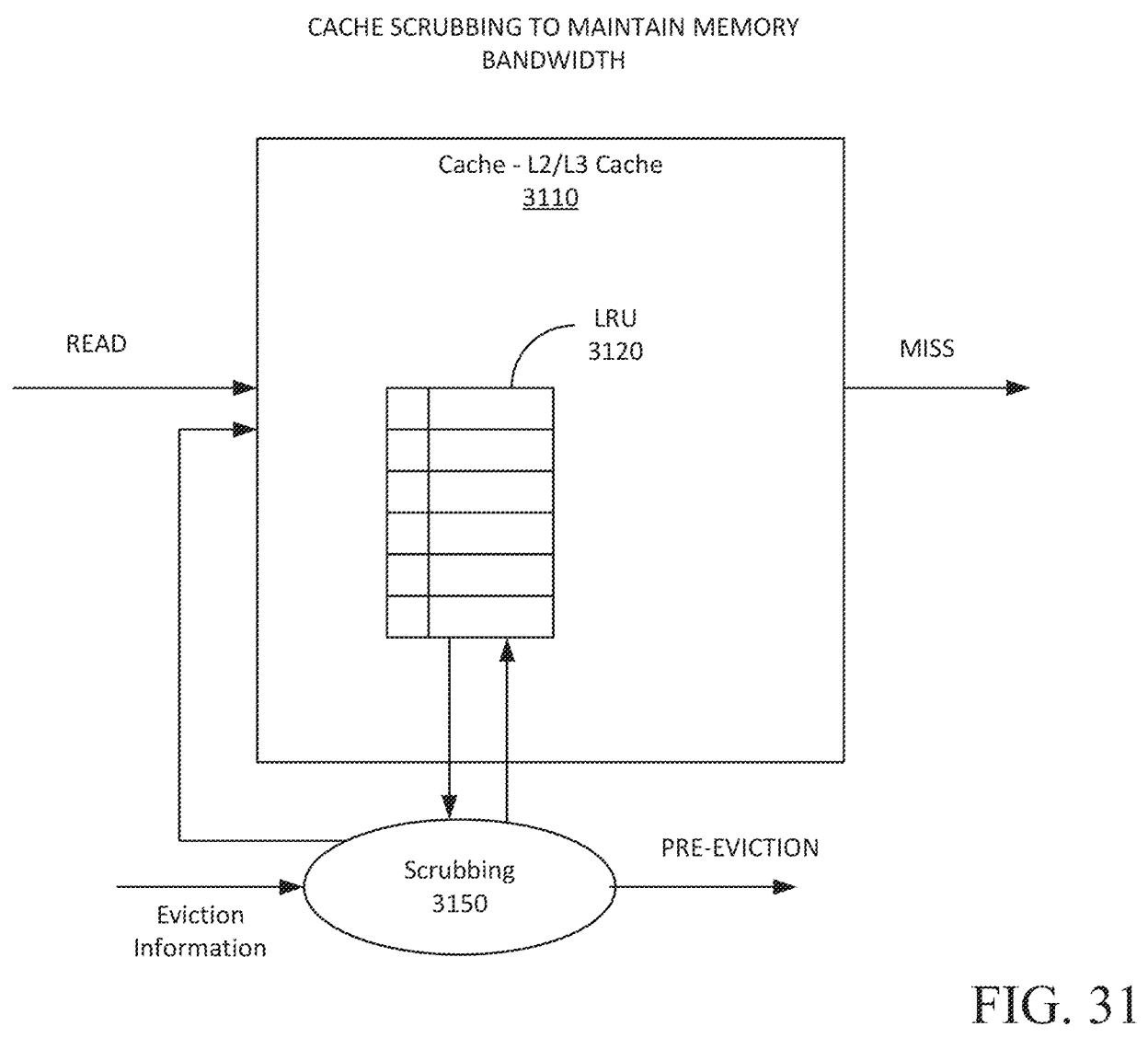

CACHE SCRUBBING TO MAINTAIN MEMORY BANDWIDTH

Cache - L2/L3 Cache
3110

LRU
3120

Scrubbing
3150

READ

MISS

PRE-EVICTION

Eviction Information

FIG. 31

CACHE STRUCTURE AND UTILIZATION

CLAIM OF PRIORITY/CROSS-REFERENCE TO RELATED APPLICATIONS

This Application is a continuation of and claims the benefit of and priority to U.S. application Ser. No. 17/674,703, entitled CACHE STRUCTURE AND UTILIZATION, by Altug Koker, et al., filed Feb. 17, 2022, now allowed, which is a continuation of and claims the benefit of and priority to U.S. application Ser. No. 17/429,291, entitled CACHE STRUCTURE AND UTILIZATION, by Altug Koker, et al., filed Aug. 6, 2021, now allowed issued as U.S. Pat. No. 12,066,975, which claims, under 35 U.S.C. § 371, the benefit of and priority to International Application No. PCT/US2020/022849, filed Mar. 14, 2020, entitled CACHE STRUCTURE AND UTILIZATION, the entire content of which is incorporated herein by reference. International Application No. PCT/US2020/022849 is related to and, under 35 U.S.C. 119(e), claims the benefit of and priority to U.S. Provisional Applications 62/819,337, entitled GRAPHICS PROCESSING, by Abhishek Appu, et al., filed Mar. 15, 2019, 62/819,435, entitled GRAPHICS DATA PROCESSING, by Lakshminarayanan Striramassarma, et al., filed Mar. 15, 2019, and 62/819,361, entitled SYSTEMS AND METHODS FOR PARTITIONING CACHE TO REDUCE CACHE ACCESS LATENCY, by Subramaniam Maiyuran, et al., filed Mar. 15, 2019, the contents of all are incorporated herein by reference.

TECHNICAL FIELD

Embodiments described herein generally relate to the field of electronic devices and, more particularly, cache structure and utilization.

BACKGROUND

Current parallel graphics data processing includes systems and methods developed to perform specific operations on graphics data such as, for example, linear interpolation, tessellation, rasterization, texture mapping, depth testing, etc. Traditionally, graphics processors used fixed function computational units to process graphics data; however, more recently, portions of graphics processors have been made programmable, enabling such processors to support a wider variety of operations for processing vertex and fragment data.

To further increase performance, graphics processors typically implement processing techniques such as pipelining that attempt to process, in parallel, as much graphics data as possible throughout the different parts of the graphics pipeline. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. A general overview of software and hardware for SIMT architectures can be found in Shane Cook, CUDA Programming Chapter 3, pages 37-51 (2013).

A graphics processor may include one or more caches to cache data from memory. However, conventional technologies include numerous inefficacies in the structure and operation of caches for graphics processor operation.

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate only typical embodiments and are therefore not to be considered limiting of its scope.

FIG. 3A-3C are block diagrams of graphics multiprocessors and multiprocessor-based GPUs;

FIG. 13 illustrates an exemplary inferencing system on a chip (SOC) suitable for performing inferencing using a trained model;

FIG. 24A is a block diagram illustrating an IP core development system;

FIG. 31 is an illustration of cache scrubbing to maintain memory bandwidth, according to some embodiments.

DETAILED DESCRIPTION

Embodiments described herein are generally directed to cache structure and utilization.

In some embodiments, an apparatus, system, or process provides for one or more of:

(1) Partitioning Mechanism For Large GPU Caches;

(2) Dynamic Overfetching of Cache Lines; and (3) Cache Scrubbing and Pre-Eviction.

A graphics processing unit (GPU) is communicatively coupled to host/processor cores to accelerate, for example, graphics operations, machine-learning operations, pattern analysis operations, and/or various general-purpose GPU (GPGPU) functions. The GPU may be communicatively coupled to the host processor/cores over a bus or another interconnect (e.g., a high-speed interconnect such as PCIe or NVLink). Alternatively, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

System Overview

Figure 1:
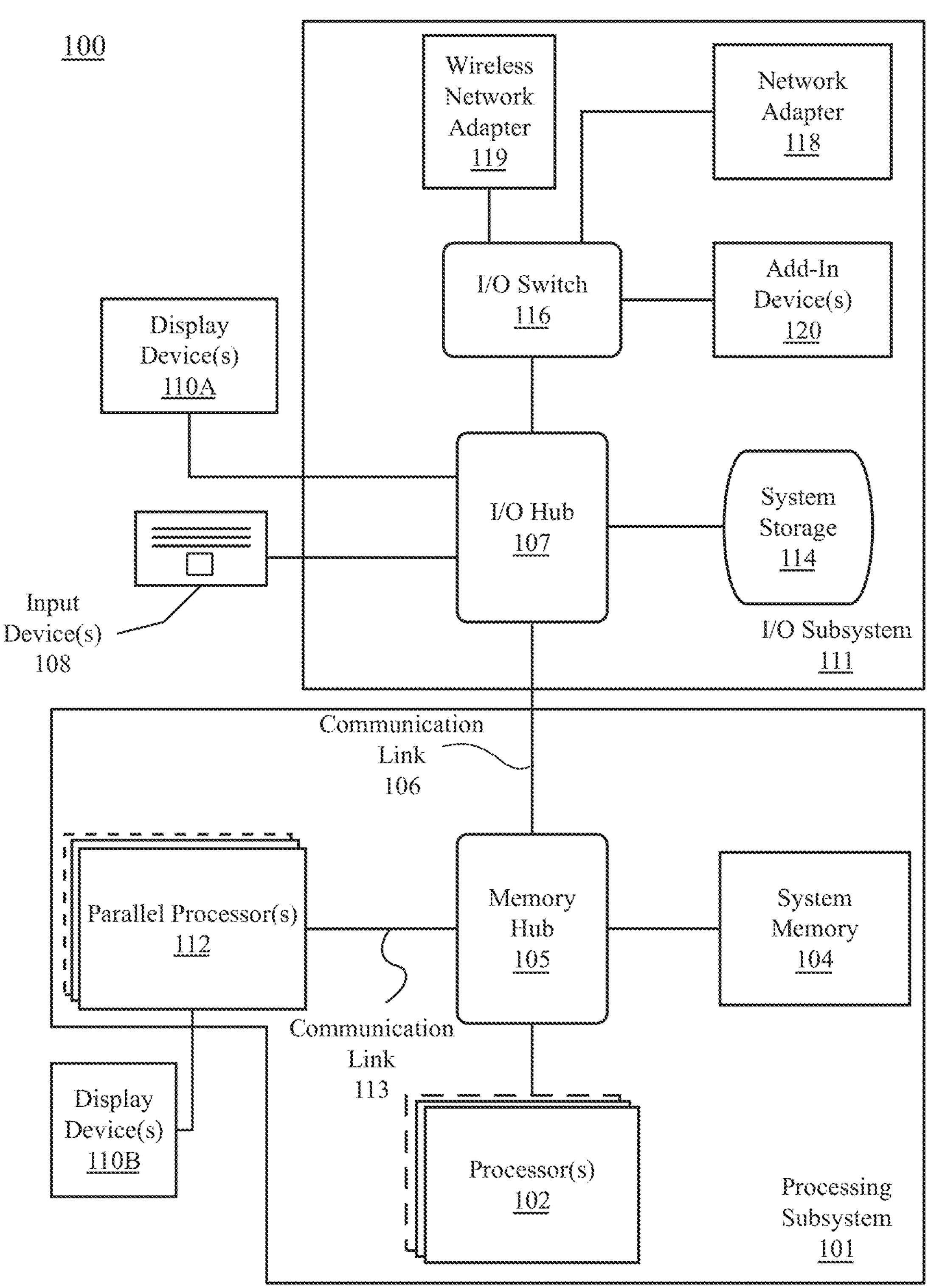
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment the one or more display device(s) 110A coupled with the I/O hub 107 can include a local, internal, or embedded display device.

The processing subsystem 101, for example, includes one or more parallel processor(s) 112 coupled to memory hub 105 via a bus or other communication link 113. The communication link 113 may be one of any number of standards-based communication link technologies or protocols, such as, but not limited to PCI Express, or may be a vendor specific communications interface or communications fabric. The one or more parallel processor(s) 112 may form a computationally focused parallel or vector processing system that can include a large number of processing cores and/or processing clusters, such as a many integrated core (MIC) processor. For example, the one or more parallel processor(s) 112 form a graphics processing subsystem that can output pixels to one of the one or more display device(s) 110A coupled via the I/O Hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The add-in device(s) 120 may also include, for example, one or more external graphics processor devices and/or compute accelerators. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NVLink high-speed interconnect, or interconnect protocols known in the art.

The one or more parallel processor(s) 112 may incorporate circuitry optimized for graphics and video processing, including, for example, video output circuitry, and constitutes a graphics processing unit (GPU). Alternatively or additionally, the one or more parallel processor(s) 112 can incorporate circuitry optimized for general purpose processing, while preserving the underlying computational architecture, described in greater detail herein. Components of the computing system 100 may be integrated with one or more other system elements on a single integrated circuit. For example, the one or more parallel processor(s) 112, memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, system memory 104 can be connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. It is also possible that two or more sets of processor(s) 102 are attached via multiple sockets, which can couple with two or more instances of the parallel processor(s) 112.

Some of the particular components shown herein are optional and may not be included in all implementations of the computing system 100. For example, any number of add-in cards or peripherals may be supported, or some components may be eliminated. Furthermore, some architectures may use different terminology for components similar to those illustrated in FIG. 1. For example, the memory hub 105 may be referred to as a Northbridge in some architectures, while the I/O hub 107 may be referred to as a Southbridge.

Figure 2A:
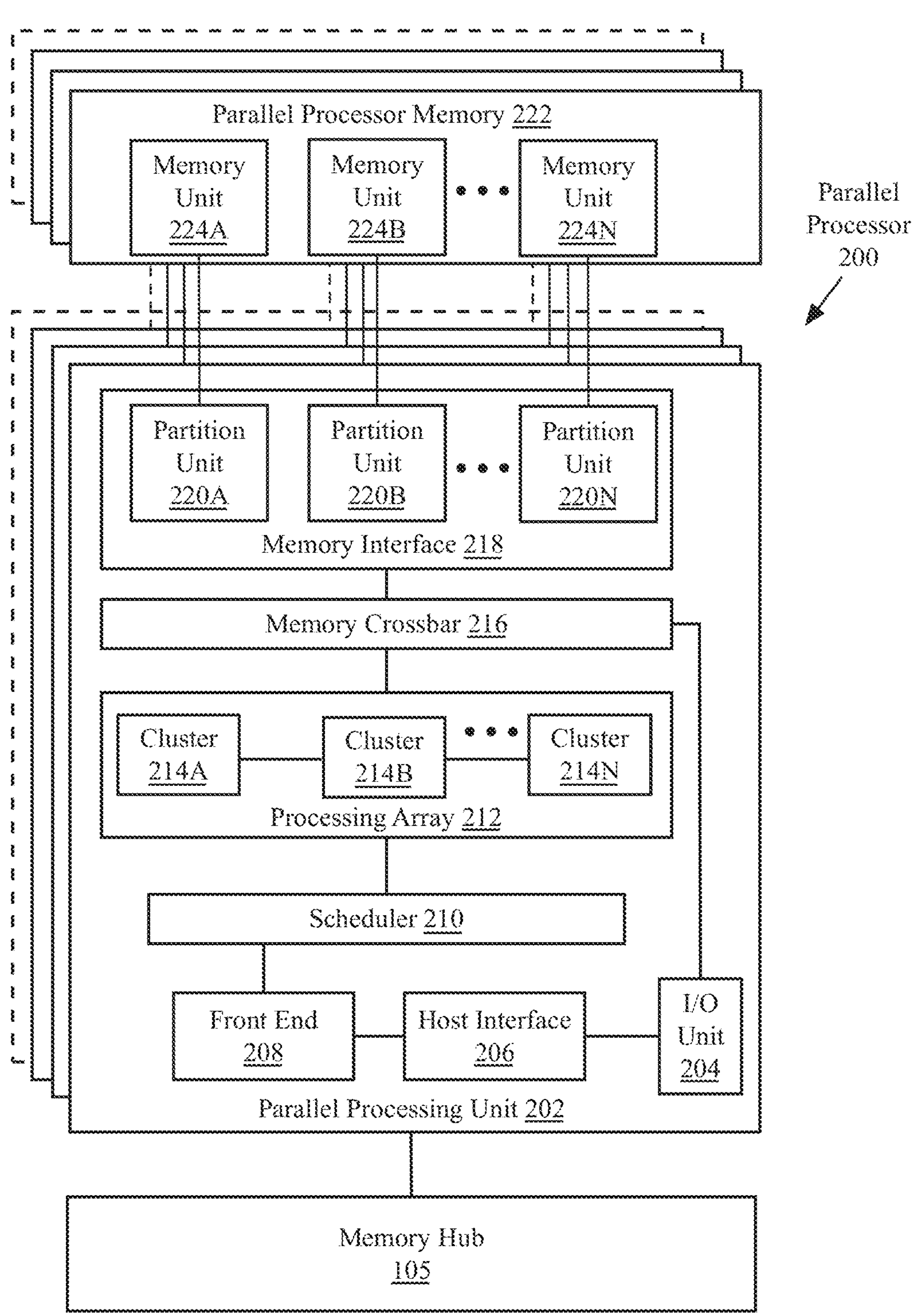
FIG. 2A-2D illustrate parallel processor components.

FIG. 2A illustrates a parallel processor 200. The parallel processor 200 may be a GPU, GPGPU or the like as described herein. The various components of the parallel processor 200 may be implemented using one or more integrated circuit devices, such as programmable processors, application specific integrated circuits (ASICs), or field programmable gate arrays (FPGA). The illustrated parallel processor 200 may be the, or one of the parallel processor(s) 112 shown in FIG. 1.

The parallel processor 200 includes a parallel processing unit 202. The parallel processing unit includes an I/O unit 204 that enables communication with other devices, including other instances of the parallel processing unit 202. The I/O unit 204 may be directly connected to other devices. For instance, the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment the front end 208 couples with a scheduler 210, which is configured to distribute commands or other work items to a processing cluster array 212. The scheduler 210 ensures that the processing cluster array 212 is properly configured and in a valid state before tasks are distributed to the processing clusters of the processing cluster array 212. The scheduler 210 may be implemented via firmware logic executing on a microcontroller. The microcontroller implemented scheduler 210 is configurable to perform complex scheduling and work distribution operations at coarse and fine granularity, enabling rapid preemption and context switching of threads executing on the processing array 212. Preferably, the host software can prove workloads for scheduling on the processing array 212 via one of multiple graphics processing doorbells. The workloads can then be automatically distributed across the processing array 212 by the scheduler 210 logic within the scheduler microcontroller.

The processing cluster array 212 can include up to "N" processing clusters (e.g., cluster 214A, cluster 214B, through cluster 214N). Each cluster 214A-214N of the processing cluster array 212 can execute a large number of concurrent threads. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210, or can be assisted in part by compiler logic during compilation of program logic configured for execution by the processing cluster array 212. Optionally, different clusters 214A-214N of the processing cluster array 212 can be allocated for processing different types of programs or for performing different types of computations.

The processing cluster array 212 can be configured to perform various types of parallel processing operations. For example, the cluster array 212 is configured to perform general-purpose parallel compute operations. For example, the processing cluster array 212 can include logic to execute processing tasks including filtering of video and/or audio data, performing modeling operations, including physics operations, and performing data transformations.

The processing cluster array 212 is configured to perform parallel graphics processing operations. In such embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In embodiments in which the parallel processing unit 202 is used to perform graphics processing, the scheduler 210 may be configured to divide the processing workload into approximately equal sized tasks, to better enable distribution of the graphics processing operations to multiple clusters 214A-214N of the processing cluster array 212. In some of these embodiments, portions of the processing cluster array 212 can be configured to perform different types of processing. For example a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that can each couple to a portion (e.g., memory unit) of parallel processor memory 222. The number of partition units 220A-220N may be configured to be equal to the number of memory units, such that a first partition unit 220A has a corresponding first memory unit 224A, a second partition unit 220B has a corresponding memory unit 224B, and an Nth partition unit 220N has a corresponding Nth memory unit 224N. In other embodiments, the number of partition units 220A-220N may not be equal to the number of memory devices.

The memory units 224A-224N can include various types of memory devices, including dynamic random-access memory (DRAM) or graphics random access memory, such as synchronous graphics random access memory (SGRAM), including graphics double data rate (GDDR) memory. Optionally, the memory units 224A-224N may also include 3D stacked memory, including but not limited to high bandwidth memory (HBM). Persons skilled in the art will appreciate that the specific implementation of the memory units 224A-224N can vary, and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

Optionally, any one of the clusters 214A-214N of the processing cluster array 212 has the ability to process data that will be written to any of the memory units 224A-224N within parallel processor memory 222. The memory crossbar 216 can be configured to transfer the output of each cluster 214A-214N to any partition unit 220A-220N or to another cluster 214A-214N, which can perform additional processing operations on the output. Each cluster 214A-214N can communicate with the memory interface 218 through the memory crossbar 216 to read from or write to various external memory devices. In one of the embodiments with the memory crossbar 216 the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. Generally, the memory crossbar 216 may, for example, by able to use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. The different instances of the parallel processing unit 202 can be configured to inter-operate even if the different instances have different numbers of processing cores, different amounts of local parallel processor memory, and/or other configuration differences. Optionally, some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems.

Figure 2B:
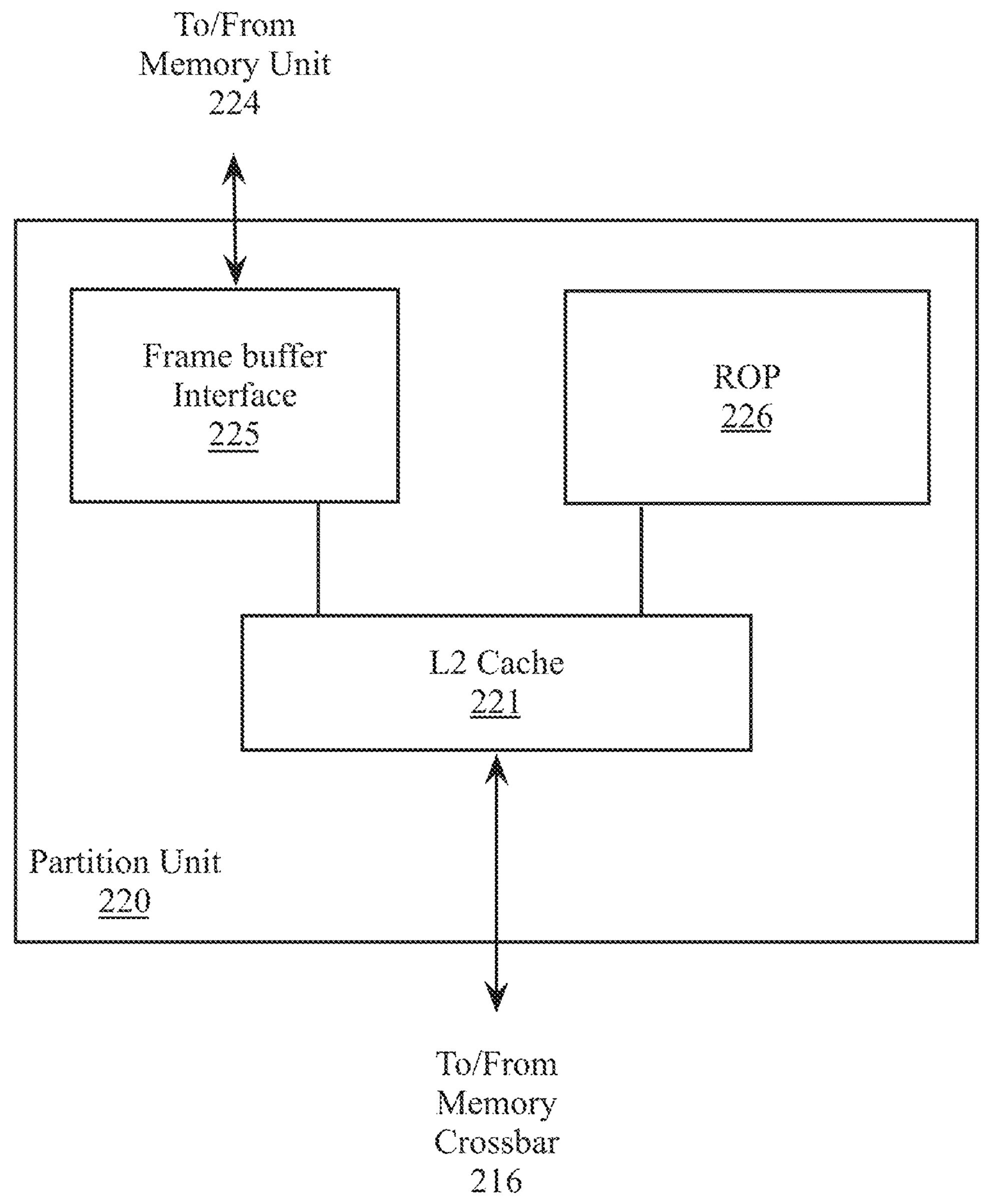

FIG. 2B is a block diagram of a partition unit 220. The partition unit 220 may be an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Updates can also be sent to the frame buffer via the frame buffer interface 225 for processing. In one embodiment the frame buffer interface 225 interfaces with one of the memory units in parallel processor memory, such as the memory units 224A-224N of FIG. 2A (e.g., within parallel processor memory 222). The partition unit 220 may additionally or alternatively also interface with one of the memory units in parallel processor memory via a memory controller (not shown).

In graphics applications, the ROP 226 is a processing unit that performs raster operations such as stencil, z test, blending, and the like. The ROP 226 then outputs processed graphics data that is stored in graphics memory. In some embodiments the ROP 226 includes compression logic to compress depth or color data that is written to memory and decompress depth or color data that is read from memory. The compression logic can be lossless compression logic that makes use of one or more of multiple compression algorithms. The type of compression that is performed by the ROP 226 can vary based on the statistical characteristics of the data to be compressed. For example, in one embodiment, delta color compression is performed on depth and color data on a per-tile basis.

The ROP 226 may be included within each processing cluster (e.g., cluster 214A-214N of FIG. 2A) instead of within the partition unit 220. In such embodiment, read and write requests for pixel data are transmitted over the memory crossbar 216 instead of pixel fragment data. The processed graphics data may be displayed on a display device, such as one of the one or more display device(s) 110 of FIG. 1, routed for further processing by the processor(s) 102, or routed for further processing by one of the processing entities within the parallel processor 200 of FIG. 2A.

Figure 2C:
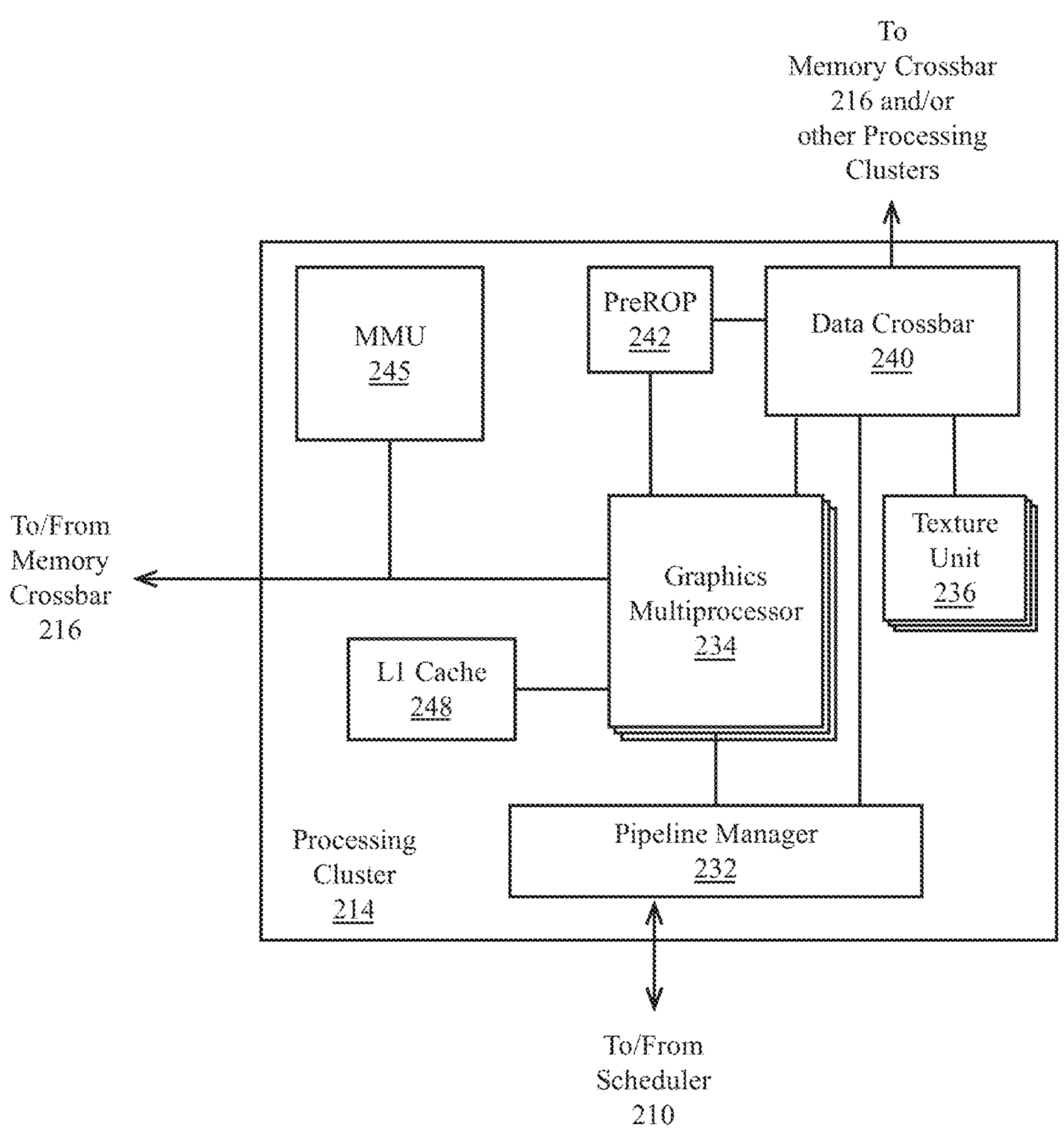

FIG. 2C is a block diagram of a processing cluster 214 within a parallel processing unit. For example, the processing cluster is an instance of one of the processing clusters 214A-214N of FIG. 2A. The processing cluster 214 can be configured to execute many threads in parallel, where the term "thread" refers to an instance of a particular program executing on a particular set of input data. Optionally, single-instruction, multiple-data (SIMD) instruction issue techniques may be used to support parallel execution of a large number of threads without providing multiple independent instruction units. Alternatively, single-instruction, multiple-thread (SIMT) techniques may be used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2A and manages execution of those instructions via a graphics multiprocessor 234 and/or a texture unit 236. The illustrated graphics multiprocessor 234 is an exemplary instance of a SIMT parallel processor. However, various types of SIMT parallel processors of differing architectures may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed via the data crossbar 240.

Each graphics multiprocessor 234 within the processing cluster 214 can include an identical set of functional execution logic (e.g., arithmetic logic units, load-store units, etc.). The functional execution logic can be configured in a pipelined manner in which new instructions can be issued before previous instructions are complete. The functional execution logic supports a variety of operations including integer and floating-point arithmetic, comparison operations, Boolean operations, bit-shifting, and computation of various algebraic functions. The same functional-unit hardware could be leveraged to perform different operations and any combination of functional units may be present.

The instructions transmitted to the processing cluster 214 constitutes a thread. A set of threads executing across the set of parallel processing engines is a thread group. A thread group executes the same program on different input data. Each thread within a thread group can be assigned to a different processing engine within a graphics multiprocessor 234. A thread group may include fewer threads than the number of processing engines within the graphics multiprocessor 234. When a thread group includes fewer threads than the number of processing engines, one or more of the processing engines may be idle during cycles in which that thread group is being processed. A thread group may also include more threads than the number of processing engines within the graphics multiprocessor 234. When the thread group includes more threads than the number of processing engines within the graphics multiprocessor 234, processing can be performed over consecutive clock cycles. Optionally, multiple thread groups can be executed concurrently on the graphics multiprocessor 234.

The graphics multiprocessor 234 may include an internal cache memory to perform load and store operations. Optionally, the graphics multiprocessor 234 can forego an internal cache and use a cache memory (e.g., L1 cache 248) within the processing cluster 214. Each graphics multiprocessor 234 also has access to L2 caches within the partition units (e.g., partition units 220A-220N of FIG. 2A) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 248.

Each processing cluster 214 may include an MMU 245 (memory management unit) that is configured to map virtual addresses into physical addresses. In other embodiments, one or more instances of the MMU 245 may reside within the memory interface 218 of FIG. 2A. The MMU 245 includes a set of page table entries (PTEs) used to map a virtual address to a physical address of a tile and optionally a cache line index. The MMU 245 may include address translation lookaside buffers (TLB) or caches that may reside within the graphics multiprocessor 234 or the L1 cache or processing cluster 214. The physical address is processed to distribute surface data access locality to allow efficient request interleaving among partition units. The cache line index may be used to determine whether a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2A). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. Optionally, each processing cluster 214 can be configured to operate independently of other processing clusters 214 using separate and distinct processing units, L1 caches, etc.

Figure 2D:
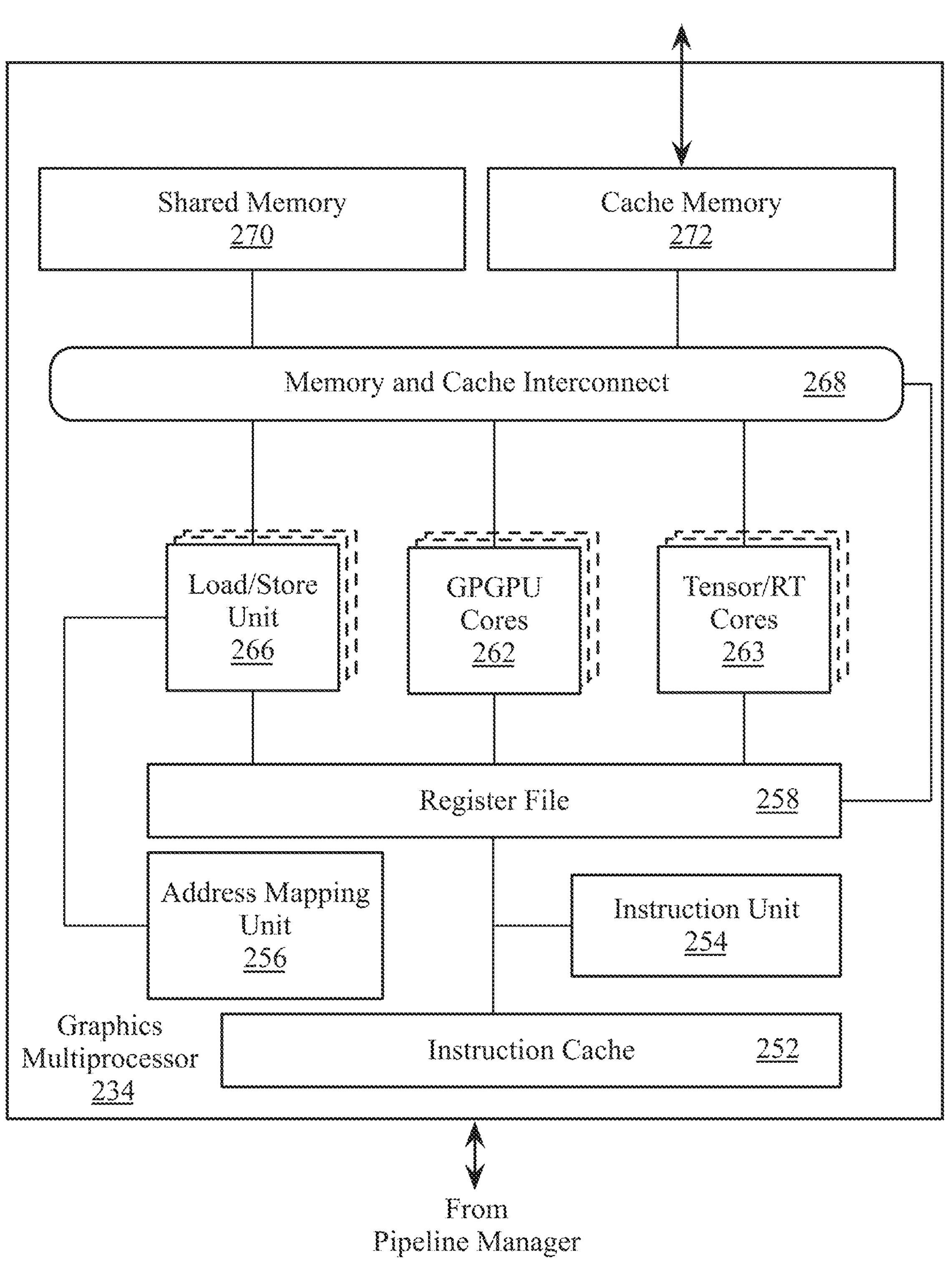

FIG. 2D shows an example of the graphics multiprocessor 234 in which the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268. The graphics multiprocessor 234 may additionally include tensor and/or ray-tracing cores 263 that include hardware logic to accelerate matrix and/or ray-tracing operations.

The instruction cache 252 may receive a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 234. The register file 258 provides temporary storage for operands connected to the data paths of the functional units (e.g., GPGPU cores 262, load/store units 266) of the graphics multiprocessor 234. The register file 258 may be divided between each of the functional units such that each functional unit is allocated a dedicated portion of the register file 258. For example, the register file 258 may be divided between the different warps being executed by the graphics multiprocessor 234.

The GPGPU cores 262 can each include floating point units (FPUs) and/or integer arithmetic logic units (ALUs) that are used to execute instructions of the graphics multiprocessor 234. In some implementations, the GPGPU cores 262 can include hardware logic that may otherwise reside within the tensor and/or ray-tracing cores 263. The GPGPU cores 262 can be similar in architecture or can differ in architecture. For example and in one embodiment, a first portion of the GPGPU cores 262 include a single precision FPU and an integer ALU while a second portion of the GPGPU cores include a double precision FPU. Optionally, the FPUs can implement the IEEE 754-2008 standard for floating point arithmetic or enable variable precision floating point arithmetic. The graphics multiprocessor 234 can additionally include one or more fixed function or special function units to perform specific functions such as copy rectangle or pixel blending operations. One or more of the GPGPU cores can also include fixed or special function logic.

The GPGPU cores 262 may include SIMD logic capable of performing a single instruction on multiple sets of data. Optionally, GPGPU cores 262 can physically execute SIMD4, SIMD8, and SIMD16 instructions and logically execute SIMD1, SIMD2, and SIMD32 instructions. The SIMD instructions for the GPGPU cores can be generated at compile time by a shader compiler or automatically generated when executing programs written and compiled for single program multiple data (SPMD) or SIMT architectures. Multiple threads of a program configured for the SIMT execution model can be executed via a single SIMD instruction. For example and in one embodiment, eight SIMT threads that perform the same or similar operations can be executed in parallel via a single SIMD8 logic unit.

The memory and cache interconnect 268 is an interconnect network that connects each of the functional units of the graphics multiprocessor 234 to the register file 258 and to the shared memory 270. For example, the memory and cache interconnect 268 is a crossbar interconnect that allows the load/store unit 266 to implement load and store operations between the shared memory 270 and the register file 258. The register file 258 can operate at the same frequency as the GPGPU cores 262, thus data transfer between the GPGPU cores 262 and the register file 258 is very low latency. The shared memory 270 can be used to enable communication between threads that execute on the functional units within the graphics multiprocessor 234. The cache memory 272 can be used as a data cache for example, to cache texture data communicated between the functional units and the texture unit 236. The shared memory 270 can also be used as a program managed cached. Threads executing on the GPGPU cores 262 can programmatically store data within the shared memory in addition to the automatically cached data that is stored within the cache memory 272.

Figure 3C:
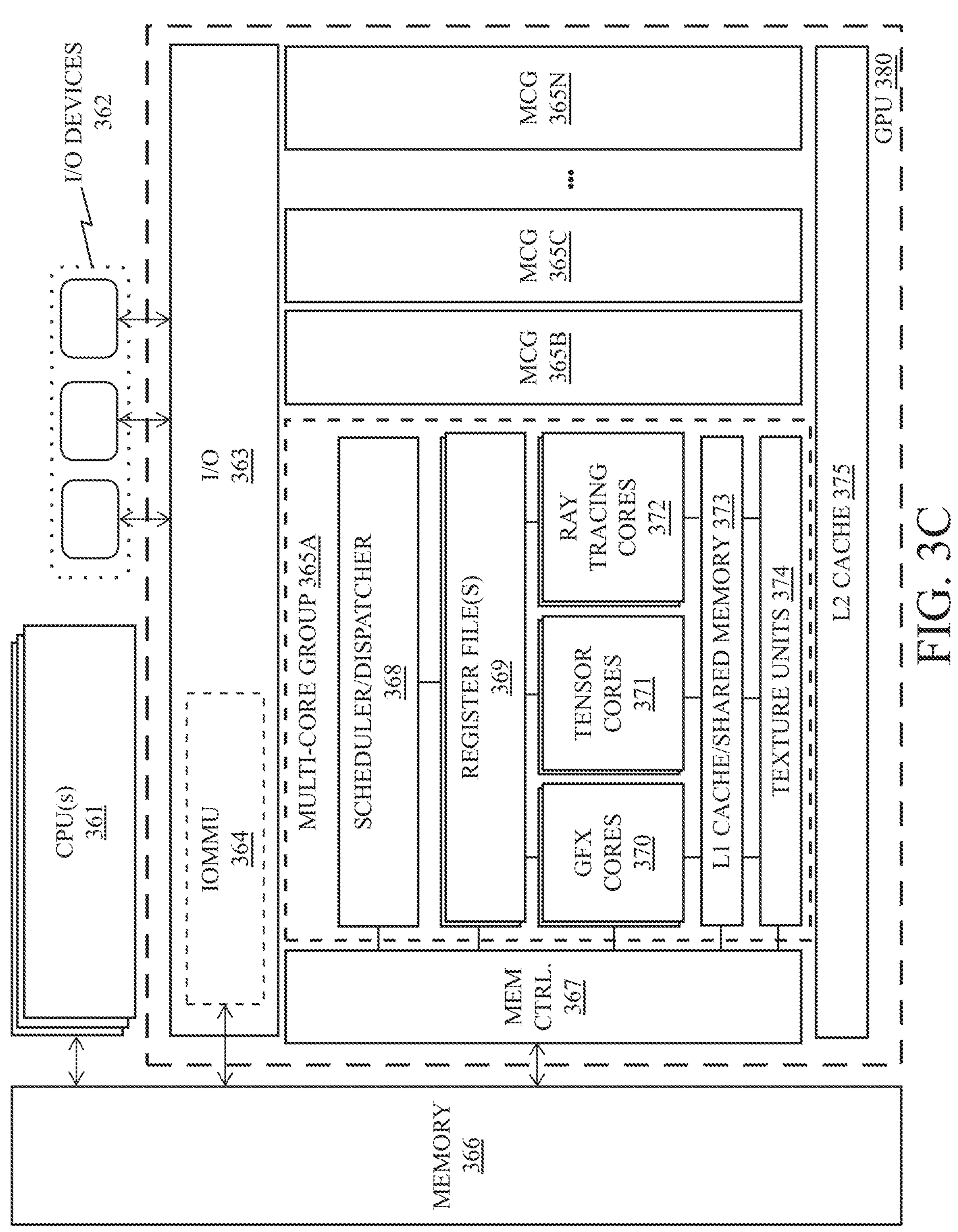

FIG. 3A-3C illustrate additional graphics multiprocessors, according to embodiments. FIG. 3A-3B illustrate graphics multiprocessors 325, 350, which are related to the graphics multiprocessor 234 of FIG. 2C and may be used in place of one of those. Therefore, the disclosure of any features in combination with the graphics multiprocessor 234 herein also discloses a corresponding combination with the graphics multiprocessor(s) 325, 350, but is not limited to such. FIG. 3C illustrates a graphics processing unit (GPU) 380 which includes dedicated sets of graphics processing resources arranged into multi-core groups 365A-365N, which correspond to the graphics multiprocessors 325, 350. The illustrated graphics multiprocessors 325, 350 and the multi-core groups 365A-365N can be streaming multiprocessors (SM) capable of simultaneous execution of a large number of execution threads.

The graphics multiprocessor 325 of FIG. 3A includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, tensor core 337A-337B, ray-tracing core 338A-338B) and multiple sets of load/store units 340A-340B. The execution resource units have a common instruction cache 330, texture and/or data cache memory 342, and shared memory 346.

The various components can communicate via an interconnect fabric 327. The interconnect fabric 327 may include one or more crossbar switches to enable communication between the various components of the graphics multiprocessor 325. The interconnect fabric 327 may be a separate, high-speed network fabric layer upon which each component of the graphics multiprocessor 325 is stacked. The components of the graphics multiprocessor 325 communicate with remote components via the interconnect fabric 327. For example, the GPGPU cores 336A-336B, 337A-337B, and 3378A-338B can each communicate with shared memory 346 via the interconnect fabric 327. The interconnect fabric 327 can arbitrate communication within the graphics multiprocessor 325 to ensure a fair bandwidth allocation between components.

The graphics multiprocessor 350 of FIG. 3B includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 353. For example, the execution resources 356A-356D can share an instruction cache 354 and shared memory 353, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2A, as well as one or more graphics processors or special purpose processing units, without departure from the scope of the embodiments described herein.

The parallel processor or GPGPU as described herein may be communicatively coupled to host/processor cores to accelerate graphics operations, machine-learning operations, pattern analysis operations, and various general-purpose GPU (GPGPU) functions. The GPU may be communicatively coupled to the host processor/cores over a bus or other interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

FIG. 3C illustrates a graphics processing unit (GPU) 380 which includes dedicated sets of graphics processing resources arranged into multi-core groups 365A-365N. While the details of only a single multi-core group 365A are provided, it will be appreciated that the other multi-core groups 365B-365N may be equipped with the same or similar sets of graphics processing resources. Details described with respect to the multi-core groups 365A-365N may also apply to any graphics multiprocessor 234, 325, 350 described herein.

As illustrated, a multi-core group 365A may include a set of graphics cores 370, a set of tensor cores 371, and a set of ray tracing cores 372. A scheduler/dispatcher 368 schedules and dispatches the graphics threads for execution on the various cores 370, 371, 372. A set of register files 369 store operand values used by the cores 370, 371, 372 when executing the graphics threads. These may include, for example, integer registers for storing integer values, floating point registers for storing floating point values, vector registers for storing packed data elements (integer and/or floating-point data elements) and tile registers for storing tensor/matrix values. The tile registers may be implemented as combined sets of vector registers.

One or more combined level 1 (L1) caches and shared memory units 373 store graphics data such as texture data, vertex data, pixel data, ray data, bounding volume data, etc., locally within each multi-core group 365A. One or more texture units 374 can also be used to perform texturing operations, such as texture mapping and sampling. A Level 2 (L2) cache 375 shared by all or a subset of the multi-core groups 365A-365N stores graphics data and/or instructions for multiple concurrent graphics threads. As illustrated, the L2 cache 375 may be shared across a plurality of multi-core groups 365A-365N. One or more memory controllers 367 couple the GPU 380 to a memory 366 which may be a system memory (e.g., DRAM) and/or a dedicated graphics memory (e.g., GDDR6 memory).

Input/output (I/O) circuitry 363 couples the GPU 380 to one or more I/O devices 362 such as digital signal processors (DSPs), network controllers, or user input devices. An on-chip interconnect may be used to couple the I/O devices 362 to the GPU 380 and memory 366. One or more I/O memory management units (IOMMUs) 364 of the I/O circuitry 363 couple the I/O devices 362 directly to the system memory 366. Optionally, the IOMMU 364 manages multiple sets of page tables to map virtual addresses to physical addresses in system memory 366. The I/O devices 362, CPU(s) 361, and GPU(s) 380 may then share the same virtual address space.

In one implementation of the IOMMU 364, the IOMMU 364 supports virtualization. In this case, it may manage a first set of page tables to map guest/graphics virtual addresses to guest/graphics physical addresses and a second set of page tables to map the guest/graphics physical addresses to system/host physical addresses (e.g., within system memory 366). The base addresses of each of the first and second sets of page tables may be stored in control registers and swapped out on a context switch (e.g., so that the new context is provided with access to the relevant set of page tables). While not illustrated in FIG. 3C, each of the cores 370, 371, 372 and/or multi-core groups 365A-365N may include translation lookaside buffers (TLBs) to cache guest virtual to guest physical translations, guest physical to host physical translations, and guest virtual to host physical translations.

The CPUs 361, GPUs 380, and I/O devices 362 may be integrated on a single semiconductor chip and/or chip package. The illustrated memory 366 may be integrated on the same chip or may be coupled to the memory controllers 367 via an off-chip interface. In one implementation, the memory 366 comprises GDDR6 memory which shares the same virtual address space as other physical system-level memories, although the underlying principles described herein are not limited to this specific implementation.

The tensor cores 371 may include a plurality of execution units specifically designed to perform matrix operations, which are the fundamental compute operation used to perform deep learning operations. For example, simultaneous matrix multiplication operations may be used for neural network training and inferencing. The tensor cores 371 may perform matrix processing using a variety of operand precisions including single precision floating-point (e.g., 32 bits), half-precision floating point (e.g., 16 bits), integer words (16 bits), bytes (8 bits), and half-bytes (4 bits). For example, a neural network implementation extracts features of each rendered scene, potentially combining details from multiple frames, to construct a high-quality final image.

In deep learning implementations, parallel matrix multiplication work may be scheduled for execution on the tensor cores 371. The training of neural networks, in particular, requires a significant number matrix dot product operations. In order to process an inner-product formulation of an N×N×N matrix multiply, the tensor cores 371 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 371 to ensure that the most efficient precision is used for different workloads (e.g., such as inferencing workloads which can tolerate quantization to bytes and half-bytes).

The ray tracing cores 372 may accelerate ray tracing operations for both real-time ray tracing and non-real-time ray tracing implementations. In particular, the ray tracing cores 372 may include ray traversal/intersection circuitry for performing ray traversal using bounding volume hierarchies (BVHs) and identifying intersections between rays and primitives enclosed within the BVH volumes. The ray tracing cores 372 may also include circuitry for performing depth testing and culling (e.g., using a Z buffer or similar arrangement). In one implementation, the ray tracing cores 372 perform traversal and intersection operations in concert with the image denoising techniques described herein, at least a portion of which may be executed on the tensor cores 371. For example, the tensor cores 371 may implement a deep learning neural network to perform denoising of frames generated by the ray tracing cores 372. However, the CPU(s) 361, graphics cores 370, and/or ray tracing cores 372 may also implement all or a portion of the denoising and/or deep learning algorithms.

In addition, as described above, a distributed approach to denoising may be employed in which the GPU 380 is in a computing device coupled to other computing devices over a network or high-speed interconnect. In this distributed approach, the interconnected computing devices may share neural network learning/training data to improve the speed with which the overall system learns to perform denoising for different types of image frames and/or different graphics applications.

The ray tracing cores 372 may process all BVH traversal and/or ray-primitive intersections, saving the graphics cores 370 from being overloaded with thousands of instructions per ray. For example, each ray tracing core 372 includes a first set of specialized circuitry for performing bounding box tests (e.g., for traversal operations) and/or a second set of specialized circuitry for performing the ray-triangle intersection tests (e.g., intersecting rays which have been traversed). Thus, for example, the multi-core group 365A can simply launch a ray probe, and the ray tracing cores 372 independently perform ray traversal and intersection and return hit data (e.g., a hit, no hit, multiple hits, etc.) to the thread context. The other cores 370, 371 are freed to perform other graphics or compute work while the ray tracing cores 372 perform the traversal and intersection operations.

Optionally, each ray tracing core 372 may include a traversal unit to perform BVH testing operations and/or an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 370 and tensor cores 371) are freed to perform other forms of graphics work.

In one optional embodiment described below, a hybrid rasterization/ray tracing approach is used in which work is distributed between the graphics cores 370 and ray tracing cores 372.

The ray tracing cores 372 (and/or other cores 370, 371) may include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 372, graphics cores 370 and tensor cores 371 is Vulkan 1.1.85. Note, however, that the underlying principles described herein are not limited to any particular ray tracing ISA.

In general, the various cores 372, 371, 370 may support a ray tracing instruction set that includes instructions/functions for one or more of ray generation, closest hit, any hit, ray-primitive intersection, per-primitive and hierarchical bounding box construction, miss, visit, and exceptions. More specifically, a preferred embodiment includes ray tracing instructions to perform one or more of the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the children volumes a ray will traverse.

Exceptions—Includes various types of exception handlers (e.g., invoked for various error conditions).

Techniques for GPU to Host Processor Interconnection

Figure 4A:
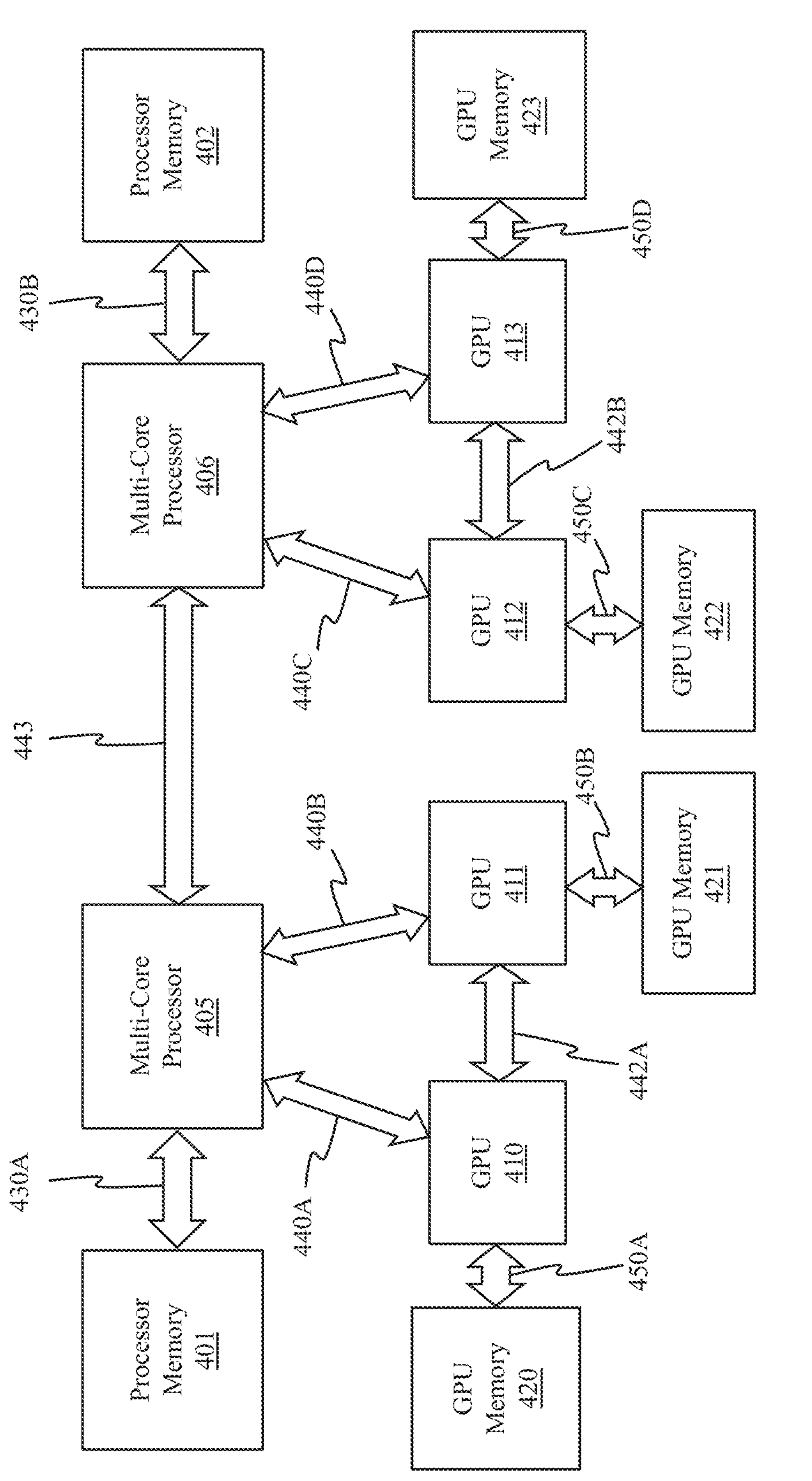
FIG. 4A-4F illustrate an exemplary architecture in which a plurality of GPUs is communicatively coupled to a plurality of multi-core processors.

FIG. 4A illustrates an exemplary architecture in which a plurality of GPUs 410-413, e.g. such as the parallel processors 200 shown in FIG. 2A, are communicatively coupled to a plurality of multi-core processors 405-406 over high-speed links 440A-440D (e.g., buses, point-to-point interconnects, etc.). The high-speed links 440A-440D may support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles described herein are not limited to any particular communication protocol or throughput.

Two or more of the GPUs 410-413 may be interconnected over high-speed links 442A-442B, which may be implemented using the same or different protocols/links than those used for high-speed links 440A-440D. Similarly, two or more of the multi-core processors 405-406 may be connected over high speed link 443 which may be symmetric multi-processor (SMP) buses operating at 20 GB/s, 30 GB/s, 120 GB/s or higher. Alternatively, all communication between the various system components shown in FIG. 4A may be accomplished using the same protocols/links (e.g., over a common interconnection fabric). As mentioned, however, the underlying principles described herein are not limited to any particular type of interconnect technology.

Each multi-core processor 405-406 may be communicatively coupled to a processor memory 401-402, via memory interconnects 430A-430B, respectively, and each GPU 410-413 is communicatively coupled to GPU memory 420-423 over GPU memory interconnects 450A-450D, respectively. The memory interconnects 430A-430B and 450A-450D may utilize the same or different memory access technologies. By way of example, and not limitation, the processor memories 401-402 and GPU memories 420-423 may be volatile memories such as dynamic random-access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint/Optane or Nano-Ram. For example, some portion of the memories may be volatile memory and another portion may be non-volatile memory (e.g., using a two-level memory (2LM) hierarchy).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
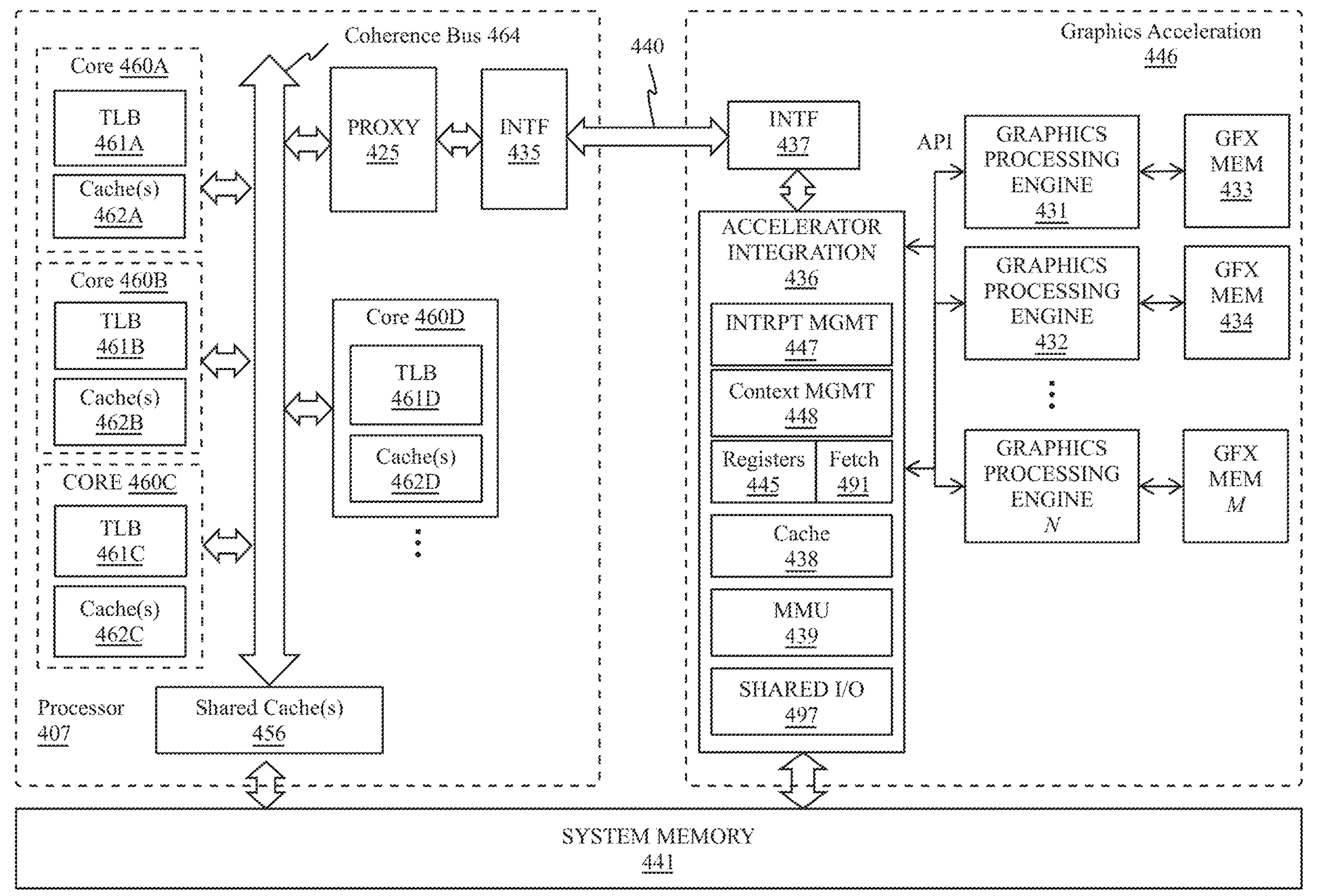

FIG. 4B illustrates additional optional details for an interconnection between a multi-core processor 407 and a graphics acceleration module 446. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the components described herein (e.g., instruction fetch units, branch prediction units, decoders, execution units, reorder buffers, etc.). The caches 462A-462D may comprise level 1 (L1) and level 2 (L2) caches. In addition, one or more shared caches 456 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402.

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles described herein.

A proxy circuit 425 may be provided that communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the high-speed link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

The accelerator integration circuit 436 may include a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431-432, N. The data stored in cache 438 and graphics memories 433-434, M may be kept coherent with the core caches 462A-462D, 456 and system memory 411. As mentioned, this may be accomplished via proxy circuit 425 which takes part in the cache coherency mechanism on behalf of cache 438 and memories 433-434, M (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is stored so that the second thread can be execute by a graphics processing engine). For example, on a context switch, the context management circuit 448 may store current register values to a designated region in memory (e.g., identified by a context pointer). It may then restore the register values when returning to the context. An interrupt management circuit 447, for example, may receive and processes interrupts received from system devices.

In one implementation, virtual/effective addresses from a graphics processing engine 431 are translated to real/physical addresses in system memory 411 by the MMU 439. Optionally, the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. Optionally, a virtualized graphics execution environment is provided in which the resources of the graphics processing engines 431-432, N are shared with multiple applications or virtual machines (VMs). The resources may be subdivided into "slices" which are allocated to different VMs and/or applications based on the processing requirements and priorities associated with the VMs and/or applications.

Thus, the accelerator integration circuit 346 acts as a bridge to the system for the graphics acceleration module 446 and provides address translation and system memory cache services. In one embodiment, to facilitate the bridging functionality, the accelerator integration circuit 436 may also include shared I/O 497 (e.g., PCIe, USB) and hardware to enable system control of voltage, clocking, performance, thermals, and security. The shared I/O 497 may utilize separate physical connections or may traverse the high-speed link 440. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One optional function of the accelerator integration circuit 436 is the physical separation of the graphics processing engines 431-432, N so that they appear to the system as independent units.

One or more graphics memories 433-434, M may be coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6), or HBM, and/or may be non-volatile memories such as 3D XPoint/Optane or Nano-Ram.

To reduce data traffic over the high-speed link 440, biasing techniques may be used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 411.

Figure 4C:
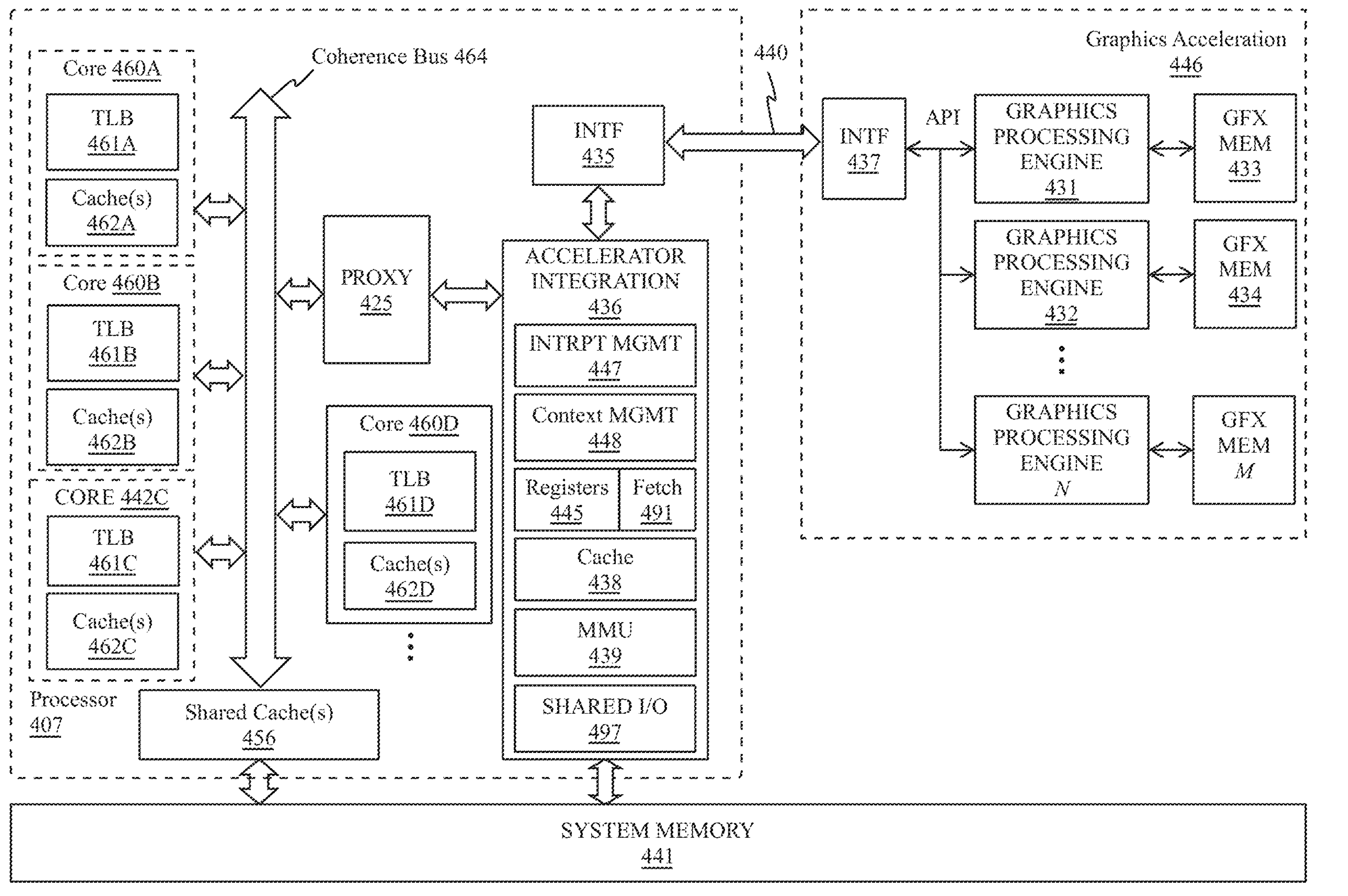

According to a variant shown in FIG. 4C the accelerator integration circuit 436 is integrated within the processor 407. The graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherency bus 464 and caches 462A-462D, 456.

The embodiments described may support different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In the embodiments of the dedicated process model, graphics processing engines 431-432, N may be dedicated to a single application or process under a single operating system. The single application can funnel other application requests to the graphics engines 431-432, N, providing virtualization within a VM/partition.

In the dedicated-process programming models, the graphics processing engines 431-432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. The process elements may be stored in system memory 411 and be addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
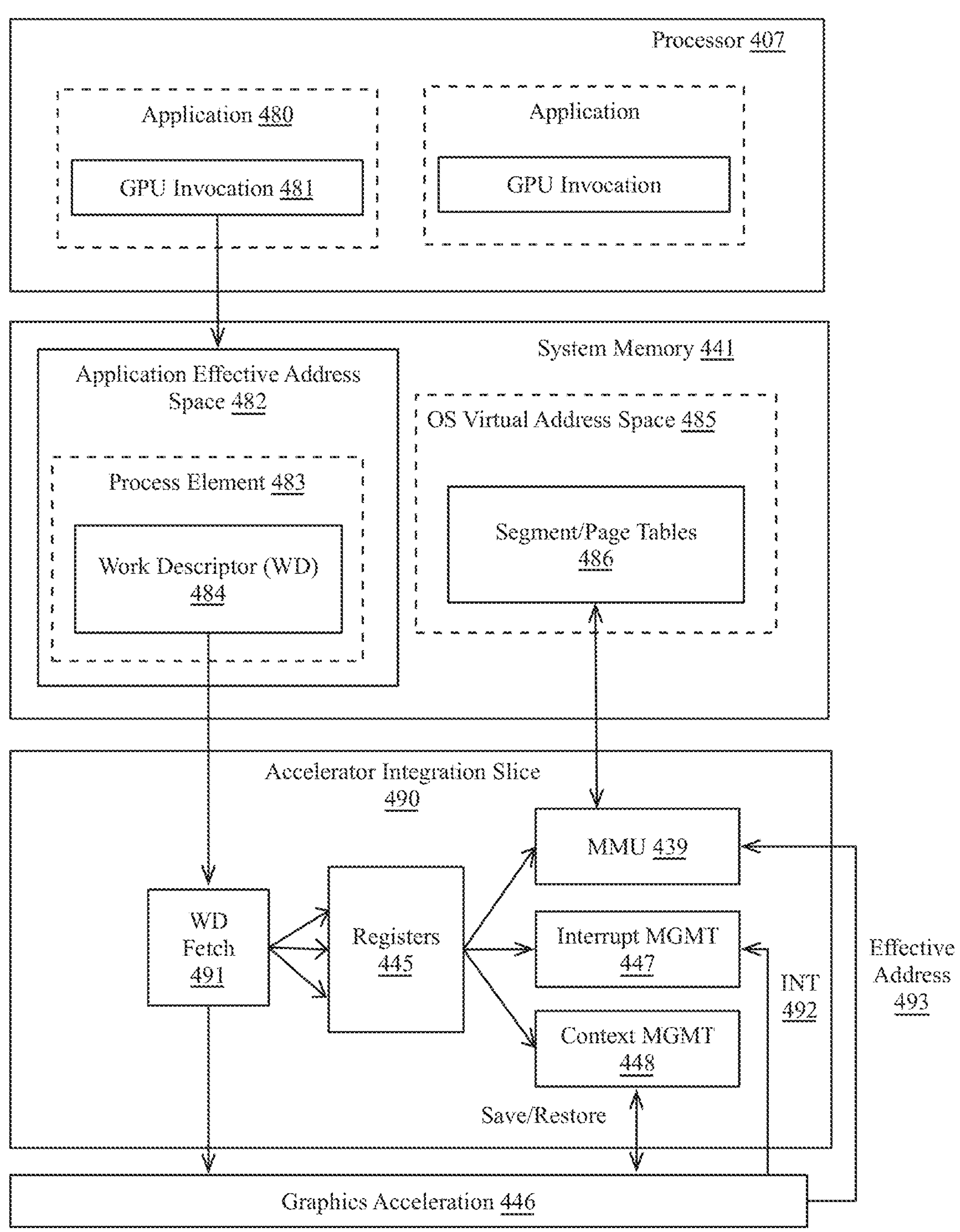

FIG. 4D illustrates an exemplary accelerator integration slice 490. As used herein, a "slice" comprises a specified portion of the processing resources of the accelerator integration circuit 436. Application effective address space 482 within system memory 411 stores process elements 483. The process elements 483 may be stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. For example, the technologies described herein may include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 448 as illustrated. For example, the MMU 439 may include segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

The same set of registers 445 may be duplicated for each graphics processing engine 431-432, N and/or graphics acceleration module 446 and may be initialized by the hypervisor or operating system. Each of these duplicated registers may be included in an accelerator integration slice 490. Exemplary registers that may be initialized by the hypervisor are shown in Table 1.

TABLE 1

| | Hypervisor Initialized Registers |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

| | Operating System Initialized Registers |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

Each WD 484 may be specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
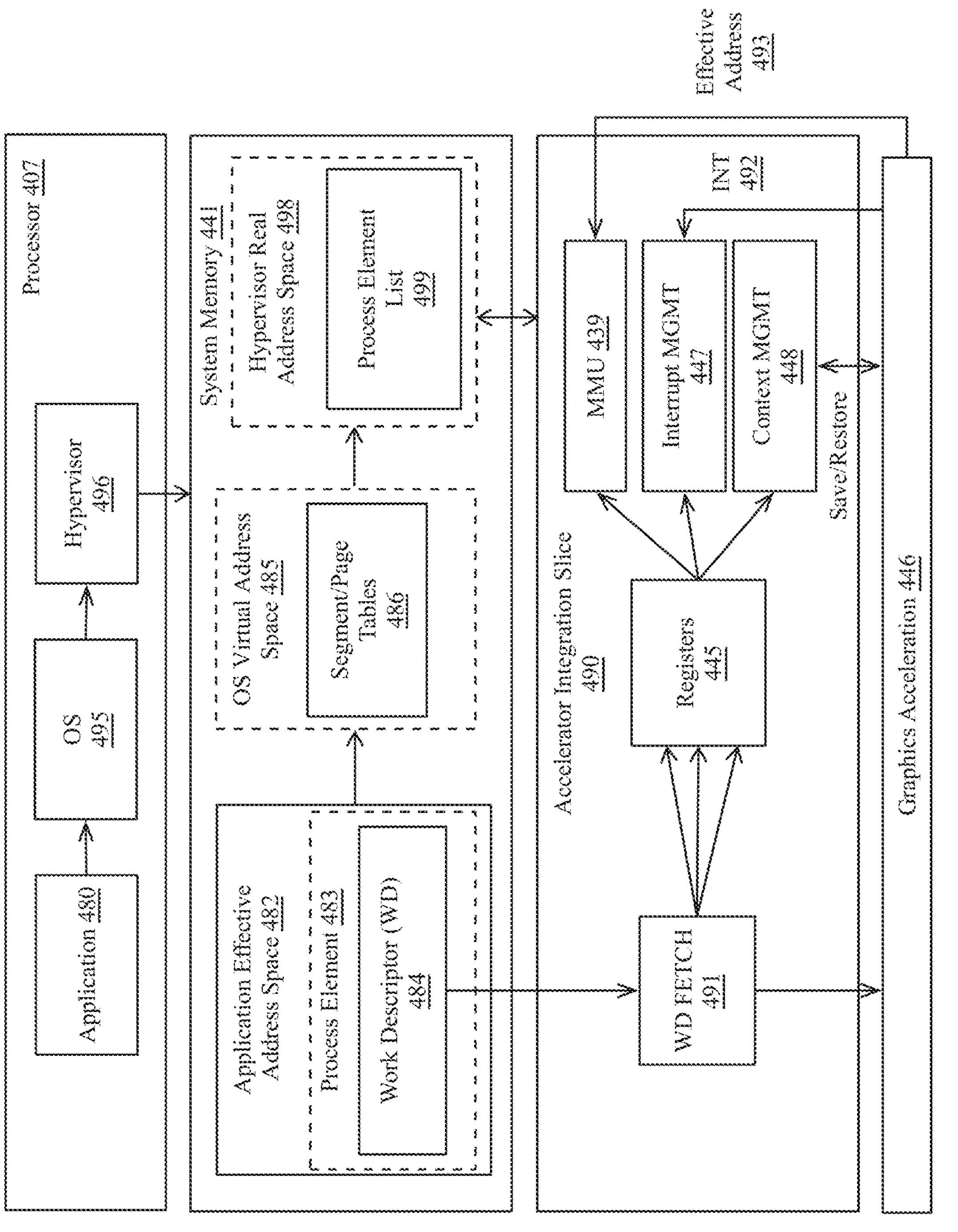

FIG. 4E illustrates additional optional details of a shared model. It includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

For the shared model, the application 480 may be required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. The CSRP may be one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

| | OS to Hypervisor Call Parameters |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

| Process Element Information | |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |
| 8 | Interrupt vector table, derived from the hypervisor call parameters. |
| 9 | A state register (SR) value |
| 10 | A logical partition ID (LPID) |
| 11 | A real address (RA) hypervisor accelerator utilization record pointer |
| 12 | The Storage Descriptor Register (SDR) |

The hypervisor may initialize a plurality of accelerator integration slice 490 registers 445.

Figure 4F:
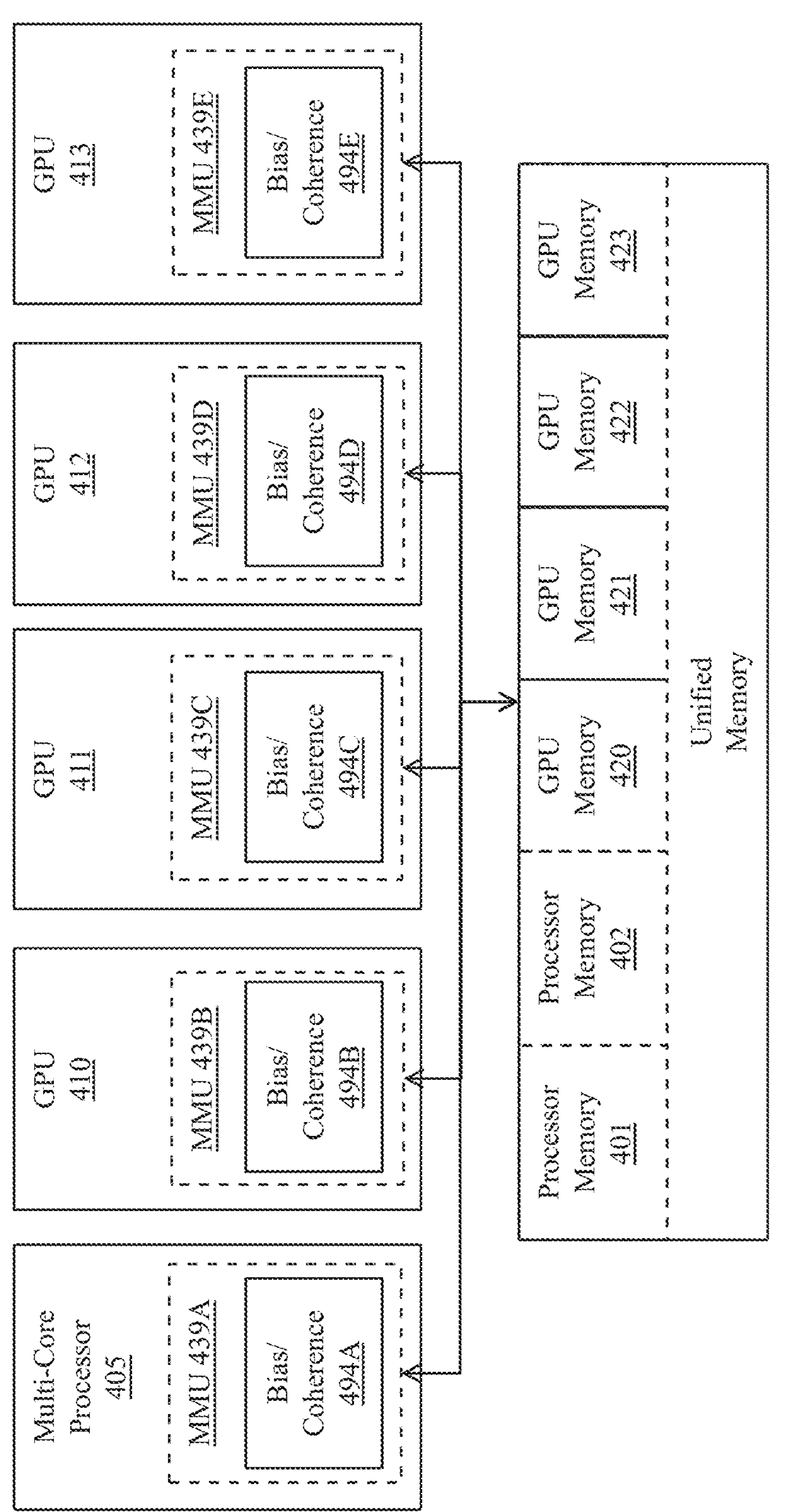

As illustrated in FIG. 4F, in one optional implementation a unified memory addressable via a common virtual memory address space used to access the physical processor memories 401-402 and GPU memories 420-423 is employed. In this implementation, operations executed on the GPUs 410-413 utilize the same virtual/effective memory address space to access the processors memories 401-402 and vice versa, thereby simplifying programmability. A first portion of the virtual/effective address space may be allocated to the processor memory 401, a second portion to the second processor memory 402, a third portion to the GPU memory 420, and so on. The entire virtual/effective memory space (sometimes referred to as the effective address space) may thereby be distributed across each of the processor memories 401-402 and GPU memories 420-423, allowing any processor or GPU to access any physical memory with a virtual address mapped to that memory.

Bias/coherence management circuitry 494A-494E within one or more of the MMUs 439A-439E may be provided that ensures cache coherence between the caches of the host processors (e.g., 405) and the GPUs 410-413 and implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

The GPU-attached memory 420-423 may be mapped as part of system memory, and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

A selection of between GPU bias and host processor bias may be driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). Optionally, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g. OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias, but is not required for the opposite transition.

Cache coherency may be maintained by temporarily rendering GPU-biased pages uncacheable by the host processor 405. To access these pages, the processor 405 may request access from the GPU 410 which may or may not grant access right away, depending on the implementation. Thus, to reduce communication between the host processor 405 and GPU 410 it is beneficial to ensure that GPU-biased pages are those which are required by the GPU but not the host processor 405 and vice versa.

Graphics Processing Pipeline

Figure 5:
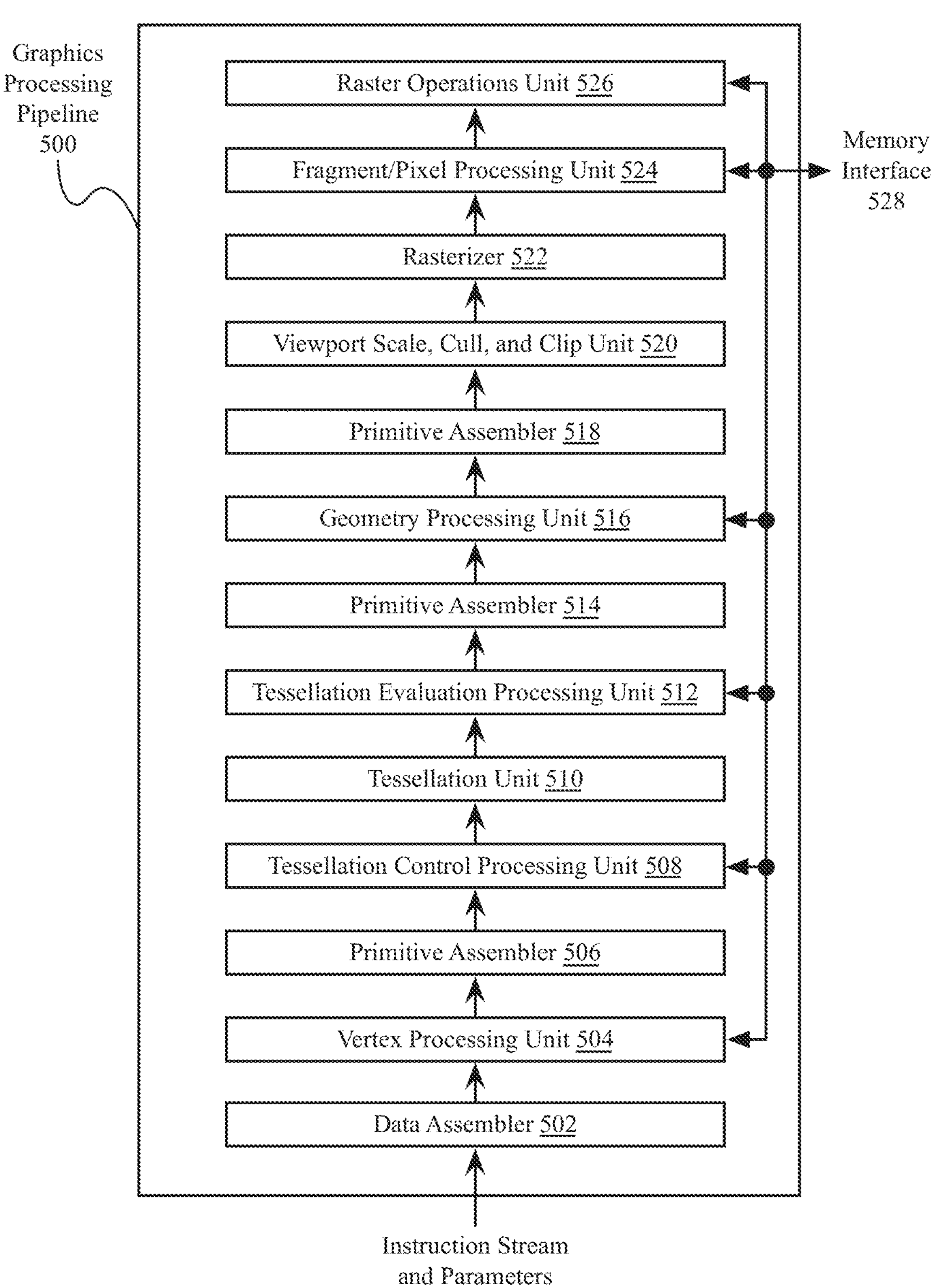
FIG. 5 illustrates a graphics processing pipeline.

FIG. 5 illustrates a graphics processing pipeline 500. A graphics multiprocessor, such as graphics multiprocessor 234 as in FIG. 2D, graphics multiprocessor 325 of FIG. 3A, graphics multiprocessor 350 of FIG. 3B can implement the illustrated graphics processing pipeline 500. The graphics multiprocessor can be included within the parallel processing subsystems as described herein, such as the parallel processor 200 of FIG. 2A, which may be related to the parallel processor(s) 112 of FIG. 1 and may be used in place of one of those. The various parallel processing systems can implement the graphics processing pipeline 500 via one or more instances of the parallel processing unit (e.g., parallel processing unit 202 of FIG. 2A) as described herein. For example, a shader unit (e.g., graphics multiprocessor 234 of FIG. 2C) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 2A) and a corresponding partition unit (e.g., partition unit 220A-220N of FIG. 2A). The graphics processing pipeline 500 may also be implemented using dedicated processing units for one or more functions. It is also possible that one or more portions of the graphics processing pipeline 500 are performed by parallel processing logic within a general-purpose processor (e.g., CPU). Optionally, one or more portions of the graphics processing pipeline 500 can access on-chip memory (e.g., parallel processor memory 222 as in FIG. 2A) via a memory interface 528, which may be an instance of the memory interface 218 of FIG. 2A. The graphics processor pipeline 500 may also be implemented via a multi-core group 365A as in FIG. 3C.

The data assembler 502 is a processing unit that may collect vertex data for surfaces and primitives. The data assembler 502 then outputs the vertex data, including the vertex attributes, to the vertex processing unit 504. The vertex processing unit 504 is a programmable execution unit that executes vertex shader programs, lighting and transforming vertex data as specified by the vertex shader programs. The vertex processing unit 504 reads data that is stored in cache, local or system memory for use in processing the vertex data and may be programmed to transform the vertex data from an object-based coordinate representation to a world space coordinate space or a normalized device coordinate space.

A first instance of a primitive assembler 506 receives vertex attributes from the vertex processing unit 504. The primitive assembler 506 readings stored vertex attributes as needed and constructs graphics primitives for processing by tessellation control processing unit 508. The graphics primitives include triangles, line segments, points, patches, and so forth, as supported by various graphics processing application programming interfaces (APIs).

The tessellation control processing unit 508 treats the input vertices as control points for a geometric patch. The control points are transformed from an input representation from the patch (e.g., the patch's bases) to a representation that is suitable for use in surface evaluation by the tessellation evaluation processing unit 512. The tessellation control processing unit 508 can also compute tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that executes geometry shader programs to transform graphics primitives received from primitive assembler 514 as specified by the geometry shader programs. The geometry processing unit 516 may be programmed to subdivide the graphics primitives into one or more new graphics primitives and calculate parameters used to rasterize the new graphics primitives.

The geometry processing unit 516 may be able to add or delete elements in the geometry stream. The geometry processing unit 516 outputs the parameters and vertices specifying new graphics primitives to primitive assembler 518. The primitive assembler 518 receives the parameters and vertices from the geometry processing unit 516 and constructs graphics primitives for processing by a viewport scale, cull, and clip unit 520. The geometry processing unit 516 reads data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 can perform depth culling and other depth-based optimizations. The rasterizer 522 also performs scan conversion on the new graphics primitives to generate fragments and output those fragments and associated coverage data to the fragment/pixel processing unit 524. The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations included but not limited to texture mapping, shading, blending, texture correction and perspective correction to produce shaded fragments or pixels that are output to a raster operations unit 526. The fragment/pixel processing unit 524 can read data that is stored in either the parallel processor memory or the system memory for use when processing the fragment data. Fragment or pixel shader programs may be configured to shade at sample, pixel, tile, or other granularities depending on the sampling rate configured for the processing units.

The raster operations unit 526 is a processing unit that performs raster operations including, but not limited to stencil, z-test, blending, and the like, and outputs pixel data as processed graphics data to be stored in graphics memory (e.g., parallel processor memory 222 as in FIG. 2A, and/or system memory 104 as in FIG. 1), to be displayed on the one or more display device(s) 110 or for further processing by one of the one or more processor(s) 102 or parallel processor(s) 112. The raster operations unit 526 may be configured to compress z or color data that is written to memory and decompress z or color data that is read from memory.

Machine Learning Overview

The architecture described above can be applied to perform training and inference operations using machine learning models. Machine learning has been successful at solving many kinds of tasks. The computations that arise when training and using machine learning algorithms (e.g., neural networks) lend themselves naturally to efficient parallel implementations. Accordingly, parallel processors such as general-purpose graphic processing units (GPGPUs) have played a significant role in the practical implementation of deep neural networks. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. The efficiency provided by parallel machine learning algorithm implementations allows the use of high capacity networks and enables those networks to be trained on larger datasets.

A machine learning algorithm is an algorithm that can learn based on a set of data. For example, machine learning algorithms can be designed to model high-level abstractions within a data set. For example, image recognition algorithms can be used to determine which of several categories to which a given input belong; regression algorithms can output a numerical value given an input; and pattern recognition algorithms can be used to generate translated text or perform text to speech and/or speech recognition.

An exemplary type of machine learning algorithm is a neural network. There are many types of neural networks; a simple type of neural network is a feedforward network. A feedforward network may be implemented as an acyclic graph in which the nodes are arranged in layers. Typically, a feedforward network topology includes an input layer and an output layer that are separated by at least one hidden layer. The hidden layer transforms input received by the input layer into a representation that is useful for generating output in the output layer. The network nodes are fully connected via edges to the nodes in adjacent layers, but there are no edges between nodes within each layer. Data received at the nodes of an input layer of a feedforward network are propagated (i.e., "fed forward") to the nodes of the output layer via an activation function that calculates the states of the nodes of each successive layer in the network based on coefficients ("weights") respectively associated with each of the edges connecting the layers. Depending on the specific model being represented by the algorithm being executed, the output from the neural network algorithm can take various forms.

Before a machine learning algorithm can be used to model a particular problem, the algorithm is trained using a training data set. Training a neural network involves selecting a network topology, using a set of training data representing a problem being modeled by the network, and adjusting the weights until the network model performs with a minimal error for all instances of the training data set. For example, during a supervised learning training process for a neural network, the output produced by the network in response to the input representing an instance in a training data set is compared to the "correct" labeled output for that instance, an error signal representing the difference between the output and the labeled output is calculated, and the weights associated with the connections are adjusted to minimize that error as the error signal is backward propagated through the layers of the network. The network is considered "trained" when the errors for each of the outputs generated from the instances of the training data set are minimized.

The accuracy of a machine learning algorithm can be affected significantly by the quality of the data set used to train the algorithm. The training process can be computationally intensive and may require a significant amount of time on a conventional general-purpose processor. Accordingly, parallel processing hardware is used to train many types of machine learning algorithms. This is particularly useful for optimizing the training of neural networks, as the computations performed in adjusting the coefficients in neural networks lend themselves naturally to parallel implementations. Specifically, many machine learning algorithms and software applications have been adapted to make use of the parallel processing hardware within general-purpose graphics processing devices.

Figure 6:
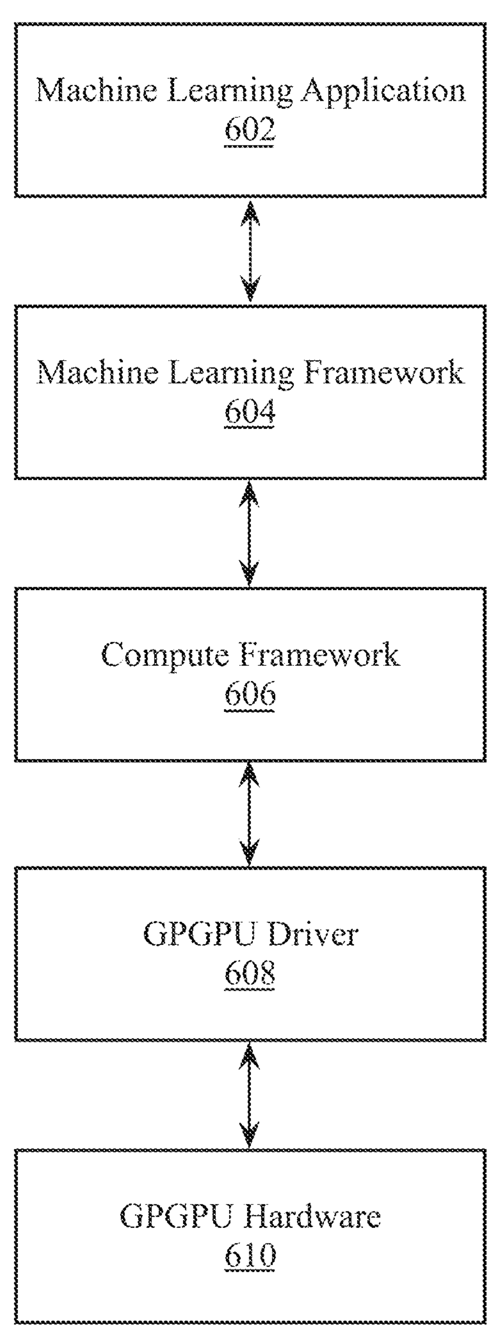
FIG. 6 illustrates a machine learning software stack.

FIG. 6 is a generalized diagram of a machine learning software stack 600. A machine learning application 602 can be configured to train a neural network using a training dataset or to use a trained deep neural network to implement machine intelligence. The machine learning application 602 can include training and inference functionality for a neural network and/or specialized software that can be used to train a neural network before deployment. The machine learning application 602 can implement any type of machine intelligence including but not limited to image recognition, mapping and localization, autonomous navigation, speech synthesis, medical imaging, or language translation.

Hardware acceleration for the machine learning application 602 can be enabled via a machine learning framework 604. The machine learning framework 604 can provide a library of machine learning primitives. Machine learning primitives are basic operations that are commonly performed by machine learning algorithms. Without the machine learning framework 604, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 604. Exemplary primitives include tensor convolutions, activation functions, and pooling, which are computational operations that are performed while training a convolutional neural network (CNN). The machine learning framework 604 can also provide primitives to implement basic linear algebra subprograms performed by many machine-learning algorithms, such as matrix and vector operations.

The machine learning framework 604 can process input data received from the machine learning application 602 and generate the appropriate input to a compute framework 606. The compute framework 606 can abstract the underlying instructions provided to the GPGPU driver 608 to enable the machine learning framework 604 to take advantage of hardware acceleration via the GPGPU hardware 610 without requiring the machine learning framework 604 to have intimate knowledge of the architecture of the GPGPU hardware 610. Additionally, the compute framework 606 can enable hardware acceleration for the machine learning framework 604 across a variety of types and generations of the GPGPU hardware 610.

GPGPU Machine Learning Acceleration

Figure 7:
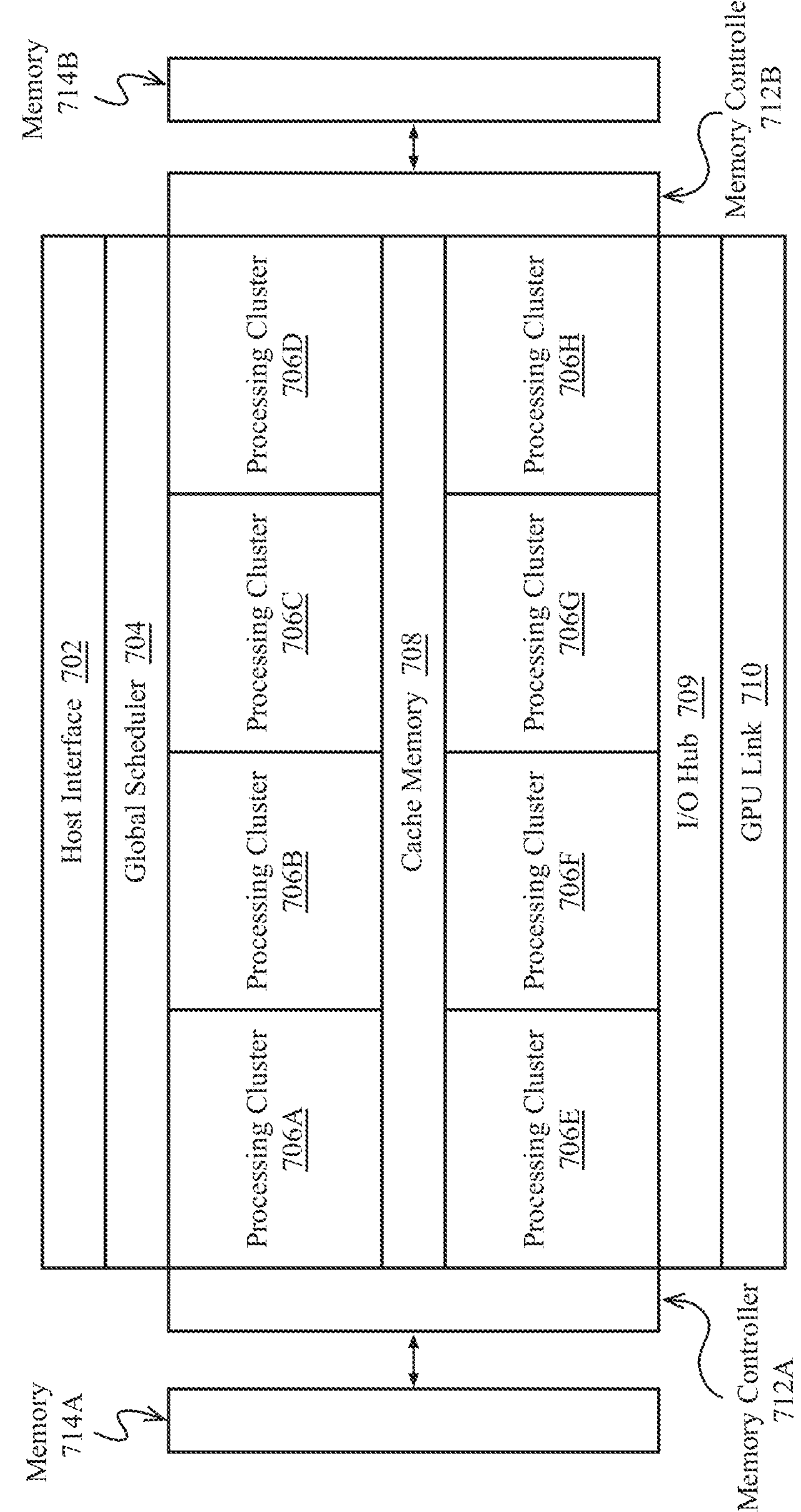
FIG. 7 illustrates a general-purpose graphics processing unit.

FIG. 7 illustrates a general-purpose graphics processing unit 700, which may be the parallel processor 200 of FIG. 2A or the parallel processor(s) 112 of FIG. 1. The general-purpose processing unit (GPGPU) 700 may be configured to be particularly efficient in processing the type of computational workloads associated with training deep neural networks. Additionally, the GPGPU 700 can be linked directly to other instances of the GPGPU to create a multi-GPU cluster to improve training speed for particularly deep neural networks.

The GPGPU 700 includes a host interface 702 to enable a connection with a host processor. The host interface 702 may be a PCI Express interface. However, the host interface can also be a vendor specific communications interface or communications fabric. The GPGPU 700 receives commands from the host processor and uses a global scheduler 704 to distribute execution threads associated with those commands to a set of processing clusters 706A-706H. The processing clusters 706A-706H share a cache memory 708. The cache memory 708 can serve as a higher-level cache for cache memories within the processing clusters 706A-706H. The illustrated processing clusters 706A-706H may correspond with processing clusters 214A-214N as in FIG. 2A.

The GPGPU 700 includes memory 714A-714B coupled with the processing clusters 706A-H via a set of memory controllers 712A-712B. The memory 714A-714B can include various types of memory devices including dynamic random-access memory (DRAM) or graphics random access memory, such as synchronous graphics random access memory (SGRAM), including graphics double data rate (GDDR) memory. The memory 714A-714B may also include 3D stacked memory, including but not limited to high bandwidth memory (HBM).

Each of the processing clusters 706A-706H may include a set of graphics multiprocessors, such as the graphics multiprocessor 234 of FIG. 2D, graphics multiprocessor 325 of FIG. 3A, graphics multiprocessor 350 of FIG. 3B, or may include a multi-core group 365A-365N as in FIG. 3C. The graphics multiprocessors of the compute cluster include multiple types of integer and floating-point logic units that can perform computational operations at a range of precisions including suited for machine learning computations. For example, at least a subset of the floating-point units in each of the processing clusters 706A-706H can be configured to perform 16-bit or 32-bit floating point operations, while a different subset of the floating-point units can be configured to perform 64-bit floating point operations.

Multiple instances of the GPGPU 700 can be configured to operate as a compute cluster. The communication mechanism used by the compute cluster for synchronization and data exchange varies across embodiments. For example, the multiple instances of the GPGPU 700 communicate over the host interface 702. In one embodiment the GPGPU 700 includes an I/O hub 709 that couples the GPGPU 700 with a GPU link 710 that enables a direct connection to other instances of the GPGPU. The GPU link 710 may be coupled to a dedicated GPU-to-GPU bridge that enables communication and synchronization between multiple instances of the GPGPU 700. Optionally, the GPU link 710 couples with a high-speed interconnect to transmit and receive data to other GPGPUs or parallel processors. The multiple instances of the GPGPU 700 may be located in separate data processing systems and communicate via a network device that is accessible via the host interface 702. The GPU link 710 may be configured to enable a connection to a host processor in addition to or as an alternative to the host interface 702.

While the illustrated configuration of the GPGPU 700 can be configured to train neural networks, an alternate configuration of the GPGPU 700 can be configured for deployment within a high performance or low power inferencing platform. In an inferencing configuration, the GPGPU 700 includes fewer of the processing clusters 706A-706H relative to the training configuration. Additionally, memory technology associated with the memory 714A-714B may differ between inferencing and training configurations. In one embodiment, the inferencing configuration of the GPGPU 700 can support inferencing specific instructions. For example, an inferencing configuration can provide support for one or more 8-bit integer dot product instructions, which are commonly used during inferencing operations for deployed neural networks.

Figure 8:
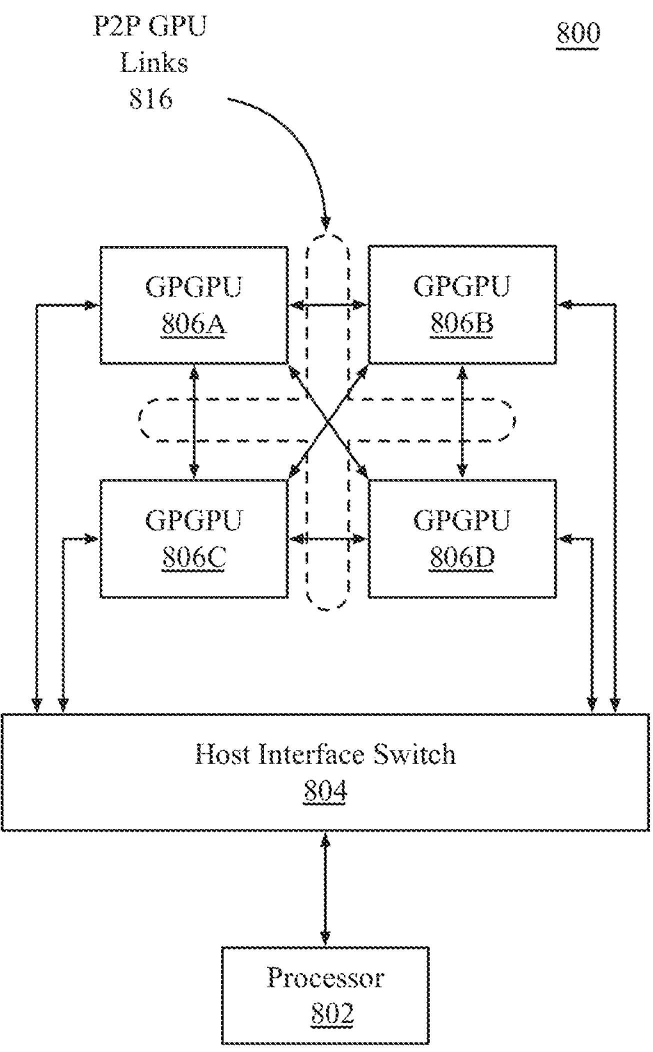
FIG. 8 illustrates a multi-GPU computing system.

FIG. 8 illustrates a multi-GPU computing system 800. The multi-GPU computing system 800 can include a processor 802 coupled to multiple GPGPUs 806A-806D via a host interface switch 804. The host interface switch 804 may be a PCI express switch device that couples the processor 802 to a PCI express bus over which the processor 802 can communicate with the set of GPGPUs 806A-806D. Each of the multiple GPGPUs 806A-806D can be an instance of the GPGPU 700 of FIG. 7. The GPGPUs 806A-806D can interconnect via a set of high-speed point to point GPU to GPU links 816. The high-speed GPU to GPU links can connect to each of the GPGPUs 806A-806D via a dedicated GPU link, such as the GPU link 710 as in FIG. 7. The P2P GPU links 816 enable direct communication between each of the GPGPUs 806A-806D without requiring communication over the host interface bus to which the processor 802 is connected. With GPU-to-GPU traffic directed to the P2P GPU links, the host interface bus remains available for system memory access or to communicate with other instances of the multi-GPU computing system 800, for example, via one or more network devices. While in FIG. 8 the GPGPUs 806A-806D connect to the processor 802 via the host interface switch 804, the processor 802 may alternatively include direct support for the P2P GPU links 816 and connect directly to the GPGPUs 806A-806D.

Machine Learning Neural Network Implementations

The computing architecture described herein can be configured to perform the types of parallel processing that is particularly suited for training and deploying neural networks for machine learning. A neural network can be generalized as a network of functions having a graph relationship. As is well-known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for an RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described below present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front-end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

Figure 9A:
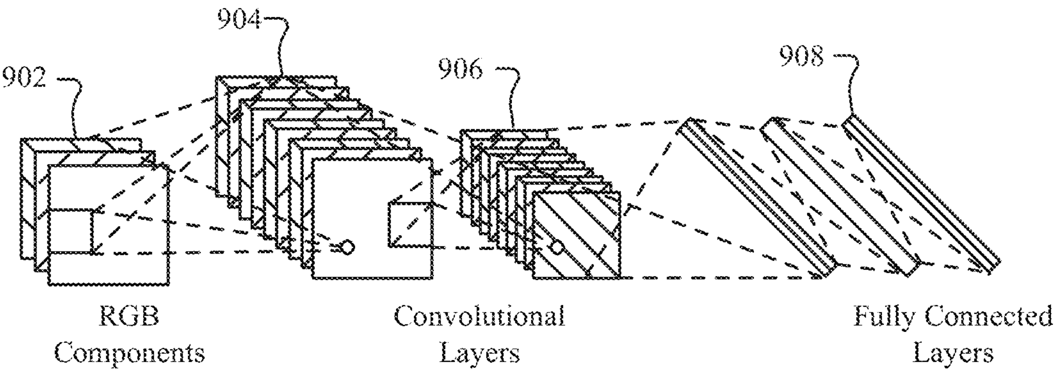
FIG. 9A-9B illustrate layers of exemplary deep neural networks.
Figure 9B:
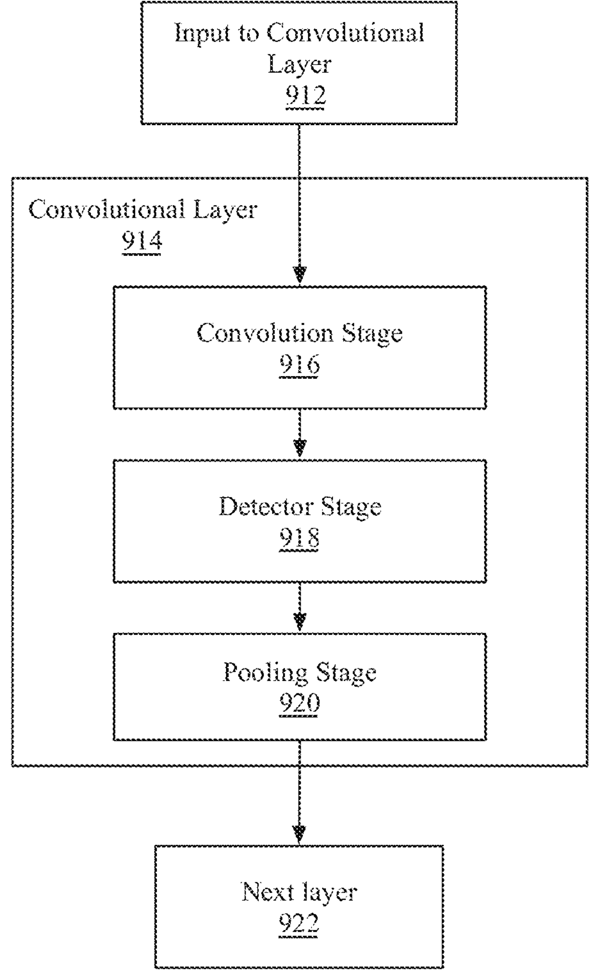

FIG. 9A-9B illustrate an exemplary convolutional neural network. FIG. 9A illustrates various layers within a CNN. As shown in FIG. 9A, an exemplary CNN used to model image processing can receive input 902 describing the red, green, and blue (RGB) components of an input image. The input 902 can be processed by multiple convolutional layers (e.g., convolutional layer 904, convolutional layer 906). The output from the multiple convolutional layers may optionally be processed by a set of fully connected layers 908. Neurons in a fully connected layer have full connections to all activations in the previous layer, as previously described for a feedforward network. The output from the fully connected layers 908 can be used to generate an output result from the network. The activations within the fully connected layers 908 can be computed using matrix multiplication instead of convolution. Not all CNN implementations make use of fully connected layers 908. For example, in some implementations the convolutional layer 906 can generate output for the CNN.

The convolutional layers are sparsely connected, which differs from traditional neural network configuration found in the fully connected layers 908. Traditional neural network layers are fully connected, such that every output unit interacts with every input unit. However, the convolutional layers are sparsely connected because the output of the convolution of a field is input (instead of the respective state value of each of the nodes in the field) to the nodes of the subsequent layer, as illustrated. The kernels associated with the convolutional layers perform convolution operations, the output of which is sent to the next layer. The dimensionality reduction performed within the convolutional layers is one aspect that enables the CNN to scale to process large images.

FIG. 9B illustrates exemplary computation stages within a convolutional layer of a CNN. Input to a convolutional layer 912 of a CNN can be processed in three stages of a convolutional layer 914. The three stages can include a convolution stage 916, a detector stage 918, and a pooling stage 920. The convolution layer 914 can then output data to a successive convolutional layer. The final convolutional layer of the network can generate output feature map data or provide input to a fully connected layer, for example, to generate a classification value for the input to the CNN.

In the convolution stage 916 performs several convolutions in parallel to produce a set of linear activations. The convolution stage 916 can include an affine transformation, which is any transformation that can be specified as a linear transformation plus a translation. Affine transformations include rotations, translations, scaling, and combinations of these transformations. The convolution stage computes the output of functions (e.g., neurons) that are connected to specific regions in the input, which can be determined as the local region associated with the neuron. The neurons compute a dot product between the weights of the neurons and the region in the local input to which the neurons are connected. The output from the convolution stage 916 defines a set of linear activations that are processed by successive stages of the convolutional layer 914.

The linear activations can be processed by a detector stage 918. In the detector stage 918, each linear activation is processed by a non-linear activation function. The non-linear activation function increases the nonlinear properties of the overall network without affecting the receptive fields of the convolution layer. Several types of non-linear activation functions may be used. One particular type is the rectified linear unit (ReLU), which uses an activation function defined as $f(x)=\max(0,x)$, such that the activation is thresholded at zero.

The pooling stage 920 uses a pooling function that replaces the output of the convolutional layer 906 with a summary statistic of the nearby outputs. The pooling function can be used to introduce translation invariance into the neural network, such that small translations to the input do not change the pooled outputs. Invariance to local translation can be useful in scenarios where the presence of a feature in the input data is more important than the precise location of the feature. Various types of pooling functions can be used during the pooling stage 920, including max pooling, average pooling, and 12-norm pooling. Additionally, some CNN implementations do not include a pooling stage. Instead, such implementations substitute and additional convolution stage having an increased stride relative to previous convolution stages.

The output from the convolutional layer 914 can then be processed by the next layer 922. The next layer 922 can be an additional convolutional layer or one of the fully connected layers 908. For example, the first convolutional layer 904 of FIG. 9A can output to the second convolutional layer 906, while the second convolutional layer can output to a first layer of the fully connected layers 908.

Figure 10:
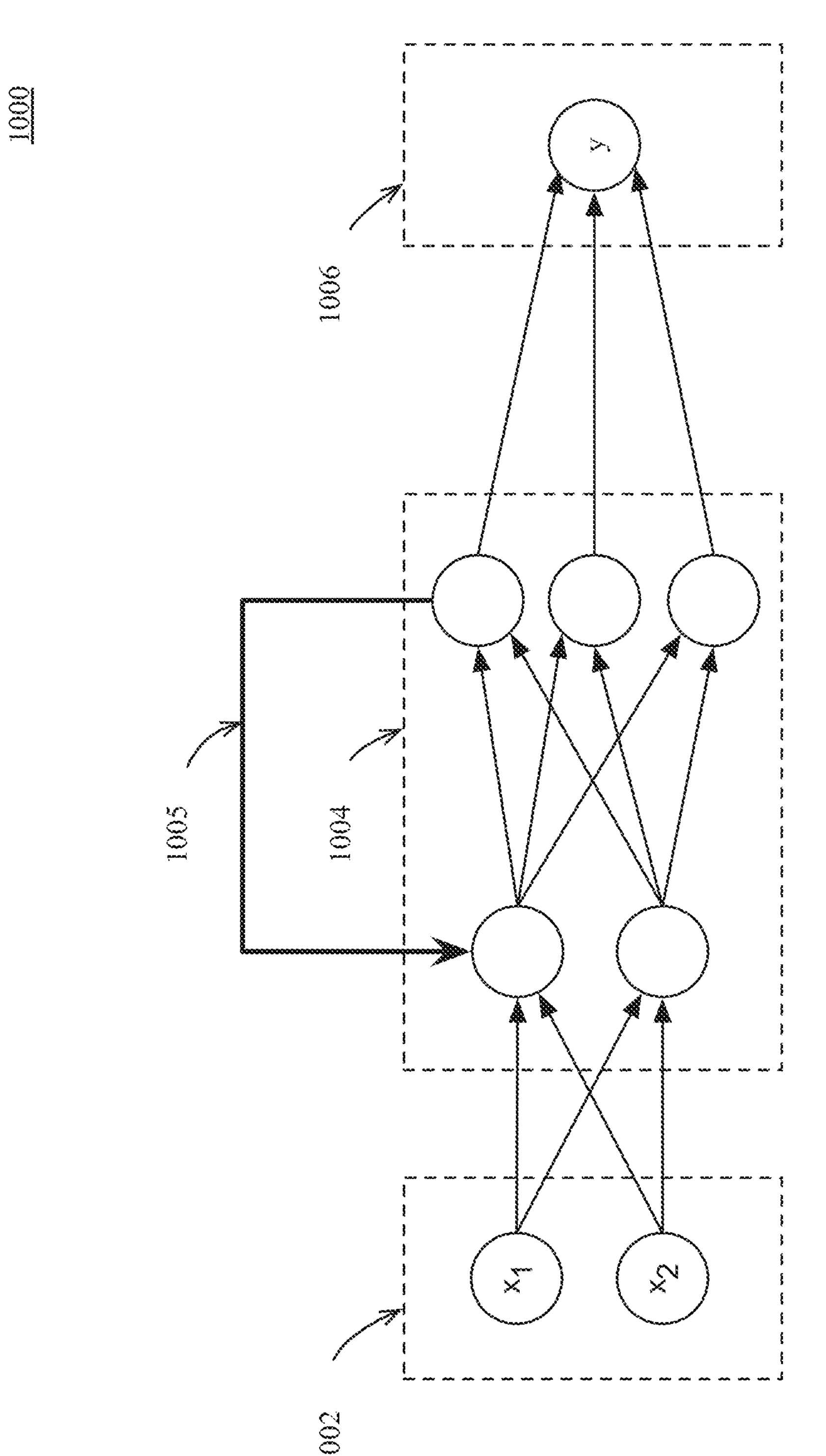
FIG. 10 illustrates an exemplary recurrent neural network.

FIG. 10 illustrates an exemplary recurrent neural network 1000. In a recurrent neural network (RNN), the previous state of the network influences the output of the current state of the network. RNNs can be built in a variety of ways using a variety of functions. The use of RNNs generally revolves around using mathematical models to predict the future based on a prior sequence of inputs. For example, an RNN may be used to perform statistical language modeling to predict an upcoming word given a previous sequence of words. The illustrated RNN 1000 can be described has having an input layer 1002 that receives an input vector, hidden layers 1004 to implement a recurrent function, a feedback mechanism 1005 to enable a 'memory' of previous states, and an output layer 1006 to output a result. The RNN 1000 operates based on time-steps. The state of the RNN at a given time step is influenced based on the previous time step via the feedback mechanism 1005. For a given time step, the state of the hidden layers 1004 is defined by the previous state and the input at the current time step. An initial input ($x_1$) at a first time step can be processed by the hidden layer 1004. A second input ($x_2$) can be processed by the hidden layer 1004 using state information that is determined during the processing of the initial input ($x_1$). A given state can be computed as $s_t=f(Ux_t++Ws_t-1)$, where U and W are parameter matrices. The function $f$ is generally a nonlinearity, such as the hyperbolic tangent function (Tanh) or a variant of the rectifier function $f(x)=\max(0,x)$. However, the specific mathematical function used in the hidden layers 1004 can vary depending on the specific implementation details of the RNN 1000.

In addition to the basic CNN and RNN networks described, variations on those networks may be enabled. One example RNN variant is the long short term memory (LSTM) RNN. LSTM RNNs are capable of learning long-term dependencies that may be necessary for processing longer sequences of language. A variant on the CNN is a convolutional deep belief network, which has a structure similar to a CNN and is trained in a manner similar to a deep belief network. A deep belief network (DBN) is a generative neural network that is composed of multiple layers of stochastic (random) variables. DBNs can be trained layer-by-layer using greedy unsupervised learning. The learned weights of the DBN can then be used to provide pre-train neural networks by determining an optimal initial set of weights for the neural network.

Figure 11:
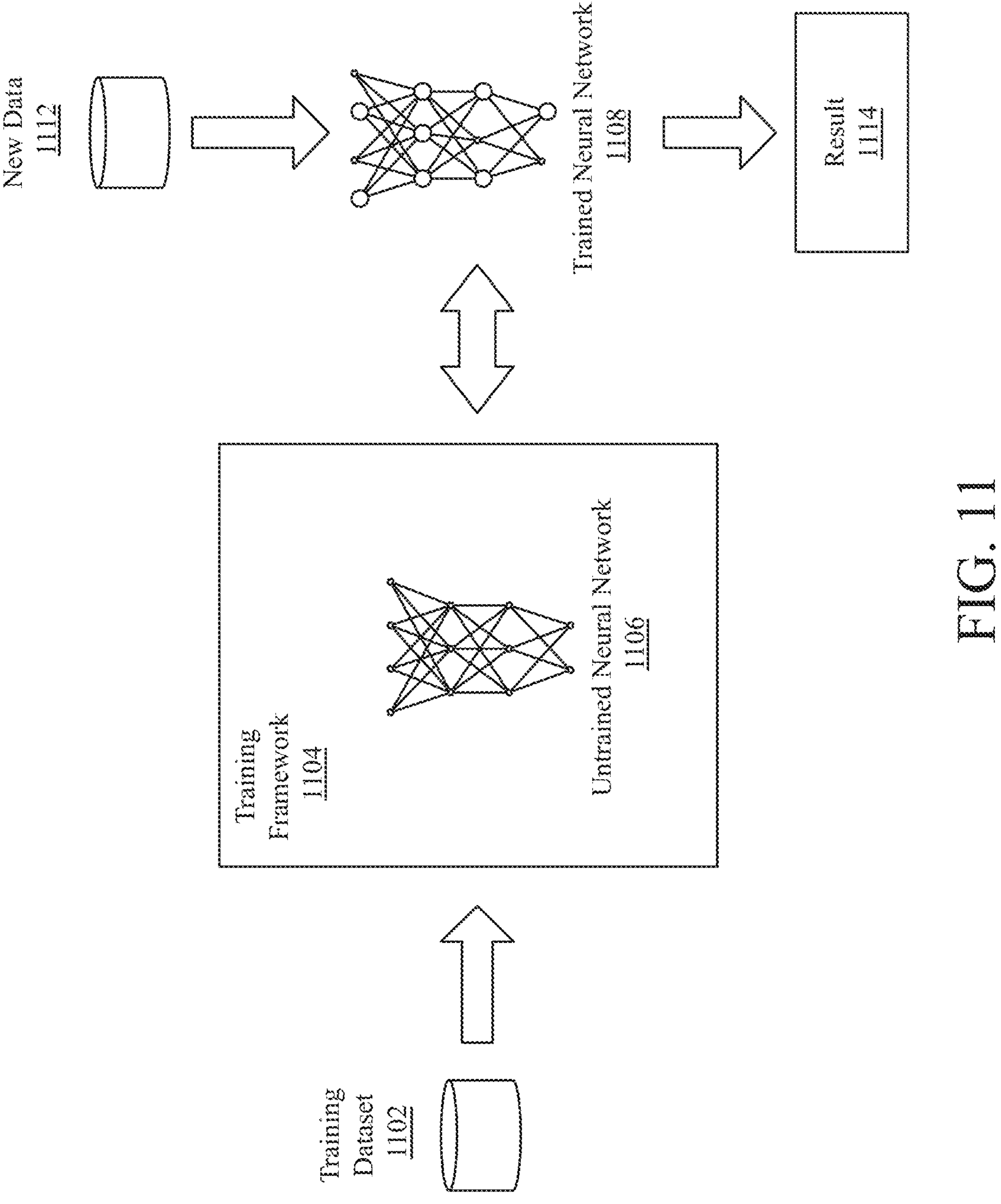
FIG. 11 illustrates training and deployment of a deep neural network.

FIG. 11 illustrates training and deployment of a deep neural network. Once a given network has been structured for a task the neural network is trained using a training dataset 1102. Various training frameworks 1104 have been developed to enable hardware acceleration of the training process. For example, the machine learning framework 604 of FIG. 6 may be configured as a training framework 604. The training framework 604 can hook into an untrained neural network 1106 and enable the untrained neural net to be trained using the parallel processing resources described herein to generate a trained neural net 1108.

To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1102 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1104 can adjust to adjust the weights that control the untrained neural network 1106. The training framework 1104 can provide tools to monitor how well the untrained neural network 1106 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural net 1108. The trained neural network 1108 can then be deployed to implement any number of machine learning operations to generate an inference result 1114 based on input of new data 1112.

Unsupervised learning is a learning method in which the network attempts to train itself using unlabeled data. Thus, for unsupervised learning the training dataset 1102 will include input data without any associated output data. The untrained neural network 1106 can learn groupings within the unlabeled input and can determine how individual inputs are related to the overall dataset. Unsupervised training can be used to generate a self-organizing map, which is a type of trained neural network 1108 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1102 includes a mix of labeled and unlabeled data of the same distribution. Incremental learning is a variant of supervised learning in which input data is continuously used to further train the model. Incremental learning enables the trained neural network 1108 to adapt to the new data 1112 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

Figure 12:
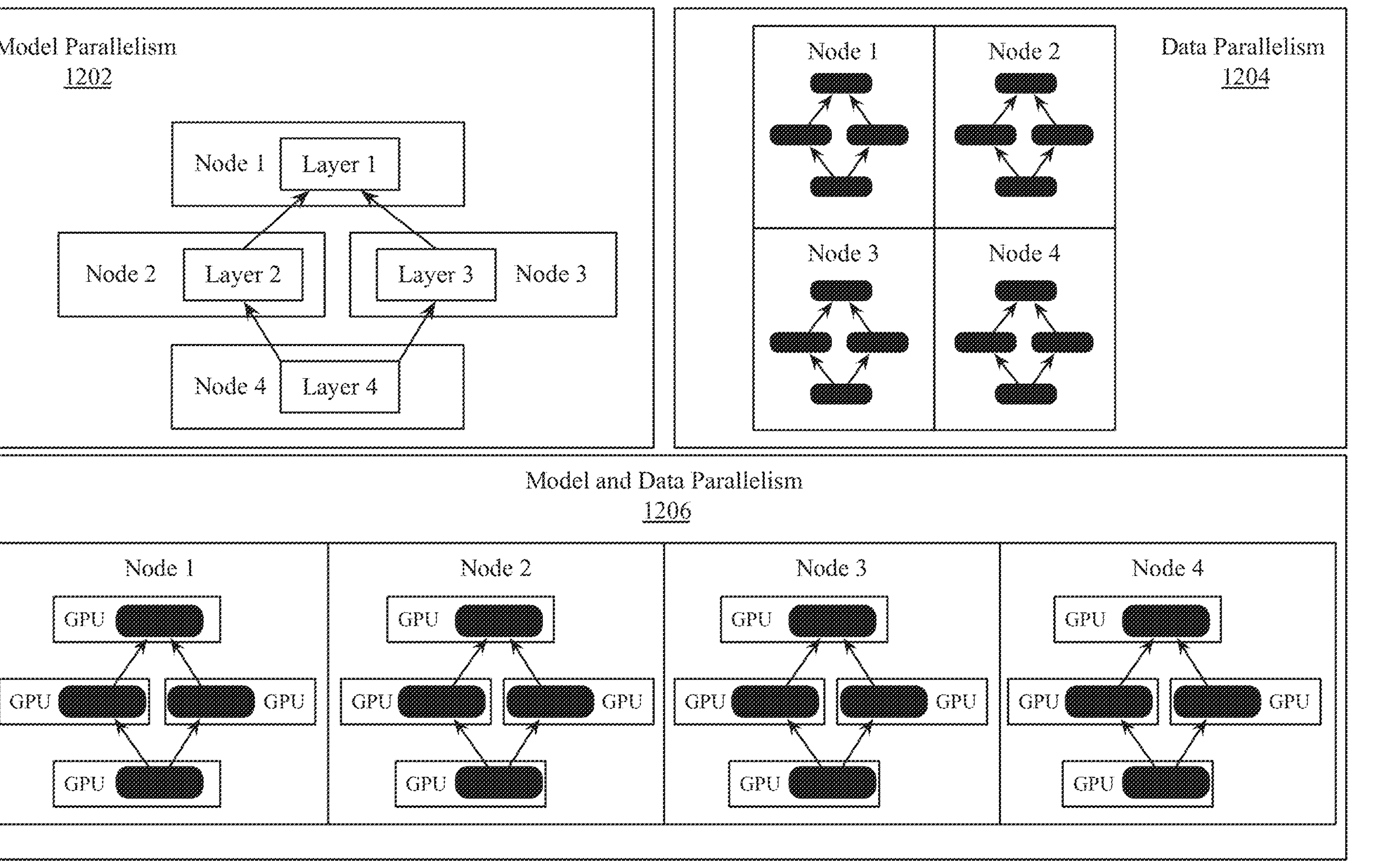
FIG. 12 is a block diagram illustrating distributed learning.

FIG. 12 is a block diagram illustrating distributed learning. Distributed learning is a training model that uses multiple distributed computing nodes to perform supervised or unsupervised training of a neural network. The distributed computational nodes can each include one or more host processors and one or more of the general-purpose processing nodes, such as the highly parallel general-purpose graphics processing unit 700 as in FIG. 7. As illustrated, distributed learning can be performed model parallelism 1202, data parallelism 1204, or a combination of model and data parallelism 1204.

In model parallelism 1202, different computational nodes in a distributed system can perform training computations for different parts of a single network. For example, each layer of a neural network can be trained by a different processing node of the distributed system. The benefits of model parallelism include the ability to scale to particularly large models. Splitting the computations associated with different layers of the neural network enables the training of very large neural networks in which the weights of all layers would not fit into the memory of a single computational node. In some instances, model parallelism can be particularly useful in performing unsupervised training of large neural networks.

In data parallelism 1204, the different nodes of the distributed network have a complete instance of the model and each node receives a different portion of the data. The results from the different nodes are then combined. While different approaches to data parallelism are possible, data parallel training approaches all require a technique of combining results and synchronizing the model parameters between each node. Exemplary approaches to combining data include parameter averaging and update based data parallelism. Parameter averaging trains each node on a subset of the training data and sets the global parameters (e.g., weights, biases) to the average of the parameters from each node. Parameter averaging uses a central parameter server that maintains the parameter data. Update based data parallelism is similar to parameter averaging except that instead of transferring parameters from the nodes to the parameter server, the updates to the model are transferred. Additionally, update based data parallelism can be performed in a decentralized manner, where the updates are compressed and transferred between nodes.

Combined model and data parallelism 1206 can be implemented, for example, in a distributed system in which each computational node includes multiple GPUs. Each node can have a complete instance of the model with separate GPUs within each node are used to train different portions of the model.

Distributed training has increased overhead relative to training on a single machine. However, the parallel processors and GPGPUs described herein can each implement various techniques to reduce the overhead of distributed training, including techniques to enable high bandwidth GPU-to-GPU data transfer and accelerated remote data synchronization.

Exemplary Machine Learning Applications

Machine learning can be applied to solve a variety of technological problems, including but not limited to computer vision, autonomous driving and navigation, speech recognition, and language processing. Computer vision has traditionally been one of the most active research areas for machine learning applications. Applications of computer vision range from reproducing human visual abilities, such as recognizing faces, to creating new categories of visual abilities. For example, computer vision applications can be configured to recognize sound waves from the vibrations induced in objects visible in a video. Parallel processor accelerated machine learning enables computer vision applications to be trained using significantly larger training dataset than previously feasible and enables inferencing systems to be deployed using low power parallel processors.

Parallel processor accelerated machine learning has autonomous driving applications including lane and road sign recognition, obstacle avoidance, navigation, and driving control. Accelerated machine learning techniques can be used to train driving models based on datasets that define the appropriate responses to specific training input. The parallel processors described herein can enable rapid training of the increasingly complex neural networks used for autonomous driving solutions and enables the deployment of low power inferencing processors in a mobile platform suitable for integration into autonomous vehicles.

Parallel processor accelerated deep neural networks have enabled machine learning approaches to automatic speech recognition (ASR). ASR includes the creation of a function that computes the most probable linguistic sequence given an input acoustic sequence. Accelerated machine learning using deep neural networks have enabled the replacement of the hidden Markov models (HMMs) and Gaussian mixture models (GMMs) previously used for ASR.

Parallel processor accelerated machine learning can also be used to accelerate natural language processing. Automatic learning procedures can make use of statistical inference algorithms to produce models that are robust to erroneous or unfamiliar input. Exemplary natural language processor applications include automatic machine translation between human languages.

The parallel processing platforms used for machine learning can be divided into training platforms and deployment platforms. Training platforms are generally highly parallel and include optimizations to accelerate multi-GPU single node training and multi-node, multi-GPU training. Exemplary parallel processors suited for training include the general-purpose graphics processing unit 700 of FIG. 7 and the multi-GPU computing system 800 of FIG. 8. On the contrary, deployed machine learning platforms generally include lower power parallel processors suitable for use in products such as cameras, autonomous robots, and autonomous vehicles.

Figure 13:
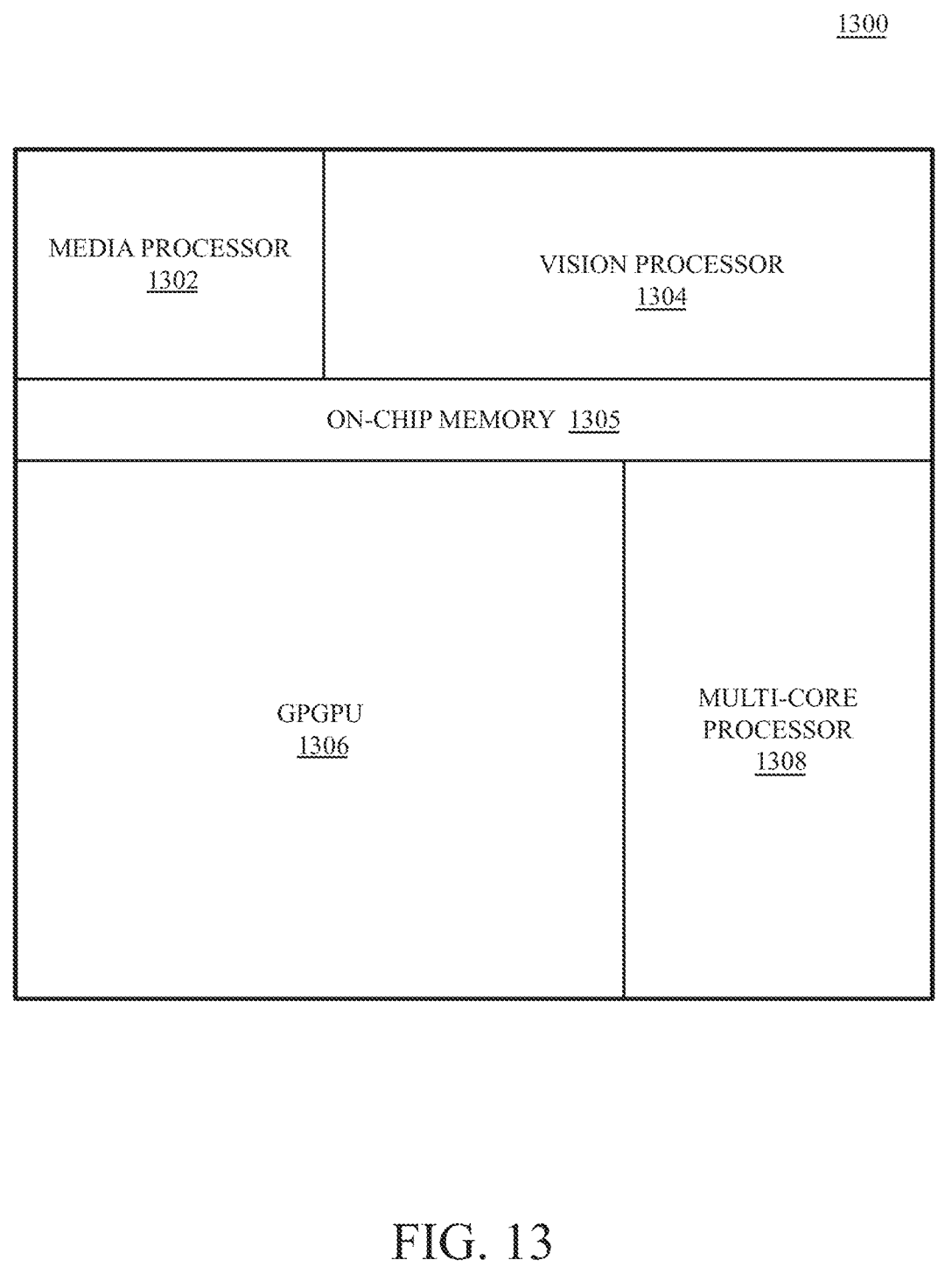

FIG. 13 illustrates an exemplary inferencing system on a chip (SOC) 1300 suitable for performing inferencing using a trained model. The SOC 1300 can integrate processing components including a media processor 1302, a vision processor 1304, a GPGPU 1306 and a multi-core processor 1308. The GPGPU 1306 may be a GPGPU as described herein, such as the GPGPU 700, and the multi-core processor 1308 may be a multi-core processor described herein, such as the multi-core processors 405-406. The SOC 1300 can additionally include on-chip memory 1305 that can enable a shared on-chip data pool that is accessible by each of the processing components. The processing components can be optimized for low power operation to enable deployment to a variety of machine learning platforms, including autonomous vehicles and autonomous robots. For example, one implementation of the SOC 1300 can be used as a portion of the main control system for an autonomous vehicle. Where the SOC 1300 is configured for use in autonomous vehicles the SOC is designed and configured for compliance with the relevant functional safety standards of the deployment jurisdiction.

During operation, the media processor 1302 and vision processor 1304 can work in concert to accelerate computer vision operations. The media processor 1302 can enable low latency decode of multiple high-resolution (e.g., 4K, 8K) video streams. The decoded video streams can be written to a buffer in the on-chip-memory 1305. The vision processor 1304 can then parse the decoded video and perform preliminary processing operations on the frames of the decoded video in preparation of processing the frames using a trained image recognition model. For example, the vision processor 1304 can accelerate convolution operations for a CNN that is used to perform image recognition on the high-resolution video data, while back end model computations are performed by the GPGPU 1306.

The multi-core processor 1308 can include control logic to assist with sequencing and synchronization of data transfers and shared memory operations performed by the media processor 1302 and the vision processor 1304. The multi-core processor 1308 can also function as an application processor to execute software applications that can make use of the inferencing compute capability of the GPGPU 1306. For example, at least a portion of the navigation and driving logic can be implemented in software executing on the multi-core processor 1308. Such software can directly issue computational workloads to the GPGPU 1306 or the computational workloads can be issued to the multi-core processor 1308, which can offload at least a portion of those operations to the GPGPU 1306.

The GPGPU 1306 can include compute clusters such as a low power configuration of the processing clusters 706A-706H within general-purpose graphics processing unit 700. The compute clusters within the GPGPU 1306 can support instruction that are specifically optimized to perform inferencing computations on a trained neural network. For example, the GPGPU 1306 can support instructions to perform low precision computations such as 8-bit and 4-bit integer vector operations.

Additional System Overview

Figure 14:
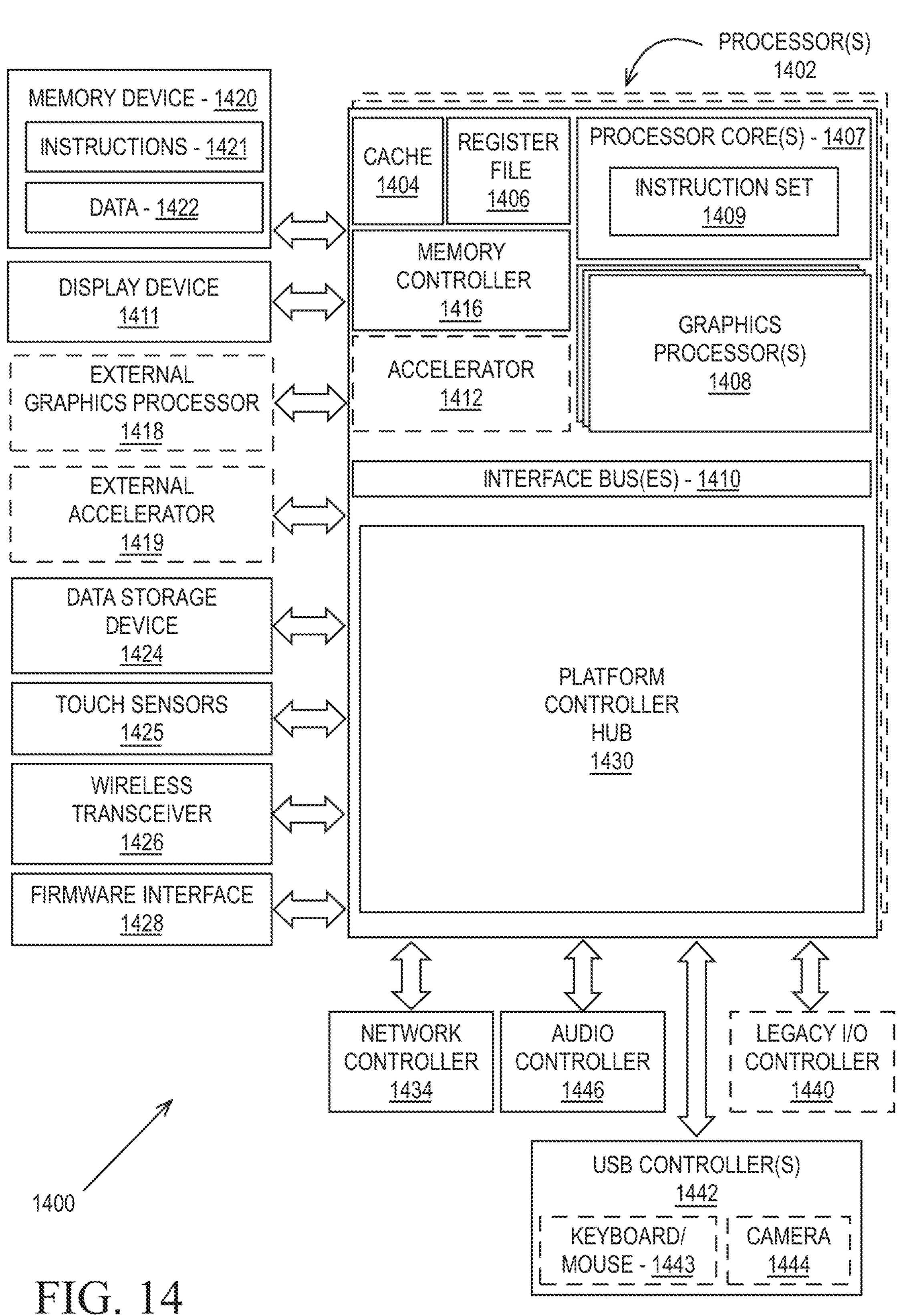
FIG. 14 is a block diagram of a processing system.

FIG. 14 is a block diagram of a processing system 1400. The elements of FIG. 14 having the same or similar names as the elements of any other figure herein describe the same elements as in the other figures, can operate or function in a manner similar to that, can comprise the same components, and can be linked to other entities, as those described elsewhere herein, but are not limited to such. System 1400 may be used in a single processor desktop system, a multiprocessor workstation system, or a server system having a large number of processors 1402 or processor cores 1407. The system 1400 may be a processing platform incorporated within a system-on-a-chip (SoC) integrated circuit for use in mobile, handheld, or embedded devices such as within Internet-of-things (IoT) devices with wired or wireless connectivity to a local or wide area network.

The system 1400 may be a processing system having components that correspond with those of FIG. 1. For example, in different configurations, processor(s) 1402 or processor core(s) 1407 may correspond with processor(s) 102 of FIG. 1. Graphics processor(s) 1408 may correspond with parallel processor(s) 112 of FIG. 1. External graphics processor 1418 may be one of the add-in device(s) 120 of FIG. 1.

The system 1400 can include, couple with, or be integrated within: a server-based gaming platform; a game console, including a game and media console; a mobile gaming console, a handheld game console, or an online game console. The system 1400 may be part of a mobile phone, smart phone, tablet computing device or mobile Internet-connected device such as a laptop with low internal storage capacity. Processing system 1400 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. The processing system 1400 may include or be part of a television or set top box device. The system 1400 can include, couple with, or be integrated within a self-driving vehicle such as a bus, tractor trailer, car, motor or electric power cycle, plane or glider (or any combination thereof). The self-driving vehicle may use system 1400 to process the environment sensed around the vehicle.

The one or more processors 1402 may include one or more processor cores 1407 to process instructions which, when executed, perform operations for system or user software. The least one of the one or more processor cores 1407 may be configured to process a specific instruction set 1409. The instruction set 1409 may facilitate Complex Instruction Set Computing (CISC), Reduced Instruction Set Computing (RISC), or computing via a Very Long Instruction Word (VLIW). One or more processor cores 1407 may process a different instruction set 1409, which may include instructions to facilitate the emulation of other instruction sets. Processor core 1407 may also include other processing devices, such as a Digital Signal Processor (DSP).

The processor 1402 may include cache memory 1404. Depending on the architecture, the processor 1402 can have a single internal cache or multiple levels of internal cache. In some embodiments, the cache memory is shared among various components of the processor 1402. In some embodiments, the processor 1402 also uses an external cache (e.g., a Level-3 (L3) cache or Last Level Cache (LLC)) (not shown), which may be shared among processor cores 1407 using known cache coherency techniques. A register file 1406 can be additionally included in processor 1402 and may include different types of registers for storing different types of data (e.g., integer registers, floating point registers, status registers, and an instruction pointer register). Some registers may be general-purpose registers, while other registers may be specific to the design of the processor 1402.

The one or more processor(s) 1402 may be coupled with one or more interface bus(es) 1410 to transmit communication signals such as address, data, or control signals between processor 1402 and other components in the system 1400. The interface bus 1410, in one of these embodiments, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. For example, the processor(s) 1402 may include an integrated memory controller 1416 and a platform controller hub 1430. The memory controller 1416 facilitates communication between a memory device and other components of the system 1400, while the platform controller hub (PCH) 1430 provides connections to I/O devices via a local I/O bus.

The memory device 1420 can be a dynamic random-access memory (DRAM) device, a static random-access memory (SRAM) device, flash memory device, phase-change memory device, or some other memory device having suitable performance to serve as process memory. The memory device 1420 can, for example, operate as system memory for the system 1400, to store data 1422 and instructions 1421 for use when the one or more processors 1402 executes an application or process. Memory controller 1416 also couples with an optional external graphics processor 1418, which may communicate with the one or more graphics processors 1408 in processors 1402 to perform graphics and media operations. In some embodiments, graphics, media, and or compute operations may be assisted by an accelerator 1412 which is a coprocessor that can be configured to perform a specialized set of graphics, media, or compute operations. For example, the accelerator 1412 may be a matrix multiplication accelerator used to optimize machine learning or compute operations. The accelerator 1412 can be a ray-tracing accelerator that can be used to perform ray-tracing operations in concert with the graphics processor 1408. In one embodiment, an external accelerator 1419 may be used in place of or in concert with the accelerator 1412.

A display device 1411 may be provided that can connect to the processor(s) 1402. The display device 1411 can be one or more of an internal display device, as in a mobile electronic device or a laptop device or an external display device attached via a display interface (e.g., DisplayPort, etc.). The display device 1411 can be a head mounted display (HMD) such as a stereoscopic display device for use in virtual reality (VR) applications or augmented reality (AR) applications.

The platform controller hub 1430 may enable peripherals to connect to memory device 1420 and processor 1402 via a high-speed I/O bus. The I/O peripherals include, but are not limited to, an audio controller 1446, a network controller 1434, a firmware interface 1428, a wireless transceiver 1426, touch sensors 1425, a data storage device 1424 (e.g., non-volatile memory, volatile memory, hard disk drive, flash memory, NAND, 3D NAND, 3D XPoint/Optane, etc.). The data storage device 1424 can connect via a storage interface (e.g., SATA) or via a peripheral bus, such as a Peripheral Component Interconnect bus (e.g., PCI, PCI express). The touch sensors 1425 can include touch screen sensors, pressure sensors, or fingerprint sensors. The wireless transceiver 1426 can be a Wi-Fi transceiver, a Bluetooth transceiver, or a mobile network transceiver such as a 3G, 4G, 5G, or Long-Term Evolution (LTE) transceiver. The firmware interface 1428 enables communication with system firmware, and can be, for example, a unified extensible firmware interface (UEFI). The network controller 1434 can enable a network connection to a wired network. In some embodiments, a high-performance network controller (not shown) couples with the interface bus 1410. The audio controller 1446 may be a multi-channel high definition audio controller. In some of these embodiments the system 1400 includes an optional legacy I/O controller 1440 for coupling legacy (e.g., Personal System 2 (PS/2)) devices to the system. The platform controller hub 1430 can also connect to one or more Universal Serial Bus (USB) controllers 1442 connect input devices, such as keyboard and mouse 1443 combinations, a camera 1444, or other USB input devices.

It will be appreciated that the system 1400 shown is exemplary and not limiting, as other types of data processing systems that are differently configured may also be used. For example, an instance of the memory controller 1416 and platform controller hub 1430 may be integrated into a discreet external graphics processor, such as the external graphics processor 1418. The platform controller hub 1430 and/or memory controller 1416 may be external to the one or more processor(s) 1402. For example, the system 1400 can include an external memory controller 1416 and platform controller hub 1430, which may be configured as a memory controller hub and peripheral controller hub within a system chipset that is in communication with the processor(s) 1402.

For example, circuit boards ("sleds") can be used on which components such as CPUs, memory, and other components are placed are designed for increased thermal performance. Processing components such as the processors may be located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICS, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to system 1400 or any component or system described herein. In one example, the power supply includes an AC to DC (alternating current to direct current) adapter to plug into a wall outlet. Such AC power can be renewable energy (e.g., solar power) power source. In one example, the power source includes a DC power source, such as an external AC to DC converter. A power source or power supply may also include wireless charging hardware to charge via proximity to a charging field. The power source can include an internal battery, alternating current supply, motion-based power supply, solar power supply, or fuel cell source.

Figure 15A:
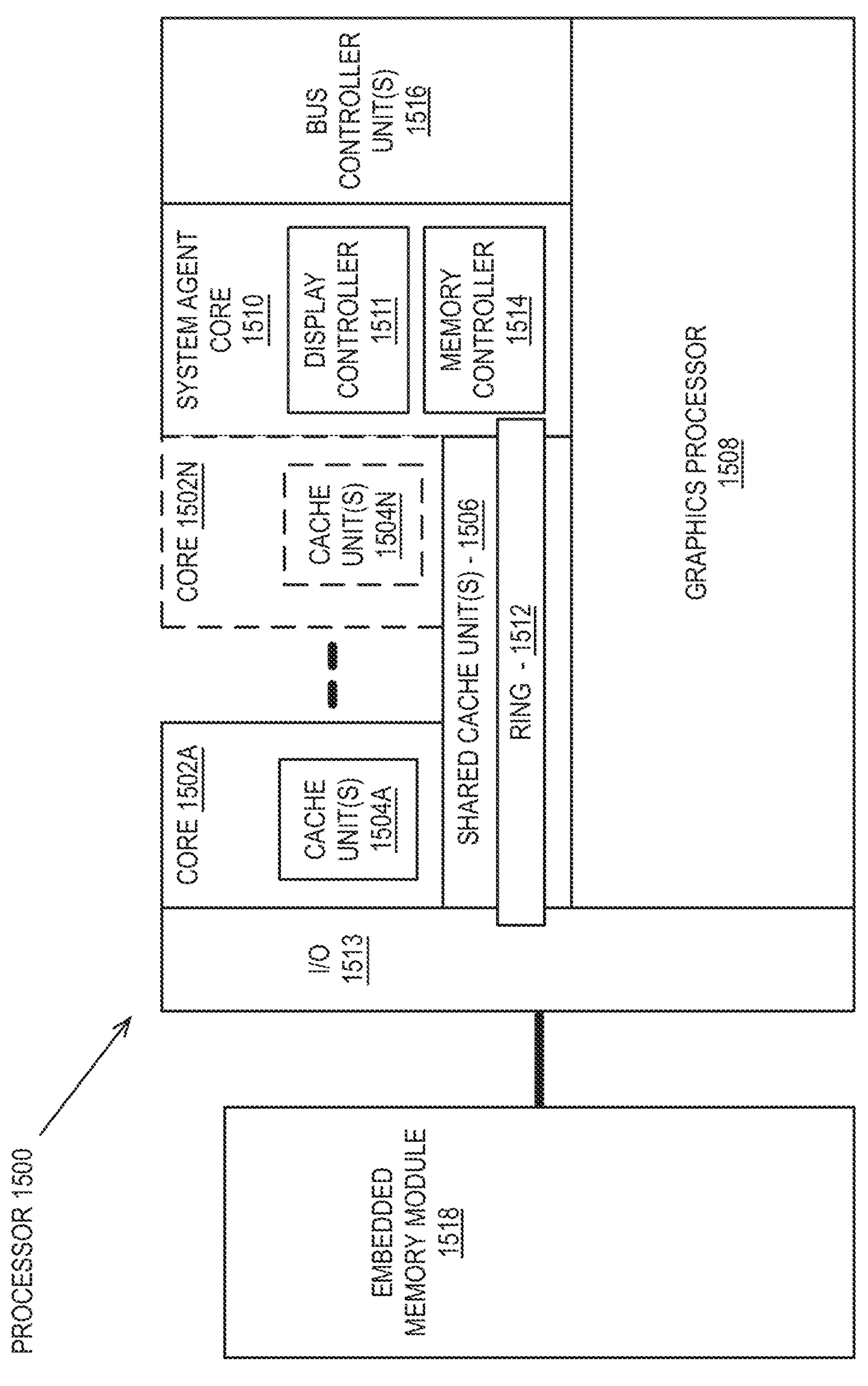
FIG. 15A-15C illustrate computing systems and graphics processors.
Figure 15B:
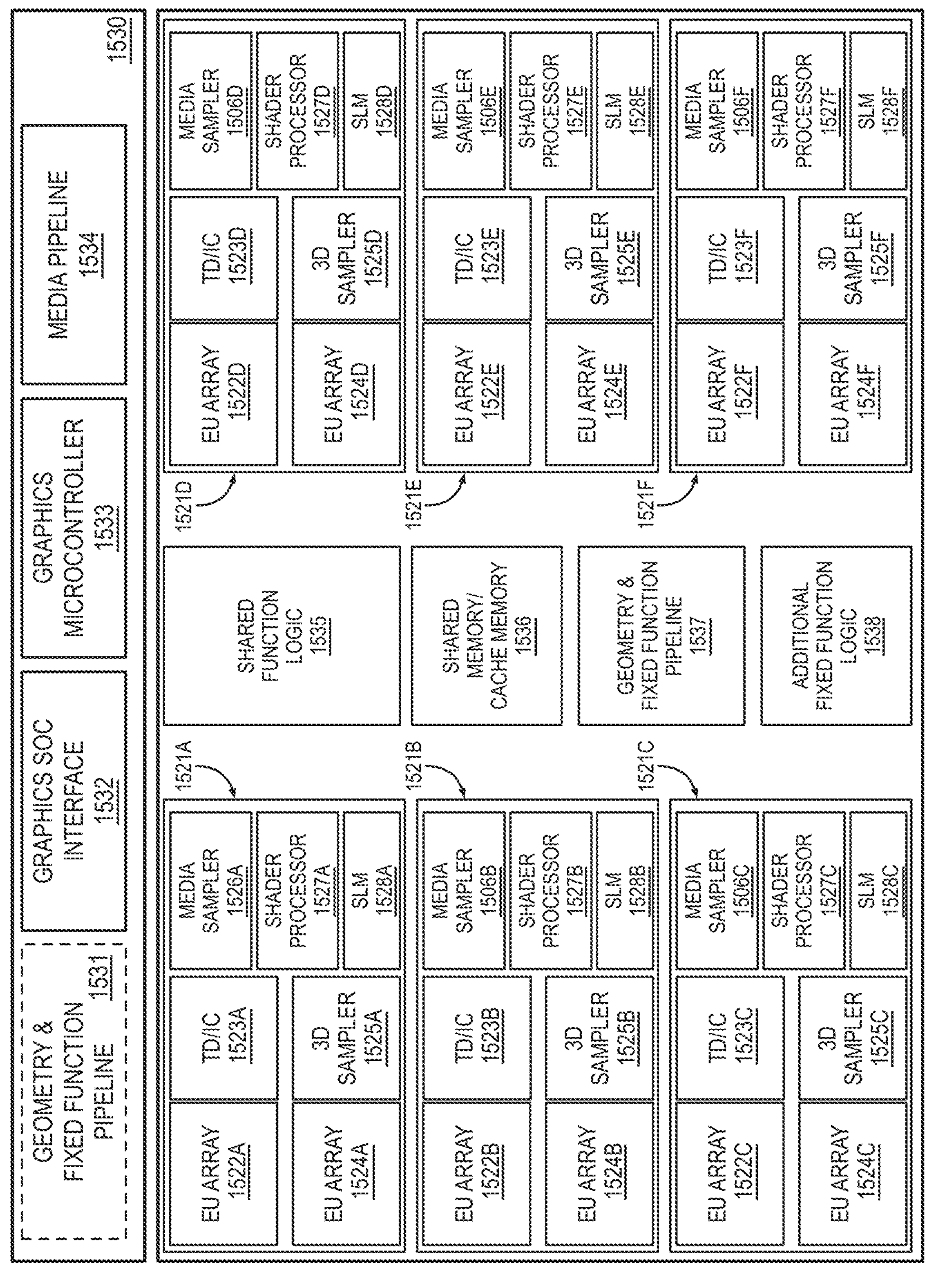
Figure 15C:
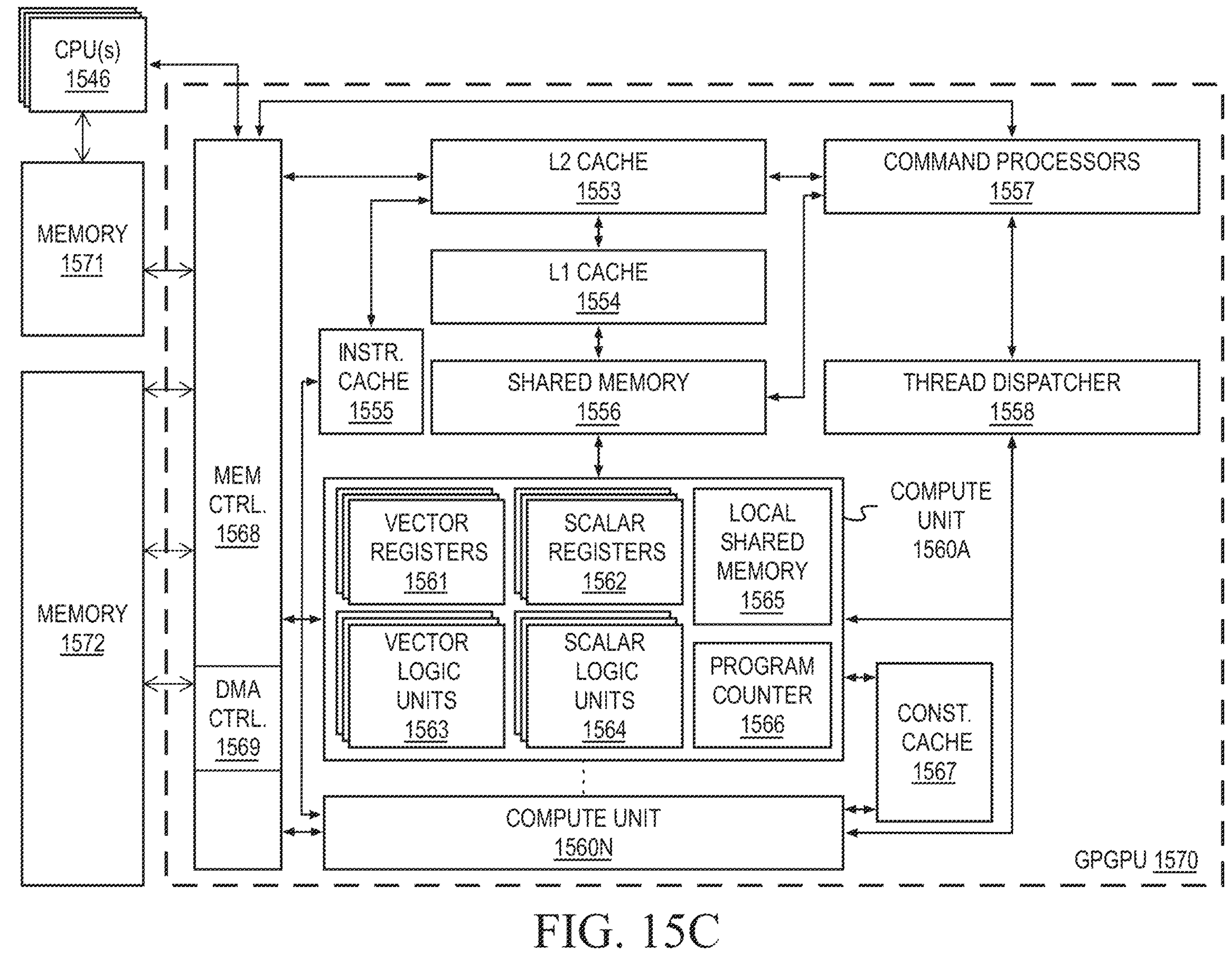

FIG. 15A-15C illustrate computing systems and graphics processors. The elements of FIG. 15A-15C having the same or similar names as the elements of any other figure herein describe the same elements as in the other figures, can operate or function in a manner similar to that, can comprise the same components, and can be linked to other entities, as those described elsewhere herein, but are not limited to such.

FIG. 15A is a block diagram of a processor 1500, which may be a variant of one of the processors 1402 and may be used in place of one of those. Therefore, the disclosure of any features in combination with the processor 1500 herein also discloses a corresponding combination with the processor(s) 1402, but is not limited to such. The processor 1500 may have one or more processor cores 1502A-1502N, an integrated memory controller 1514, and an integrated graphics processor 1508. Where an integrated graphics processor 1508 is excluded, the system that includes the processor will include a graphics processor device within a system chipset or coupled via a system bus. Processor 1500 can include additional cores up to and including additional core 1502N represented by the dashed lined boxes. Each of processor cores 1502A-1502N includes one or more internal cache units 1504A-1504N. In some embodiments each processor core 1502A-1502N also has access to one or more shared cache units 1506. The internal cache units 1504A-1504N and shared cache units 1506 represent a cache memory hierarchy within the processor 1500. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1506 and 1504A-1504N.

The processor 1500 may also include a set of one or more bus controller units 1516 and a system agent core 1510. The one or more bus controller units 1516 manage a set of peripheral buses, such as one or more PCI or PCI express busses. System agent core 1510 provides management functionality for the various processor components. The system agent core 1510 may include one or more integrated memory controllers 1514 to manage access to various external memory devices (not shown).

For example, one or more of the processor cores 1502A-1502N may include support for simultaneous multi-threading. The system agent core 1510 includes components for coordinating and operating cores 1502A-1502N during multi-threaded processing. System agent core 1510 may additionally include a power control unit (PCU), which includes logic and components to regulate the power state of processor cores 1502A-1502N and graphics processor 1508.

The processor 1500 may additionally include graphics processor 1508 to execute graphics processing operations. In some of these embodiments, the graphics processor 1508 couples with the set of shared cache units 1506, and the system agent core 1510, including the one or more integrated memory controllers 1514. The system agent core 1510 may also include a display controller 1511 to drive graphics processor output to one or more coupled displays. The display controller 1511 may also be a separate module coupled with the graphics processor via at least one interconnect, or may be integrated within the graphics processor 1508.

A ring-based interconnect unit 1512 may be used to couple the internal components of the processor 1500. However, an alternative interconnect unit may be used, such as a point-to-point interconnect, a switched interconnect, or other techniques, including techniques well known in the art. In some of these embodiments with a ring-based interconnect 1512, the graphics processor 1508 couples with the ring-based interconnect 1512 via an I/O link 1513.

The exemplary I/O link 1513 represents at least one of multiple varieties of I/O interconnects, including an on package I/O interconnect which facilitates communication between various processor components and a high-performance embedded memory module 1518, such as an eDRAM module. Optionally, each of the processor cores 1502A-1502N and graphics processor 1508 can use embedded memory modules 1518 as a shared Last Level Cache.

The processor cores 1502A-1502N may, for example, be homogeneous cores executing the same instruction set architecture. Alternatively, the processor cores 1502A-1502N are heterogeneous in terms of instruction set architecture (ISA), where one or more of processor cores 1502A-1502N execute a first instruction set, while at least one of the other cores executes a subset of the first instruction set or a different instruction set. The processor cores 1502A-1502N may be heterogeneous in terms of microarchitecture, where one or more cores having a relatively higher power consumption couple with one or more power cores having a lower power consumption. As another example, the processor cores 1502A-1502N are heterogeneous in terms of computational capability. Additionally, processor 1500 can be implemented on one or more chips or as an SoC integrated circuit having the illustrated components, in addition to other components.

FIG. 15B is a block diagram of hardware logic of a graphics processor core 1519, according to some embodiments described herein. The graphics processor core 1519, sometimes referred to as a core slice, can be one or multiple graphics cores within a modular graphics processor. The graphics processor core 1519 is exemplary of one graphics core slice, and a graphics processor as described herein may include multiple graphics core slices based on target power and performance envelopes. Each graphics processor core 1519 can include a fixed function block 1530 coupled with multiple sub-cores 1521A-1521F, also referred to as sub-slices, that include modular blocks of general-purpose and fixed function logic.

The fixed function block 1530 may include a geometry/fixed function pipeline 1531 that can be shared by all sub-cores in the graphics processor core 1519, for example, in lower performance and/or lower power graphics processor implementations. The geometry/fixed function pipeline 1531 may include a 3D fixed function pipeline (e.g., 3D pipeline 1612 as in FIG. 16A described below) a video front-end unit, a thread spawner and thread dispatcher, and a unified return buffer manager, which manages unified return buffers (e.g., unified return buffer 1718 in FIG. 17, as described below).

The fixed function block 1530 may also include a graphics SoC interface 1532, a graphics microcontroller 1533, and a media pipeline 1534. The graphics SoC interface 1532 provides an interface between the graphics processor core 1519 and other processor cores within a system on a chip integrated circuit. The graphics microcontroller 1533 is a programmable sub-processor that is configurable to manage various functions of the graphics processor core 1519, including thread dispatch, scheduling, and pre-emption. The media pipeline 1534 (e.g., media pipeline 1616 of FIG. 16A and FIG. 17) includes logic to facilitate the decoding, encoding, pre-processing, and/or post-processing of multimedia data, including image and video data. The media pipeline 1534 implement media operations via requests to compute or sampling logic within the sub-cores 1521-1521F.

The SoC interface 1532 may enable the graphics processor core 1519 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 1532 can also enable communication with fixed function devices within the SoC, such as camera imaging pipelines, and enables the use of and/or implements global memory atomics that may be shared between the graphics processor core 1519 and CPUs within the SoC. The SoC interface 1532 can also implement power management controls for the graphics processor core 1519 and enable an interface between a clock domain of the graphic core 1519 and other clock domains within the SoC. Optionally, the SoC interface 1532 enables receipt of command buffers from a command streamer and global thread dispatcher that are configured to provide commands and instructions to each of one or more graphics cores within a graphics processor. The commands and instructions can be dispatched to the media pipeline 1534, when media operations are to be performed, or a geometry and fixed function pipeline (e.g., geometry and fixed function pipeline 1531, geometry and fixed function pipeline 1537) when graphics processing operations are to be performed.

The graphics microcontroller 1533 can be configured to perform various scheduling and management tasks for the graphics processor core 1519. In one configuration the graphics microcontroller 1533 can, for example, perform graphics and/or compute workload scheduling on the various graphics parallel engines within execution unit (EU) arrays 1522A-1522F, 1524A-1524F within the sub-cores 1521A-1521F. In this workload scheduling, host software executing on a CPU core of an SoC including the graphics processor core 1519 can submit workloads to one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. Optionally, the graphics microcontroller 1533 can also facilitate low-power or idle states for the graphics processor core 1519, providing the graphics processor core 1519 with the ability to save and restore registers within the graphics processor core 1519 across low-power state transitions independently from the operating system and/or graphics driver software on the system.

The graphics processor core 1519 may have more than or fewer than the illustrated sub-cores 1521A-1521F, up to N modular sub-cores. For each set of N sub-cores, the graphics processor core 1519 can also include shared function logic 1535, shared and/or cache memory 1536, a geometry/fixed function pipeline 1537, as well as additional fixed function logic 1538 to accelerate various graphics and compute processing operations. The shared function logic 1535 can include logic units associated with the shared function logic 1720 of FIG. 17 (e.g., sampler, math, and/or inter-thread communication logic) that can be shared by each N sub-cores within the graphics processor core 1519. The shared and/or cache memory 1536 can be a last-level cache for the set of N sub-cores 1521A-1521F within the graphics processor core 1519, and can also serve as shared memory that is accessible by multiple sub-cores. The geometry/fixed function pipeline 1537 can be included instead of the geometry/fixed function pipeline 1531 within the fixed function block 1530 and can include the same or similar logic units.

The graphics processor core 1519 may include additional fixed function logic 1538 that can include various fixed function acceleration logic for use by the graphics processor core 1519. Optionally, the additional fixed function logic 1538 includes an additional geometry pipeline for use in position only shading. In position-only shading, two geometry pipelines exist, the full geometry pipeline within the geometry/fixed function pipeline 1538, 1531, and a cull pipeline, which is an additional geometry pipeline which may be included within the additional fixed function logic 1538. For example, the cull pipeline may be a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example, the cull pipeline logic within the additional fixed function logic 1538 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

Optionally, the additional fixed function logic 1538 can also include machine-learning acceleration logic, such as fixed function matrix multiplication logic, for implementations including optimizations for machine learning training or inferencing.

Within each graphics sub-core 1521A-1521F a set of execution resources is included that may be used to perform graphics, media, and compute operations in response to requests by graphics pipeline, media pipeline, or shader programs. The graphics sub-cores 1521A-1521F include multiple EU arrays 1522A-1522F, 1524A-1524F, thread dispatch and inter-thread communication (TD/IC) logic 1523A-1523F, a 3D (e.g., texture) sampler 1525A-1525F, a media sampler 1506A-1506F, a shader processor 1527A-1527F, and shared local memory (SLM) 1528A-1528F. The EU arrays 1522A-1522F, 1524A-1524F each include multiple execution units, which are general-purpose graphics processing units capable of performing floating-point and integer/fixed-point logic operations in service of a graphics, media, or compute operation, including graphics, media, or compute shader programs. The TD/IC logic 1523A-1523F performs local thread dispatch and thread control operations for the execution units within a sub-core and facilitate communication between threads executing on the execution units of the sub-core. The 3D sampler 1525A-1525F can read texture or other 3D graphics related data into memory. The 3D sampler can read texture data differently based on a configured sample state and the texture format associated with a given texture. The media sampler 1506A-1506F can perform similar read operations based on the type and format associated with media data. For example, each graphics sub-core 1521A-1521F can alternately include a unified 3D and media sampler. Threads executing on the execution units within each of the sub-cores 1521A-1521F can make use of shared local memory 1528A-1528F within each sub-core, to enable threads executing within a thread group to execute using a common pool of on-chip memory.

FIG. 15C is a block diagram of general-purpose graphics processing unit (GPGPU) 1570 that can be configured as a graphics processor, e.g. the graphics processor 1508, and/or compute accelerator, according to embodiments described herein. The GPGPU 1570 can interconnect with host processors (e.g., one or more CPU(s) 1546) and memory 1571, 1572 via one or more system and/or memory busses. Memory 1571 may be system memory that can be shared with the one or more CPU(s) 1546, while memory 1572 is device memory that is dedicated to the GPGPU 1570. For example, components within the GPGPU 1570 and device memory 1572 may be mapped into memory addresses that are accessible to the one or more CPU(s) 1546. Access to memory 1571 and 1572 may be facilitated via a memory controller 1568. The memory controller 1568 may include an internal direct memory access (DMA) controller 1569 or can include logic to perform operations that would otherwise be performed by a DMA controller.

The GPGPU 1570 includes multiple cache memories, including an L2 cache 1553, L1 cache 1554, an instruction cache 1555, and shared memory 1556, at least a portion of which may also be partitioned as a cache memory. The GPGPU 1570 also includes multiple compute units 1560A-1560N. Each compute unit 1560A-1560N includes a set of vector registers 1561, scalar registers 1562, vector logic units 1563, and scalar logic units 1564. The compute units 1560A-1560N can also include local shared memory 1565 and a program counter 1566. The compute units 1560A-1560N can couple with a constant cache 1567, which can be used to store constant data, which is data that will not change during the run of kernel or shader program that executes on the GPGPU 1570. The constant cache 1567 may be a scalar data cache and cached data can be fetched directly into the scalar registers 1562.

During operation, the one or more CPU(s) 1546 can write commands into registers or memory in the GPGPU 1570 that has been mapped into an accessible address space. The command processors 1557 can read the commands from registers or memory and determine how those commands will be processed within the GPGPU 1570. A thread dispatcher 1558 can then be used to dispatch threads to the compute units 1560A-1560N to perform those commands. Each compute unit 1560A-1560N can execute threads independently of the other compute units. Additionally, each compute unit 1560A-1560N can be independently configured for conditional computation and can conditionally output the results of computation to memory. The command processors 1557 can interrupt the one or more CPU(s) 1546 when the submitted commands are complete.

Figure 16A:
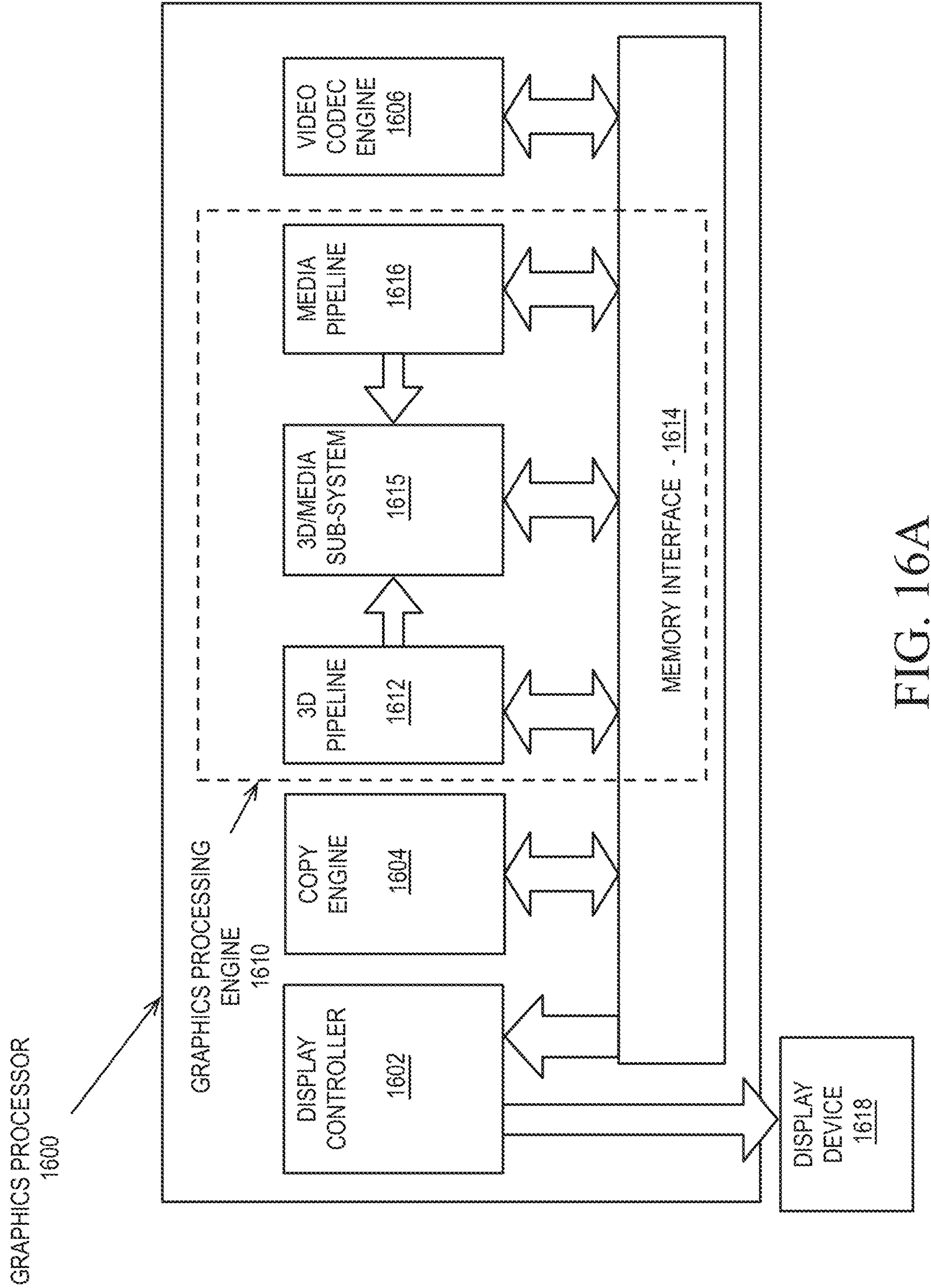
FIG. 16A-16C illustrate block diagrams of additional graphics processor and compute accelerator architectures.
Figure 16B:
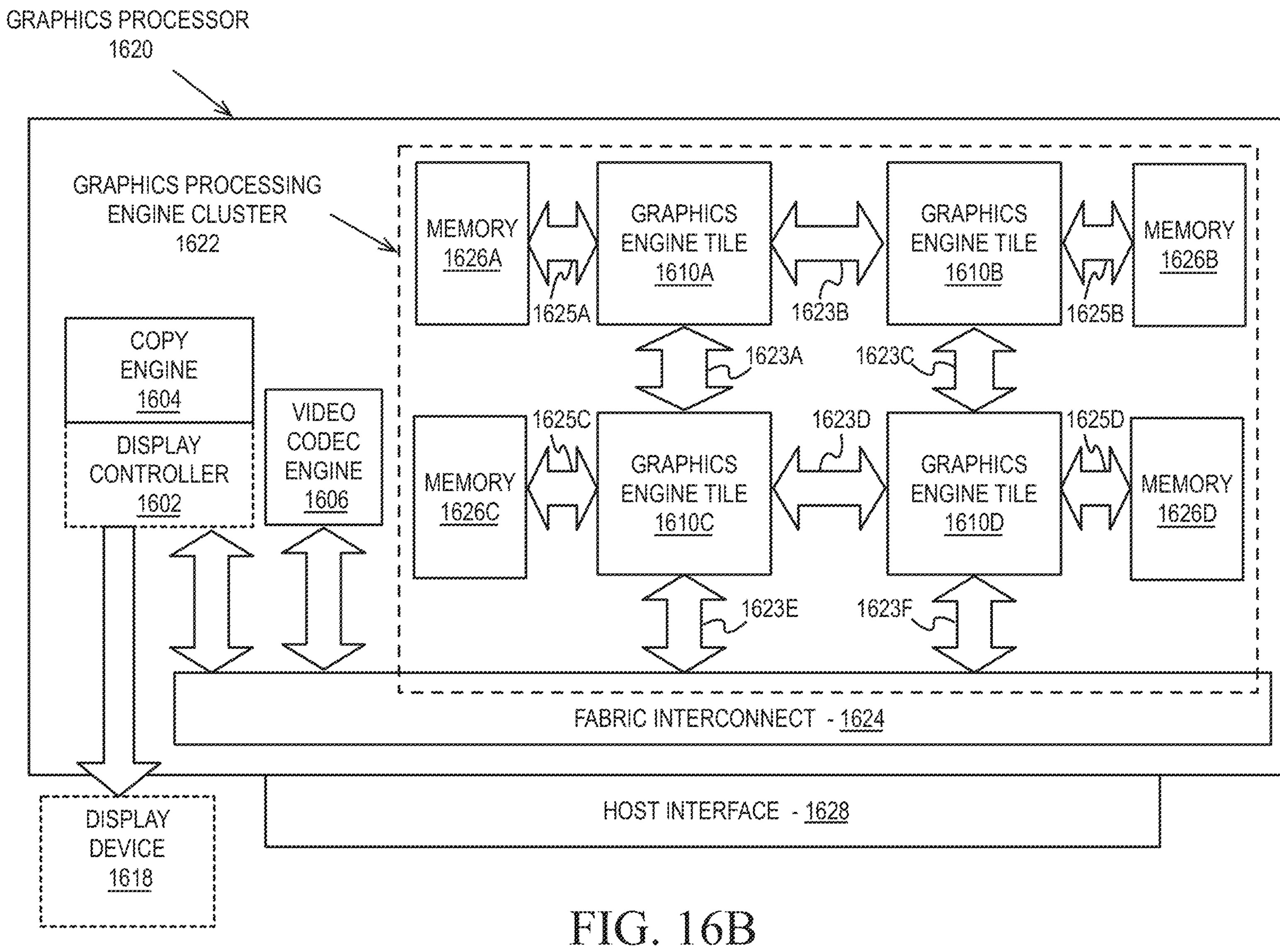
Figure 16C:
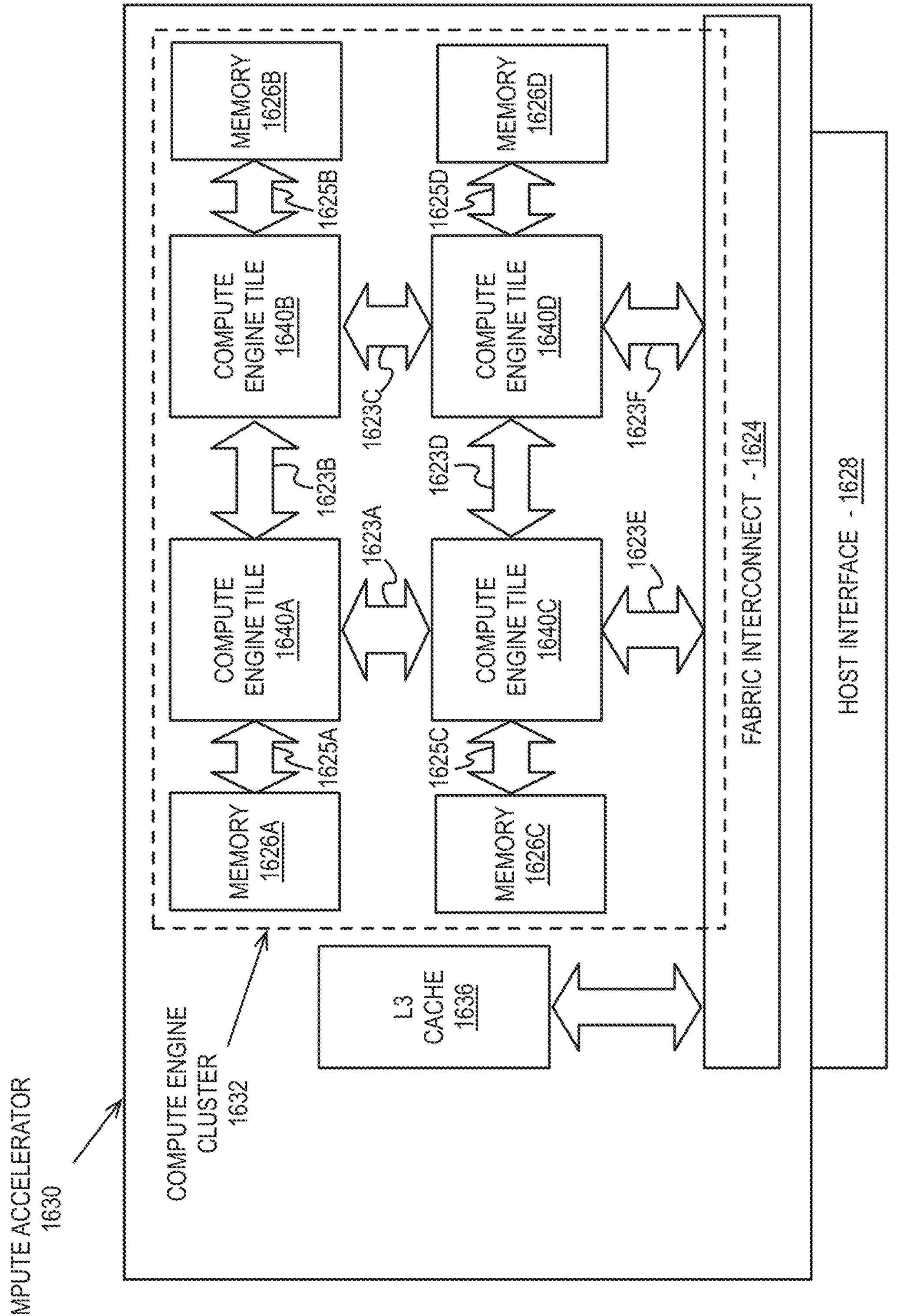

FIG. 16A-16C illustrate block diagrams of additional graphics processor and compute accelerator architectures provided by embodiments described herein, e.g. in accordance with FIG. 15A-15C. The elements of FIG. 16A-16C having the same or similar names as the elements of any other figure herein describe the same elements as in the other figures, can operate or function in a manner similar to that, can comprise the same components, and can be linked to other entities, as those described elsewhere herein, but are not limited to such.

FIG. 16A is a block diagram of a graphics processor 1600, which may be a discrete graphics processing unit, or may be a graphics processor integrated with a plurality of processing cores, or other semiconductor devices such as, but not limited to, memory devices or network interfaces. The graphics processor 1600 may be a variant of the graphics processor 1508 and may be used in place of the graphics processor 1508. Therefore, the disclosure of any features in combination with the graphics processor 1508 herein also discloses a corresponding combination with the graphics processor 1600, but is not limited to such. The graphics processor may communicate via a memory mapped I/O interface to registers on the graphics processor and with commands placed into the processor memory. Graphics processor 1600 may include a memory interface 1614 to access memory. Memory interface 1614 can be an interface to local memory, one or more internal caches, one or more shared external caches, and/or to system memory.

Optionally, graphics processor 1600 also includes a display controller 1602 to drive display output data to a display device 1618. Display controller 1602 includes hardware for one or more overlay planes for the display and composition of multiple layers of video or user interface elements. The display device 1618 can be an internal or external display device. In one embodiment the display device 1618 is a head mounted display device, such as a virtual reality (VR) display device or an augmented reality (AR) display device. Graphics processor 1600 may include a video codec engine 1606 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE) 421M/VC-1, and Joint Photographic Experts Group (JPEG) formats such as JPEG, and Motion JPEG (MJPEG) formats.

Graphics processor 1600 may include a block image transfer (BLIT) engine 1604 to perform two-dimensional (2D) rasterizer operations including, for example, bit-boundary block transfers. However, alternatively, 2D graphics operations may be performed using one or more components of graphics processing engine (GPE) 1610. In some embodiments, GPE 1610 is a compute engine for performing graphics operations, including three-dimensional (3D) graphics operations and media operations.

GPE 1610 may include a 3D pipeline 1612 for performing 3D operations, such as rendering three-dimensional images and scenes using processing functions that act upon 3D primitive shapes (e.g., rectangle, triangle, etc.). The 3D pipeline 1612 includes programmable and fixed function elements that perform various tasks within the element and/or spawn execution threads to a 3D/Media sub-system 1615. While 3D pipeline 1612 can be used to perform media operations, an embodiment of GPE 1610 also includes a media pipeline 1616 that is specifically used to perform media operations, such as video post-processing and image enhancement.

Media pipeline 1616 may include fixed function or programmable logic units to perform one or more specialized media operations, such as video decode acceleration, video de-interlacing, and video encode acceleration in place of, or on behalf of video codec engine 1606. Media pipeline 1616 may additionally include a thread spawning unit to spawn threads for execution on 3D/Media sub-system 1615. The spawned threads perform computations for the media operations on one or more graphics execution units included in 3D/Media sub-system 1615.

The 3D/Media subsystem 1615 may include logic for executing threads spawned by 3D pipeline 1612 and media pipeline 1616. The pipelines may send thread execution requests to 3D/Media subsystem 1615, which includes thread dispatch logic for arbitrating and dispatching the various requests to available thread execution resources. The execution resources include an array of graphics execution units to process the 3D and media threads. The 3D/Media subsystem 1615 may include one or more internal caches for thread instructions and data. Additionally, the 3D/Media subsystem 1615 may also include shared memory, including registers and addressable memory, to share data between threads and to store output data.

FIG. 16B illustrates a graphics processor 1620, being a variant of the graphics processor 1600 and may be used in place of the graphics processor 1600 and vice versa. Therefore, the disclosure of any features in combination with the graphics processor 1600 herein also discloses a corresponding combination with the graphics processor 1620, but is not limited to such. The graphics processor 1620 has a tiled architecture, according to embodiments described herein. The graphics processor 1620 may include a graphics processing engine cluster 1622 having multiple instances of the graphics processing engine 1610 of FIG. 16A within a graphics engine tile 1610A-1610D. Each graphics engine tile 1610A-1610D can be interconnected via a set of tile interconnects 1623A-1623F. Each graphics engine tile 1610A-1610D can also be connected to a memory module or memory device 1626A-1626D via memory interconnects 1625A-1625D. The memory devices 1626A-1626D can use any graphics memory technology. For example, the memory devices 1626A-1626D may be graphics double data rate (GDDR) memory. The memory devices 1626A-1626D may be high-bandwidth memory (HBM) modules that can be on-die with their respective graphics engine tile 1610A-1610D. The memory devices 1626A-1626D may be stacked memory devices that can be stacked on top of their respective graphics engine tile 1610A-1610D. Each graphics engine tile 1610A-1610D and associated memory 1626A-1626D may reside on separate chiplets, which are bonded to a base die or base substrate, as described in further detail in FIG. 24B-24D.

The graphics processor 1620 may be configured with a non-uniform memory access (NUMA) system in which memory devices 1626A-1626D are coupled with associated graphics engine tiles 1610A-1610D. A given memory device may be accessed by graphics engine tiles other than the tile to which it is directly connected. However, access latency to the memory devices 1626A-1626D may be lowest when accessing a local tile. In one embodiment, a cache coherent NUMA (ccNUMA) system is enabled that uses the tile interconnects 1623A-1623F to enable communication between cache controllers within the graphics engine tiles 1610A-1610D to keep a consistent memory image when more than one cache stores the same memory location.

The graphics processing engine cluster 1622 can connect with an on-chip or on-package fabric interconnect 1624. The fabric interconnect 1624 can enable communication between graphics engine tiles 1610A-1610D and components such as the video codec 1606 and one or more copy engines 1604. The copy engines 1604 can be used to move data out of, into, and between the memory devices 1626A-1626D and memory that is external to the graphics processor 1620 (e.g., system memory). The fabric interconnect 1624 can also be used to interconnect the graphics engine tiles 1610A-1610D. The graphics processor 1620 may optionally include a display controller 1602 to enable a connection with an external display device 1618. The graphics processor may also be configured as a graphics or compute accelerator. In the accelerator configuration, the display controller 1602 and display device 1618 may be omitted.

The graphics processor 1620 can connect to a host system via a host interface 1628. The host interface 1628 can enable communication between the graphics processor 1620, system memory, and/or other system components. The host interface 1628 can be, for example, a PCI express bus or another type of host system interface.

FIG. 16C illustrates a compute accelerator 1630, according to embodiments described herein. The compute accelerator 1630 can include architectural similarities with the graphics processor 1620 of FIG. 16B and is optimized for compute acceleration. A compute engine cluster 1632 can include a set of compute engine tiles 1640A-1640D that include execution logic that is optimized for parallel or vector-based general-purpose compute operations. The compute engine tiles 1640A-1640D may not include fixed function graphics processing logic, although in some embodiments one or more of the compute engine tiles 1640A-1640D can include logic to perform media acceleration. The compute engine tiles 1640A-1640D can connect to memory 1626A-1626D via memory interconnects 1625A-1625D. The memory 1626A-1626D and memory interconnects 1625A-1625D may be similar technology as in graphics processor 1620, or can be different. The graphics compute engine tiles 1640A-1640D can also be interconnected via a set of tile interconnects 1623A-1623F and may be connected with and/or interconnected by a fabric interconnect 1624. In one embodiment the compute accelerator 1630 includes a large L3 cache 1636 that can be configured as a device-wide cache. The compute accelerator 1630 can also connect to a host processor and memory via a host interface 1628 in a similar manner as the graphics processor 1620 of FIG. 16B.

Graphics Processing Engine

Figure 17:
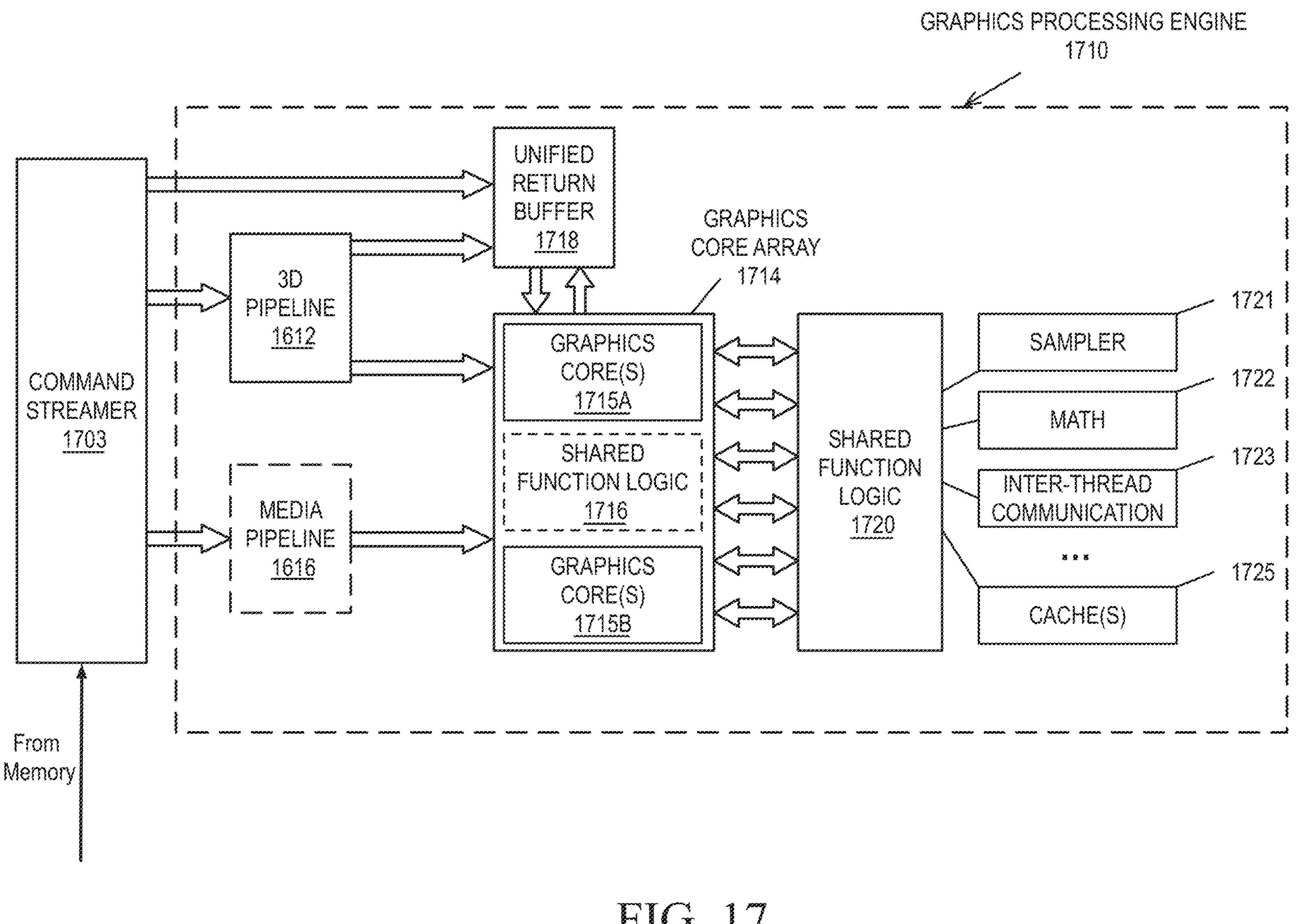
FIG. 17 is a block diagram of a graphics processing engine of a graphics processor.

FIG. 17 is a block diagram of a graphics processing engine 1710 of a graphics processor in accordance with some embodiments. The graphics processing engine (GPE) 1710 may be a version of the GPE 1610 shown in FIG. 16A, and may also represent a graphics engine tile 1610A-1610D of FIG. 16B. The elements of FIG. 17 having the same or similar names as the elements of any other figure herein describe the same elements as in the other figures, can operate or function in a manner similar to that, can comprise the same components, and can be linked to other entities, as those described elsewhere herein, but are not limited to such. For example, the 3D pipeline 1612 and media pipeline 1616 of FIG. 16A are also illustrated in FIG. 17. The media pipeline 1616 is optional in some embodiments of the GPE 1710 and may not be explicitly included within the GPE 1710. For example and in at least one embodiment, a separate media and/or image processor is coupled to the GPE 1710.

GPE 1710 may couple with or include a command streamer 1703, which provides a command stream to the 3D pipeline 1612 and/or media pipelines 1616. Alternatively or additionally, the command streamer 1703 may be directly coupled to a unified return buffer 1718. The unified return buffer 1718 may be communicatively coupled to a graphics core array 1714. Optionally, the command streamer 1703 is coupled with memory, which can be system memory, or one or more of internal cache memory and shared cache memory. The command streamer 1703 may receive commands from the memory and sends the commands to 3D pipeline 1612 and/or media pipeline 1616. The commands are directives fetched from a ring buffer, which stores commands for the 3D pipeline 1612 and media pipeline 1616. The ring buffer can additionally include batch command buffers storing batches of multiple commands. The commands for the 3D pipeline 1612 can also include references to data stored in memory, such as but not limited to vertex and geometry data for the 3D pipeline 1612 and/or image data and memory objects for the media pipeline 1616. The 3D pipeline 1612 and media pipeline 1616 process the commands and data by performing operations via logic within the respective pipelines or by dispatching one or more execution threads to the graphics core array 1714. The graphics core array 1714 may include one or more blocks of graphics cores (e.g., graphics core(s) 1715A, graphics core(s) 1715B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 1612 can include fixed function and programmable logic to process one or more shader programs, such as vertex shaders, geometry shaders, pixel shaders, fragment shaders, compute shaders, or other shader programs, by processing the instructions and dispatching execution threads to the graphics core array 1714. The graphics core array 1714 provides a unified block of execution resources for use in processing these shader programs. Multi-purpose execution logic (e.g., execution units) within the graphics core(s) 1715A-1715B of the graphics core array 1714 includes support for various 3D API shader languages and can execute multiple simultaneous execution threads associated with multiple shaders.

The graphics core array 1714 may include execution logic to perform media functions, such as video and/or image processing. The execution units may include general-purpose logic that is programmable to perform parallel general-purpose computational operations, in addition to graphics processing operations. The general-purpose logic can perform processing operations in parallel or in conjunction with general-purpose logic within the processor core(s) 1407 of FIG. 14 or core 1502A-1502N as in FIG. 15A.

Output data generated by threads executing on the graphics core array 1714 can output data to memory in a unified return buffer (URB) 1718. The URB 1718 can store data for multiple threads. The URB 1718 may be used to send data between different threads executing on the graphics core array 1714. The URB 1718 may additionally be used for synchronization between threads on the graphics core array 1714 and fixed function logic within the shared function logic 1720.

Optionally, the graphics core array 1714 may be scalable, such that the array includes a variable number of graphics cores, each having a variable number of execution units based on the target power and performance level of GPE 1710. The execution resources may be dynamically scalable, such that execution resources may be enabled or disabled as needed.

The graphics core array 1714 couples with shared function logic 1720 that includes multiple resources that are shared between the graphics cores in the graphics core array. The shared functions within the shared function logic 1720 are hardware logic units that provide specialized supplemental functionality to the graphics core array 1714. In various embodiments, shared function logic 1720 includes but is not limited to sampler 1721, math 1722, and inter-thread communication (ITC) 1723 logic. Additionally, one or more cache(s) 1725 within the shared function logic 1720 may be implemented.

A shared function is implemented at least in a case where the demand for a given specialized function is insufficient for inclusion within the graphics core array 1714. Instead a single instantiation of that specialized function is implemented as a stand-alone entity in the shared function logic 1720 and shared among the execution resources within the graphics core array 1714. The precise set of functions that are shared between the graphics core array 1714 and included within the graphics core array 1714 varies across embodiments. Specific shared functions within the shared function logic 1720 that are used extensively by the graphics core array 1714 may be included within shared function logic 1716 within the graphics core array 1714. Optionally, the shared function logic 1716 within the graphics core array 1714 can include some or all logic within the shared function logic 1720. All logic elements within the shared function logic 1720 may be duplicated within the shared function logic 1716 of the graphics core array 1714. Alternatively, the shared function logic 1720 is excluded in favor of the shared function logic 1716 within the graphics core array 1714.

Execution Units

Figure 18A:
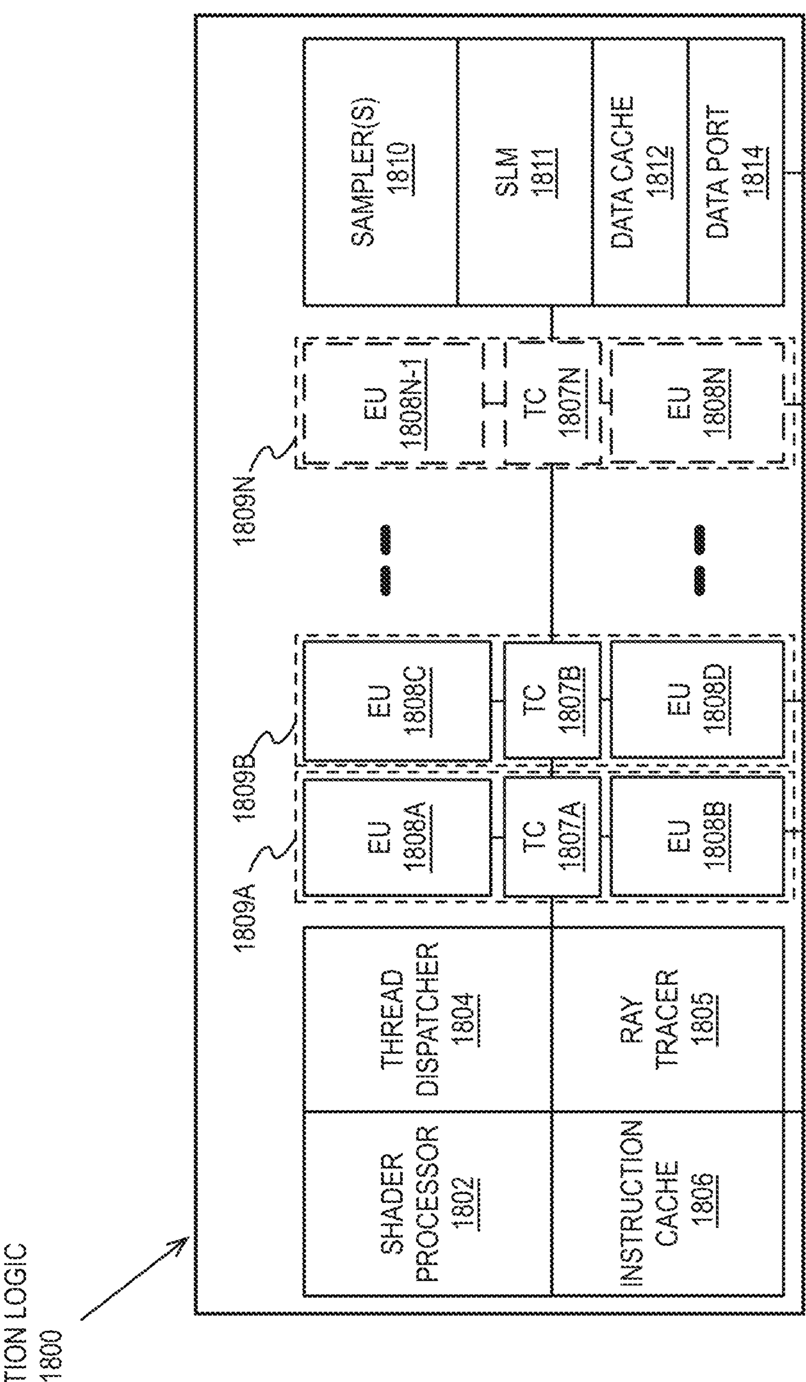
FIG. 18A-18B illustrate thread execution logic including an array of processing elements employed in a graphics processor core.
Figure 18B:
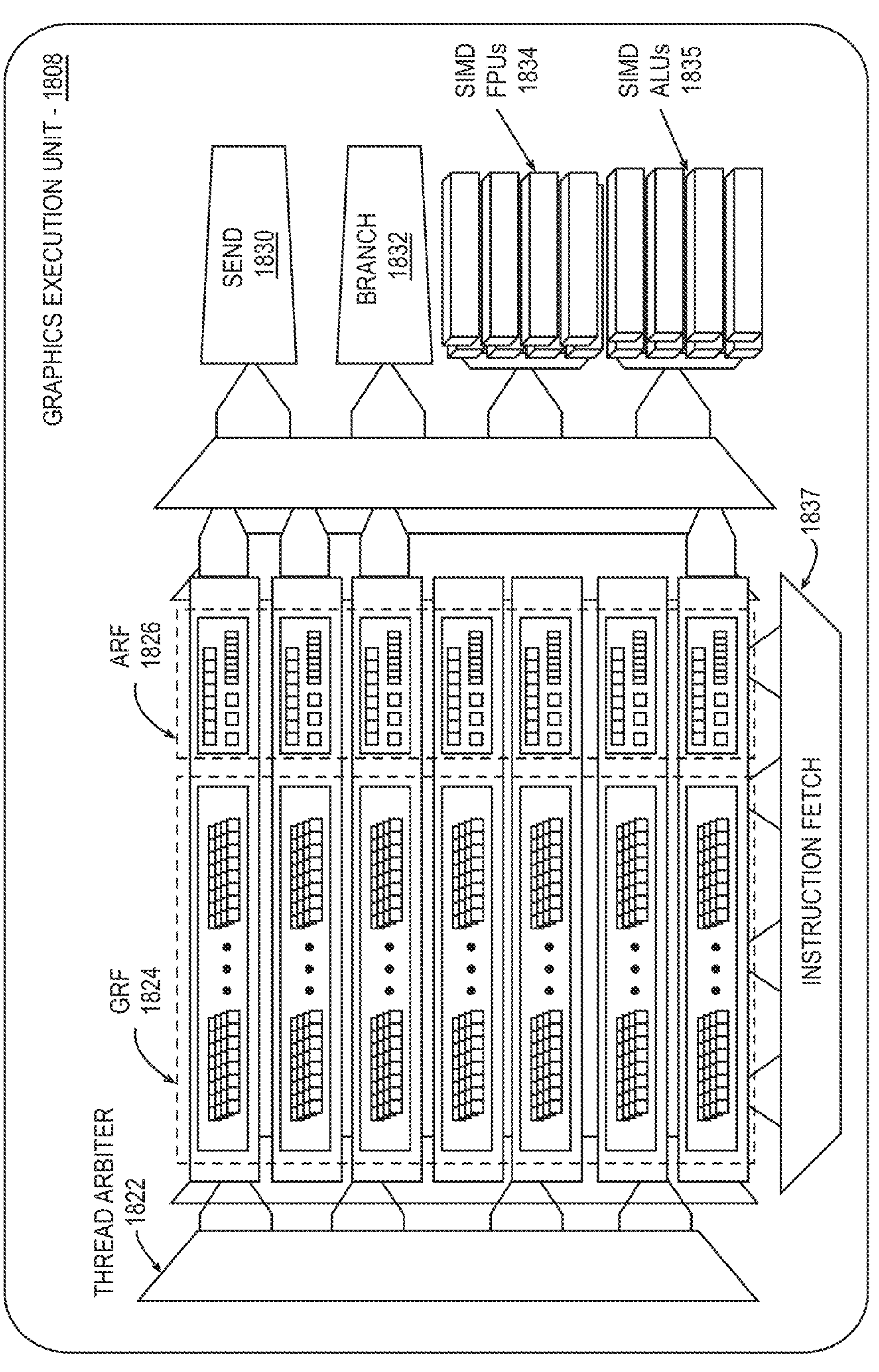

FIG. 18A-18B illustrate thread execution logic 1800 including an array of processing elements employed in a graphics processor core according to embodiments described herein. The elements of FIG. 18A-18B having the same or similar names as the elements of any other figure herein describe the same elements as in the other figures, can operate or function in a manner similar to that, can comprise the same components, and can be linked to other entities, as those described elsewhere herein, but are not limited to such. FIG. 18A-18B illustrates an overview of thread execution logic 1800, which may be representative of hardware logic illustrated with each sub-core 1521A-1521F of FIG. 15B. FIG. 18A is representative of an execution unit within a general-purpose graphics processor, while FIG. 18B is representative of an execution unit that may be used within a compute accelerator.

As illustrated in FIG. 18A, thread execution logic 1800 may include a shader processor 1802, a thread dispatcher 1804, instruction cache 1806, a scalable execution unit array including a plurality of execution units 1808A-1808N, a sampler 1810, shared local memory 1811, a data cache 1812, and a data port 1814. Optionally, the scalable execution unit array can dynamically scale by enabling or disabling one or more execution units (e.g., any of execution units 1808A, 1808B, 1808C, 1808D, through 1808N-1 and 1808N) based on the computational requirements of a workload. The included components may be interconnected via an interconnect fabric that links to each of the components. Thread execution logic 1800 may include one or more connections to memory, such as system memory or cache memory, through one or more of instruction cache 1806, data port 1814, sampler 1810, and execution units 1808A-1808N. Each execution unit (e.g. 1808A) may be a stand-alone programmable general-purpose computational unit that is capable of executing multiple simultaneous hardware threads while processing multiple data elements in parallel for each thread. In various embodiments, the array of execution units 1808A-1808N is scalable to include any number individual execution units.

The execution units 1808A-1808N may be primarily used to execute shader programs. A shader processor 1802 can process the various shader programs and dispatch execution threads associated with the shader programs via a thread dispatcher 1804. The thread dispatcher may include logic to arbitrate thread initiation requests from the graphics and media pipelines and instantiate the requested threads on one or more execution units 1808A-1808N. For example, a geometry pipeline can dispatch vertex, tessellation, or geometry shaders to the thread execution logic for processing. Optionally, the thread dispatcher 1804 can also process runtime thread spawning requests from the executing shader programs.

The execution units 1808A-1808N may support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 1808A-1808N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 1808A-1808N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader, such as vertex shader 2107 illustrated in FIG. 21. Various embodiments can apply to use execution by use of Single Instruction Multiple Thread (SIMT) as an alternate to use of SIMD or in addition to use of SIMD. Reference to a SIMD core or operation can apply also to SIMT or apply to SIMD in combination with SIMT.

Each execution unit in execution units 1808A-1808N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs), Floating-Point Units (FPUs), or other logic units (e.g., tensor cores, ray tracing cores, etc.) for a particular graphics processor. Additionally, the execution units 1808A-1808N may support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 184-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

Optionally, one or more execution units can be combined into a fused execution unit 1809A-1809N having thread control logic (1807A-1807N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 1809A-1809N includes at least two execution units. For example, fused execution unit 1809A includes a first EU 1808A, second EU 1808B, and thread control logic 1807A that is common to the first EU 1808A and the second EU 1808B. The thread control logic 1807A controls threads executed on the fused graphics execution unit 1809A, allowing each EU within the fused execution units 1809A-1809N to execute using a common instruction pointer register.

One or more internal instruction caches (e.g., 1806) are included in the thread execution logic 1800 to cache thread instructions for the execution units. One or more data caches (e.g., 1812) may be included in the thread execution logic 1800 to cache thread data during thread execution. Threads executing on the execution logic 1800 can also store explicitly managed data in the shared local memory 1811. A sampler 1810 may be included to provide texture sampling for 3D operations and media sampling for media operations. Sampler 1810 may include specialized texture or media sampling functionality to process texture or media data during the sampling process before providing the sampled data to an execution unit.

During execution, the graphics and media pipelines send thread initiation requests to thread execution logic 1800 via thread spawning and dispatch logic. Once a group of geometric objects has been processed and rasterized into pixel data, pixel processor logic (e.g., pixel shader logic, fragment shader logic, etc.) within the shader processor 1802 is invoked to further compute output information and cause results to be written to output surfaces (e.g., color buffers, depth buffers, stencil buffers, etc.). A pixel shader or fragment shader may calculate the values of the various vertex attributes that are to be interpolated across the rasterized object. The pixel processor logic within the shader processor 1802 may then execute an application programming interface (API)-supplied pixel or fragment shader program. To execute the shader program, the shader processor 1802 dispatches threads to an execution unit (e.g., 1808A) via thread dispatcher 1804. Shader processor 1802 may use texture sampling logic in the sampler 1810 to access texture data in texture maps stored in memory. Arithmetic operations on the texture data and the input geometry data compute pixel color data for each geometric fragment, or discards one or more pixels from further processing.

In addition, the data port 1814 may provide a memory access mechanism for the thread execution logic 1800 to output processed data to memory for further processing on a graphics processor output pipeline. The data port 1814 may include or couple to one or more cache memories (e.g., data cache 1812) to cache data for memory access via the data port 1814.

Optionally, the execution logic 1800 can also include a ray tracer 1805 that can provide ray tracing acceleration functionality. The ray tracer 1805 can support a ray tracing instruction set that includes instructions/functions for ray generation. The ray tracing instruction set can be similar to or different from the ray-tracing instruction set supported by the ray tracing cores 372 in FIG. 3C.

FIG. 18B illustrates exemplary internal details of an execution unit 1808. A graphics execution unit 1808 can include an instruction fetch unit 1837, a general register file array (GRF) 1824, an architectural register file array (ARF) 1826, a thread arbiter 1822, a send unit 1830, a branch unit 1832, a set of SIMD floating point units (FPUs) 1834, and optionally a set of dedicated integer SIMD ALUs 1835. The GRF 1824 and ARF 1826 includes the set of general register files and architecture register files associated with each simultaneous hardware thread that may be active in the graphics execution unit 1808. Per thread architectural state may be maintained in the ARF 1826, while data used during thread execution is stored in the GRF 1824. The execution state of each thread, including the instruction pointers for each thread, can be held in thread-specific registers in the ARF 1826.

The graphics execution unit 1808 may have an architecture that is a combination of Simultaneous Multi-Threading (SMT) and fine-grained Interleaved Multi-Threading (IMT). The architecture may have a modular configuration that can be fine-tuned at design time based on a target number of simultaneous threads and number of registers per execution unit, where execution unit resources are divided across logic used to execute multiple simultaneous threads. The number of logical threads that may be executed by the graphics execution unit 1808 is not limited to the number of hardware threads, and multiple logical threads can be assigned to each hardware thread.

Optionally, the graphics execution unit 1808 can co-issue multiple instructions, which may each be different instructions. The thread arbiter 1822 of the graphics execution unit thread 1808 can dispatch the instructions to one of the send unit 1830, branch unit 1832, or SIMD FPU(s) 1834 for execution. Each execution thread can access 128 general-purpose registers within the GRF 1824, where each register can store 32 bytes, accessible as a SIMD 8-element vector of 32-bit data elements. Each execution unit thread may have access to 4 Kbytes within the GRF 1824, although embodiments are not so limited, and greater or fewer register resources may be provided in other embodiments. The graphics execution unit 1808 may be partitioned into seven hardware threads that can independently perform computational operations, although the number of threads per execution unit can also vary according to embodiments, for example, up to 16 hardware threads may be supported. In an exemplary embodiment, in which seven threads may access 4 Kbytes, the GRF 1824 can store a total of 28 Kbytes. In another exemplary embodiment, where 16 threads may access 4 Kbytes, the GRF 1824 can store a total of 64 Kbytes. The number of threads per execution unit are, however, not limited to those examples and may be more or less than the given numbers. Flexible addressing modes can permit registers to be addressed together to build effectively wider registers or to represent strided rectangular block data structures.

Additionally or alternatively, memory operations, sampler operations, and other longer-latency system communications may be dispatched via "send" instructions that are executed by the message passing send unit 1830. Branch instructions may be dispatched to a dedicated branch unit 1832 to facilitate SIMD divergence and eventual convergence.

The graphics execution unit 1808 may include one or more SIMD floating point units (FPU(s)) 1834 to perform floating-point operations. The FPU(s) 1834 may also support integer computation. In some instances, the FPU(s) 1834 can SIMD execute up to M number of 32-bit floating-point (or integer) operations, or SIMD execute up to 2M 16-bit integer or 16-bit floating-point operations. Optionally, at least one of the FPU(s) provides extended math capability to support high-throughput transcendental math functions and double precision 184-bit floating-point. A set of 8-bit integer SIMD ALUs 1835 may also be present, and may be specifically optimized to perform operations associated with machine learning computations.

Optionally, arrays of multiple instances of the graphics execution unit 1808 can be instantiated in a graphics sub-core grouping (e.g., a sub-slice). For scalability, product architects can choose the exact number of execution units per sub-core grouping. The execution unit 1808 may execute instructions across a plurality of execution channels. In addition, each thread executed on the graphics execution unit 1808 may be executed on a different channel.

Figure 19:
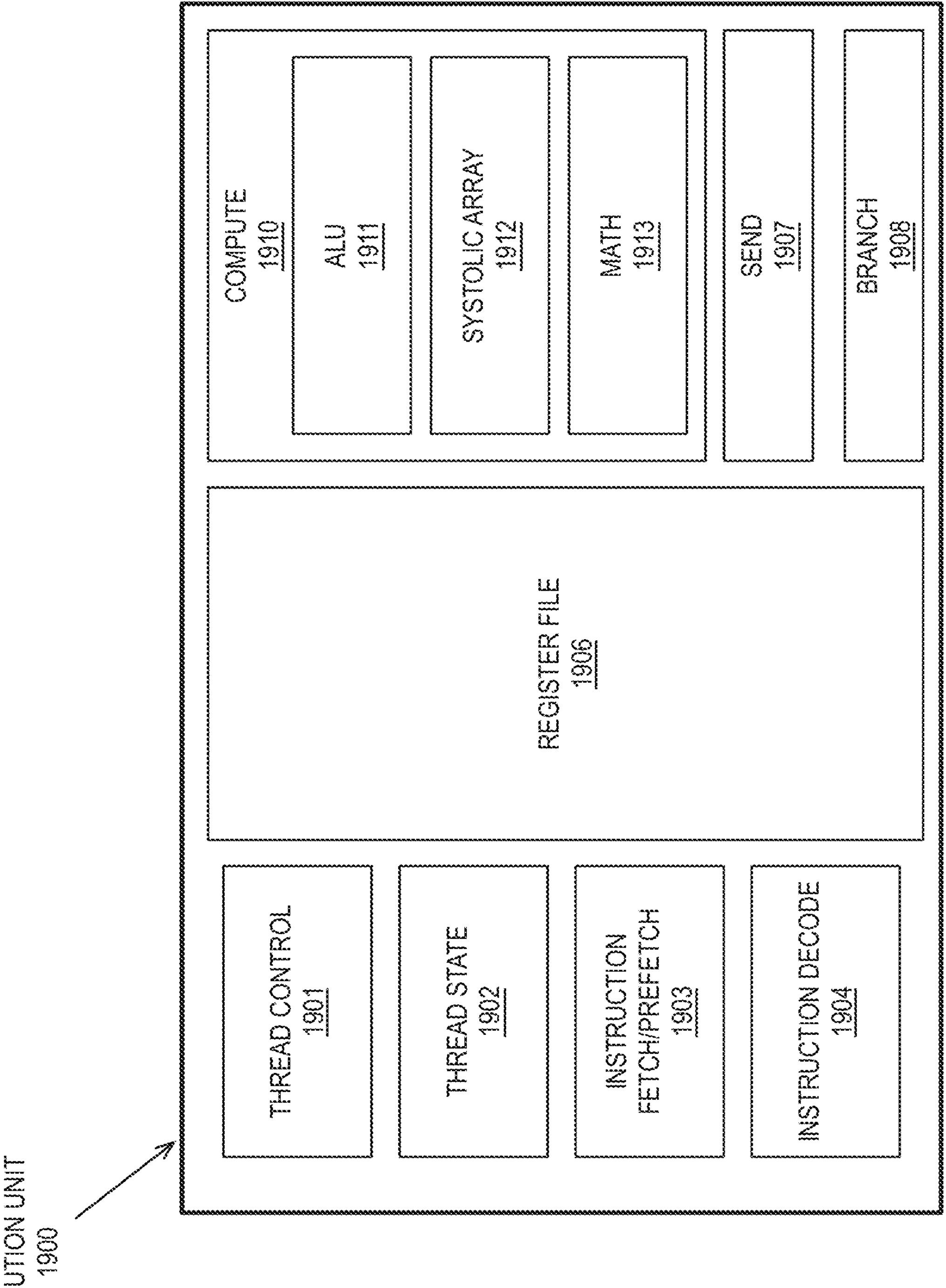
FIG. 19 illustrates an additional execution unit.

FIG. 19 illustrates a further exemplary execution unit 1900. The elements of FIG. 19 having the same or similar names as the elements of any other figure herein describe the same elements as in the other figures, can operate or function in a manner similar to that, can comprise the same components, and can be linked to other entities, as those described elsewhere herein, but are not limited to such. The execution unit 1900 may be a compute-optimized execution unit for use in, for example, a compute engine tile 1640A-1640D as in FIG. 16C, but is not limited as such. The execution unit 1900 may also be used in a graphics engine tile 1610A-1610D as in FIG. 16B. The execution unit 1900 may include a thread control unit 1901, a thread state unit 1902, an instruction fetch/prefetch unit 1903, and an instruction decode unit 1904. The execution unit 1900 may additionally include a register file 1906 that stores registers that can be assigned to hardware threads within the execution unit. The execution unit 1900 may additionally include a send unit 1907 and a branch unit 1908. The send unit 1907 and branch unit 1908 may operate similarly as the send unit 1830 and a branch unit 1832 of the graphics execution unit 1808 of FIG. 18B.

The execution unit 1900 can also include a compute unit 1910 that includes multiple different types of functional units. The compute unit 1910 may also include an ALU unit 1911 that includes an array of arithmetic logic units. The ALU unit 1911 can be configured to perform 64-bit, 32-bit, and 16-bit integer and floating-point operations. Integer and floating-point operations may be performed simultaneously. The compute unit 1910 can also include a systolic array 1912, and a math unit 1913. The systolic array 1912 includes a W wide and D deep network of data processing units that can be used to perform vector or other data-parallel operations in a systolic manner. The systolic array 1912 can be configured to perform matrix operations, such as matrix dot product operations. The systolic array 1912 may support 16-bit floating point operations, as well as 8-bit and 4-bit integer operations. The systolic array 1912 may be configured to accelerate machine learning operations. The systolic array 1912 can be configured with support for the bfloat16, a 16-bit floating point format. A math unit 1913 can be included to perform a specific subset of mathematical operations in an efficient and lower-power manner than then ALU unit 1911. The math unit 1913 can include math logic found in shared function logic of a graphics processing engine provided by other embodiments described, e.g., the math logic 1722 of the shared function logic 1720 of FIG. 17. The math unit 1913 can be configured to perform 32-bit and 64-bit floating point operations.

The thread control unit 1901 includes logic to control the execution of threads within the execution unit. The thread control unit 1901 can include thread arbitration logic to start, stop, and preempt execution of threads within the execution unit 1900. The thread state unit 1902 can be used to store thread state for threads assigned to execute on the execution unit 1900. Storing the thread state within the execution unit 1900 enables the rapid pre-emption of threads when those threads become blocked or idle. The instruction fetch/prefetch unit 1903 can fetch instructions from an instruction cache of higher-level execution logic (e.g., instruction cache 1806 as in FIG. 18A). The instruction fetch/prefetch unit 1903 can also issue prefetch requests for instructions to be loaded into the instruction cache based on an analysis of currently executing threads. The instruction decode unit 1904 can be used to decode instructions to be executed by the compute units. The instruction decode unit 1904 can be used as a secondary decoder to decode complex instructions into constituent micro-operations.

The execution unit 1900 additionally includes a register file 1906 that can be used by hardware threads executing on the execution unit 1900. Registers in the register file 1906 can be divided across the logic used to execute multiple simultaneous threads within the compute unit 1910 of the execution unit 1900. The number of logical threads that may be executed by the graphics execution unit 1900 is not limited to the number of hardware threads, and multiple logical threads can be assigned to each hardware thread. The size of the register file 1906 can vary across embodiments based on the number of supported hardware threads. Register renaming may be used to dynamically allocate registers to hardware threads.

Figure 20:
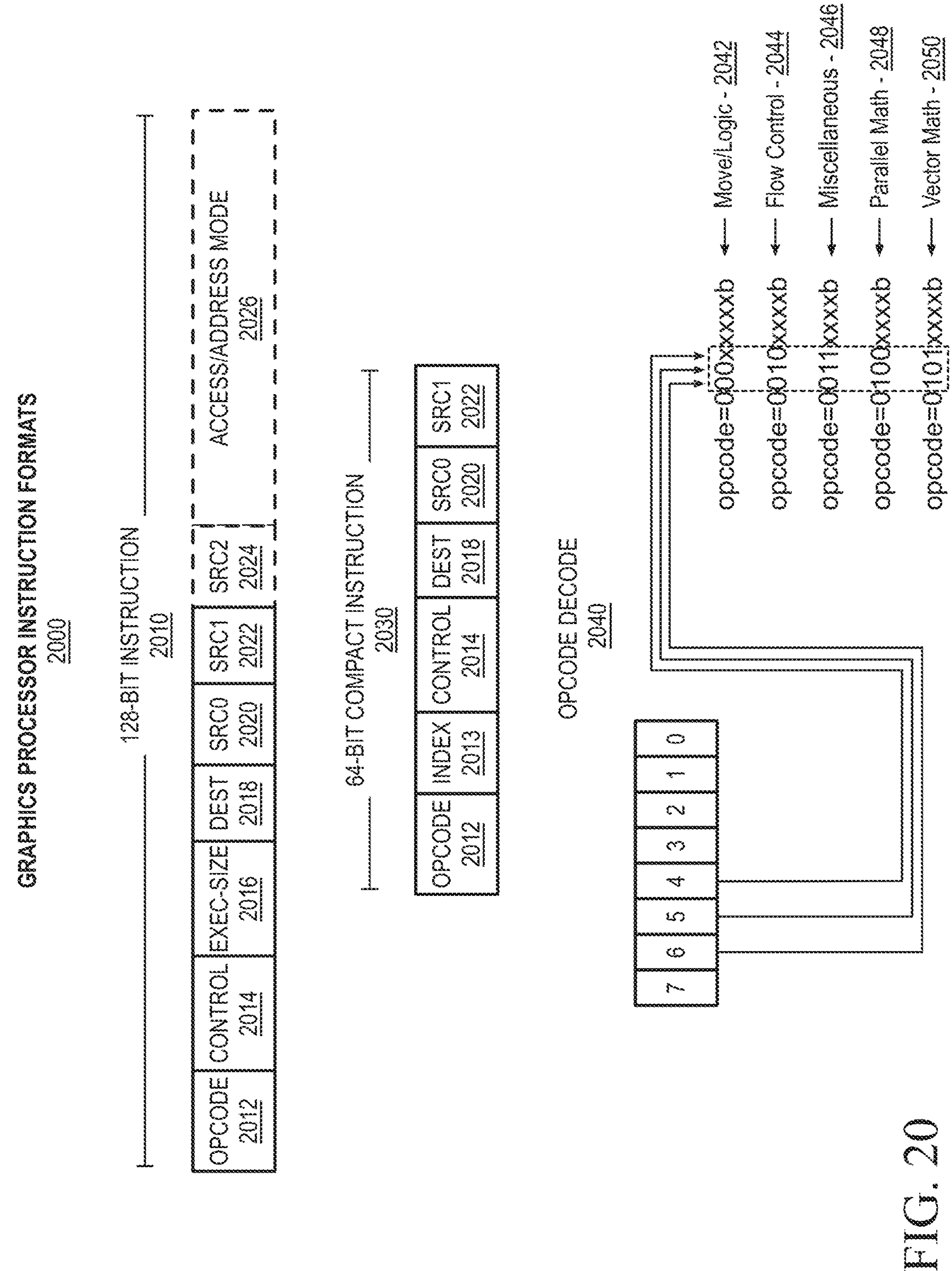
FIG. 20 is a block diagram illustrating a graphics processor instruction formats.

FIG. 20 is a block diagram illustrating a graphics processor instruction format 2000. The graphics processor execution units support an instruction set having instructions in multiple formats. The solid lined boxes illustrate the components that are generally included in an execution unit instruction, while the dashed lines include components that are optional or that are only included in a sub-set of the instructions. The instruction formats 2000 described and illustrated are macro-instructions, in that they are instructions supplied to the execution unit, as opposed to micro-operations resulting from instruction decode once the instruction is processed.

The graphics processor execution units as described herein may natively support instructions in a 128-bit instruction format 2010. A 64-bit compacted instruction format 2030 is available for some instructions based on the selected instruction, instruction options, and number of operands. The native 128-bit instruction format 2010 provides access to all instruction options, while some options and operations are restricted in the 64-bit format 2030. The native instructions available in the 64-bit format 2030 vary by embodiment. The instruction is compacted in part using a set of index values in an index field 2013. The execution unit hardware references a set of compaction tables based on the index values and uses the compaction table outputs to reconstruct a native instruction in the 128-bit instruction format 2010. Other sizes and formats of instruction can be used.

For each format, instruction opcode 2012 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. Instruction control field 2014 may enable control over certain execution options, such as channels selection (e.g., predication) and data channel order (e.g., swizzle). For instructions in the 128-bit instruction format 2010 an exec-size field 2016 limits the number of data channels that will be executed in parallel. An exec-size field 2016 may not be available for use in the 64-bit compact instruction format 2030.

Some execution unit instructions have up to three operands including two source operands, src0 2020, src 1 2022, and one destination 2018. The execution units may support dual destination instructions, where one of the destinations is implied. Data manipulation instructions can have a third source operand (e.g., SRC2 2024), where the instruction opcode 2012 determines the number of source operands. An instruction's last source operand can be an immediate (e.g., hard-coded) value passed with the instruction.

The 128-bit instruction format 2010 may include an access/address mode field 2026 specifying, for example, whether direct register addressing mode or indirect register addressing mode is used. When direct register addressing mode is used, the register address of one or more operands is directly provided by bits in the instruction.

The 128-bit instruction format 2010 may also include an access/address mode field 2026, which specifies an address mode and/or an access mode for the instruction. The access mode may be used to define a data access alignment for the instruction. Access modes including a 16-byte aligned access mode and a 1-byte aligned access mode may be supported, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

The address mode portion of the access/address mode field 2026 may determine whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

Instructions may be grouped based on opcode 2012 bit-fields to simplify Opcode decode 2040. For an 8-bit opcode, bits 4, 5, and 6 allow the execution unit to determine the type of opcode. The precise opcode grouping shown is merely an example. A move and logic opcode group 2042 may include data movement and logic instructions (e.g., move (mov), compare (cmp)). Move and logic group 2042 may share the five most significant bits (MSB), where move (mov) instructions are in the form of 0000xxxxb and logic instructions are in the form of 0001xxxxb. A flow control instruction group 2044 (e.g., call, jump (jmp)) includes instructions in the form of 0010xxxxb (e.g., 0x20). A miscellaneous instruction group 2046 includes a mix of instructions, including synchronization instructions (e.g., wait, send) in the form of 0011xxxxb (e.g., 0x30). A parallel math instruction group 2048 includes component-wise arithmetic instructions (e.g., add, multiply (mul)) in the form of 0100xxxxb (e.g., 0x40). The parallel math group 2048 performs the arithmetic operations in parallel across data channels. The vector math group 2050 includes arithmetic instructions (e.g., dp4) in the form of 0101xxxxb (e.g., 0x50). The vector math group performs arithmetic such as dot product calculations on vector operands. The illustrated opcode decode 2040, in one embodiment, can be used to determine which portion of an execution unit will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

Figure 21:
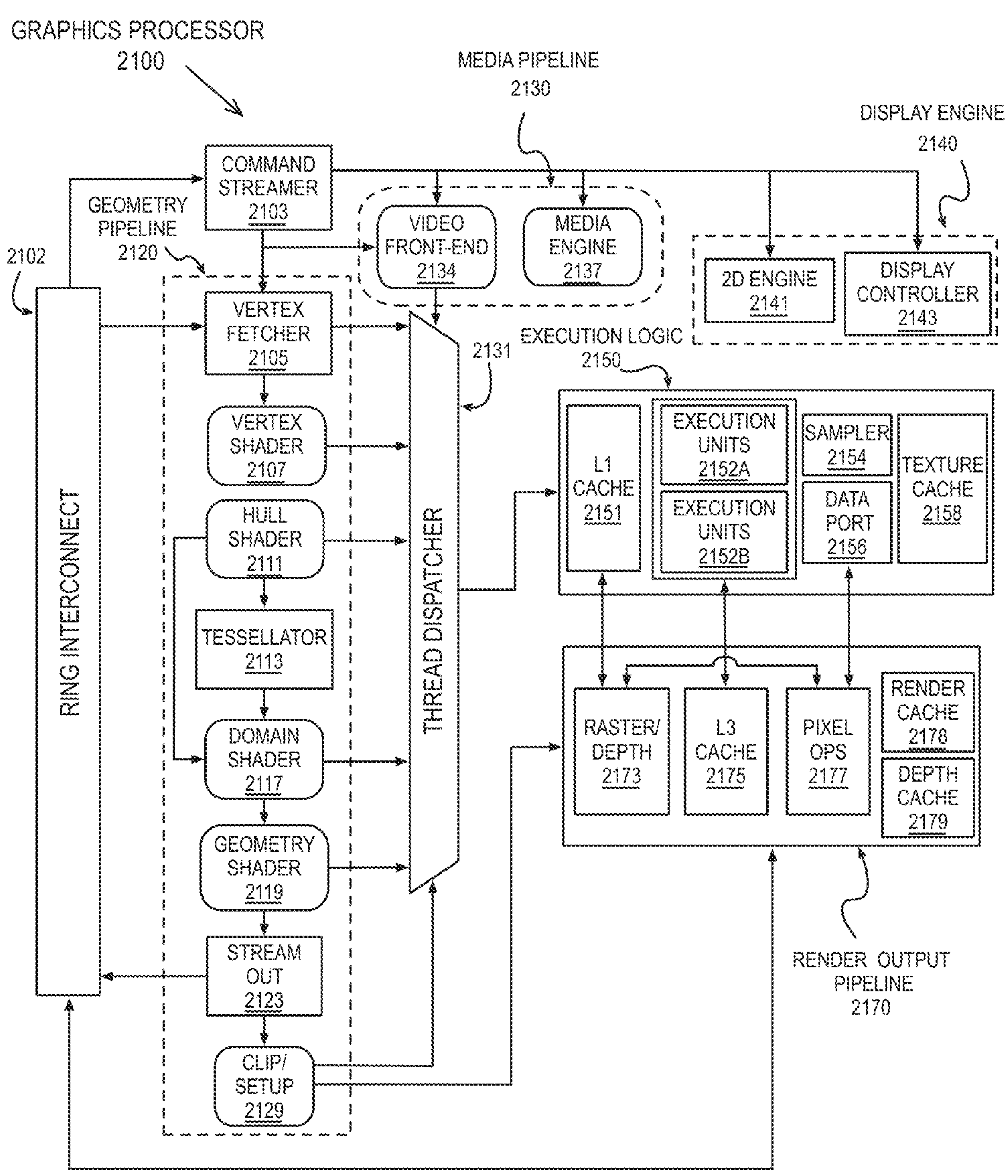
FIG. 21 is a block diagram of an additional graphics processor architecture.

FIG. 21 is a block diagram of graphics processor 2100, according to another embodiment. The elements of FIG. 21 having the same or similar names as the elements of any other figure herein describe the same elements as in the other figures, can operate or function in a manner similar to that, can comprise the same components, and can be linked to other entities, as those described elsewhere herein, but are not limited to such.

The graphics processor 2100 may include different types of graphics processing pipelines, such as a geometry pipeline 2120, a media pipeline 2130, a display engine 2140, thread execution logic 2150, and a render output pipeline 2170. Graphics processor 2100 may be a graphics processor within a multi-core processing system that includes one or more general-purpose processing cores. The graphics processor may be controlled by register writes to one or more control registers (not shown) or via commands issued to graphics processor 2100 via a ring interconnect 2102. Ring interconnect 2102 may couple graphics processor 2100 to other processing components, such as other graphics processors or general-purpose processors. Commands from ring interconnect 2102 are interpreted by a command streamer

2103, which supplies instructions to individual components of the geometry pipeline 2120 or the media pipeline 2130.

Command streamer 2103 may direct the operation of a vertex fetcher 2105 that reads vertex data from memory and executes vertex-processing commands provided by command streamer 2103. The vertex fetcher 2105 may provide vertex data to a vertex shader 2107, which performs coordinate space transformation and lighting operations to each vertex. Vertex fetcher 2105 and vertex shader 2107 may execute vertex-processing instructions by dispatching execution threads to execution units 2152A-2152B via a thread dispatcher 2131.

The execution units 2152A-2152B may be an array of vector processors having an instruction set for performing graphics and media operations. The execution units 2152A-2152B may have an attached L1 cache 2151 that is specific for each array or shared between the arrays. The cache can be configured as a data cache, an instruction cache, or a single cache that is partitioned to contain data and instructions in different partitions.

A geometry pipeline 2120 may include tessellation components to perform hardware-accelerated tessellation of 3D objects. A programmable hull shader 2111 may configure the tessellation operations. A programmable domain shader 2117 may provide back-end evaluation of tessellation output. A tessellator 2113 may operate at the direction of hull shader 2111 and contain special purpose logic to generate a set of detailed geometric objects based on a coarse geometric model that is provided as input to geometry pipeline 2120. In addition, if tessellation is not used, tessellation components (e.g., hull shader 2111, tessellator 2113, and domain shader 2117) can be bypassed.

Complete geometric objects may be processed by a geometry shader 2119 via one or more threads dispatched to execution units 2152A-2152B, or can proceed directly to the clipper 2129. The geometry shader may operate on entire geometric objects, rather than vertices or patches of vertices as in previous stages of the graphics pipeline. If the tessellation is disabled the geometry shader 2119 receives input from the vertex shader 2107. The geometry shader 2119 may be programmable by a geometry shader program to perform geometry tessellation if the tessellation units are disabled.

Before rasterization, a clipper 2129 processes vertex data. The clipper 2129 may be a fixed function clipper or a programmable clipper having clipping and geometry shader functions. A rasterizer and depth test component 2173 in the render output pipeline 2170 may dispatch pixel shaders to convert the geometric objects into per pixel representations. The pixel shader logic may be included in thread execution logic 2150. Optionally, an application can bypass the rasterizer and depth test component 2173 and access unrasterized vertex data via a stream out unit 2123.

The graphics processor 2100 has an interconnect bus, interconnect fabric, or some other interconnect mechanism that allows data and message passing amongst the major components of the processor. In some embodiments, execution units 2152A-2152B and associated logic units (e.g., L1 cache 2151, sampler 2154, texture cache 2158, etc.) interconnect via a data port 2156 to perform memory access and communicate with render output pipeline components of the processor. A sampler 2154, caches 2151, 2158 and execution units 2152A-2152B each may have separate memory access paths. Optionally, the texture cache 2158 can also be configured as a sampler cache.

The render output pipeline 2170 may contain a rasterizer and depth test component 2173 that converts vertex-based objects into an associated pixel-based representation. The rasterizer logic may include a windower/masker unit to perform fixed function triangle and line rasterization. An associated render cache 2178 and depth cache 2179 are also available in some embodiments. A pixel operations component 2177 performs pixel-based operations on the data, though in some instances, pixel operations associated with 2D operations (e.g. bit block image transfers with blending) are performed by the 2D engine 2141, or substituted at display time by the display controller 2143 using overlay display planes. A shared L3 cache 2175 may be available to all graphics components, allowing the sharing of data without the use of main system memory.

The graphics processor media pipeline 2130 may include a media engine 2137 and a video front-end 2134. Video front-end 2134 may receive pipeline commands from the command streamer 2103. The media pipeline 2130 may include a separate command streamer. Video front-end 2134 may process media commands before sending the command to the media engine 2137. Media engine 2137 may include thread spawning functionality to spawn threads for dispatch to thread execution logic 2150 via thread dispatcher 2131.

The graphics processor 2100 may include a display engine 2140. This display engine 2140 may be external to processor 2100 and may couple with the graphics processor via the ring interconnect 2102, or some other interconnect bus or fabric. Display engine 2140 may include a 2D engine 2141 and a display controller 2143. Display engine 2140 may contain special purpose logic capable of operating independently of the 3D pipeline. Display controller 2143 may couple with a display device (not shown), which may be a system integrated display device, as in a laptop computer, or an external display device attached via a display device connector.

The geometry pipeline 2120 and media pipeline 2130 maybe configurable to perform operations based on multiple graphics and media programming interfaces and are not specific to any one application programming interface (API). A driver software for the graphics processor may translate API calls that are specific to a particular graphics or media library into commands that can be processed by the graphics processor. Support may be provided for the Open Graphics Library (OpenGL), Open Computing Language (OpenCL), and/or Vulkan graphics and compute API, all from the Khronos Group. Support may also be provided for the Direct3D library from the Microsoft Corporation. A combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figures 22A, 22B:
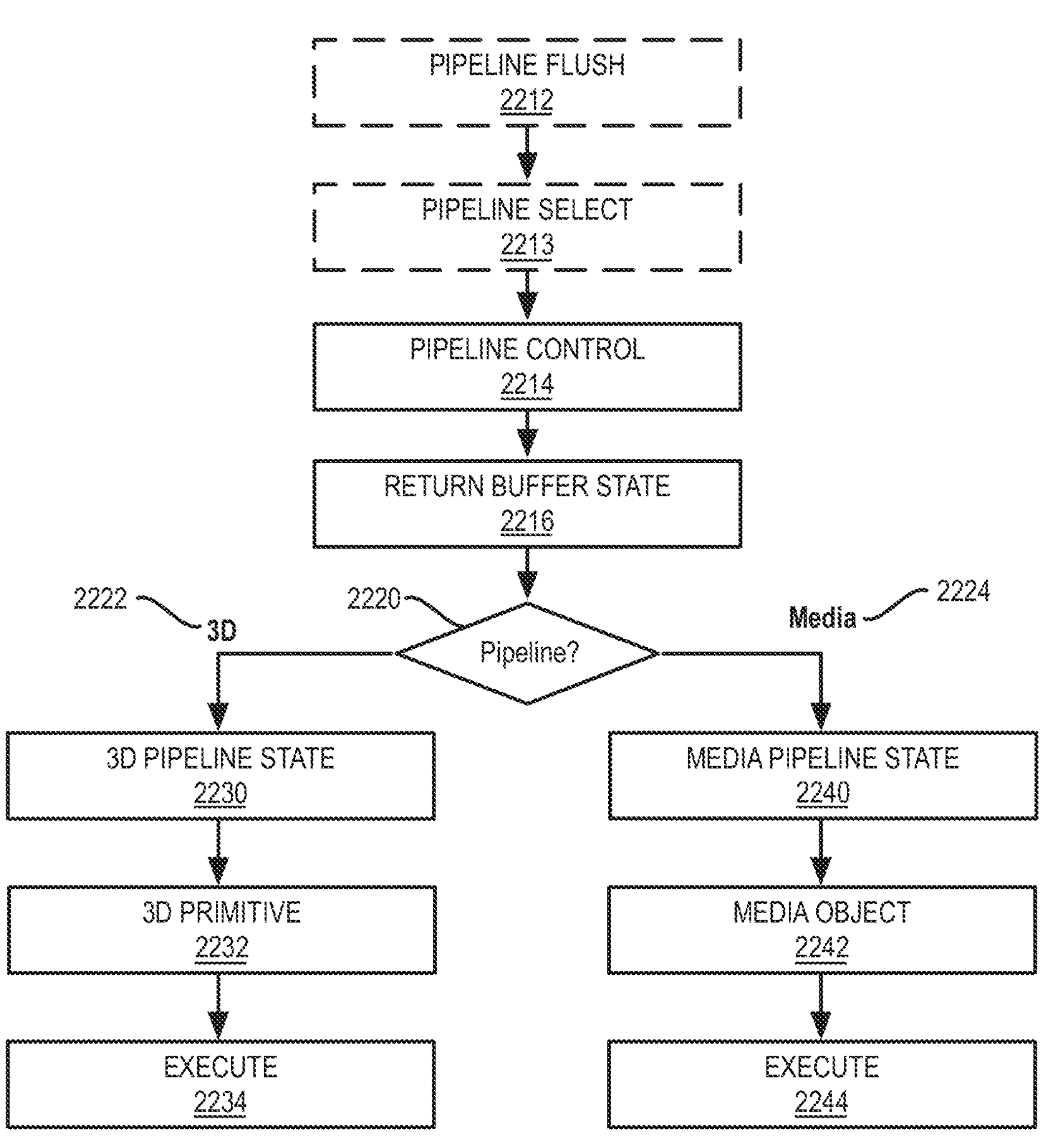
FIG. 22A-22B illustrate a graphics processor command format and command sequence.

FIG. 22A is a block diagram illustrating a graphics processor command format 2200 used for programming graphics processing pipelines, such as, for example, the pipelines described herein in conjunction with FIG. 16A, 17, 21. FIG. 22B is a block diagram illustrating a graphics processor command sequence 2210 according to an embodiment. The solid lined boxes in FIG. 22A illustrate the components that are generally included in a graphics command while the dashed lines include components that are optional or that are only included in a sub-set of the graphics commands. The exemplary graphics processor command format 2200 of FIG. 22A includes data fields to identify a client 2202, a command operation code (opcode) 2204, and data 2206 for the command. A sub-opcode 2205 and a command size 2208 are also included in some commands.

Client 2202 may specify the client unit of the graphics device that processes the command data. A graphics processor command parser may examine the client field of each command to condition the further processing of the command and route the command data to the appropriate client unit. The graphics processor client units may include a memory interface unit, a render unit, a 2D unit, a 3D unit, and a media unit. Each client unit may have a corresponding processing pipeline that processes the commands. Once the command is received by the client unit, the client unit reads the opcode 2204 and, if present, sub-opcode 2205 to determine the operation to perform. The client unit performs the command using information in data field 2206. For some commands an explicit command size 2208 is expected to specify the size of the command. The command parser may automatically determine the size of at least some of the commands based on the command opcode. Commands may be aligned via multiples of a double word. Other command formats can also be used.

The flow diagram in FIG. 22B illustrates an exemplary graphics processor command sequence 2210. Software or firmware of a data processing system that features an exemplary graphics processor may use a version of the command sequence shown to set up, execute, and terminate a set of graphics operations. A sample command sequence is shown and described for purposes of example only and is not limited to these specific commands or to this command sequence. Moreover, the commands may be issued as batch of commands in a command sequence, such that the graphics processor will process the sequence of commands in at least partially concurrence.

The graphics processor command sequence 2210 may begin with a pipeline flush command 2212 to cause any active graphics pipeline to complete the currently pending commands for the pipeline. Optionally, the 3D pipeline 2222 and the media pipeline 2224 may not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. Pipeline flush command 2212 can be used for pipeline synchronization or before placing the graphics processor into a low power state.

A pipeline select command 2213 may be used when a command sequence requires the graphics processor to explicitly switch between pipelines. A pipeline select command 2213 may be required only once within an execution context before issuing pipeline commands unless the context is to issue commands for both pipelines. A pipeline flush command 2212 may be required immediately before a pipeline switch via the pipeline select command 2213.

A pipeline control command 2214 may configure a graphics pipeline for operation and may be used to program the 3D pipeline 2222 and the media pipeline 2224. The pipeline control command 2214 may configure the pipeline state for the active pipeline. The pipeline control command 2214 may be used for pipeline synchronization and to clear data from one or more cache memories within the active pipeline before processing a batch of commands.

Return buffer state commands 2216 may be used to configure a set of return buffers for the respective pipelines to write data. Some pipeline operations require the allocation, selection, or configuration of one or more return buffers into which the operations write intermediate data during processing. The graphics processor may also use one or more return buffers to store output data and to perform cross thread communication. The return buffer state 2216 may include selecting the size and number of return buffers to use for a set of pipeline operations.

The remaining commands in the command sequence differ based on the active pipeline for operations. Based on a pipeline determination 2220, the command sequence is tailored to the 3D pipeline 2222 beginning with the 3D pipeline state 2230 or the media pipeline 2224 beginning at the media pipeline state 2240.

The commands to configure the 3D pipeline state 2230 include 3D state setting commands for vertex buffer state, vertex element state, constant color state, depth buffer state, and other state variables that are to be configured before 3D primitive commands are processed. The values of these commands are determined at least in part based on the particular 3D API in use. The 3D pipeline state 2230 commands may also be able to selectively disable or bypass certain pipeline elements if those elements will not be used.

A 3D primitive 2232 command may be used to submit 3D primitives to be processed by the 3D pipeline. Commands and associated parameters that are passed to the graphics processor via the 3D primitive 2232 command are forwarded to the vertex fetch function in the graphics pipeline. The vertex fetch function uses the 3D primitive 2232 command data to generate vertex data structures. The vertex data structures are stored in one or more return buffers. The 3D primitive 2232 command may be used to perform vertex operations on 3D primitives via vertex shaders. To process vertex shaders, 3D pipeline 2222 dispatches shader execution threads to graphics processor execution units.

The 3D pipeline 2222 may be triggered via an execute 2234 command or event. A register may write trigger command executions. An execution may be triggered via a 'go' or 'kick' command in the command sequence. Command execution may be triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

The graphics processor command sequence 2210 may follow the media pipeline 2224 path when performing media operations. In general, the specific use and manner of programming for the media pipeline 2224 depends on the media or compute operations to be performed. Specific media decode operations may be offloaded to the media pipeline during media decode. The media pipeline can also be bypassed and media decode can be performed in whole or in part using resources provided by one or more general-purpose processing cores. The media pipeline may also include elements for general-purpose graphics processor unit (GPGPU) operations, where the graphics processor is used to perform SIMD vector operations using computational shader programs that are not explicitly related to the rendering of graphics primitives.

Media pipeline 2224 may be configured in a similar manner as the 3D pipeline 2222. A set of commands to configure the media pipeline state 2240 are dispatched or placed into a command queue before the media object commands 2242. Commands for the media pipeline state 2240 may include data to configure the media pipeline elements that will be used to process the media objects. This includes data to configure the video decode and video encode logic within the media pipeline, such as encode or decode format. Commands for the media pipeline state 2240 may also support the use of one or more pointers to "indirect" state elements that contain a batch of state settings.

Media object commands 2242 may supply pointers to media objects for processing by the media pipeline. The media objects include memory buffers containing video data to be processed. Optionally, all media pipeline states must be valid before issuing a media object command 2242. Once the pipeline state is configured and media object commands 2242 are queued, the media pipeline 2224 is triggered via an execute command 2244 or an equivalent execute event (e.g., register write). Output from media pipeline 2224 may then be post processed by operations provided by the 3D pipeline 2222 or the media pipeline 2224. GPGPU operations may be configured and executed in a similar manner as media operations.

Graphics Software Architecture

Figure 23:
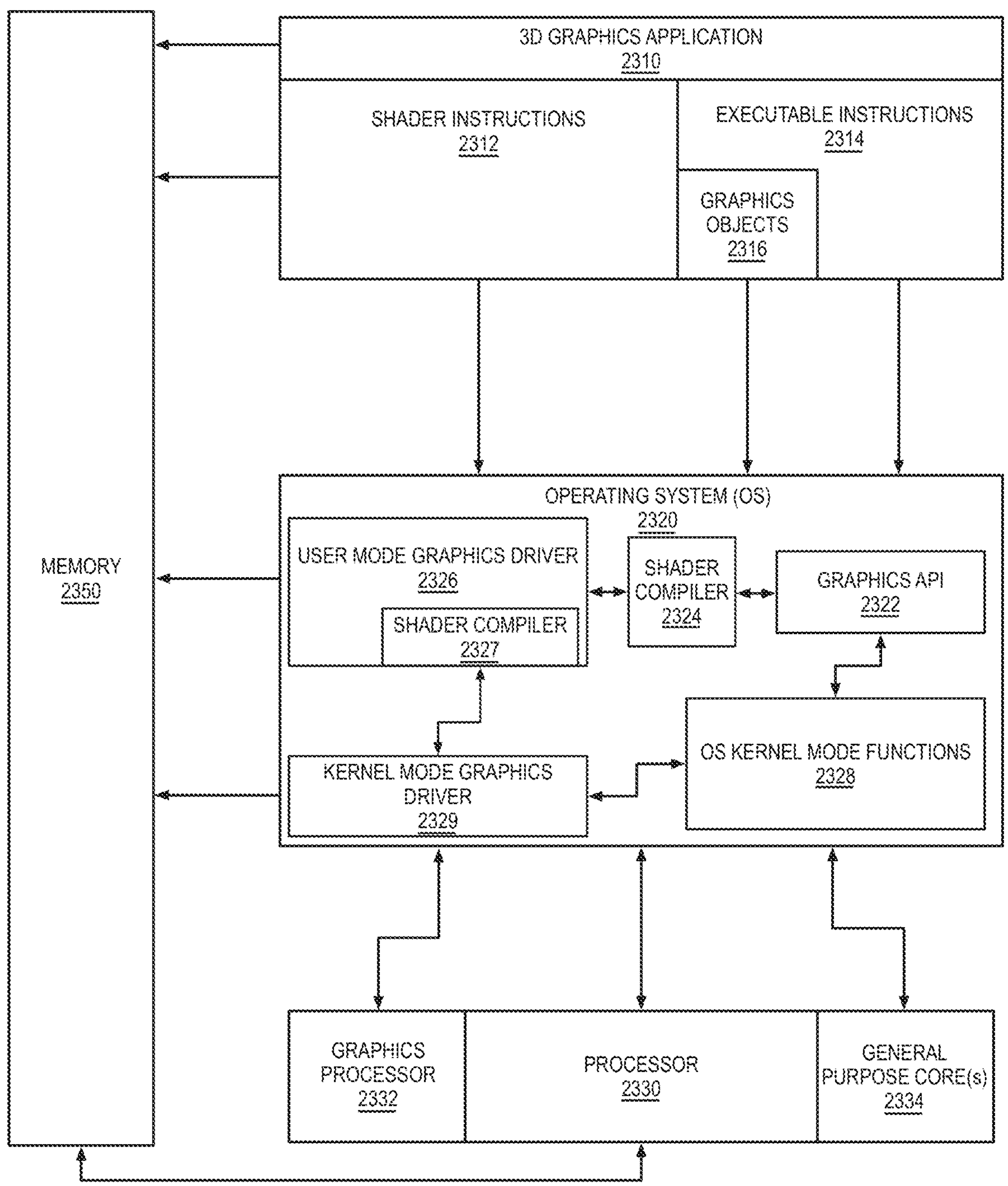
FIG. 23 illustrates exemplary graphics software architecture for a data processing system.

FIG. 23 illustrates an exemplary graphics software architecture for a data processing system 2300. Such a software architecture may include a 3D graphics application 2310, an operating system 2320, and at least one processor 2330. Processor 2330 may include a graphics processor 2332 and one or more general-purpose processor core(s) 2334. The processor 2330 may be a variant of the processor 1402 or any other of the processors described herein. The processor 2330 may be used in place of the processor 1402 or any other of the processors described herein. Therefore, the disclosure of any features in combination with the processor 1402 or any other of the processors described herein also discloses a corresponding combination with the graphics processor 2330, but is not limited to such. Moreover, the elements of FIG. 23 having the same or similar names as the elements of any other figure herein describe the same elements as in the other figures, can operate or function in a manner similar to that, can comprise the same components, and can be linked to other entities, as those described elsewhere herein, but are not limited to such. The graphics application 2310 and operating system 2320 are each executed in the system memory 2350 of the data processing system.

3D graphics application 2310 may contain one or more shader programs including shader instructions 2312. The shader language instructions may be in a high-level shader language, such as the High-Level Shader Language (HLSL) of Direct3D, the OpenGL Shader Language (GLSL), and so forth. The application may also include executable instructions 2314 in a machine language suitable for execution by the general-purpose processor core 2334. The application may also include graphics objects 2316 defined by vertex data.

The operating system 2320 may be a Microsoft® Windows® operating system from the Microsoft Corporation, a proprietary UNIX-like operating system, or an open source UNIX-like operating system using a variant of the Linux kernel. The operating system 2320 can support a graphics API 2322 such as the Direct3D API, the OpenGL API, or the Vulkan API. When the Direct3D API is in use, the operating system 2320 uses a front-end shader compiler 2324 to compile any shader instructions 2312 in HLSL into a lower-level shader language. The compilation may be a just-in-time (JIT) compilation or the application can perform shader pre-compilation. High-level shaders may be compiled into low-level shaders during the compilation of the 3D graphics application 2310. The shader instructions 2312 may be provided in an intermediate form, such as a version of the Standard Portable Intermediate Representation (SPIR) used by the Vulkan API.

User mode graphics driver 2326 may contain a back-end shader compiler 2327 to convert the shader instructions 2312 into a hardware specific representation. When the OpenGL API is in use, shader instructions 2312 in the GLSL high-level language are passed to a user mode graphics driver 2326 for compilation. The user mode graphics driver 2326 may use operating system kernel mode functions 2328 to communicate with a kernel mode graphics driver 2329. The kernel mode graphics driver 2329 may communicate with graphics processor 2332 to dispatch commands and instructions.

IP Core Implementations

One or more aspects may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

FIG. 24A is a block diagram illustrating an IP core development system 2400 that may be used to manufacture an integrated circuit to perform operations according to an embodiment. The IP core development system 2400 may be used to generate modular, re-usable designs that can be incorporated into a larger design or used to construct an entire integrated circuit (e.g., an SOC integrated circuit). A design facility 2430 can generate a software simulation 2410 of an IP core design in a high-level programming language (e.g., C/C++). The software simulation 2410 can be used to design, test, and verify the behavior of the IP core using a simulation model 2412. The simulation model 2412 may include functional, behavioral, and/or timing simulations. A register transfer level (RTL) design 2415 can then be created or synthesized from the simulation model 2412. The RTL design 2415 is an abstraction of the behavior of the integrated circuit that models the flow of digital signals between hardware registers, including the associated logic performed using the modeled digital signals. In addition to an RTL design 2415, lower-level designs at the logic level or transistor level may also be created, designed, or synthesized. Thus, the particular details of the initial design and simulation may vary.

The RTL design 2415 or equivalent may be further synthesized by the design facility into a hardware model 2420, which may be in a hardware description language (HDL), or some other representation of physical design data. The HDL may be further simulated or tested to verify the IP core design. The IP core design can be stored for delivery to a 3$^{rd}$ party fabrication facility 2465 using non-volatile memory 2440 (e.g., hard disk, flash memory, or any non-volatile storage medium). Alternatively, the IP core design may be transmitted (e.g., via the Internet) over a wired connection 2450 or wireless connection 2460. The fabrication facility 2465 may then fabricate an integrated circuit that is based at least in part on the IP core design. The fabricated integrated circuit can be configured to perform operations in accordance with at least one embodiment described herein.

Figure 24B:
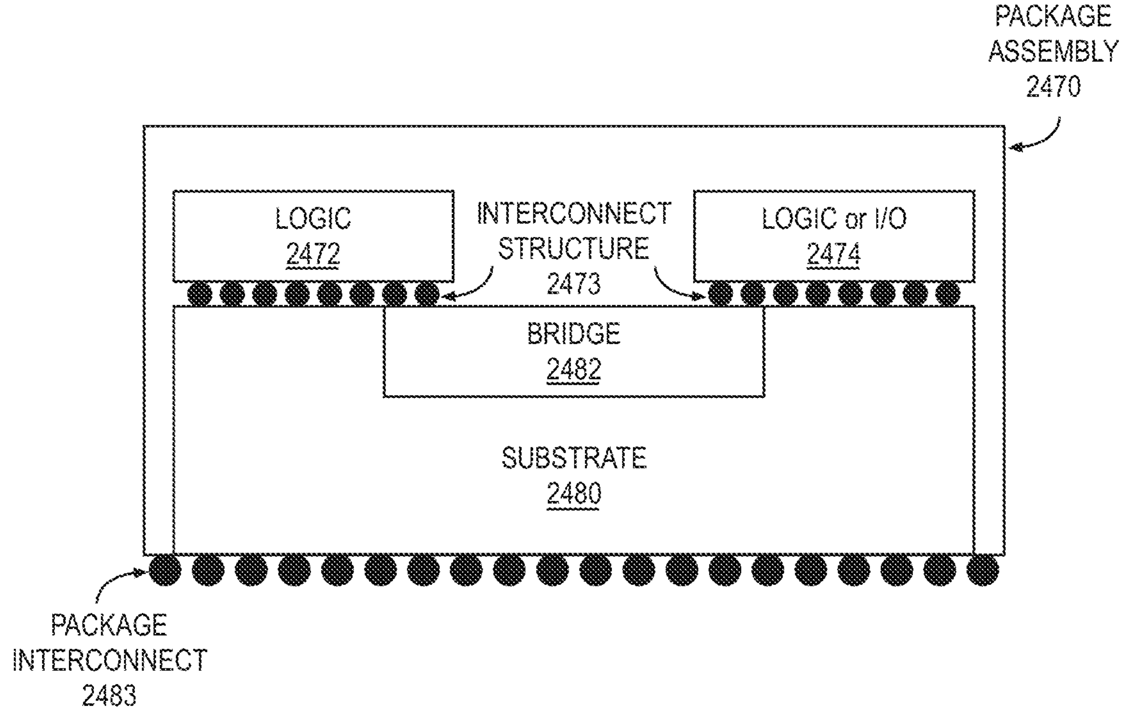
FIG. 24B illustrates a cross-section side view of an integrated circuit package assembly.

FIG. 24B illustrates a cross-section side view of an integrated circuit package assembly 2470. The integrated circuit package assembly 2470 illustrates an implementation of one or more processor or accelerator devices as described herein. The package assembly 2470 includes multiple units of hardware logic 2472, 2474 connected to a substrate 2480. The logic 2472, 2474 may be implemented at least partly in configurable logic or fixed-functionality logic hardware, and can include one or more portions of any of the processor core(s), graphics processor(s), or other accelerator devices described herein. Each unit of logic 2472, 2474 can be implemented within a semiconductor die and coupled with the substrate 2480 via an interconnect structure 2473. The interconnect structure 2473 may be configured to route electrical signals between the logic 2472, 2474 and the substrate 2480, and can include interconnects such as, but not limited to bumps or pillars. The interconnect structure 2473 may be configured to route electrical signals such as, for example, input/output (I/O) signals and/or power or ground signals associated with the operation of the logic 2472, 2474. Optionally, the substrate 2480 may be an epoxy-based laminate substrate. The substrate 2480 may also include other suitable types of substrates. The package assembly 2470 can be connected to other electrical devices via a package interconnect 2483. The package interconnect 2483 may be coupled to a surface of the substrate 2480 to route electrical signals to other electrical devices, such as a motherboard, other chipset, or multi-chip module.

The units of logic 2472, 2474 may be electrically coupled with a bridge 2482 that is configured to route electrical signals between the logic 2472, 2474. The bridge 2482 may be a dense interconnect structure that provides a route for electrical signals. The bridge 2482 may include a bridge substrate composed of glass or a suitable semiconductor material. Electrical routing features can be formed on the bridge substrate to provide a chip-to-chip connection between the logic 2472, 2474.

Although two units of logic 2472, 2474 and a bridge 2482 are illustrated, embodiments described herein may include more or fewer logic units on one or more dies. The one or more dies may be connected by zero or more bridges, as the bridge 2482 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Figure 24C:
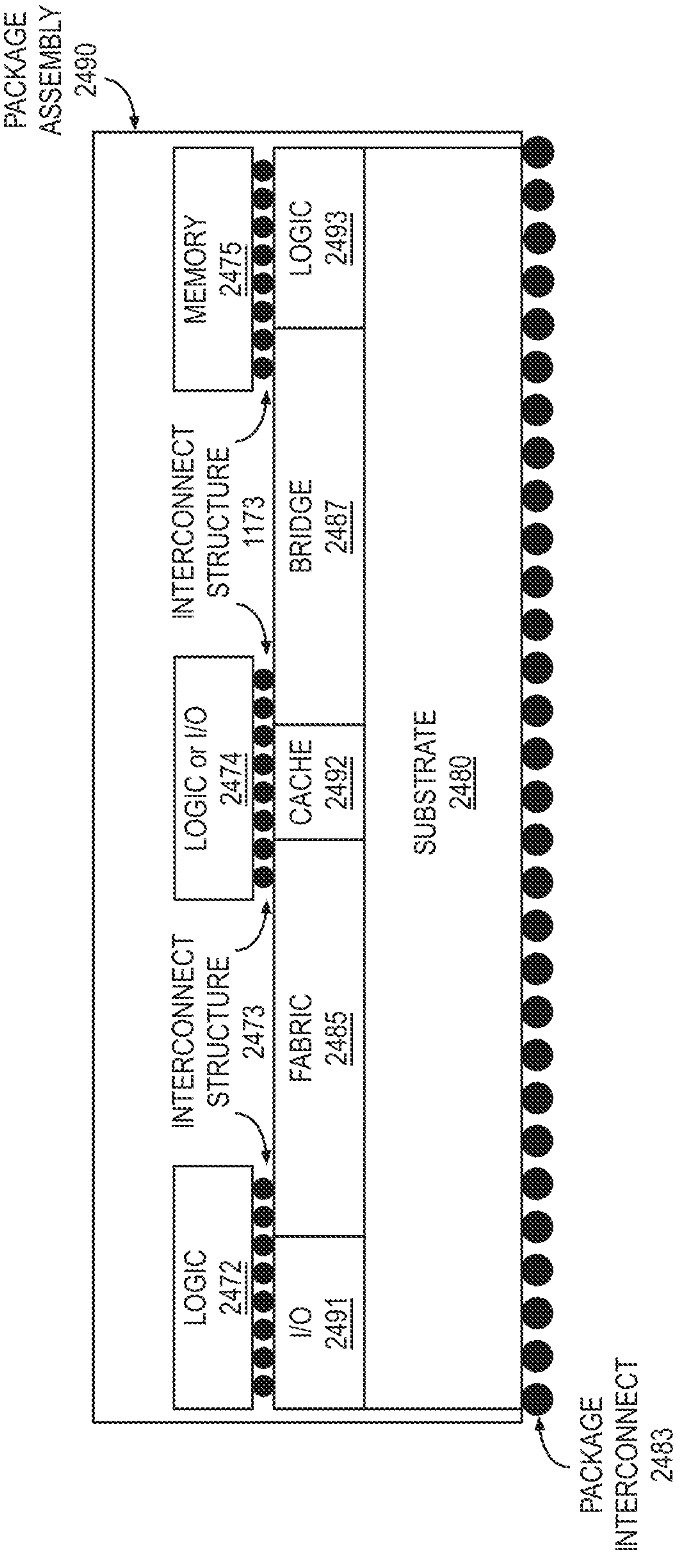
FIG. 24C illustrates a package assembly that includes multiple units of hardware logic chiplets connected to a substrate (e.g., base die)

FIG. 24C illustrates a package assembly 2490 that includes multiple units of hardware logic chiplets connected to a substrate 2480 (e.g., base die). A graphics processing unit, parallel processor, and/or compute accelerator as described herein can be composed from diverse silicon chiplets that are separately manufactured. In this context, a chiplet is an at least partially packaged integrated circuit that includes distinct units of logic that can be assembled with other chiplets into a larger package. A diverse set of chiplets with different IP core logic can be assembled into a single device. Additionally the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

The hardware logic chiplets can include special purpose hardware logic chiplets 2472, logic or I/O chiplets 2474, and/or memory chiplets 2475. The hardware logic chiplets 2472 and logic or I/O chiplets 2474 may be implemented at least partly in configurable logic or fixed-functionality logic hardware and can include one or more portions of any of the processor core(s), graphics processor(s), parallel processors, or other accelerator devices described herein. The memory chiplets 2475 can be DRAM (e.g., GDDR, HBM) memory or cache (SRAM) memory.

Each chiplet can be fabricated as separate semiconductor die and coupled with the substrate 2480 via an interconnect structure 2473. The interconnect structure 2473 may be configured to route electrical signals between the various chiplets and logic within the substrate 2480. The interconnect structure 2473 can include interconnects such as, but not limited to bumps or pillars. In some embodiments, the interconnect structure 2473 may be configured to route electrical signals such as, for example, input/output (I/O) signals and/or power or ground signals associated with the operation of the logic, I/O and memory chiplets.

The substrate 2480 may be an epoxy-based laminate substrate, however, it is not limited to that and the substrate 2480 may also include other suitable types of substrates. The package assembly 2490 can be connected to other electrical devices via a package interconnect 2483. The package interconnect 2483 may be coupled to a surface of the substrate 2480 to route electrical signals to other electrical devices, such as a motherboard, other chipset, or multi-chip module.

A logic or I/O chiplet 2474 and a memory chiplet 2475 may be electrically coupled via a bridge 2487 that is configured to route electrical signals between the logic or I/O chiplet 2474 and a memory chiplet 2475. The bridge 2487 may be a dense interconnect structure that provides a route for electrical signals. The bridge 2487 may include a bridge substrate composed of glass or a suitable semiconductor material. Electrical routing features can be formed on the bridge substrate to provide a chip-to-chip connection between the logic or I/O chiplet 2474 and a memory chiplet 2475. The bridge 2487 may also be referred to as a silicon bridge or an interconnect bridge. For example, the bridge 2487 is an Embedded Multi-die Interconnect Bridge (EMIB). Alternatively, the bridge 2487 may simply be a direct connection from one chiplet to another chiplet.

The substrate 2480 can include hardware components for I/O 2491, cache memory 2492, and other hardware logic 2493. A fabric 2485 can be embedded in the substrate 2480 to enable communication between the various logic chiplets and the logic 2491, 2493 within the substrate 2480. Optionally, the I/O 2491, fabric 2485, cache, bridge, and other hardware logic 2493 can be integrated into a base die that is layered on top of the substrate 2480.

Furthermore, a package assembly 2490 can also include a smaller or greater number of components and chiplets that are interconnected by a fabric 2485 or one or more bridges 2487. The chiplets within the package assembly 2490 may be arranged in a 3D or 2.5D arrangement. In general, bridge structures 2487 may be used to facilitate a point to point interconnect between, for example, logic or I/O chiplets and memory chiplets. The fabric 2485 can be used to interconnect the various logic and/or I/O chiplets (e.g., chiplets 2472, 2474, 2491, 2493). with other logic and/or I/O chiplets. The cache memory 2492 within the substrate can act as a global cache for the package assembly 2490, part of a distributed global cache, or as a dedicated cache for the fabric 2485.

Figure 24D:
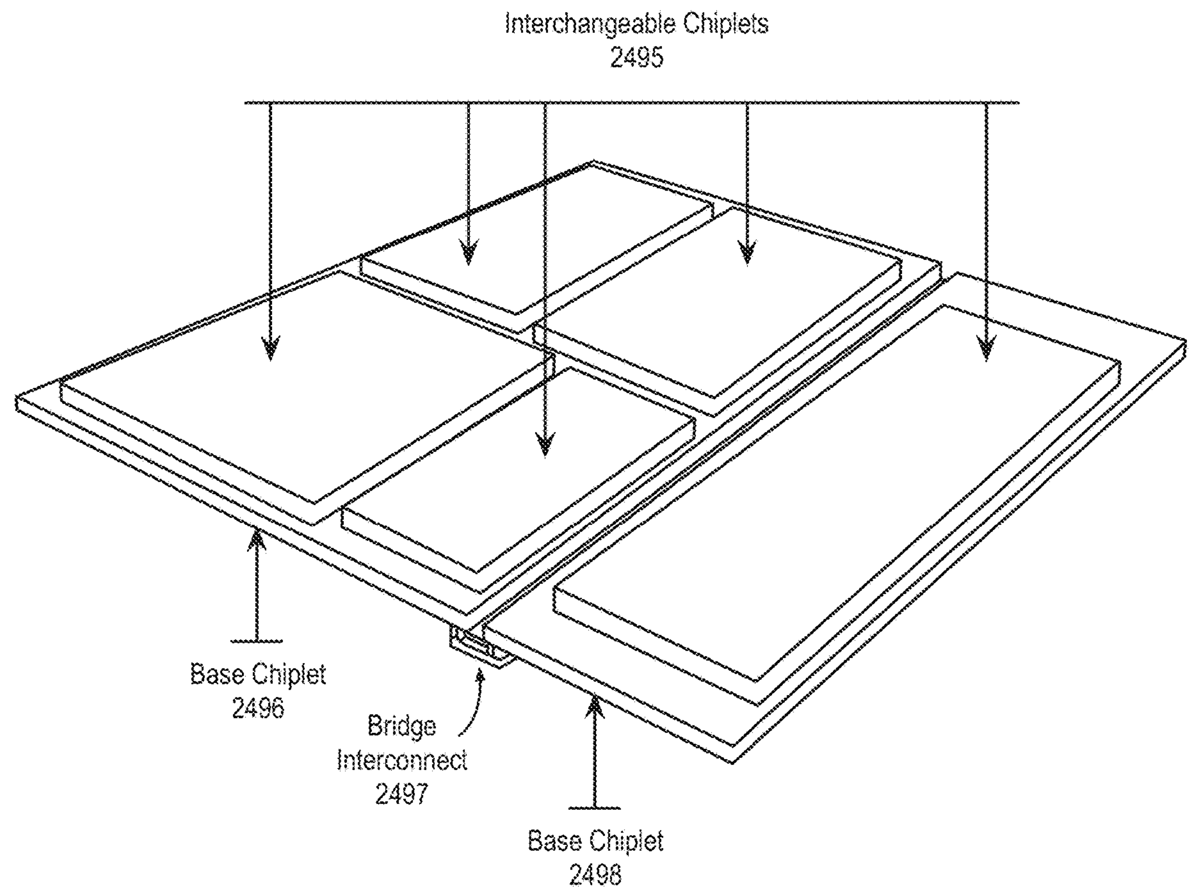
FIG. 24D illustrates a package assembly including interchangeable chiplets.

FIG. 24D illustrates a package assembly 2494 including interchangeable chiplets 2495, according to an embodiment. The interchangeable chiplets 2495 can be assembled into standardized slots on one or more base chiplets 2496, 2498. The base chiplets 2496, 2498 can be coupled via a bridge interconnect 2497, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

SRAM and power delivery circuits may be fabricated into one or more of the base chiplets 2496, 2498, which can be fabricated using a different process technology relative to the interchangeable chiplets 2495 that are stacked on top of the base chiplets. For example, the base chiplets 2496, 2498 can be fabricated using a larger process technology, while the interchangeable chiplets can be manufactured using a smaller process technology. One or more of the interchangeable chiplets 2495 may be memory (e.g., DRAM) chiplets. Different memory densities can be selected for the package assembly 2494 based on the power, and/or performance targeted for the product that uses the package assembly 2494. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on a Chip Integrated Circuit

Figure 25:
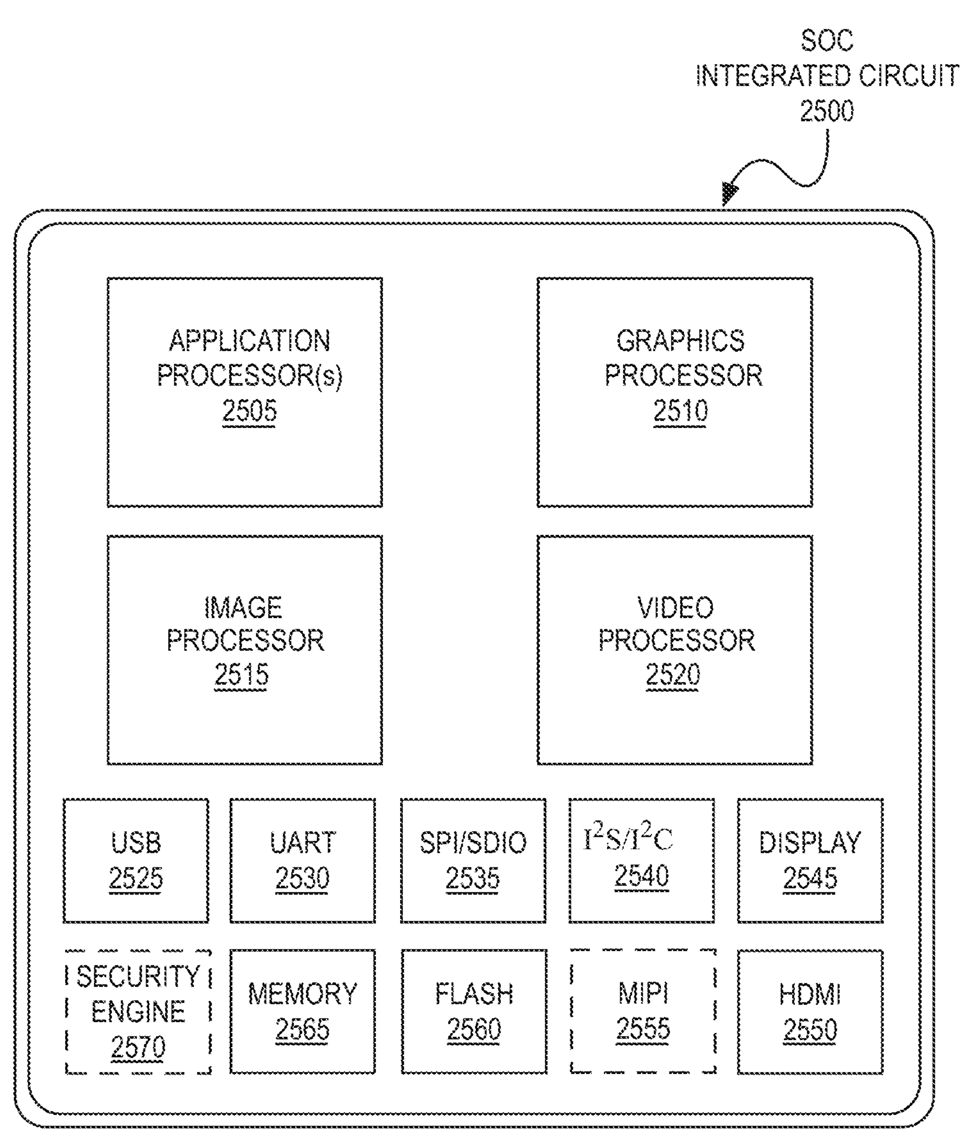
FIG. 25 is a block diagram illustrating an exemplary system on a chip integrated circuit.

FIG. 25-26 illustrate exemplary integrated circuits and associated graphics processors that may be fabricated using one or more IP cores. In addition to what is illustrated, other logic and circuits may be included, including additional graphics processors/cores, peripheral interface controllers, or general-purpose processor cores. The elements of FIG. 25-26 having the same or similar names as the elements of any other figure herein describe the same elements as in the other figures, can operate or function in a manner similar to that, can comprise the same components, and can be linked to other entities, as those described elsewhere herein, but are not limited to such.

FIG. 25 is a block diagram illustrating an exemplary system on a chip integrated circuit 2500 that may be fabricated using one or more IP cores. Exemplary integrated circuit 2500 includes one or more application processor(s) 2505 (e.g., CPUs), at least one graphics processor 2510, which may be a variant of the graphics processor 1408, 1508, 2510, or of any graphics processor described herein and may be used in place of any graphics processor described. Therefore, the disclosure of any features in combination with a graphics processor herein also discloses a corresponding combination with the graphics processor 2510, but is not limited to such. The integrated circuit 2500 may additionally include an image processor 2515 and/or a video processor 2520, any of which may be a modular IP core from the same or multiple different design facilities. Integrated circuit 2500 may include peripheral or bus logic including a USB controller 2525, UART controller 2530, an SPI/SDIO controller 2535, and an $I^2S/I^2C$ controller 2540. Additionally, the integrated circuit can include a display device 2545 coupled to one or more of a high-definition multimedia interface (HDMI) controller 2550 and a mobile industry processor interface (MIPI) display interface 2555. Storage may be provided by a flash memory subsystem 2560 including flash memory and a flash memory controller. Memory interface may be provided via a memory controller 2565 for access to SDRAM or SRAM memory devices. Some integrated circuits additionally include an embedded security engine 2570.

Figure 26A:
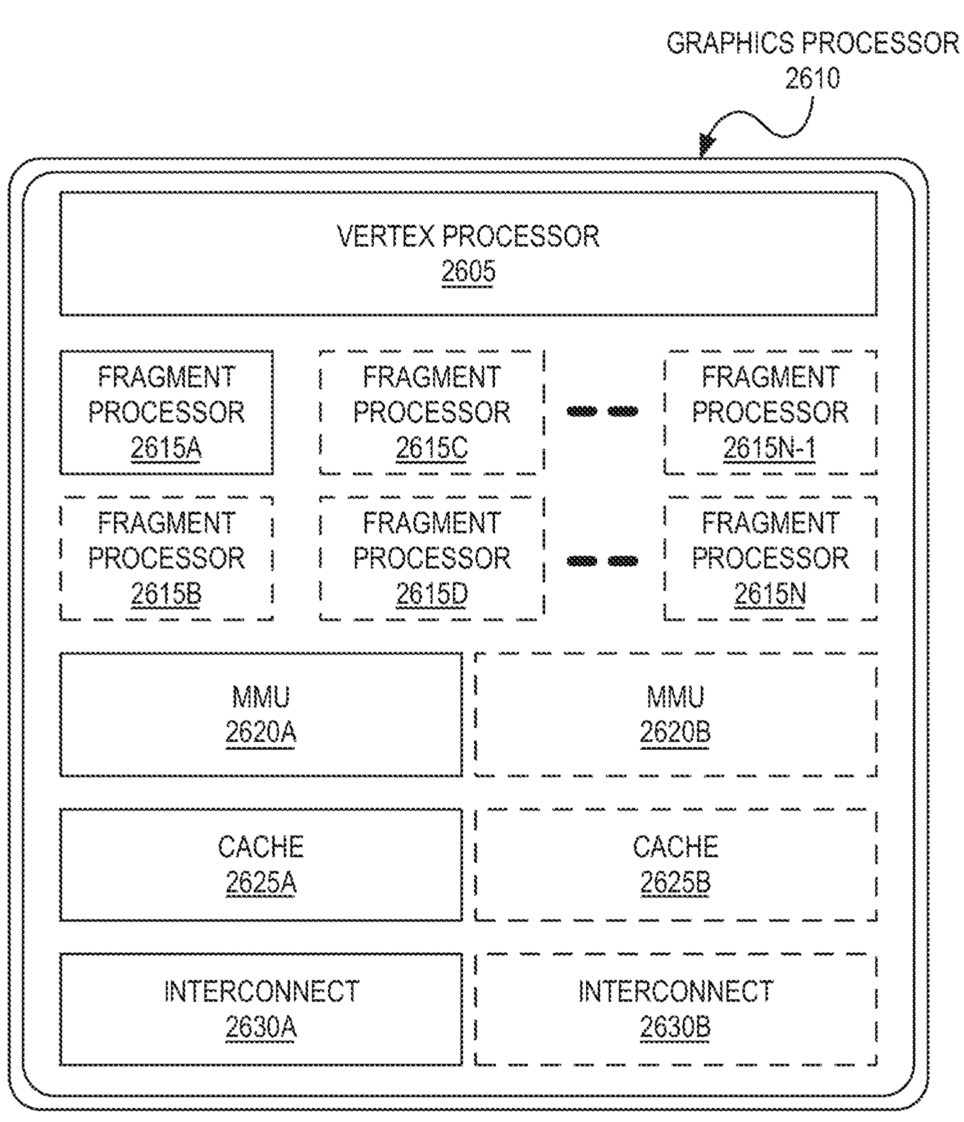
FIG. 26A-26B are block diagrams illustrating exemplary graphics processors for use within an SoC.
Figure 26B:
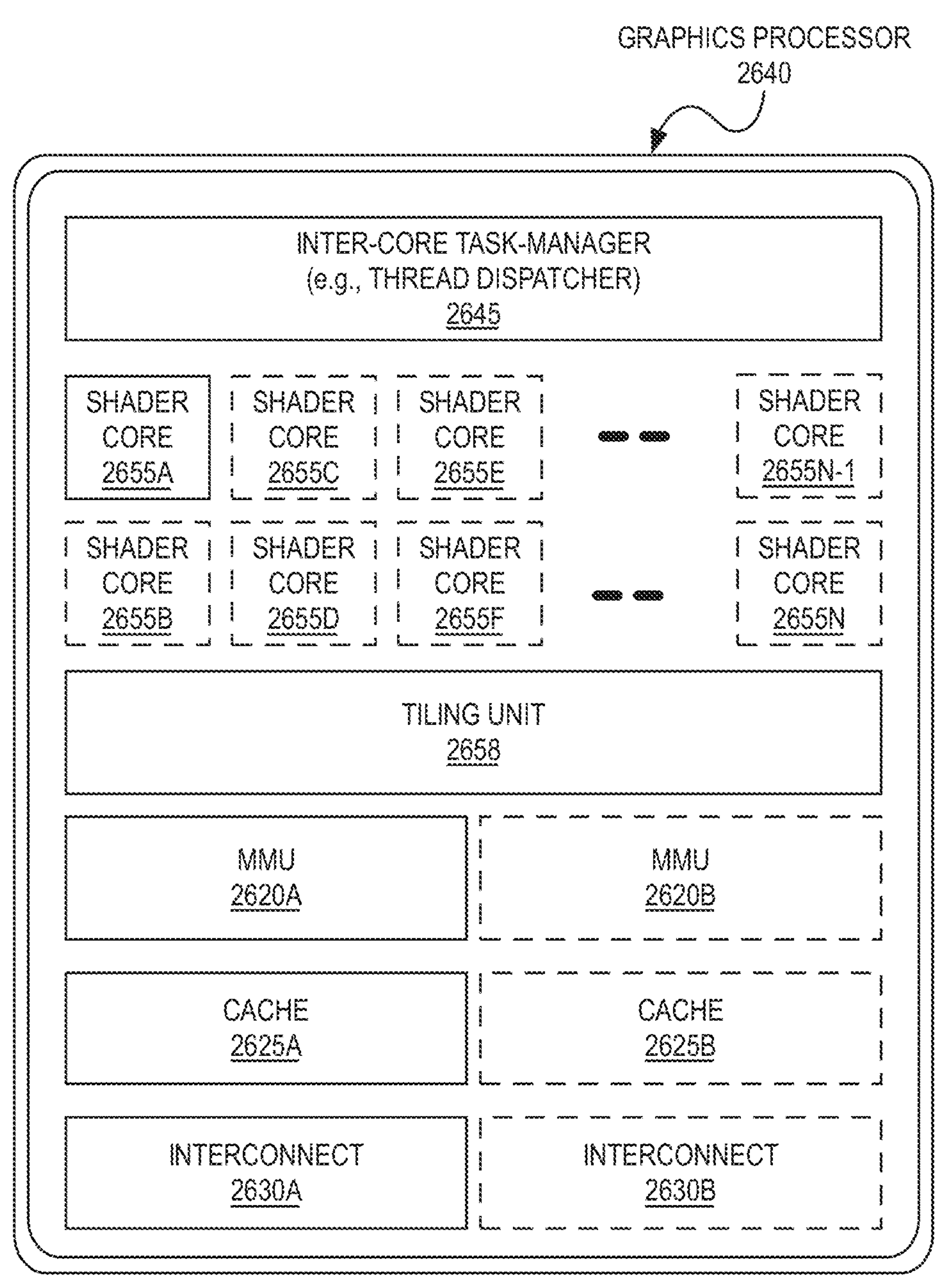

FIG. 26A-26B are block diagrams illustrating exemplary graphics processors for use within an SoC, according to embodiments described herein. The graphics processors may be variants of the graphics processor 1408, 1508, 2510, or any other graphics processor described herein. The graphics processors may be used in place of the graphics processor 1408, 1508, 2510, or any other of the graphics processors described herein. Therefore, the disclosure of any features in combination with the graphics processor 1408, 1508, 2510, or any other of the graphics processors described herein also discloses a corresponding combination with the graphics processors of FIG. 26A-26B, but is not limited to such. FIG. 26A illustrates an exemplary graphics processor 2610 of a system on a chip integrated circuit that may be fabricated using one or more IP cores, according to an embodiment. FIG. 26B illustrates an additional exemplary graphics processor 2640 of a system on a chip integrated circuit that may be fabricated using one or more IP cores, according to an embodiment. Graphics processor 2610 of FIG. 26A is an example of a low power graphics processor core. Graphics processor 2640 of FIG. 26B is an example of a higher performance graphics processor core. For example, each of the graphics processors 2610, 2640 can be a variant of the graphics processor 2510 of FIG. 25, as mentioned at the outset of this paragraph.

As shown in FIG. 26A, graphics processor 2610 includes a vertex processor 2605 and one or more fragment processor(s) 2615A-2615N (e.g., 2615A, 2615B, 2615C, 2615D, through 2615N-1, and 2615N). Graphics processor 2610 can execute different shader programs via separate logic, such that the vertex processor 2605 is optimized to execute operations for vertex shader programs, while the one or more fragment processor(s) 2615A-2615N execute fragment (e.g., pixel) shading operations for fragment or pixel shader programs. The vertex processor 2605 performs the vertex processing stage of the 3D graphics pipeline and generates primitives and vertex data. The fragment processor(s) 2615A-2615N use the primitive and vertex data generated by the vertex processor 2605 to produce a framebuffer that is displayed on a display device. The fragment processor(s) 2615A-2615N may be optimized to execute fragment shader programs as provided for in the OpenGL API, which may be used to perform similar operations as a pixel shader program as provided for in the Direct 3D API.

Graphics processor 2610 additionally includes one or more memory management units (MMUs) 2620A-2620B, cache(s) 2625A-2625B, and circuit interconnect(s) 2630A-2630B. The one or more MMU(s) 2620A-2620B provide for virtual to physical address mapping for the graphics processor 2610, including for the vertex processor 2605 and/or fragment processor(s) 2615A-2615N, which may reference vertex or image/texture data stored in memory, in addition to vertex or image/texture data stored in the one or more cache(s) 2625A-2625B. The one or more MMU(s) 2620A-2620B may be synchronized with other MMUs within the system, including one or more MMUs associated with the one or more application processor(s) 2505, image processor 2515, and/or video processor 2520 of FIG. 25, such that each processor 2505-2520 can participate in a shared or unified virtual memory system. Components of graphics processor 2610 may correspond with components of other graphics processors described herein. The one or more MMU(s) 2620A-2620B may correspond with MMU 245 of FIG. 2C. Vertex processor 2605 and fragment processor 2615A-2615N may correspond with graphics multiprocessor 234. The one or more circuit interconnect(s) 2630A-2630B enable graphics processor 2610 to interface with other IP cores within the SoC, either via an internal bus of the SoC or via a direct connection, according to embodiments. The one or more circuit interconnect(s) 2630A-2630B may correspond with the data crossbar 240 of FIG. 2C. Further correspondence may be found between analogous components of the graphics processor 2610 and the various graphics processor architectures described herein.

As shown FIG. 26B, graphics processor 2640 includes the one or more MMU(s) 2620A-2620B, cache(s) 2625A-2625B, and circuit interconnect(s) 2630A-2630B of the graphics processor 2610 of FIG. 26A. Graphics processor 2640 includes one or more shader cores 2655A-2655N (e.g., 2655A, 2655B, 2655C, 2655D, 2655E, 2655F, through 2655N-1, and 2655N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2640 includes an inter-core task manager 2645, which acts as a thread dispatcher to dispatch execution threads to one or more shader cores 2655A-2655N and a tiling unit 2658 to accelerate tiling operations for tile-based rendering, in which rendering operations for a scene are subdivided in image space, for example to exploit local spatial coherence within a scene or to optimize use of internal caches. Shader cores 2655A-2655N may correspond with, for example, graphics multiprocessor 234 as in FIG. 2D, or graphics multiprocessors 325, 350 of FIGS. 3A and 3B respectively, or multi-core group 365A of FIG. 3C.

Cache Structure and Utilization

In some embodiments, an apparatus, system, or process provides for one or more of:

(1) Partitioning Mechanism For Large GPU Caches;

(2) Dynamic Overfetching of Cache Lines; and (3) Cache Scrubbing and Pre-Eviction.

In some embodiments, the apparatus, system, or process includes the following:

(1) Partitioning Mechanism For Large GPU Cache

In some embodiments, an apparatus, system, or process provides a partitioning mechanism or operation for a large GPU cache, including, but not limited to, the partitioning of the cache to control allocation between data structures. In some embodiments, a GPU cache, such as an L3 cache, may be partitioned at instruction, surface, or memory page level depending on the particular requirements of a system. In some embodiments, software API based allocation/partitioning of the cache is provided to allow selection of the needed partitioning of the cache.

Figure 27:
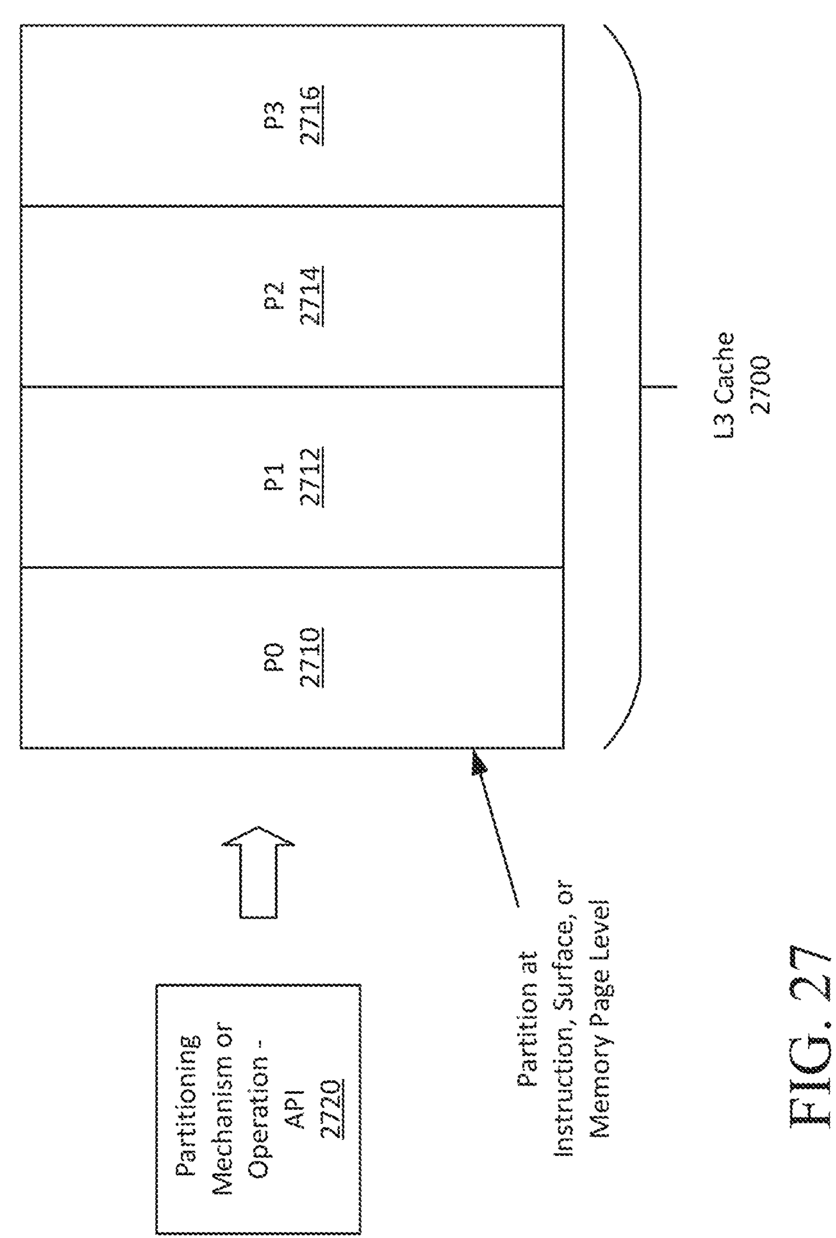
FIG. 27 is a block diagram of a processing environment adapted to implement GPU cache partitioning, according to some embodiments.

FIG. 27 is a block diagram of a processing environment adapted to implement GPU cache partitioning, according to some embodiments. Referring to FIG. 27, an L3 cache 2700, or other large cache, includes a number of partitions, the partitions being shown as P0 2710, P1 2712, P2 2714, and P3 2716.

In some embodiments, a partitioning mechanism or operation 2720 is provided to control allocation between data structures, wherein the partitioning may, for example, be provided at an instruction level, a memory surface level, or a memory page level. In some embodiments, partitioning mechanism or operation includes implementation of a software application programming interface (API) based allocation of the cache 2700.

Figure 28:
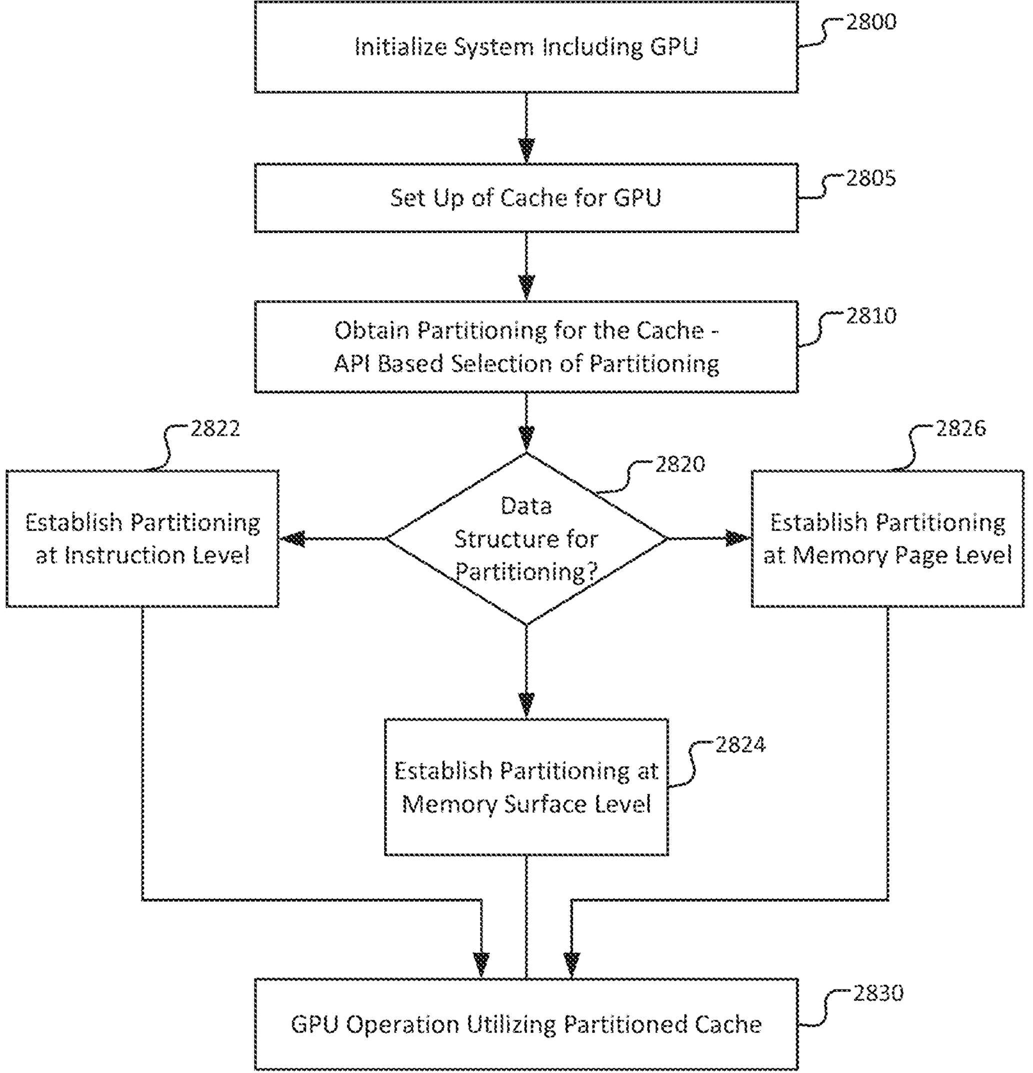
FIG. 28 is a flow chart to illustrate a process for partitioning of a large cache, according to some embodiments.

FIG. 28 is a flow chart to illustrate a process for partitioning of a large cache, according to some embodiments. In some embodiments, a process may include initializing a system including a GPU 2800, and setting up a cache for the GPU 2805, wherein the cache may be a larger cache, such as an L2 or L3 cache. In some embodiments, the process includes obtaining partitioning for the cache, which may include receiving a partitioning selection provide via a API 2810.

In some embodiments, the process including determining according to which of multiple different data structures the cache is to be partitioned 2820. In a particular implementation, based on the selection of data structure, partitioning is to be established at an instruction level 2822, partitioning is to be established at a memory surface level 2824, or partitioning is to be established at a memory page level 2824.

The process then is to process with GPU operation utilizing the partitioned cache 2830.

(2) Dynamic Overfetching of Cache Lines

In some embodiments, an apparatus, system, or process is to provide for dynamic overfetching of cache lines, wherein overfetching refers to prefetching of data extending to an overfetch boundary. Dynamic overfetching may in particular be applied to a large cache, such as an L2 or L3 cache. However, embodiments may be applied to any cache. The dynamic overfetching provides for dynamic modification of an amount of data to be overfetched depending on the particular requirements of a system. As used herein, overfetching in general refers to fetching a greater amount of data to a cache than is required to address a cache miss.

Prefetching is utilized to cache related data, and thereby reduce the likelihood of future cache misses. However, the proximity of data in memory to other data that will be required in the future may vary depending on various factors, including the type of data being accessed or the particular operation or application being run. Thus, conventional systems may prefetch too little or too much data.

Figure 29:
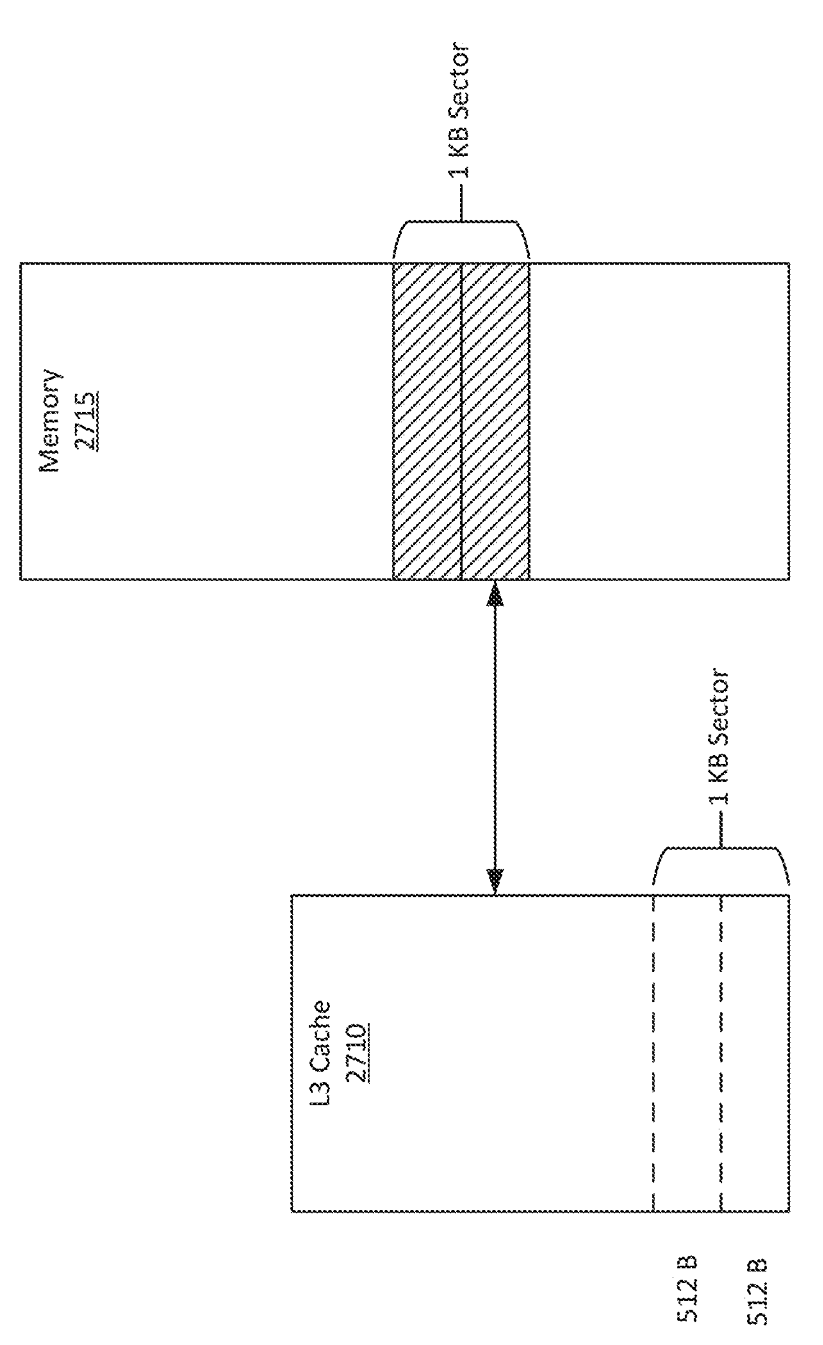
FIG. 29 is an illustration of dynamic overfetching of cache lines, according to some embodiments.

FIG. 29 is an illustration of dynamic overfetching of cache lines, according to some embodiments. In some embodiments, an apparatus, system, or process is to vary the size of a sector to be prefetched. In some embodiments, operation may include software, hardware, or a combination of both.

FIG. 29 illustrates an L3 cache 2710 and an associated memory. For example, an overfetched sector may be either 512 B or 1 KB, depending on sector size chosen. Based on the selection, the block of cache lines to be prefetched may extend to either the 512 B or 1 KB boundary, as shown in FIG. 29. However, embodiments are not limited to these boundaries, and may include a larger number of boundary choice; smaller (such as 256 B) or larger (such as 2 KB) boundaries; or both.

In some embodiments, the selection of a overfetch boundary may be selected based on certain factors. In a first example, the sector selection may be based at least in part on data accesses that are being performed. For example, either software or hardware may detect the variances in the data accesses being made, and dynamically change the sector size in L3 to accommodate the cache lines in, for example, 1 KB sectors or 512 B sectors. In another example, the sector selection may be based at least in part on a type of data compression being utilized.

In some embodiments, the selected sector is maintained on eviction, such that the overfetched data is evicted from the cache together in same manner as the data was overfetched into the cache.

Figure 30:
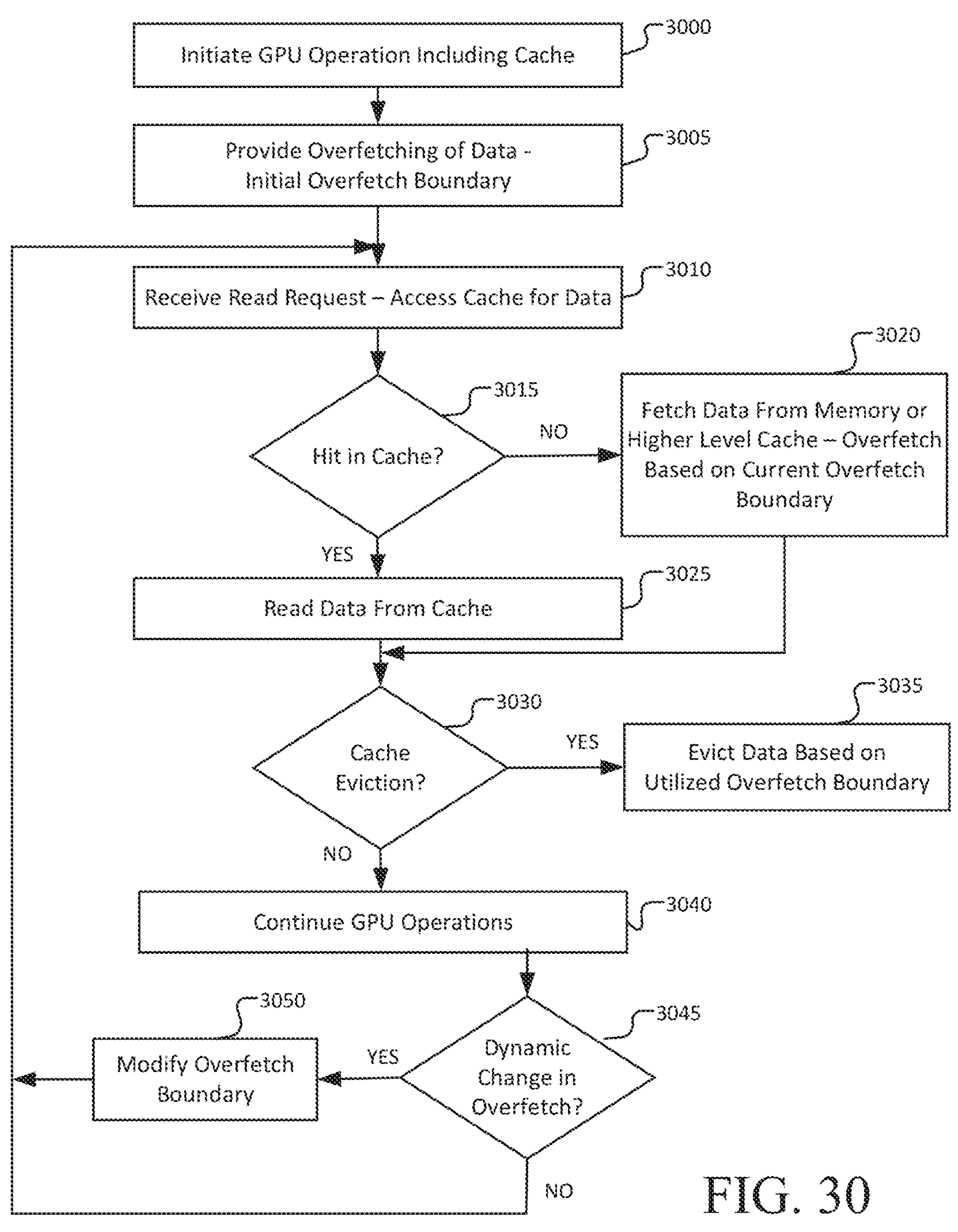
FIG. 30 is a flowchart to illustrate a process for dynamic overfetching of cache lines, according to some embodiments.

FIG. 30 is a flowchart to illustrate a process for dynamic overfetching of cache lines, according to some embodiments. As illustrated in FIG. 30, a process may include initiating GPU operation in a system including operation of a cache 3000, wherein the cache may be a larger cache, such as a L2 or L3 cache. The process includes prefetching of data for the cache to an overfetch boundary, wherein overfetching may be based upon a particular initial overfetch boundary 3005. The initial overfetch boundary may be an initial setting, or may be a default.

Upon receiving a request, the cache may be accessed for the data 3010. In some embodiments, upon a determination that there is no hit in the cache 3015 (i.e., there is a miss in the cache), data is fetched from memory (or higher level cache, if any) with the fetching including overfetching based on the current overfetch boundary 3020. Otherwise, there is a hit, and the data is read from the cache 3025.

The process may proceed with a determination whether data is to be evicted from the cache 3030. If so, the data is to be evicted based upon the overfetch boundary that was utilized for the overfetch operation 3035.

The process may then proceed with GPU operations 3040, which may include the use of the read in processing, or any other operation. In some embodiments, there may be a determination whether there has been a dynamic change in the overfetch 3045, such as a change in response to a hardware or software determination that a larger or smaller overfetch boundary should be implemented. If so, the process may include modifying the overfetch boundary accordingly 3050, and continuing with read request operations 3010 utilizing the modified overfetch boundary.

(3) Cache Scrubbing and Pre-Eviction

There are numerous challenges in maintaining the memory bandwidth for a larger cache, such as L2 or L3 cache, especially when there is a fully dirty cache. In conventional operation, whenever the cache misses, eviction may occur at the time of allocation. However, dirty lines (lines that have been modified but not yet written back) must be addressed to write back changes. This thus limits the memory bandwidth to constantly address cache eviction each time the cache is accessed in circumstances in which is a cache is largely or fully dirty.

In some embodiments, an apparatus, system, or process provides for scrubbing the cache before a miss occurs in the cache. In some embodiments, the apparatus, system, or process further provides for pre-evicting or downgrading certain cache lines prior to allocation, such as by monitoring and detecting an eviction pattern. In this manner, processing of cache lines to be evicted or downgraded may occur prior to a read miss, thus allowing for improved memory bandwidth.

FIG. 31 is an illustration of cache scrubbing to maintain memory bandwidth, according to some embodiments. As illustrated in FIG. 31, a cache 3110, which may be a larger cache such as an L2 or L3 cache, is to receive read requests, and to either provide data or to indicate a miss in the cache and fetch required data to the cache. The cache 3110 may include LRU (Least Recently Used) information for cache data, wherein the LRU information may be utilized in determining which data to be evicted from the cache 3110 upon allocating the cache for fetched data.

In some embodiments, an apparatus, system, or process is to detect a state of the LRU information 3120 prior to allocation, including identifying dirty cache lines and scrubbing the dirty lines, writing back changes to memory, illustrated as scrubbing 3150. In some embodiments, upon detecting the state of the LRU information 3120, one or more dirty lines are scrubbed before a miss occurs in the L3 cache. In addition, scrubbing further includes identifying cache lines that may be pre-evicted from the cache or downgraded in the cache, thus enabling improved efficiency and bandwidth in memory operation. The identification of data to be pre-evicted may be based on eviction data. In some embodiments, the scrubbing and pre-eviction may include detecting an eviction pattern for the cache 3110, and operating to evict or downgrade cache lines in advance based on the eviction data.

Figure 32:
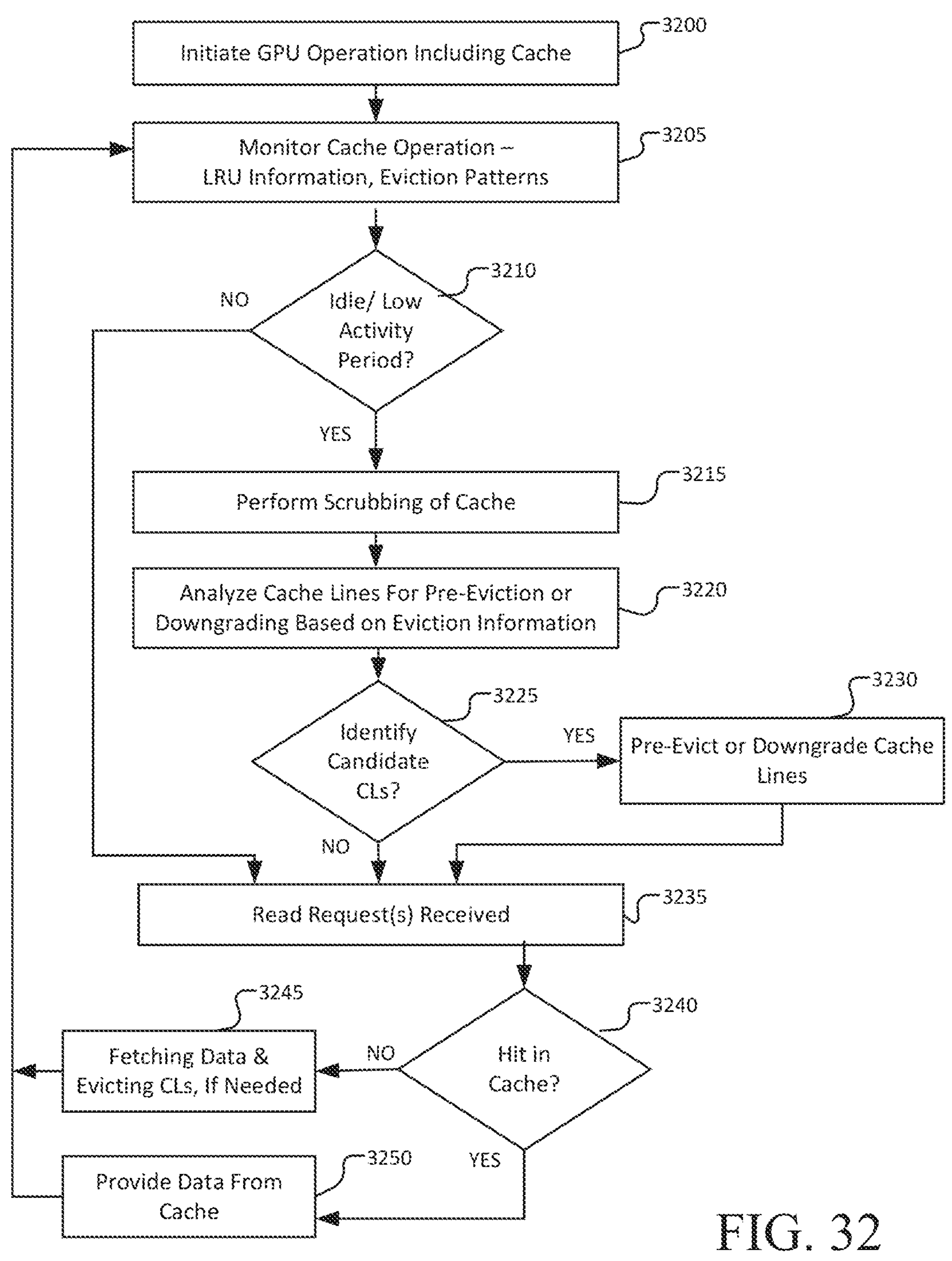
FIG. 32 is a flowchart to illustrate a process for cache scrubbing and pre-eviction of cache lines, according to some embodiments.

FIG. 32 is a flowchart to illustrate a process for cache scrubbing and pre-eviction of cache lines, according to some embodiments. In some embodiments, a process includes initiating GPU operation, including operation of a cache, such as a larger cache, including an L2 or L3 cache. In some embodiments, the operation of the cache is monitored 3205, which may include monitoring of LRU information for the cache, eviction patterns for the cache, or both.

In some embodiments, upon detection of an idle or other low activity period 3210, the process includes performing a scrubbing of the cache 3215 to address dirty cache lines in the cache. In some embodiments, the process further includes analyzing cache lines in the cache for possible pre-eviction or downgrading based at least in part on eviction information for the cache 3220. For example, upon the monitoring of the cache operation 3205 identifying an eviction pattern for data in the cache, the eviction pattern may be utilized to identify cache lines. In some embodiments, upon identifying one or more candidate cache lines 3225, the process includes pre-evicting or downgrading the identified cache lines 3230, thereby providing an improved condition for cache misses.

In some embodiments, the process further includes receiving one or more read requests 3235 and determining whether each request is a hit in the cache 3240. If not, i.e., there is a miss in the cache, then process may continue with fetching data as required, and evicting cache lines if required 3245. However, in such instance the scrubbing and pre-eviction process may have provided an improved condition, which may avoid eviction from the cache or improve the process for eviction and allocation. If there is a hit, the process may continue with providing the data from the cache 3250.

The process may then continue with monitoring of the cache operation 3205, and possible additional scrubbing and pre-eviction of cache lines to improve the efficiency and bandwidth of the memory operation.

In some embodiments, an apparatus includes: one or more processors including a graphics processor; a memory for storage of data for processing by the one or more processors; and a cache to cache data from the memory; wherein the apparatus is to provide for dynamic overfetching of cache lines for the cache, including receiving a read request for data and accessing the cache for the requested data, and upon a miss in the cache, overfetching data from memory or a higher level cache in addition to fetching the requested data, wherein the overfetching of data is based at least in part on a current overfetch boundary, and provides for data is to be prefetched extending to the current overfetch boundary.

In some embodiments, the apparatus is further to provide for eviction of data, including, upon a determination that the requested data is to be evicted, evicting the overfetched data according to the overfetch boundary.

In some embodiments, the apparatus is further to dynamically change a selection of the overfetch boundary.

In some embodiments, selection of the overfetch boundary is based on one or more of data accesses that are being performed or a type of data compression that is being utilized.

In some embodiments, the overfetch boundary is selected from a plurality of possible overfetch boundaries.

In some embodiments, the possible overfetch boundaries include a 512 B sector boundary and a 1 KB sector boundary.

In some embodiments, the current overfetch boundary is one of either a default overfetch boundary or an initial setting overfetch boundary.

In some embodiments, the cache is one of an L2 cache or an L3 cache.

In some embodiments, one or more non-transitory computer-readable storage mediums having stored thereon executable computer program instructions that, when executed by one or more processors, cause the one or more processors to perform operations including: receiving a read request requesting data for one or more processors including a graphics processor; accessing a cache for the requested data; upon a miss in the cache, overfetching data from a memory or a higher level cache in addition to fetching the requested data, wherein the overfetching of data is based at least in part on a current overfetch boundary, and provides for data is to be prefetched extending to the current overfetch boundary.

In some embodiments, the instructions further include instructions for, upon a determination that the requested data is to be evicted from the cache, evicting the overfetched data according to the overfetch boundary.

In some embodiments, the instructions further include instructions for dynamically changing a selection of the overfetch boundary.

In some embodiments, selection of the overfetch boundary is based on one or more of data accesses that are being performed or a type of data compression that is being utilized.

In some embodiments, the overfetch boundary is selected from a plurality of possible overfetch boundaries.

In some embodiments, the possible overfetch boundaries include a 512 B sector boundary and a 1 KB sector boundary.

In some embodiments, the current overfetch boundary is one of either a default overfetch boundary or an initial setting overfetch boundary.

In some embodiments, a method includes receiving a read request requesting data for one or more processors including a graphics processor; accessing a cache for the requested data; upon a miss in the cache, overfetching data from a memory or a higher level cache in addition to fetching the requested data, wherein the overfetching of data is based at least in part on a current overfetch boundary, and provides for data is to be prefetched extending to the current overfetch boundary.

In some embodiments, the method further includes, upon a determination that the requested data is to be evicted from the cache, evicting the overfetched data according to the overfetch boundary.

In some embodiments, the method further includes dynamically changing a selection of the overfetch boundary.

In some embodiments, selection of the overfetch boundary is based on one or more of data accesses that are being performed or a type of data compression that is being utilized.

In some embodiments, the overfetch boundary is selected from a plurality of possible overfetch boundaries.

In some embodiments, an apparatus includes one or more processors including a graphics processor; a memory for storage of data for processing by the one or more processors; and a cache to cache data from the memory; wherein the apparatus is to set up the cache for the graphics processor; establish partitioning for the cache according to a data structure; and operate the graphics processor utilizing the partitioned cache.

In some embodiments, the data structure is one of an instruction level, a memory surface level, and a memory page level.

In some embodiments, the apparatus is to partition the cache according to a received selection of data structure.

In some embodiments, the selection of data structure is received via an application programming interface (API).

In some embodiments, the cache is one of an L2 cache or an L3 cache.

In some embodiments, an apparatus includes one or more processors including a graphics processor; a memory for storage of data for processing by the one or more processors; and a cache to cache data from the memory; wherein the apparatus is to monitor operation of the cache; upon an idle or low activity period occurring, perform scrubbing of the cache to address dirty lines in the cache; identify one or more cache lines based on eviction information for the cache; and pre-evict or downgrade the identified cache lines.

In some embodiments, wherein the eviction information includes a detected eviction pattern for the cache.

In some embodiments, wherein the identified cache lines are pre-evicted or downgraded prior to a miss in the cache.

In some embodiments, wherein the cache includes least recently used (LRU) information for the cache data, and wherein the LRU information is used in the identification of the cache lines for pre-eviction or downgrading.

In some embodiments, the cache is one of an L2 cache or an L3 cache.

The foregoing description and drawings are to be regarded in an illustrative rather than a restrictive sense. Persons skilled in the art will understand that various modifications and changes may be made to the embodiments described herein without departing from the broader spirit and scope of the embodiments as set forth in the appended claims.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer. In some embodiments, a non-transitory computer-readable storage medium has stored thereon data representing sequences of instructions that, when executed by a processor, cause the processor to perform certain operations.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. An apparatus comprising:

one or more processors including a graphics processing unit (GPU); and a memory for storage of data for processing by the one or more processors;

wherein the one or more processors include a cache to cache data from the memory for use by the one or more processors, the cache including least recently used (LRU) information; and wherein the apparatus is to provide for processing of the cache, including:

monitoring operation of the cache, the monitoring of the cache including monitoring the LRU information of the cache and monitoring cache lines for potential pre-eviction, detecting a low activity period in operation of the cache, identifying one or more cache lines of the cache as dirty based at least in part on the monitoring of the LRU information for the cache, and scrubbing the identified one or more cache lines during the low activity period prior to allocation of the one or more cache lines for fetched data, wherein scrubbing the identified one or more cache lines includes writing data from the one or more cache lines back to a source, and identifying one or more cache lines for pre-eviction based at least in part on the monitoring, and evicting data from the one or more cache lines prior to allocation of the one or more cache lines for fetched data.

2. The apparatus of claim 1, wherein:

monitoring operation of the cache further includes detecting an eviction pattern for cache lines in the cache; and identifying the one or more cache lines for pre-eviction includes identifying cache lines based on the detected eviction pattern.

3. The apparatus of claim 1, wherein the apparatus is further to provide for receiving and handling read requests for the cache following the processing of the cache.

4. The apparatus of claim 1, wherein the cache is a GPU cache.

5. The apparatus of claim 1, wherein the cache is one of an L2 (Level 2) cache or an L3 (Level 3) cache.

6. One or more non-transitory computer-readable storage mediums having stored thereon executable computer program instructions that, when executed by one or more processors, cause the one or more processors to perform operations comprising:

monitoring operation of a cache in a computing system, the computing system including one or more processors including a graphics processing unit (GPU), wherein the cache includes least recently used (LRU) information and wherein monitoring operation of the cache includes monitoring the LRU information of the cache and monitoring cache lines for potential pre-eviction;

detecting a low activity period in operation of the cache;

identifying one or more cache lines of the cache as dirty based at least in part on the monitoring, and scrubbing the identified one or more cache lines during the low activity period prior to allocation of the one or more cache lines for fetched data, wherein scrubbing the identified one or more cache lines includes writing data from the one or more cache lines back to a source; and identifying one or more cache lines for pre-eviction based at least in part on the monitoring, and evicting data from the one or more cache lines prior to allocation of the one or more cache lines for fetched data.

7. The one or more storage mediums of claim 6, wherein:

monitoring operation of the cache further includes detecting an eviction pattern for cache lines in the cache; and identifying the one or more cache lines for pre-eviction includes identifying cache lines based on the detected eviction pattern.

8. The one or more storage mediums of claim 6, wherein the instructions further include instructions that, when executed by one or more processors, cause the one or more processors to perform operations comprising:

receiving and handling read requests for the cache following the processing of the cache.

9. A method comprising:

monitoring operation of a cache in a computing system, the computing system including one or more processors including a graphics processing unit (GPU), wherein the cache includes least recently used (LRU) information and wherein monitoring operation of the cache includes monitoring the LRU information of the cache and monitoring cache lines for potential pre-eviction;

detecting a low activity period in operation of the cache;

identifying one or more cache lines of the cache as dirty based at least in part on the monitoring, and scrubbing the identified one or more cache lines during the low activity period prior to allocation of the one or more cache lines for fetched data, wherein scrubbing the identified one or more cache lines includes writing data from the one or more cache lines back to a source; and identifying one or more cache lines for pre-eviction based at least in part on the monitoring, and evicting data from the one or more cache lines prior to allocation of the one or more cache lines for fetched data.

10. The method of claim 9, wherein:

monitoring operation of the cache further includes detecting an eviction pattern for cache lines in the cache; and identifying the one or more cache lines for pre-eviction includes identifying cache lines based on the detected eviction pattern.

11. The method of claim 9, further comprising:

receiving and handling read requests for the cache following the processing of the cache.

* * * * *